(12) United States Patent
Colaresi et al.

(10) Patent No.: US 10,048,389 B1
(45) Date of Patent: Aug. 14, 2018

(54) CENTROID CONTACT RADIATION DETECTOR SYSTEM AND METHOD

(71) Applicant: Mirion Technologies (Canberra), Inc., Meriden, CT (US)

(72) Inventors: James Francis Colaresi, Portland, CT (US); Kenneth Michael Yocum, Rocky Hill, CT (US); Aderemi Sikiru Adekola, Farmington, CT (US)

(73) Assignee: MIRION TECHNOLOGIES (CANBERRA), INC., Meriden, CT (US)

( * ) Notice: Subject to any disclaimer, the term of this patent is extended or adjusted under 35 U.S.C. 154(b) by 0 days.

(21) Appl. No.: 15/491,709

(22) Filed: Apr. 19, 2017

(51) Int. Cl.
*G01T 1/24* (2006.01)

(52) U.S. Cl.
CPC .................... *G01T 1/241* (2013.01)

(58) Field of Classification Search
CPC ..... G01T 1/167; G01T 1/2928; H01L 31/075; H01L 31/085; H01L 31/117; Y02E 10/548
See application file for complete search history.

(56) References Cited

U.S. PATENT DOCUMENTS

| | | | |
|---|---|---|---|
| 3,225,198 A | 12/1965 | Mayer | |
| 3,546,459 A | 12/1970 | Higatsberger et al. | |
| 4,056,726 A | 11/1977 | Harchol | |
| 4,060,432 A * | 11/1977 | Hall | G01T 1/24 438/17 |
| 4,237,470 A | 12/1980 | Raudorf | |
| 5,373,163 A | 12/1994 | Sigg | |
| 5,710,578 A | 1/1998 | Beauregard et al. | |
| 5,757,007 A * | 5/1998 | Sangsingkeow | G01T 1/2928 250/370.01 |
| 5,780,922 A | 7/1998 | Mishra et al. | |
| 6,100,533 A * | 8/2000 | Martini | G01T 1/241 250/370.01 |
| 8,575,750 B1 * | 11/2013 | Zhou | G01T 1/24 250/255 |

(Continued)

OTHER PUBLICATIONS

Gehman; "PPC Germanium Detectors"; LA-UR 10-06294; Los Alamos National Laboratory; Advances in Neutrino Technology 2010, Santa Fe, NM; Sep. 16, 2010; 73 pgs.

(Continued)

*Primary Examiner* — Marcus Taningco
(74) *Attorney, Agent, or Firm* — David W. Carstens; Carstens & Cahoon, LLP

(57) ABSTRACT

A centroid contact radiation detector system/method providing for low capacitance and noise insensitivity is disclosed. The system incorporates a P-type/N-type bulk germanium volume (PGEV/NGEV) having an internal well cavity void (IWCV). The external NGEV surfaces incorporate an N+/P+ electrode and the surface of the IWCV incorporates a centrally located P+/N+ contact (CPPC). The IWCV surface is constructed and the CPPC is positioned within the IWCV so as to provide uniform symmetric field distribution within the PGEV/NGEV and improved noise immunity. The CPPC may be formed using point, reduced-area, medium-area, large-area, hemispherical, semi-hemispherical, and cylindrical annulus contact constructions. The PGEV/NGEV may be constructed using cylindrical, regular polyhedral, or spherical forms.

20 Claims, 192 Drawing Sheets

(56) References Cited

U.S. PATENT DOCUMENTS

| | | | |
|---|---|---|---|
| 9,105,777 B1* | 8/2015 | Zhou | H01L 31/035281 |
| 9,261,610 B2* | 2/2016 | Zhang | G01T 1/24 |
| 9,269,847 B2 | 2/2016 | Yocum et al. | |
| 2011/0095194 A1 | 4/2011 | Orava et al. | |
| 2011/0169121 A1 | 7/2011 | Bui et al. | |
| 2012/0252158 A1 | 10/2012 | Carothers et al. | |
| 2014/0264049 A1* | 9/2014 | Yocum | H01L 31/117 250/370.14 |

OTHER PUBLICATIONS

Radford; "Novel HPGe Detector Design for Gamma-ray Tracking and Imaging;" Oak Ridge National Laboratory, Physics Division; Aug. 16, 2012; 29 pgs.

Barton; "Low Noise Threshold in Ge PPC Detectors"; Sandia National Laboratories; CNNS Workshop, Livermore, CA; Dec. 6-7, 2012; 22 pgs.

"P-Type Point Contact Detector Development"; Majorana Group, LBNL; Sep. 22, 2009; 5 pp.

Luke, et al.; "Low Capacitance Large Volume Shaped-Filed Germanium Detector"; IEEE Transactions on Nuclear Science; vol. 36, No. 1; Feb. 1989; pp. 926-930.

"Germanium Detectors"; www.canberra.com; Canberra Industries, Inc., Meriden, CT, USA; Nov. 2008; 3 pp.

"Germanium Well Detector (WELL)"; www.canberra.com; Canberra Industries, Inc., Meriden, CT, USA; Oct. 2012; http://www.canberra.com/products/detectors/germanium-detectors.asp; 2 pp.

Guiseppe; "Neutrinoless Double-Beta Decay and the Majorana Experiment"; Los Alamos National Laboratory; 2009; 47 pp.

"High-purity Germanium (HPGe) Detectors"; Canberra Industries, Inc.; Meriden, CT, USA; 2012; http://www.canberra.com/products/detectors/germanium-detectors.asp;2 pp.

"Standard Electrode Coaxial Ge Detectors SEGe)"; www.canberra.com; Canberra Industries, Inc., Meriden, CT, USA; Jan. 2013; 2 pp.

Luke; "Low Noise Germanium Radial Drift Detector"; Nuclear Instruments and Methods in Physics Research A271; Mar. 7, 1988; pp. 567-570.

Finnerty; "Preliminary Oral Exam: Astroparticle Physics with Prototype Broad Energy Germanium Detectors"; University of North Carolina; Chapel Hill, NC, USA; Apr. 16, 2010; 93 pp.

Cooper, et al.; "A Novel HPGe Detector for Gamma-ray Tracking and Imaging"; Nuclear Instruments and Methods in Physics Research; A-665; Oct. 2011; pp. 25-32.

* cited by examiner

*Prior Art*

*Prior Art*

*Prior Art*

*Prior Art*

*Prior Art*

*Prior Art*

*Prior Art*

*Prior Art*

*Prior Art*

*Prior Art*

*Prior Art*

*Prior Art*

*FIG. 63*
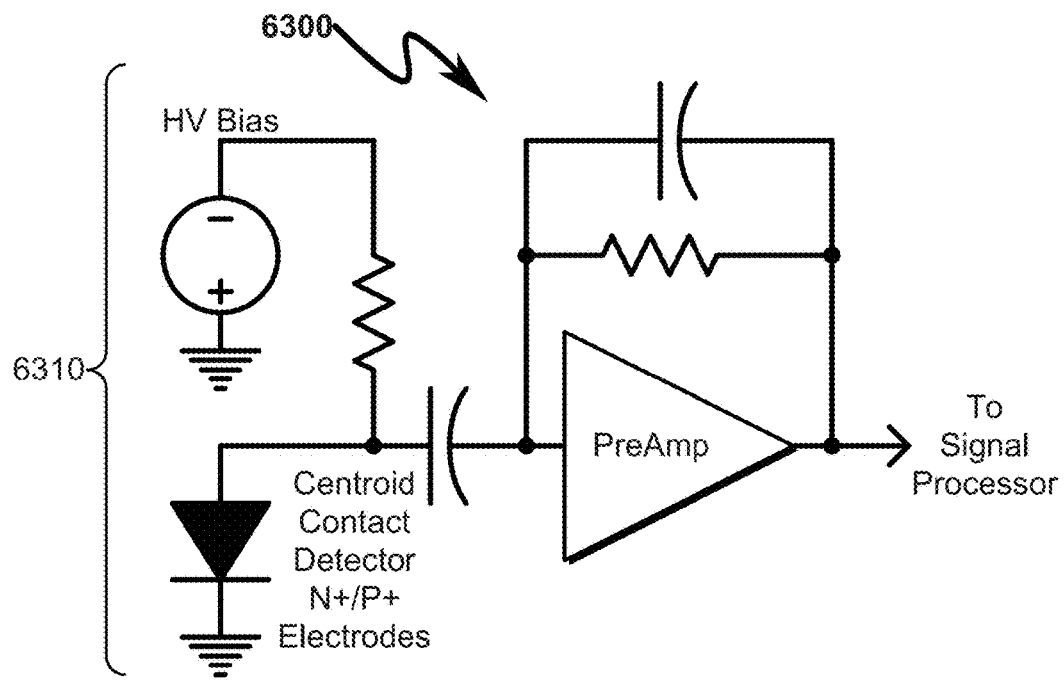
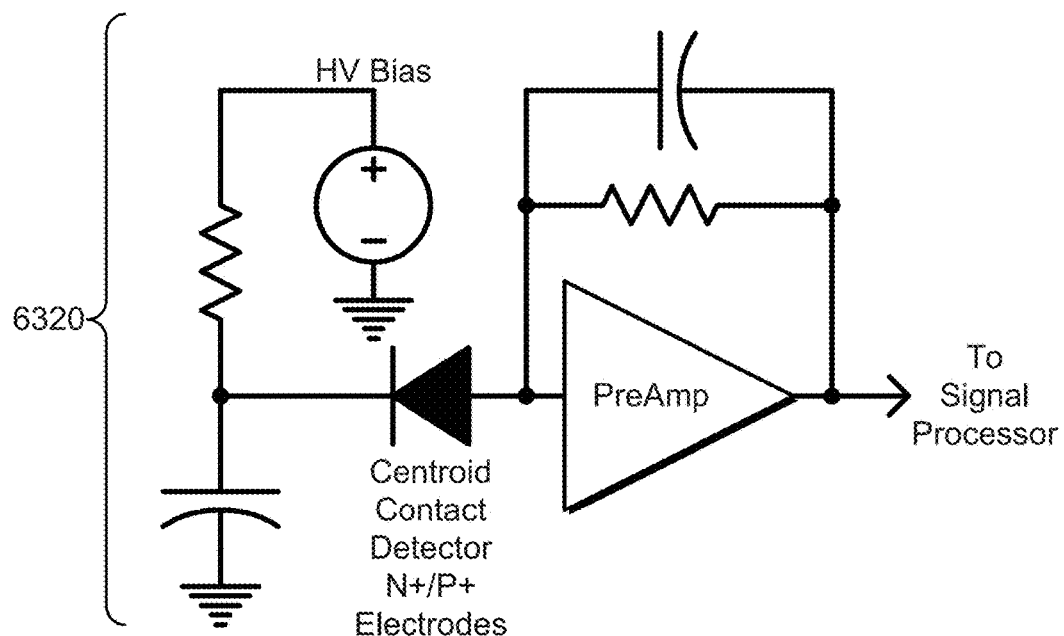

10700

FIG. 111
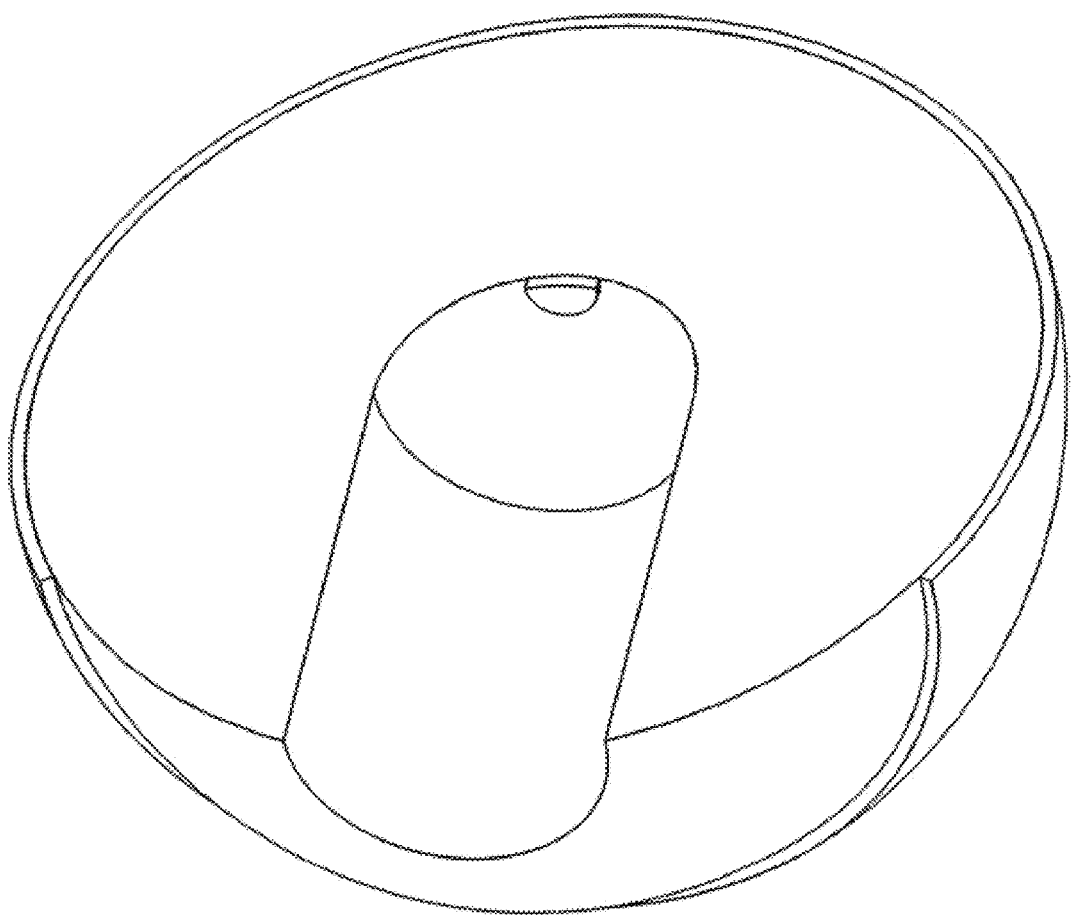

US 10,048,389 B1

CENTROID CONTACT RADIATION DETECTOR SYSTEM AND METHOD

CROSS REFERENCE TO RELATED APPLICATIONS

Not Applicable

PARTIAL WAIVER OF COPYRIGHT

All of the material in this patent application is subject to copyright protection under the copyright laws of the United States and of other countries. As of the first effective filing date of the present application, this material is protected as unpublished material.

However, permission to copy this material is hereby granted to the extent that the copyright owner has no objection to the facsimile reproduction by anyone of the patent documentation or patent disclosure, as it appears in the United States Patent and Trademark Office patent file or records, but otherwise reserves all copyright rights whatsoever.

STATEMENT REGARDING FEDERALLY SPONSORED RESEARCH OR DEVELOPMENT

Not Applicable

REFERENCE TO A MICROFICHE APPENDIX

Not Applicable

FIELD OF THE INVENTION

The present invention generally relates to systems and methods for the detection of radiation, more particularly, but not by way of limitation to the use of low noise SEGe, XtRa, BEGe, REGe, SAGe, and LEGe radiation detectors employing a centroid P+ or N+ electrode contact in this application.

PRIOR ART AND BACKGROUND OF THE INVENTION

General Detector Classes (0100)-(0800)

As generally depicted in FIG. 1 (0100)-FIG. 8 (0800), historically HPGe detectors have been classified into one of the following designs:

Planar designs (0110) (generally depicted in FIG. 1 (0100)-FIG. 2 (0200)) comprising a N-bulk or P-bulk (0111) material with planar P+ or N+, respectively, electrodes (0112) and planar N+ or P+, respectively, electrodes (0112) with optional isolation grooves.

Coaxial designs (0310) (generally depicted in FIG. 3 (0300)-FIG. 4 (0400)) comprising a N-bulk or P-bulk (0311) material with surrounding P+ or N+, respectively, electrodes (0312) and inner well (cavity) N+ or P+, respectively, electrodes (0313) with optional isolation grooves.

Point-contact designs (0510) (generally depicted in FIG. 5 (0500)-FIG. 6 (0600)) comprising a N-bulk or P-bulk (0510) material with surrounding large area P+ or N+, respectively, electrodes (0511) and small area N+ or P+, respectively, electrodes (0512)) with optional isolation grooves.

Well designs (0710) (generally depicted in FIG. 7 (0700)-FIG. 8 (0800)) comprising a N-bulk or P-bulk (0710) material having a well cavity with surrounding large area P+ or N+, respectively, electrodes (0711) and small area N+ or P+, respectively, electrodes (0712) with optional isolation grooves (0714).

Specialty designs comprising complex bulk geometries, segmented contacts, strip contacts, and combinations thereof with optional isolation grooves.

Each of these designs suffers from various deficiencies which make them non-optimal for a variety of radiation detection application scenarios.

OBJECTIVES OF THE INVENTION

Accordingly, the objectives of the present invention are (among others) to circumvent the deficiencies in the prior art by use of a centroid contact, herein defined as a single internally bounded contact, to affect the following objectives:

(1) Provide for a centroid contact radiation detector system and method that decreases the detector capacitance in the device.

(2) Provide for a centroid contact radiation detector system and method that maintains stronger, more uniform, and symmetric electric fields in the device.

(3) Provide for a centroid contact radiation detector system and method that reduces noise leading to improved energy resolution.

(4) Provide for a centroid contact radiation detector system and method that improves energy resolution.

(5) Provide for a centroid contact radiation detector system and method that enhances the charge collection process.

(6) Provide for a centroid contact radiation detector system and method that improves performance of the pulse shaping amplifier (PSA) portion of the detector.

While these objectives should not be understood to limit the teachings of the present invention, in general these objectives are achieved in part or in whole by the disclosed invention that is discussed in the following sections. One skilled in the art will no doubt be able to select aspects of the present invention as disclosed to affect any combination of the objectives described above.

BRIEF SUMMARY OF THE INVENTION

The present invention discloses a new detector geometry with a centralized internal small area signal electrode. The new device has a capacitance similar to the current types of low capacitance detectors (e.g. BEGe, LEGe, SAGe, and SAGe Well). The signal contact is generally located near the 3-D center of the device volume, at the centroid of the $4\pi$ electric field distribution, rather than on one face like current $2\pi$ SAGe and LEGe detectors. The centroid of the electric field distribution is defined here as the point at which the charge collection times for all charge carriers originating equidistant from that centroid are as close to equal as allowed by the device geometry and impurity distribution. Put another way, the electric field centroid is located at the center of the $4\pi$ electric field symmetry. For cylindrical detectors with flat impurity distributions the electric field centroid is generally located near the center of mass, or geometric centroid, of the detector volume but may differ based on device geometry and germanium impurity distribution. In the extreme of a spherical volume with constant impurity concentration throughout, the charge collection times for all points equidistant from the electric field centroid will be equal and the electric field centroid will be positioned at the center of the sphere.

Because the length and diameter are equal it can be seen in the attached drawings that if the outside corners of the cylinder forming the detector volume are rounded with sequentially larger and larger radius bevels the internal electric field gradient will become more uniform as the weaker fields in the corners become stronger and merge with the existing field structure to form a uniform spherical gradient. This 4π geometry provides the greatest symmetric E-field strength throughout the greatest detector volume for all low capacitance detector geometries. All else being equal, better field strength equates with better charge collection performance and symmetry equates with improved pulse shape analysis (PSA). In practice the cylindrical geometry is the most practical choice for reasons of efficiency and material utilization.

The new centroid electrode geometry maintains or improves energy resolution performance compared to current low capacitance detectors. This device structure is the optimum configuration for providing uniform field with highest electrical field strength in devices with small signal electrodes. The 4π uniformity of the electric field in the bulk volume of this detector will prove more suitable for background reduction by PSA technique than other devices such as SAGe Well detectors.

The methodology of having a centralized small area signal electrode can be extended to other detector types (i.e., SEGe, XtRa, BEGe, REGe, SAGe, and LEGe detectors) for the purpose of providing uniform electric field in the bulk volume of the detector. On SEGe, BEGe, SAGe, and XtRa detectors the existing P+ signal contacts can be replaced by small area internal P+ signal electrodes at the centroid of the electric field. On LEGe and REGe detectors the N+ contacts can be replaced by small area internal N+ signal electrodes at the electric field centroid. Thus all detectors with a centroid contact fall into either of two general classes: Small Anode Germanium (SAGe) detectors or Small Cathode Germanium (SCGe) detectors.

Like other SAGe and SCGe devices this new contact configuration lends itself to use in electrically cooled cryostats as a replacement for higher capacitance coaxial detectors. A consequence of the lower capacitance of the new geometry is less performance degradation resulting from mechanical vibrations. The combination of lower capacitance and improved charge collecting fields will lead to larger detectors with improved performance in electrically cooled detector systems.

High energy efficiencies, peak to Compton ratios, and germanium material utilization will be improved for large volume SAGe and SCGe detectors as a result of this new electrode geometry. With current electrode geometries large volume SAGe detectors require geometric tapers to improve drift fields to acceptable levels for complete charge collection. The new configuration eliminates the need for tapers on large volume SAGe devices (with the exception of SAGe Well) and extends their range to larger volumes. Currently SCGe detectors are not available in very large volumes due to the limitations of n-type germanium material quality. This new centralized electrode geometry allows larger volume SCGe detectors. Volumes may be further increased by beveling the front and back corners of the devices to improve fields in low field regions thus allowing larger diameters or greater lengths.

BRIEF DESCRIPTION OF THE DRAWINGS

For a fuller understanding of the advantages provided by the invention, reference should be made to the following detailed description together with the accompanying drawings wherein:

FIG. 63 illustrates exemplary schematics of detector circuits useful in implementing a number of preferred invention embodiments;

FIG. 111 illustrates a bottom front perspective front sectional view of a preferred exemplary sphere-shaped invention system embodiment incorporating a semi-hemispherical point-contact centroid signal contact;

FIG. 119 illustrates a bottom right rear perspective view of a preferred exemplary invention system embodiment depicting an exemplary detector housing and detector contact wiring;

FIG. 120 illustrates a bottom right rear perspective right section view of a preferred exemplary invention system embodiment depicting an exemplary detector housing and detector contact wiring;

FIG. 121 illustrates a top right perspective view of a preferred exemplary invention detector housing system embodiment depicting contact wiring and detail of an exemplary centroid spring ring contact apparatus;

FIG. 122 illustrates a top view of a preferred exemplary invention detector housing system embodiment depicting contact wiring and detail of an exemplary centroid spring ring contact apparatus;

FIG. 123 illustrates a bottom right perspective view of a preferred exemplary invention detector housing system embodiment depicting contact wiring and detail of an exemplary centroid spring ring contact apparatus;

FIG. 124 illustrates a bottom view of a preferred exemplary invention detector housing system embodiment depicting contact wiring and detail of an exemplary centroid spring ring contact apparatus;

FIG. 125 illustrates a top right perspective view of a preferred exemplary invention detector housing system embodiment depicting contact wiring and detail of an exemplary centroid wiring point contact apparatus;

FIG. 126 illustrates a top view of a preferred exemplary invention detector housing system embodiment depicting contact wiring and detail of an exemplary centroid wiring point contact apparatus;

FIG. 127 illustrates a bottom right perspective view of a preferred exemplary invention detector housing system embodiment depicting contact wiring and detail of an exemplary centroid wiring point contact apparatus;

FIG. 128 illustrates a bottom view of a preferred exemplary invention detector housing system embodiment depicting contact wiring and detail of an exemplary centroid wiring point contact apparatus;

FIG. 129 illustrates a top view of a preferred exemplary embodiment incorporating a wraparound P+ (or N+) outer contact and N+ (or P+) centroid inner contact;

FIG. 130 illustrates a top right front perspective view of a preferred exemplary embodiment incorporating a wraparound P+ (or N+) outer contact and N+ (or P+) centroid inner contact;

Figure 131:
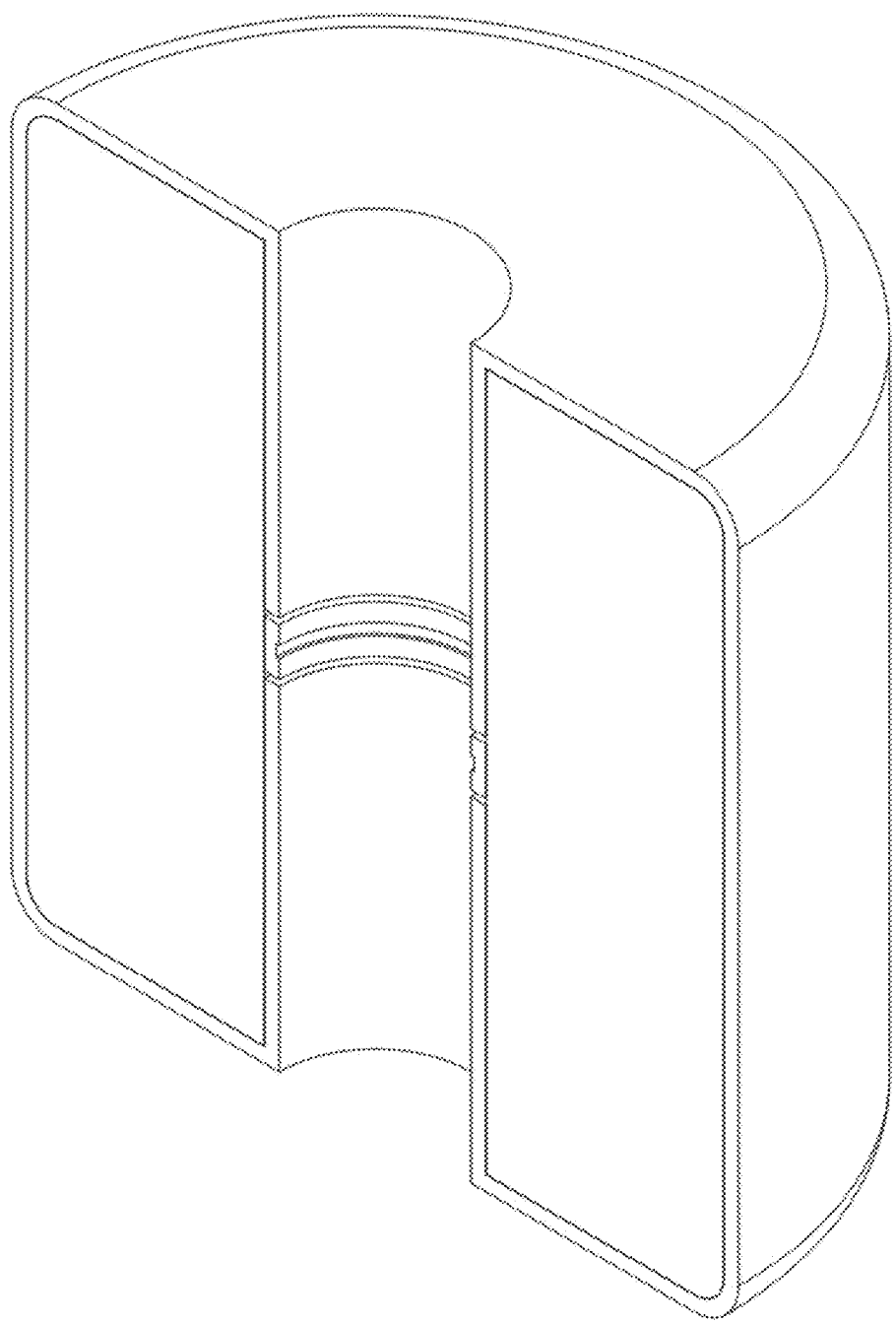
Figure 132:
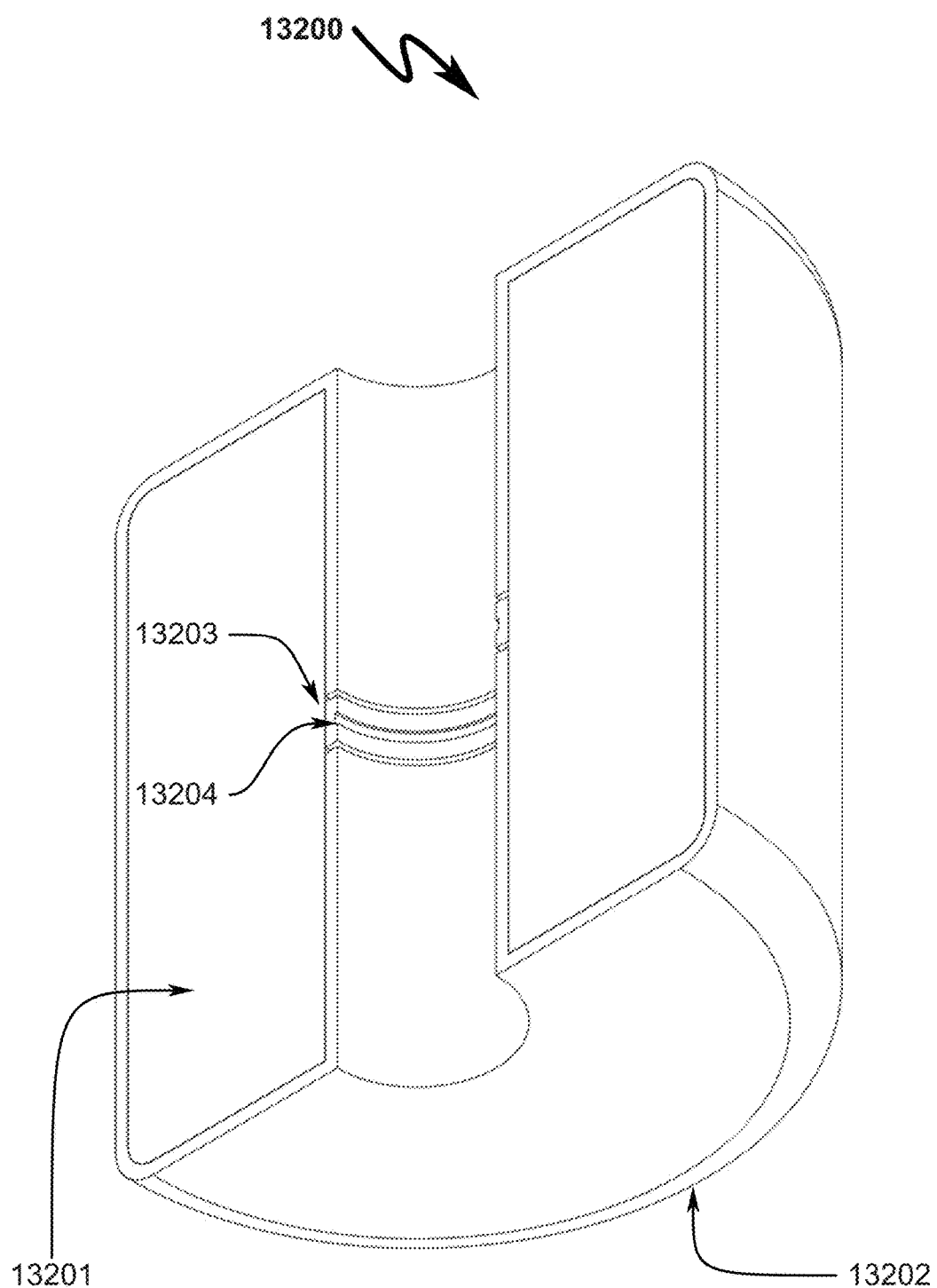
Figure 133:
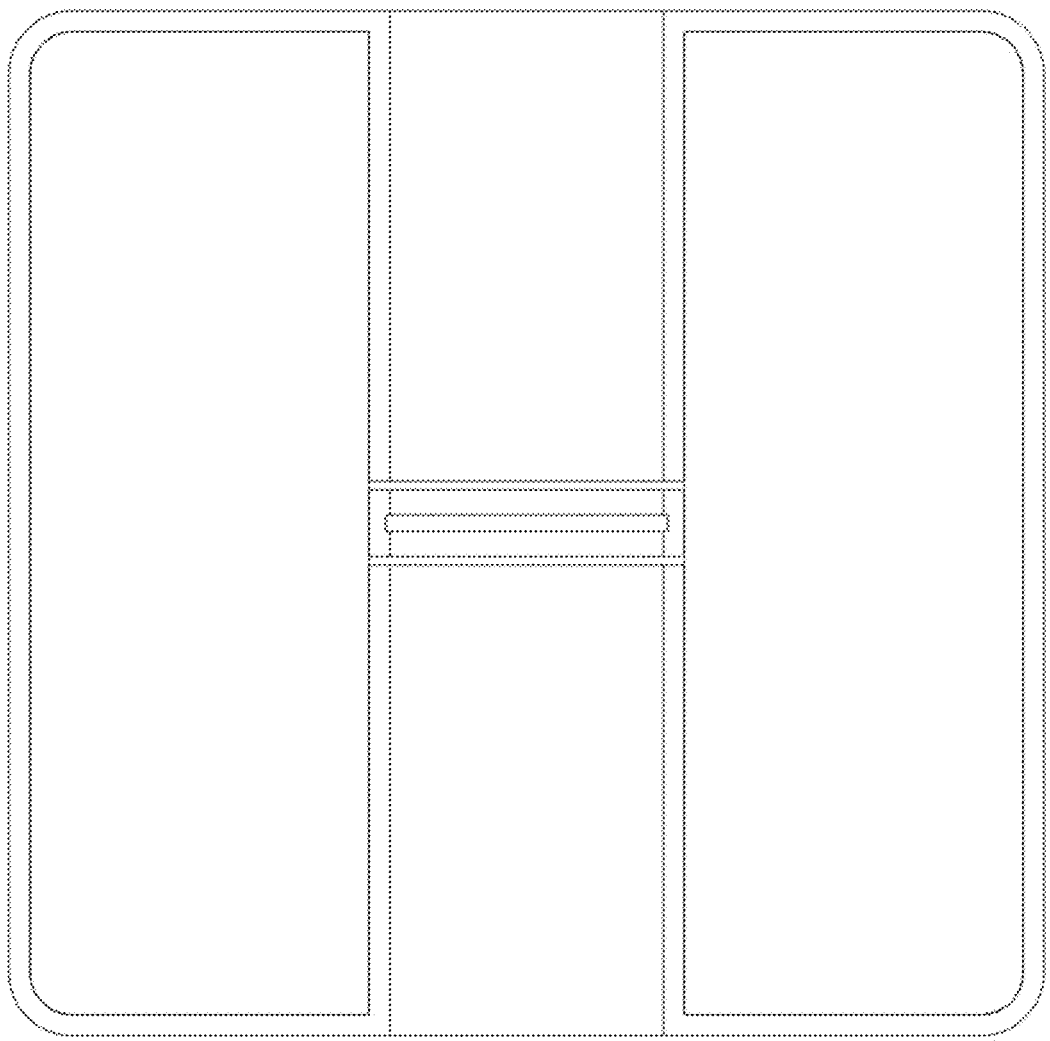
Figure 134:
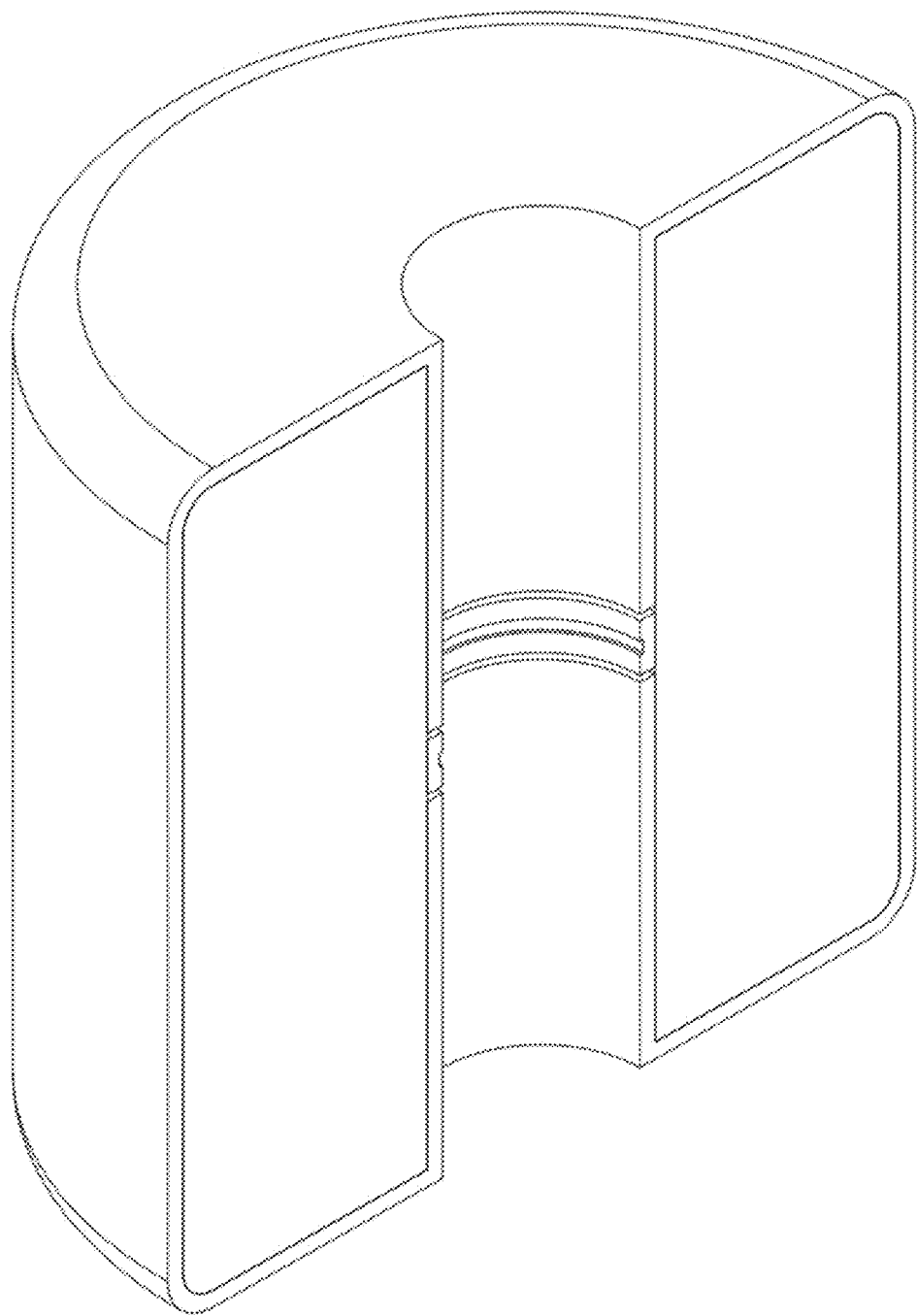
Figure 135:
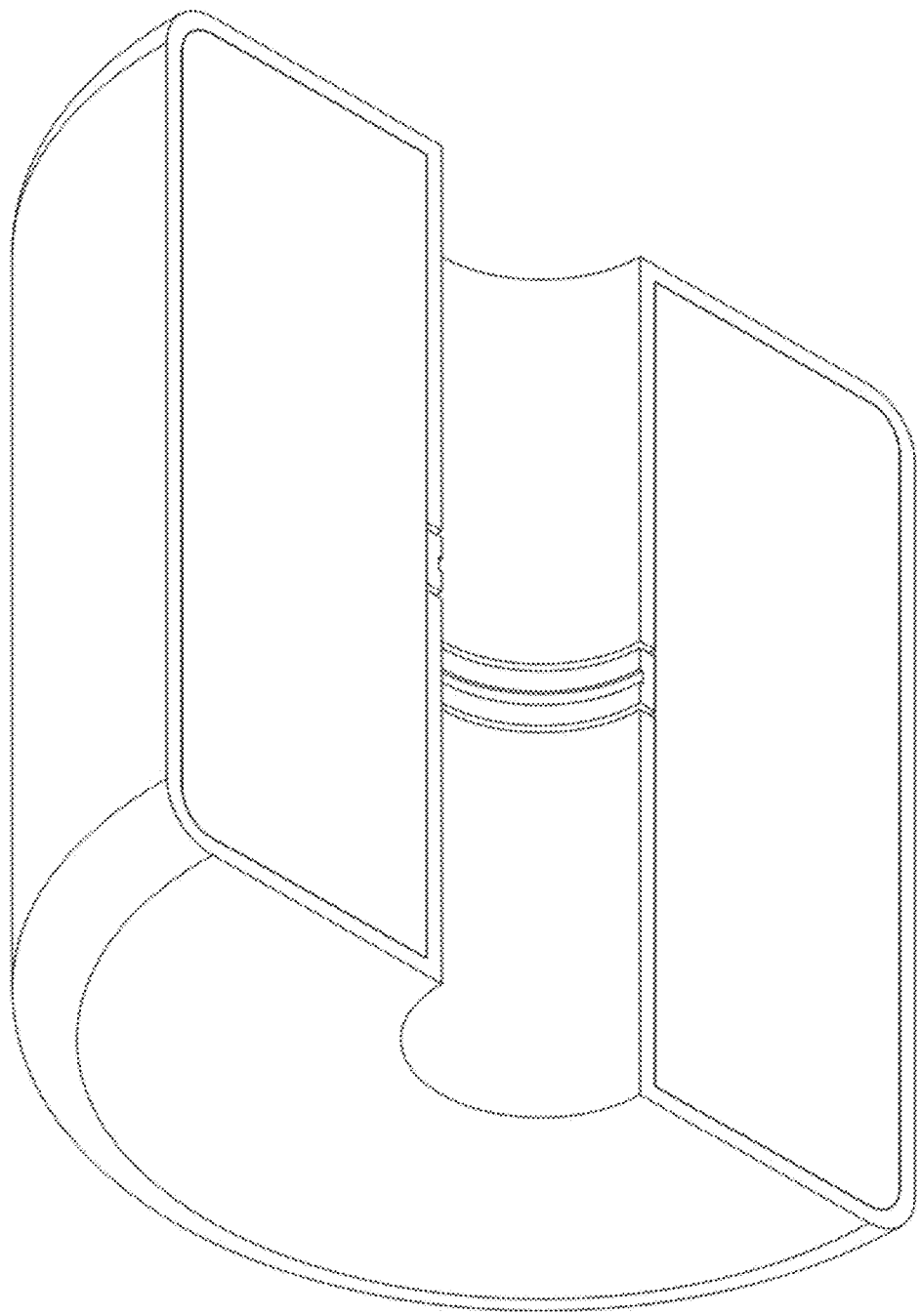
Figure 136:
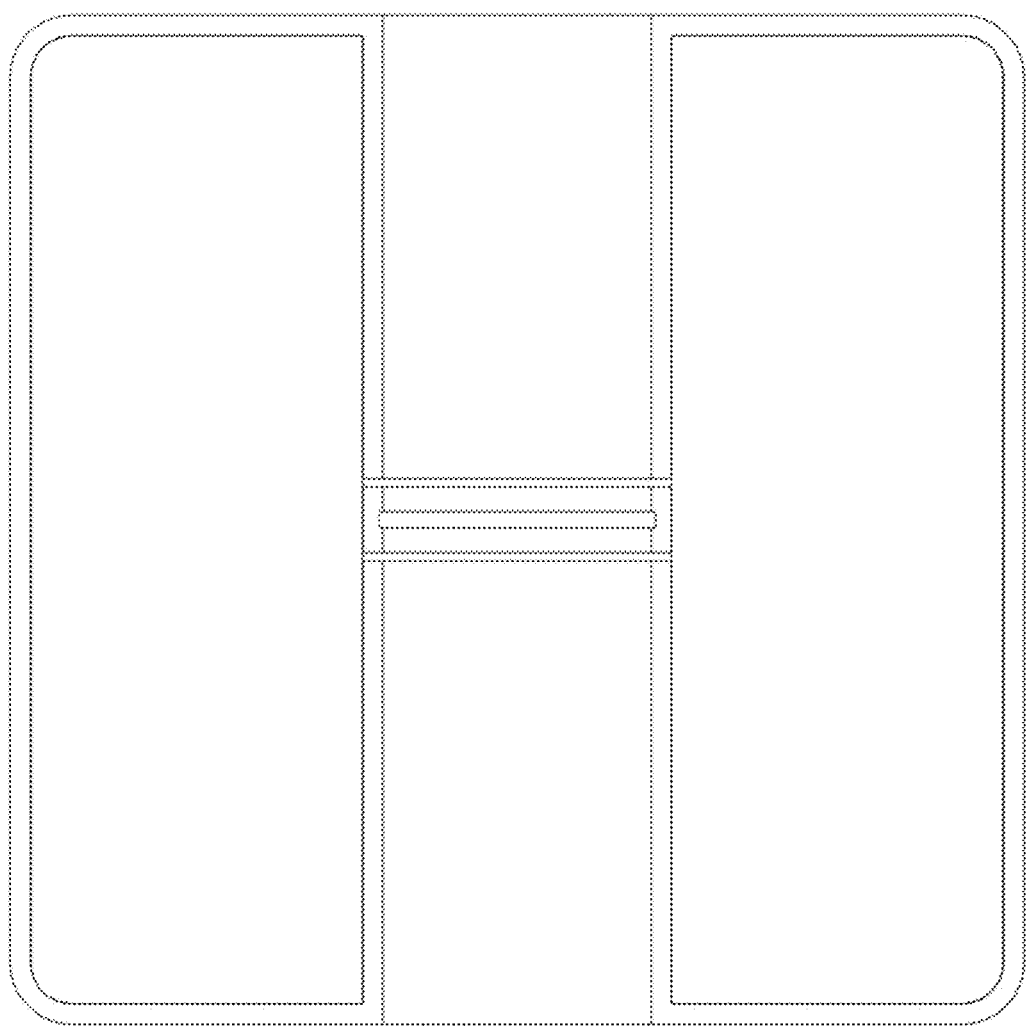
Figure 137:
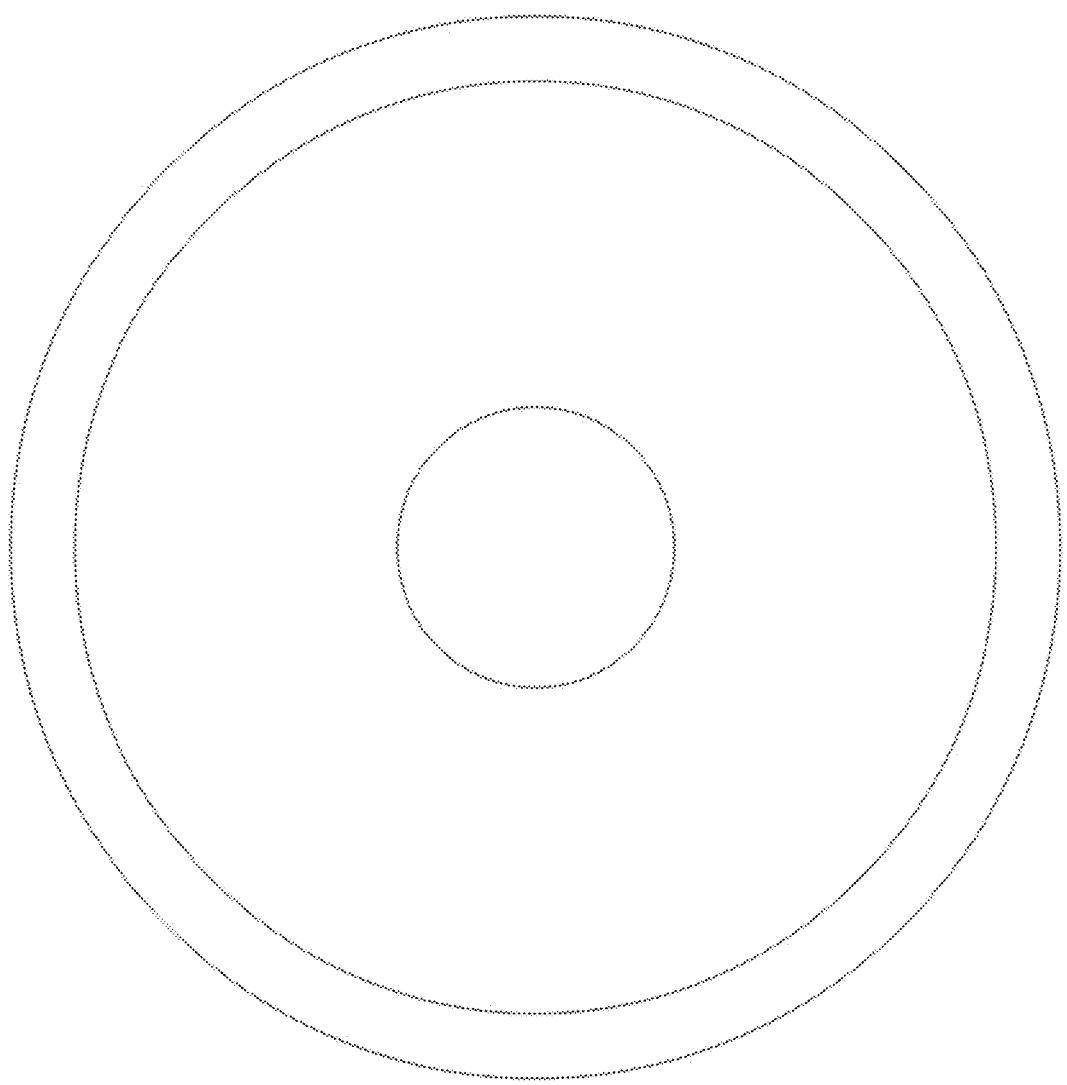
Figure 138:
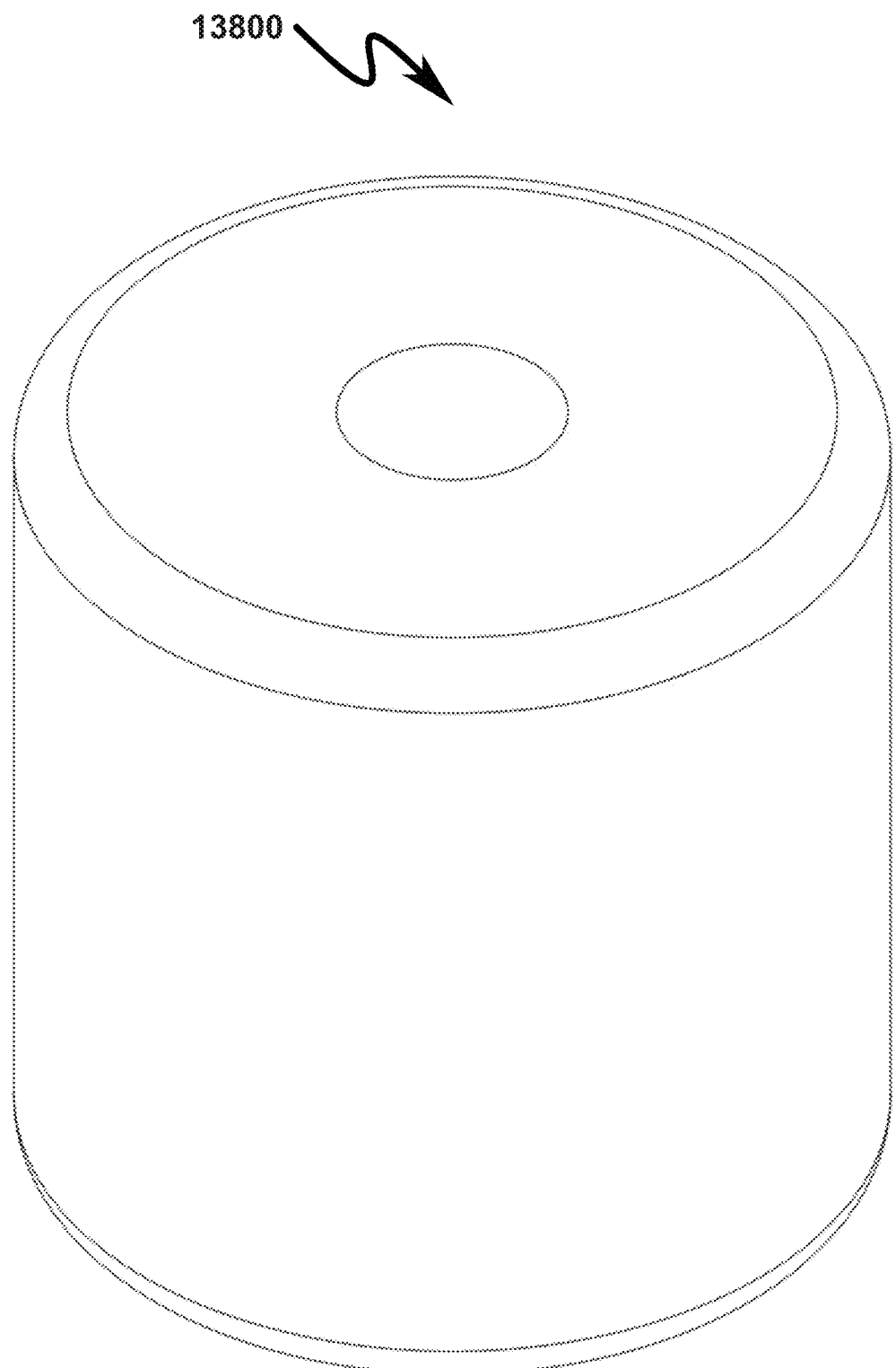
Figure 139:
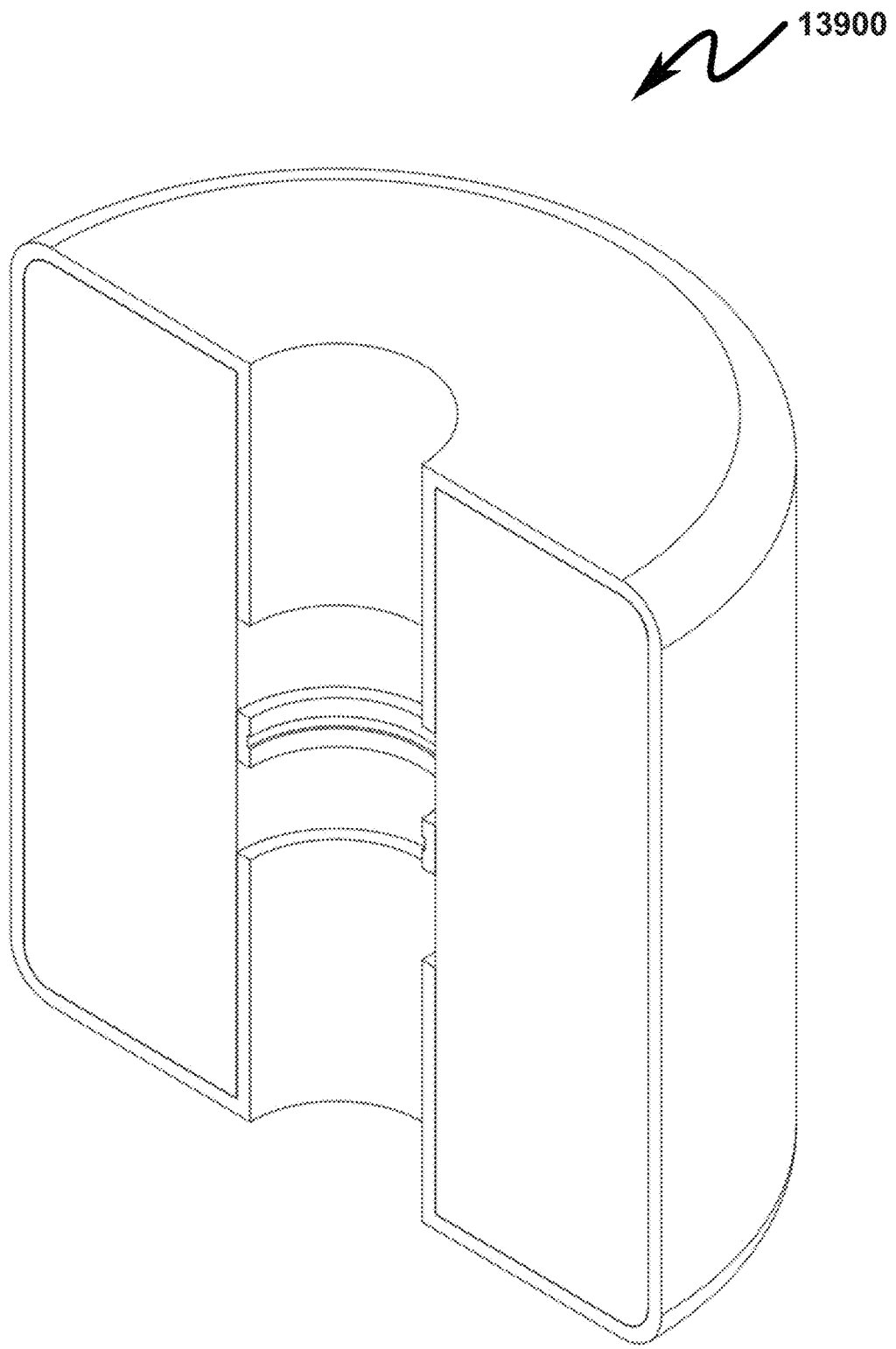
Figure 140:
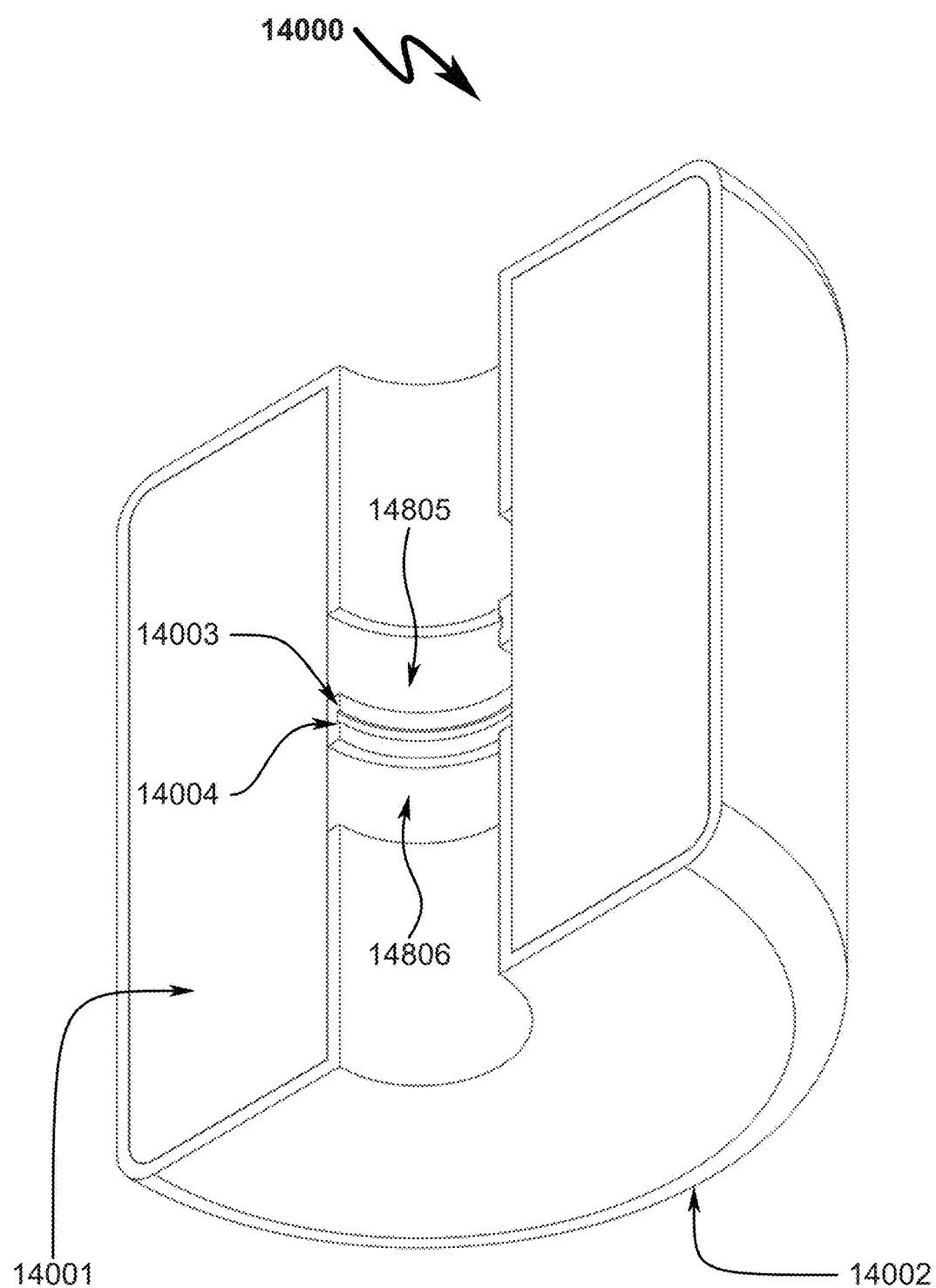
Figure 141:
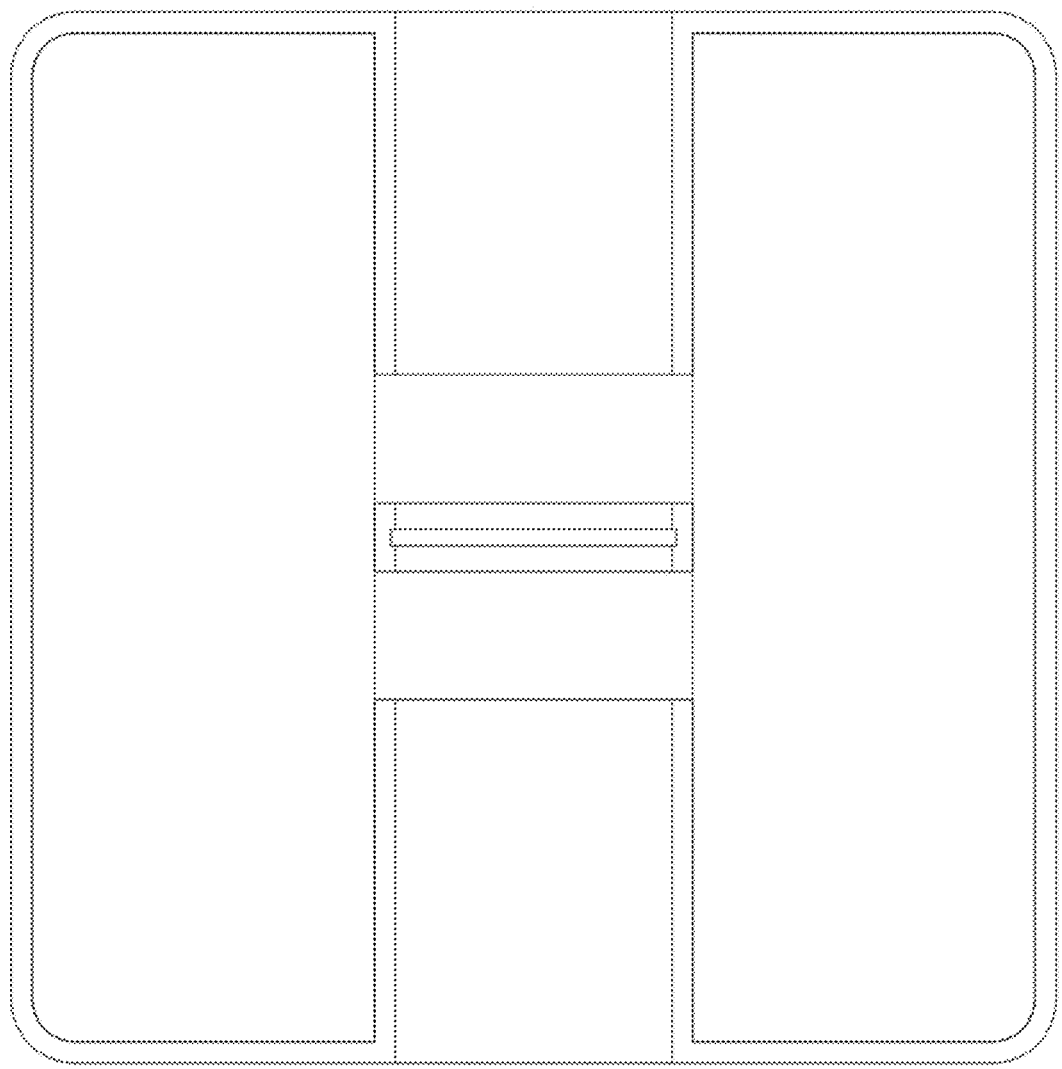
Figure 142:
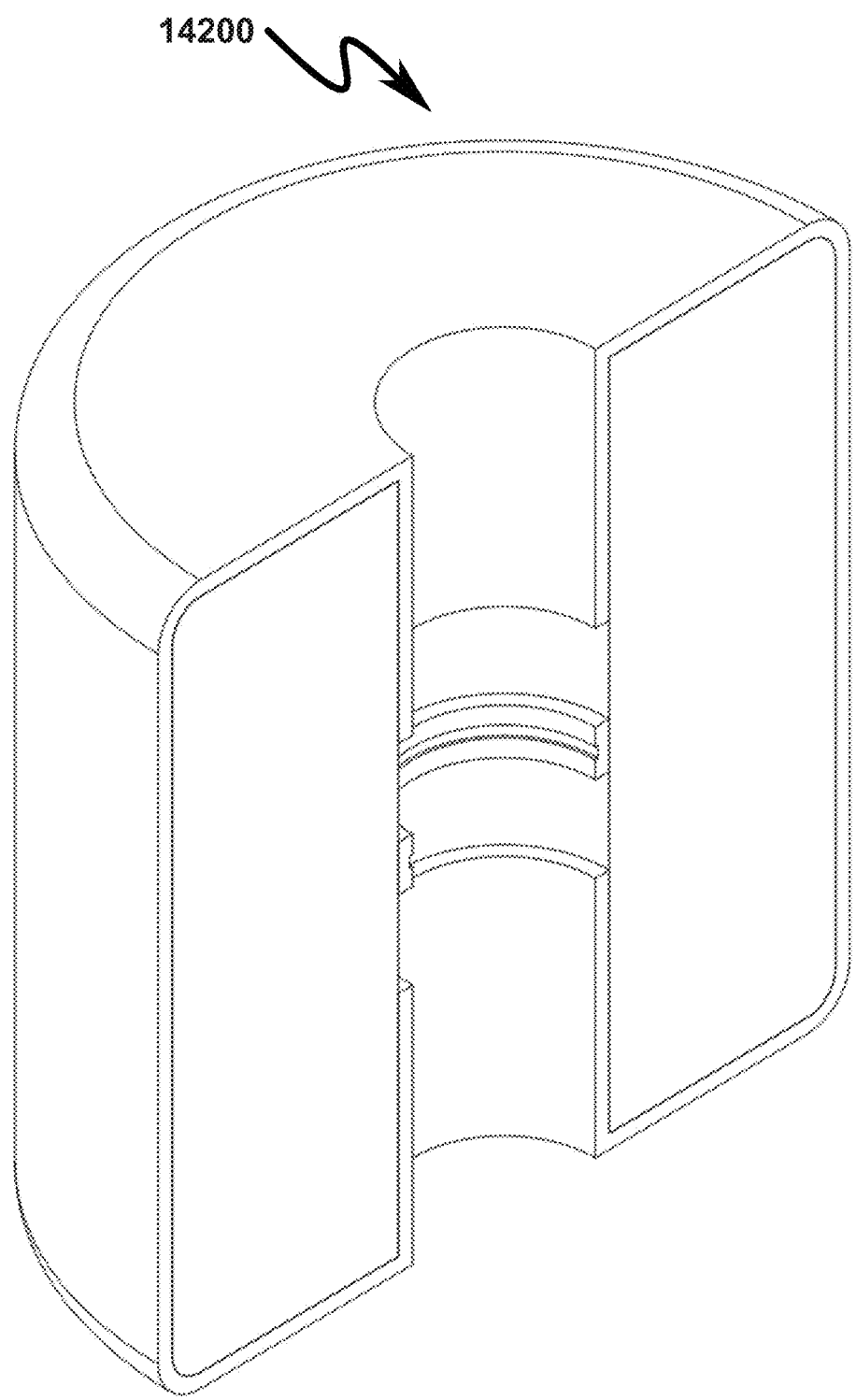
Figure 143:
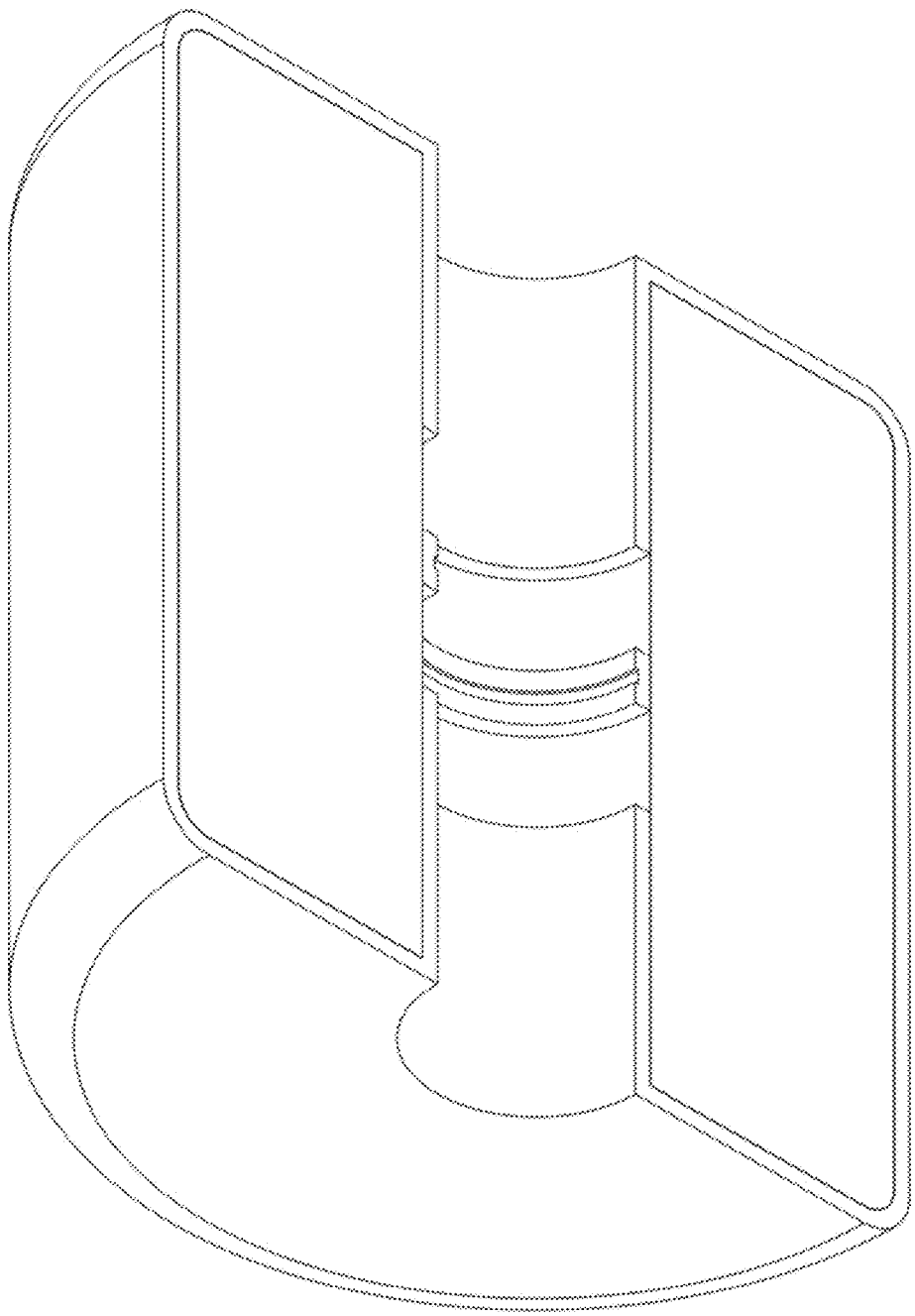
Figure 144:
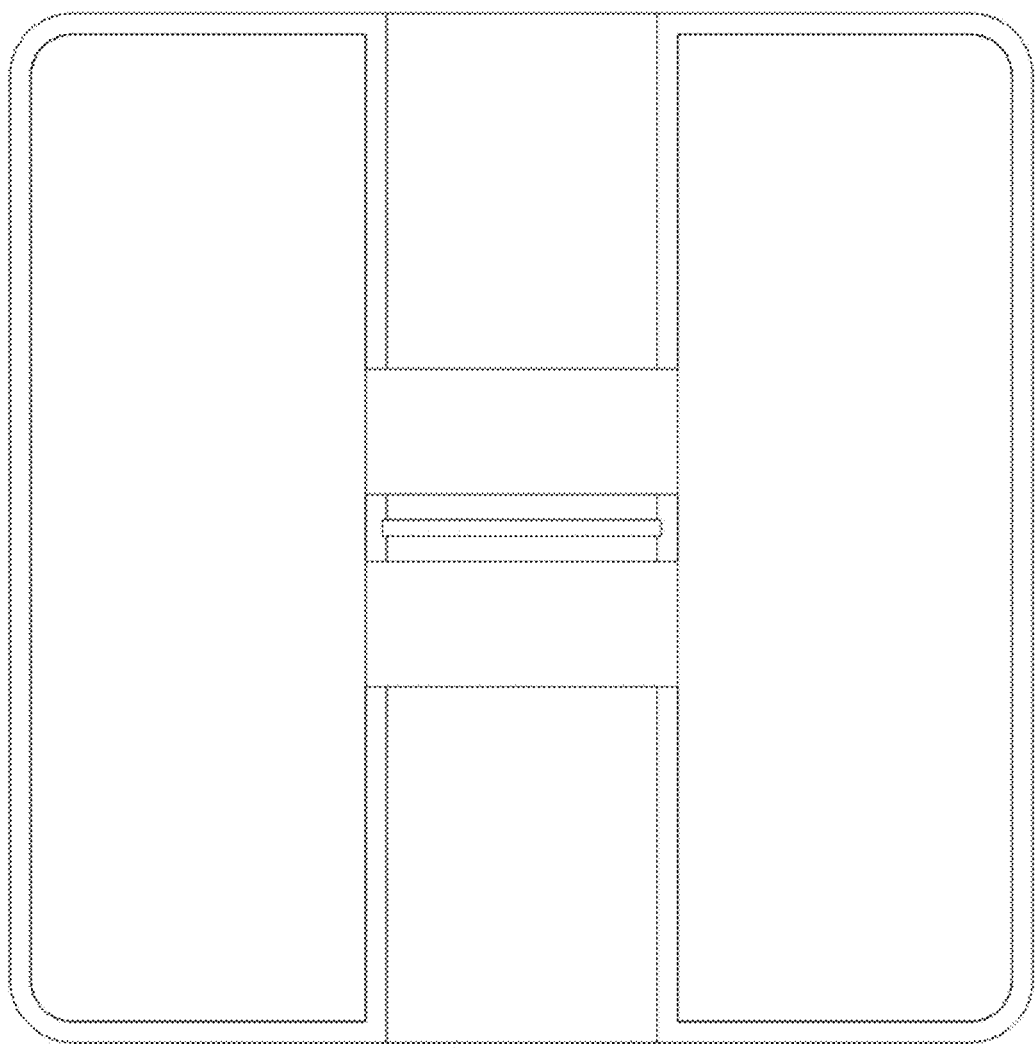
Figure 145:
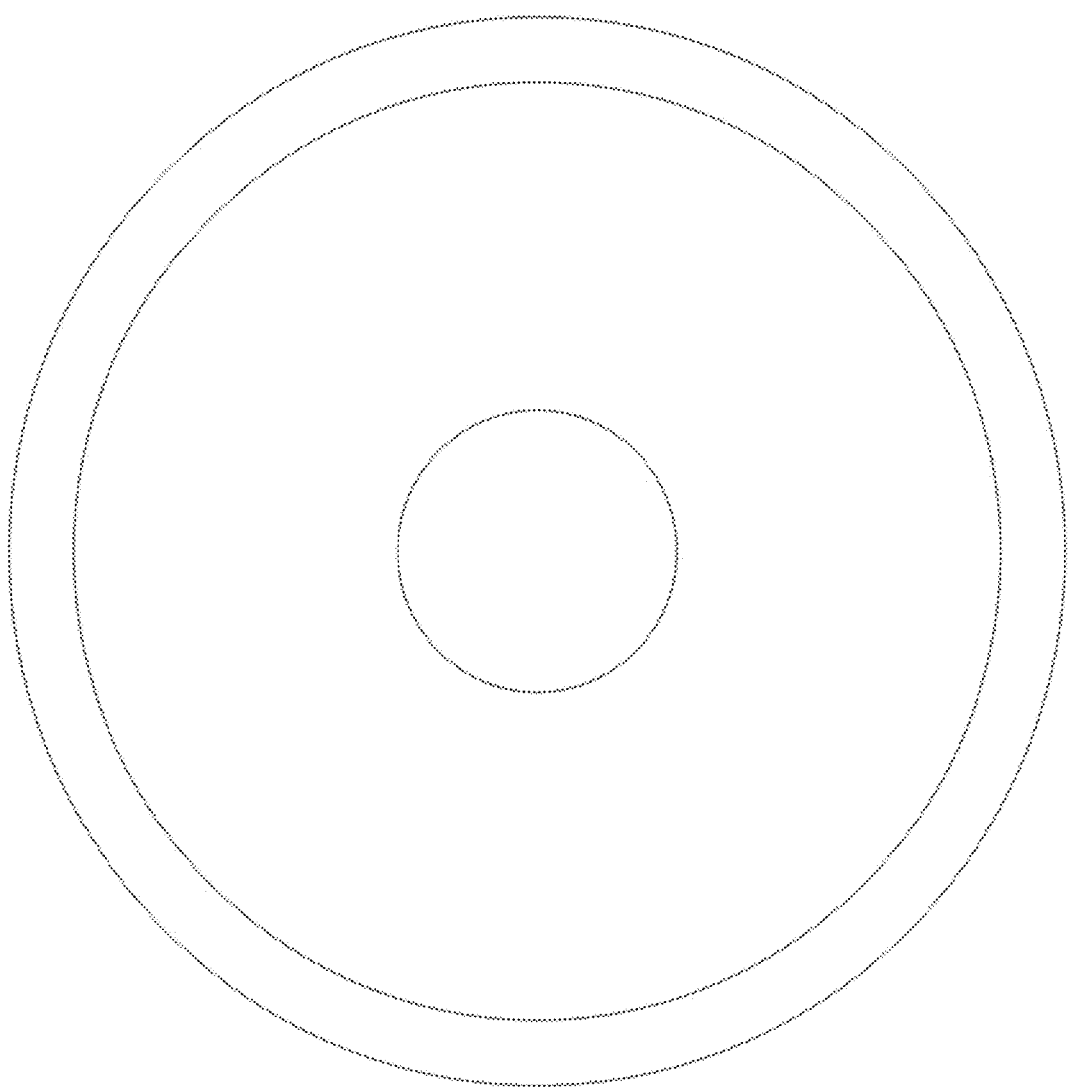
Figure 146:
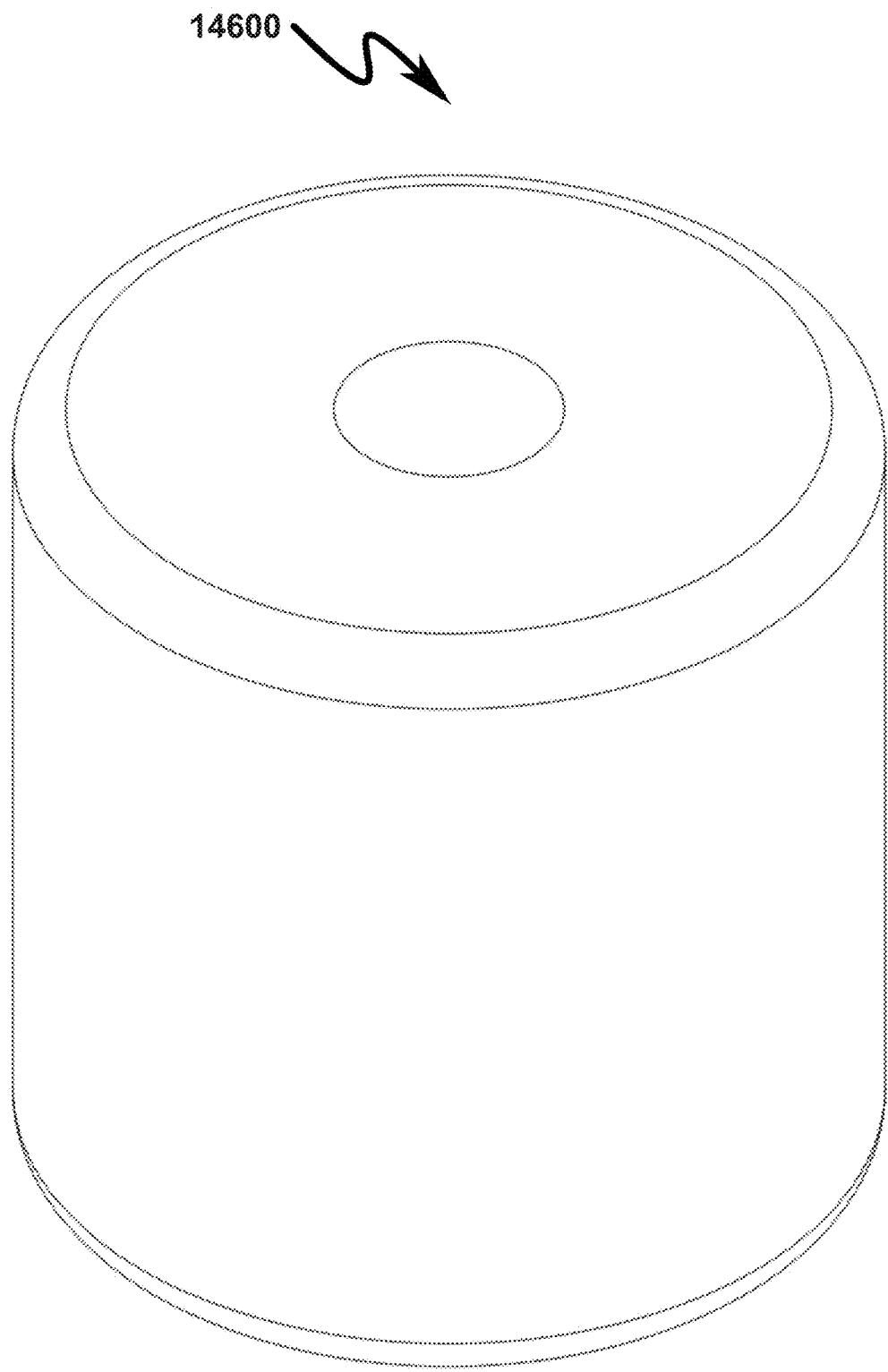
Figure 147:
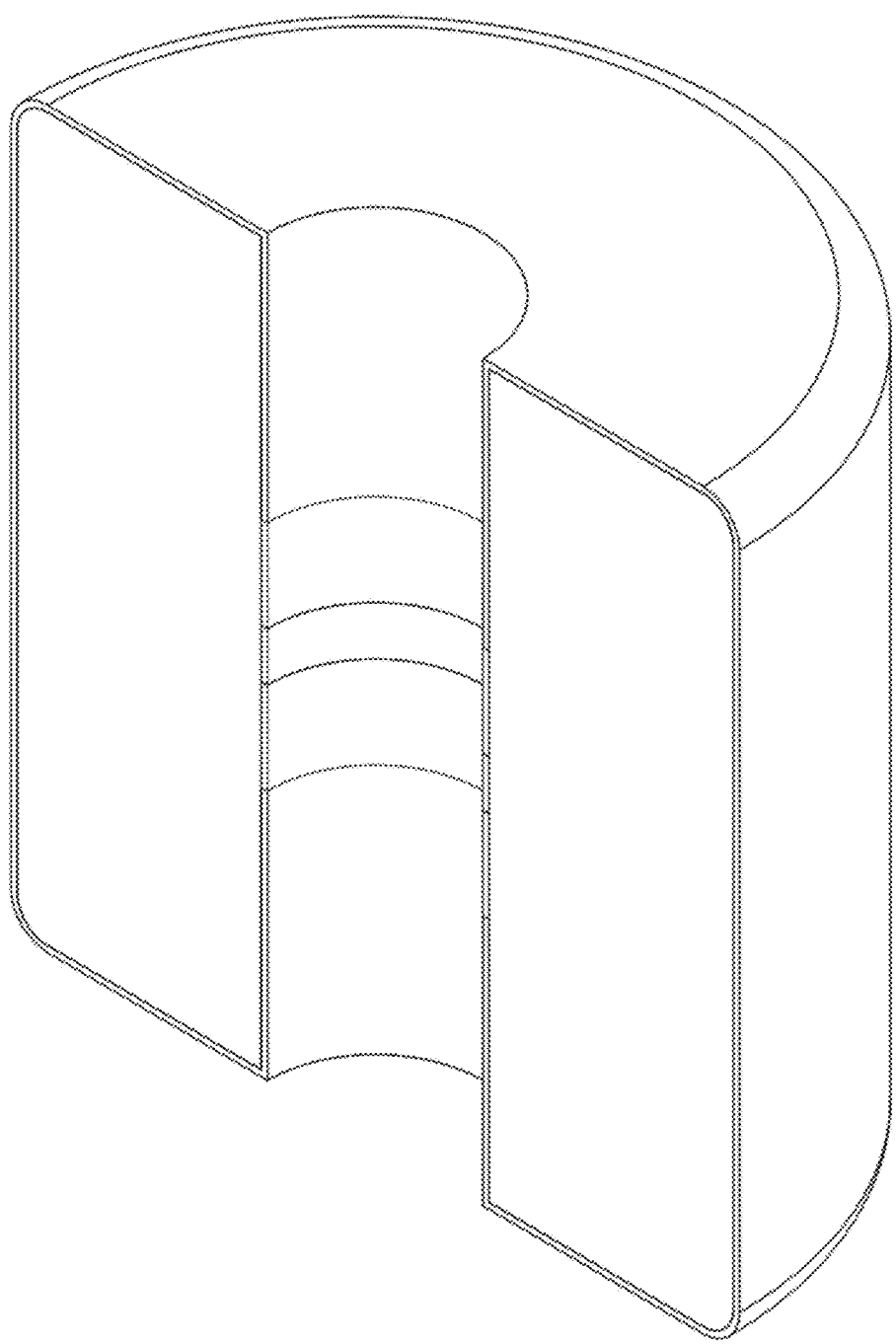
Figure 148:
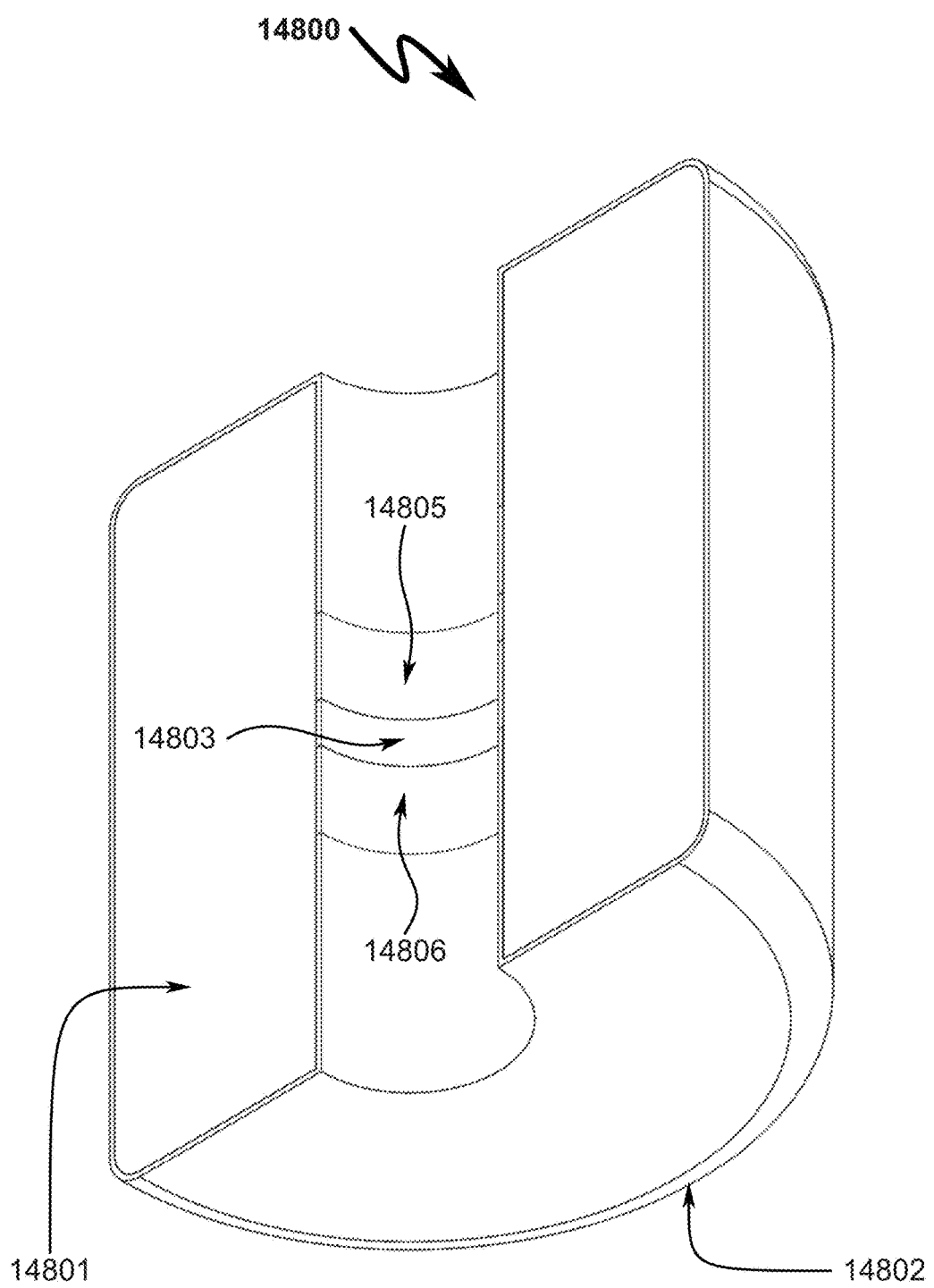
Figure 149:
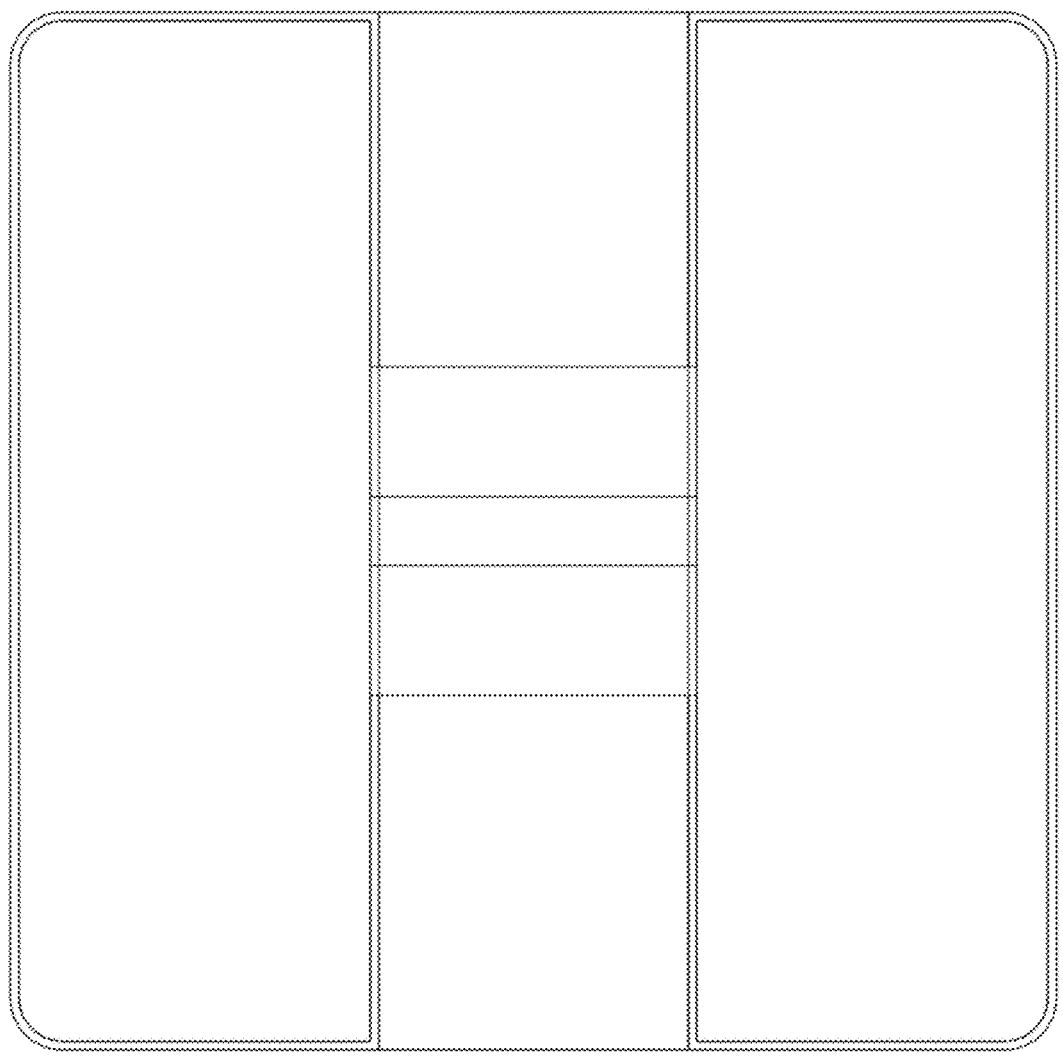
Figure 150:
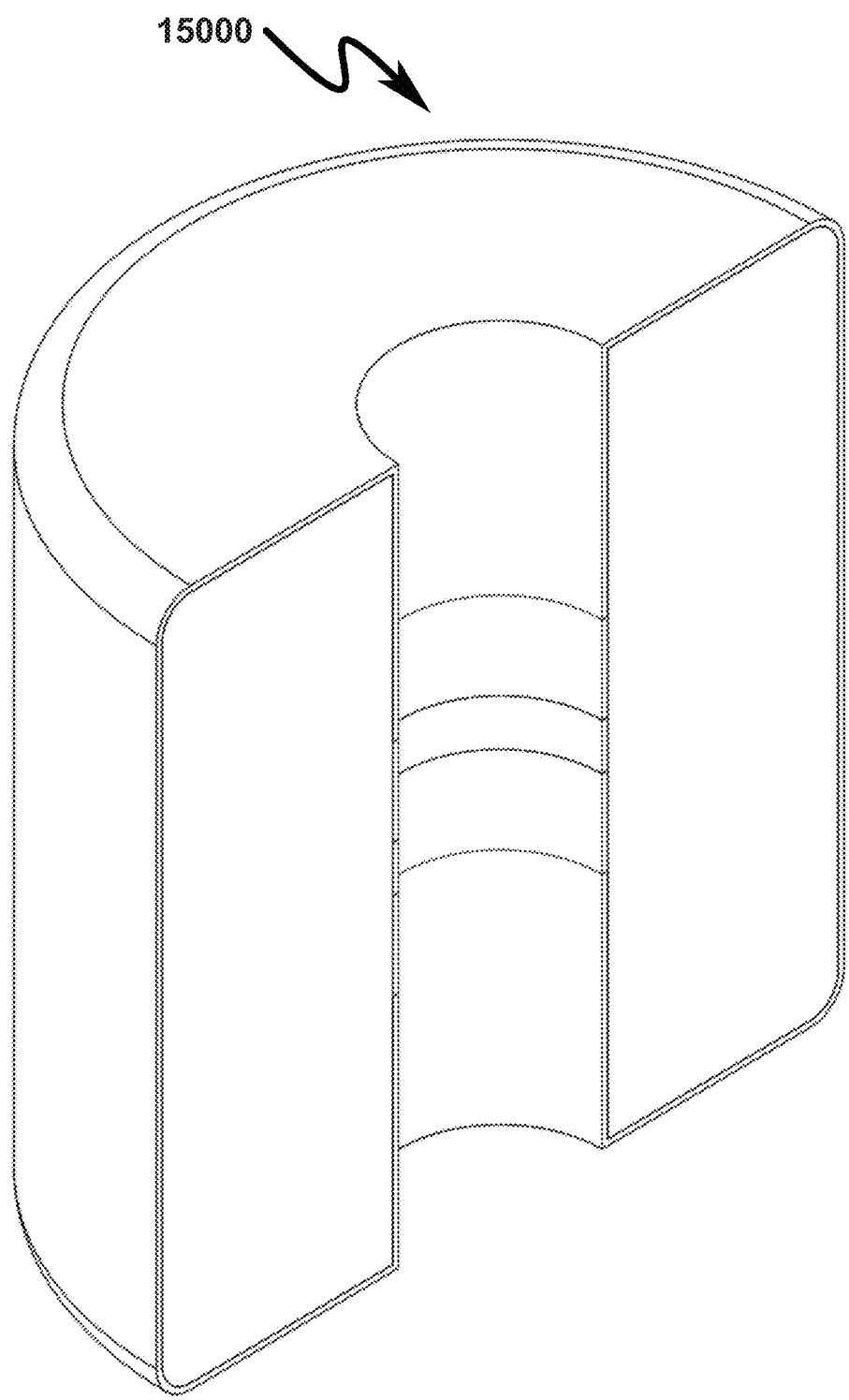
Figure 151:
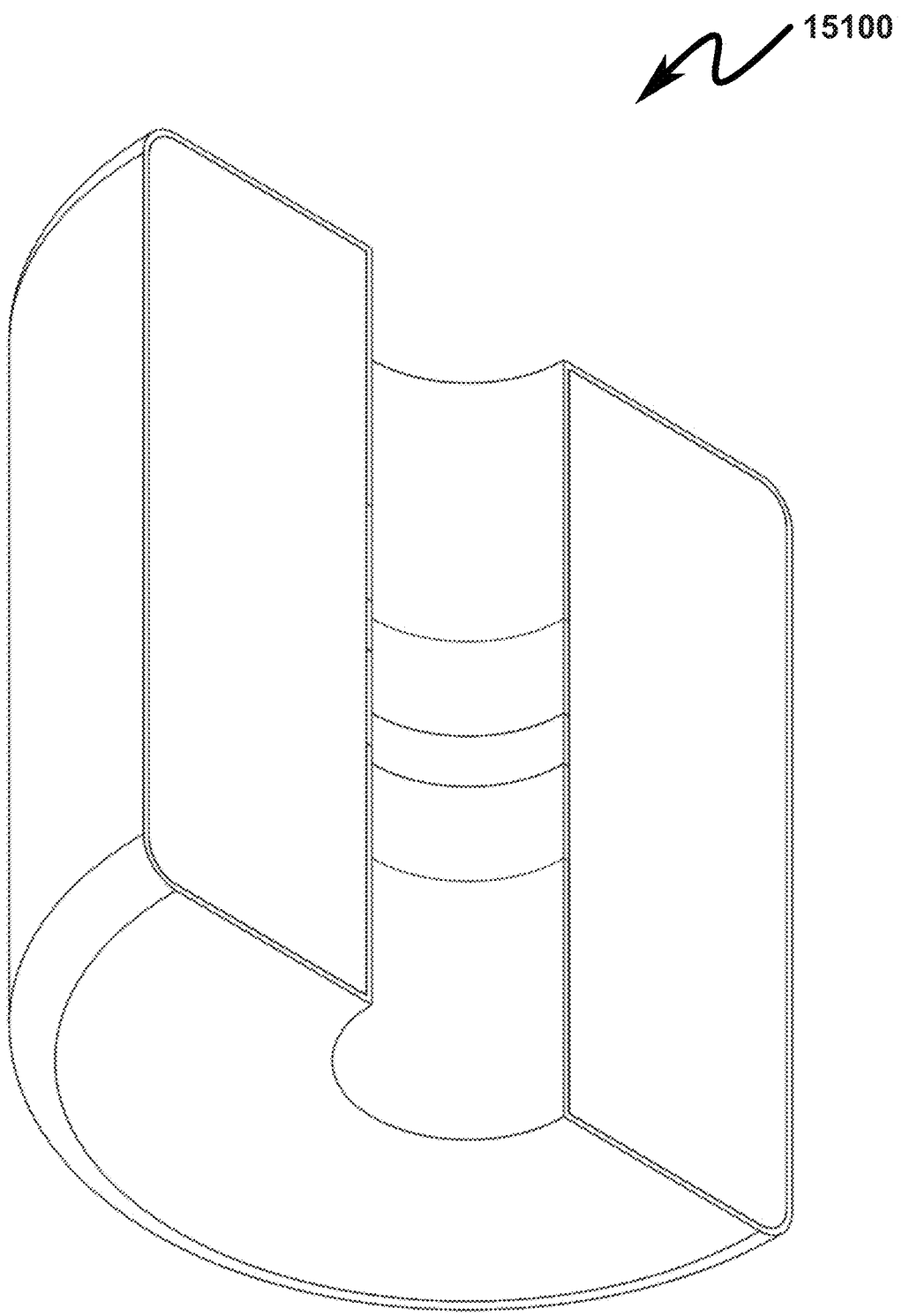
Figure 152:
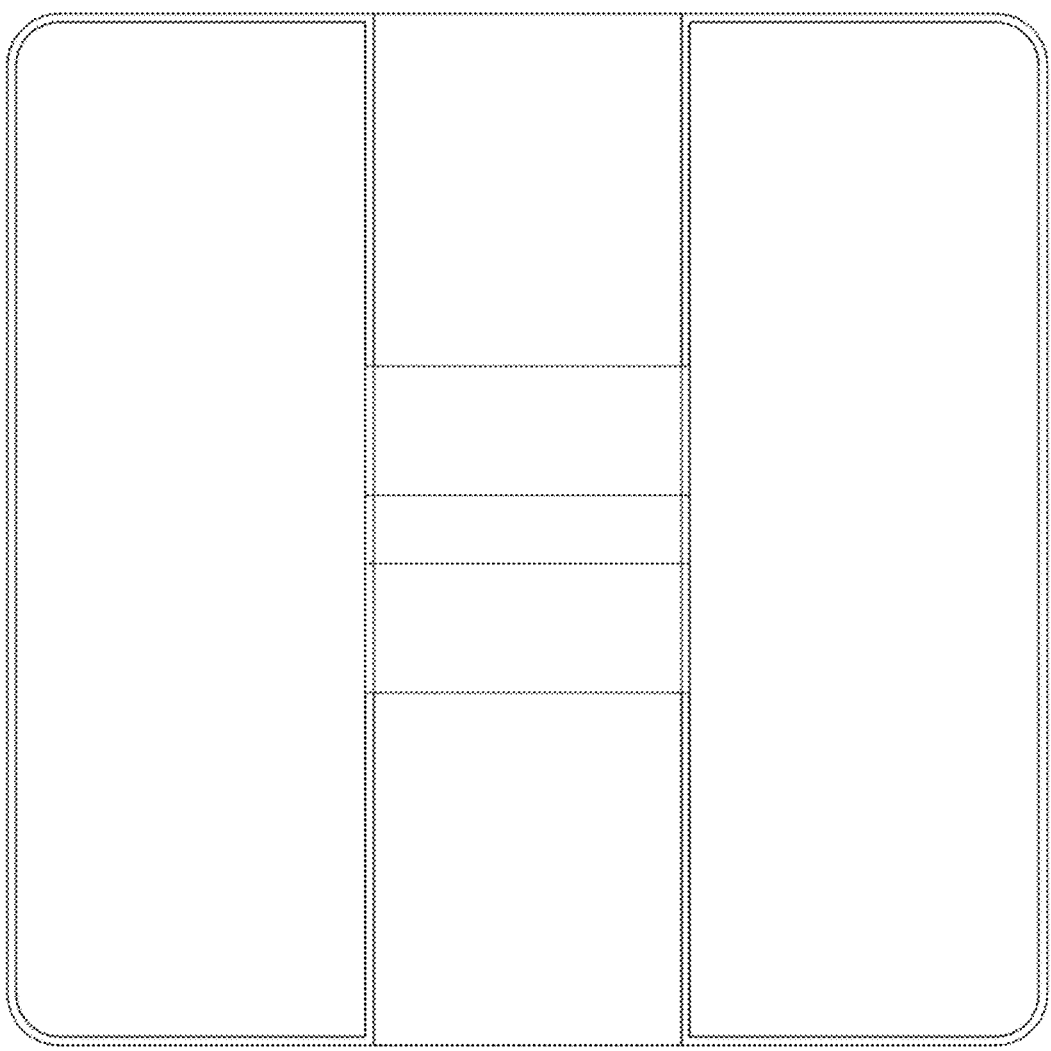
Figure 153:
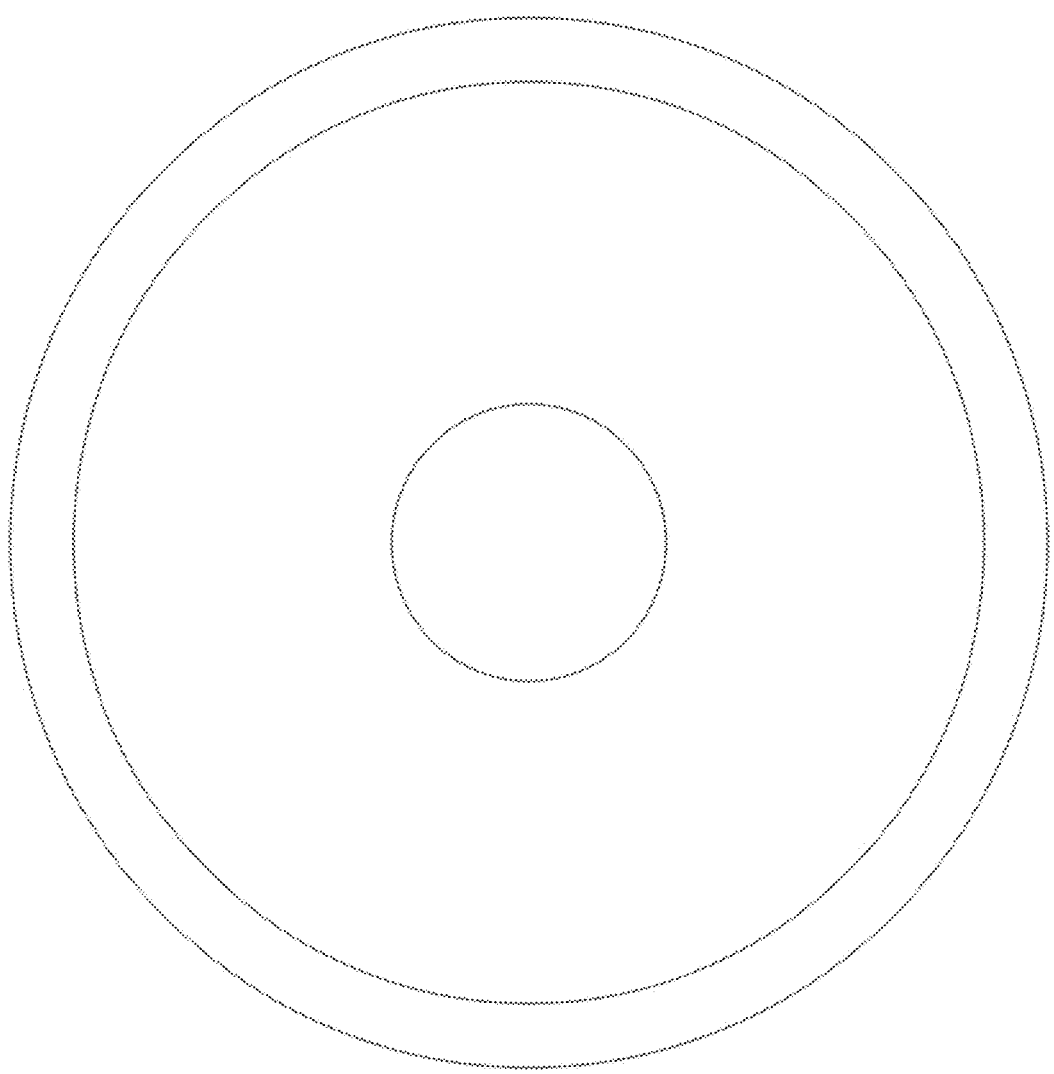
Figure 154:
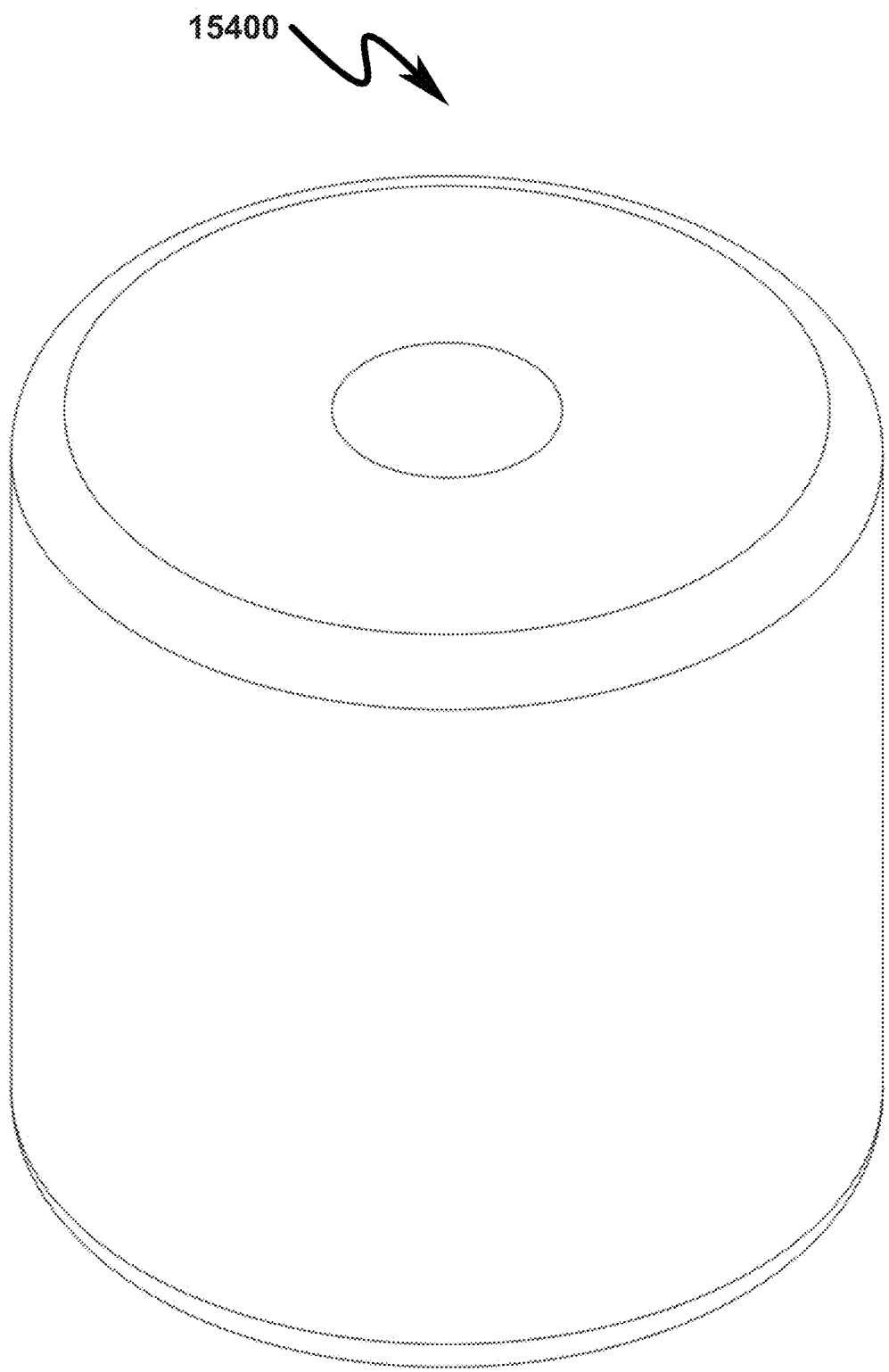
Figure 155:
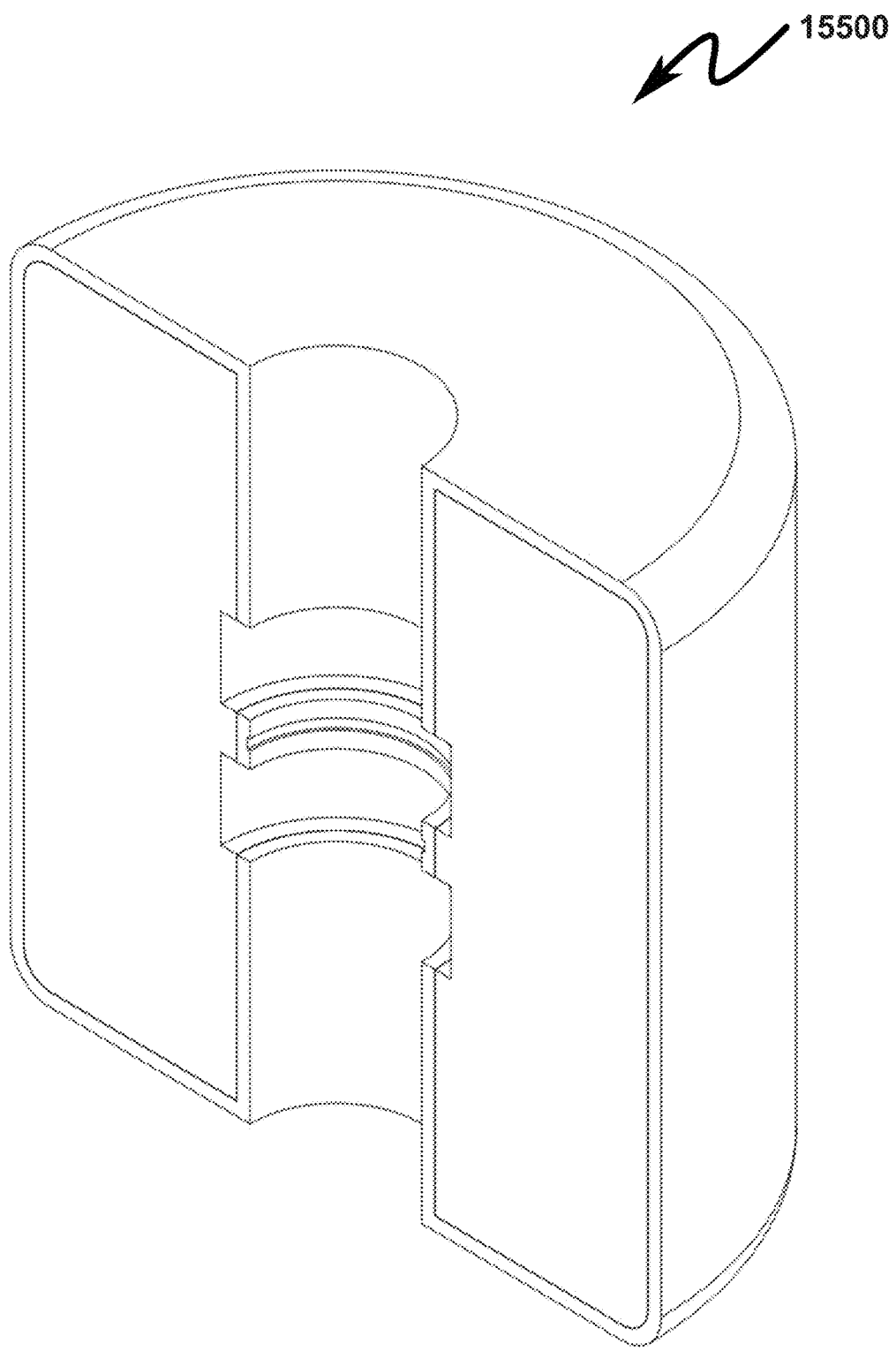
Figure 156:
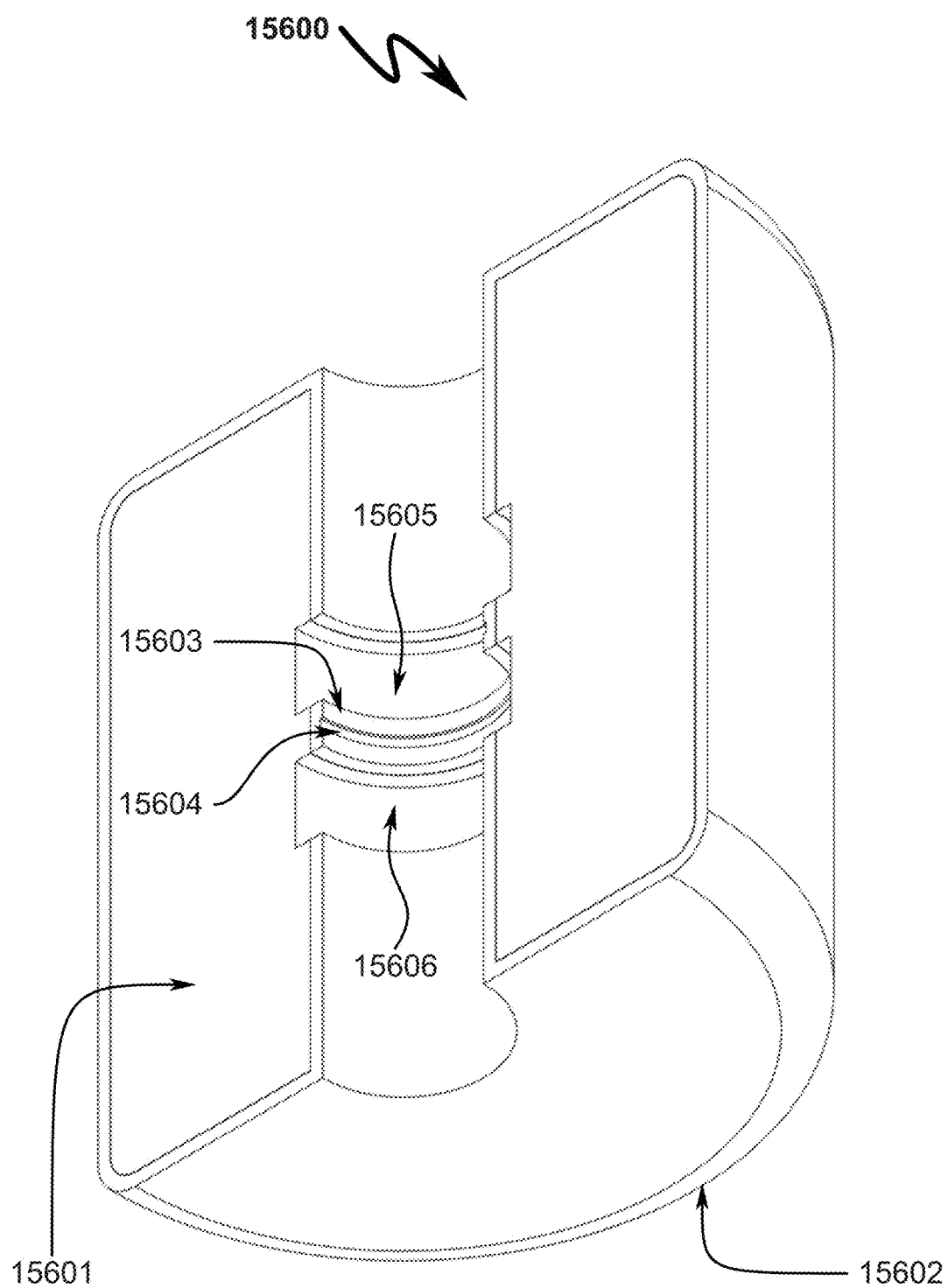
Figure 157:
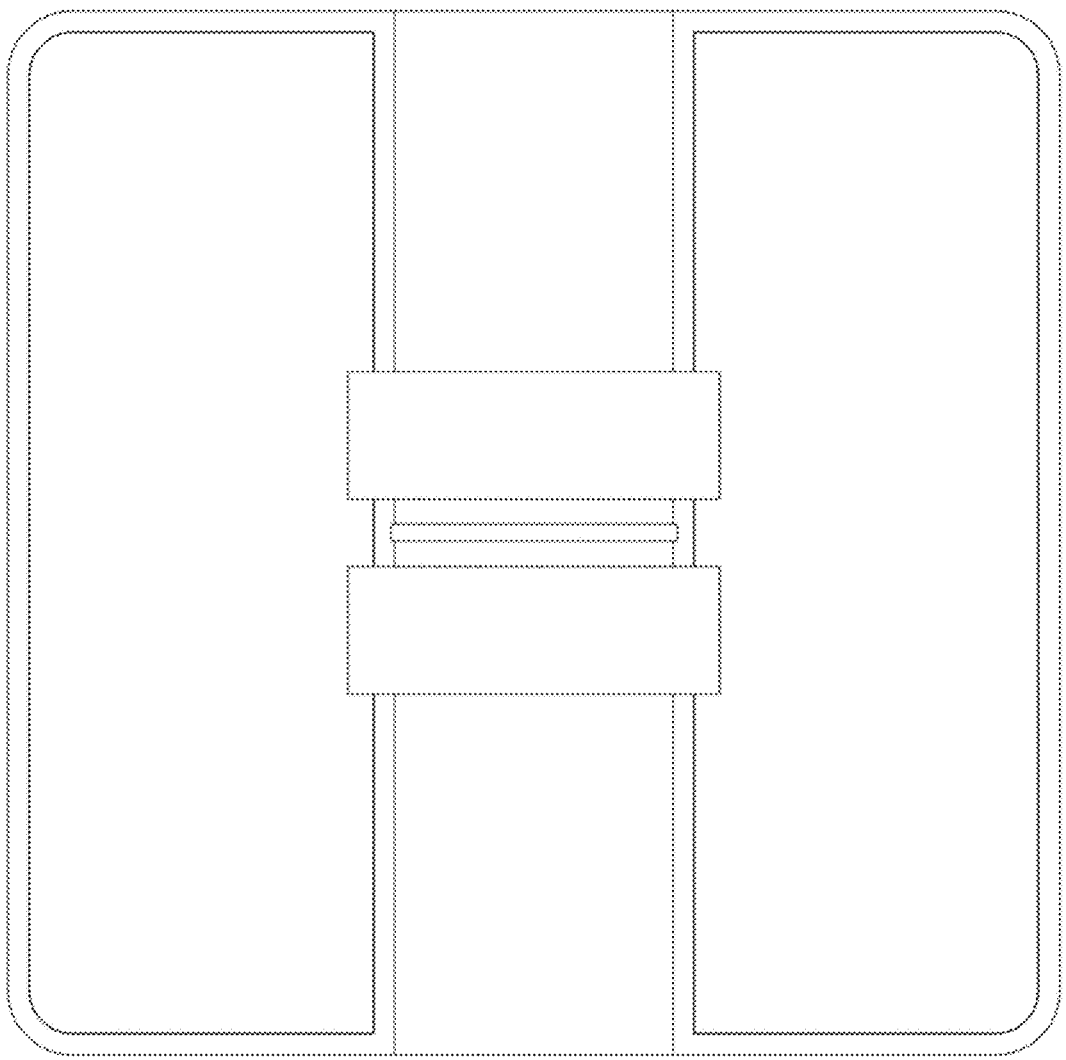
Figure 158:
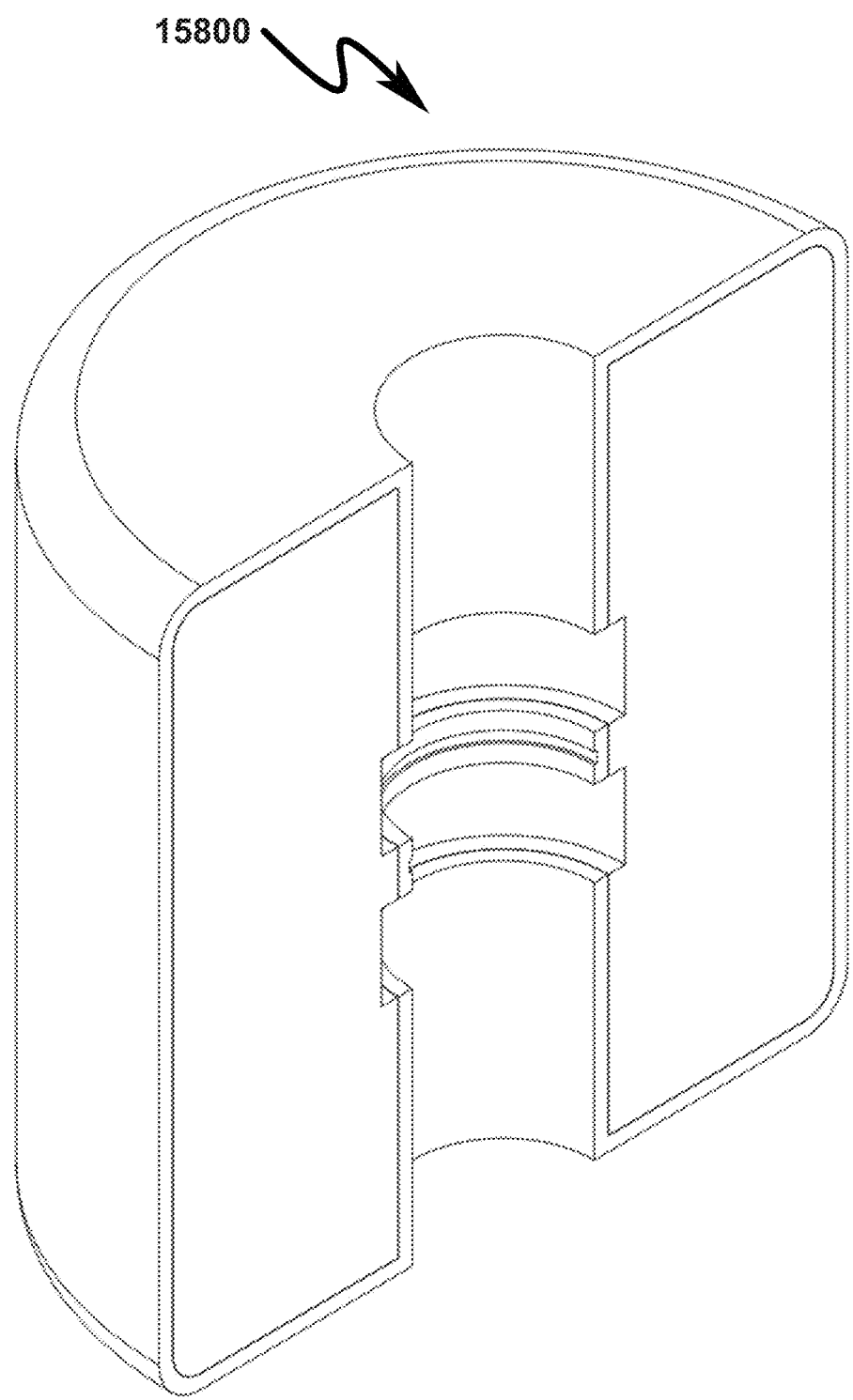
Figure 159:
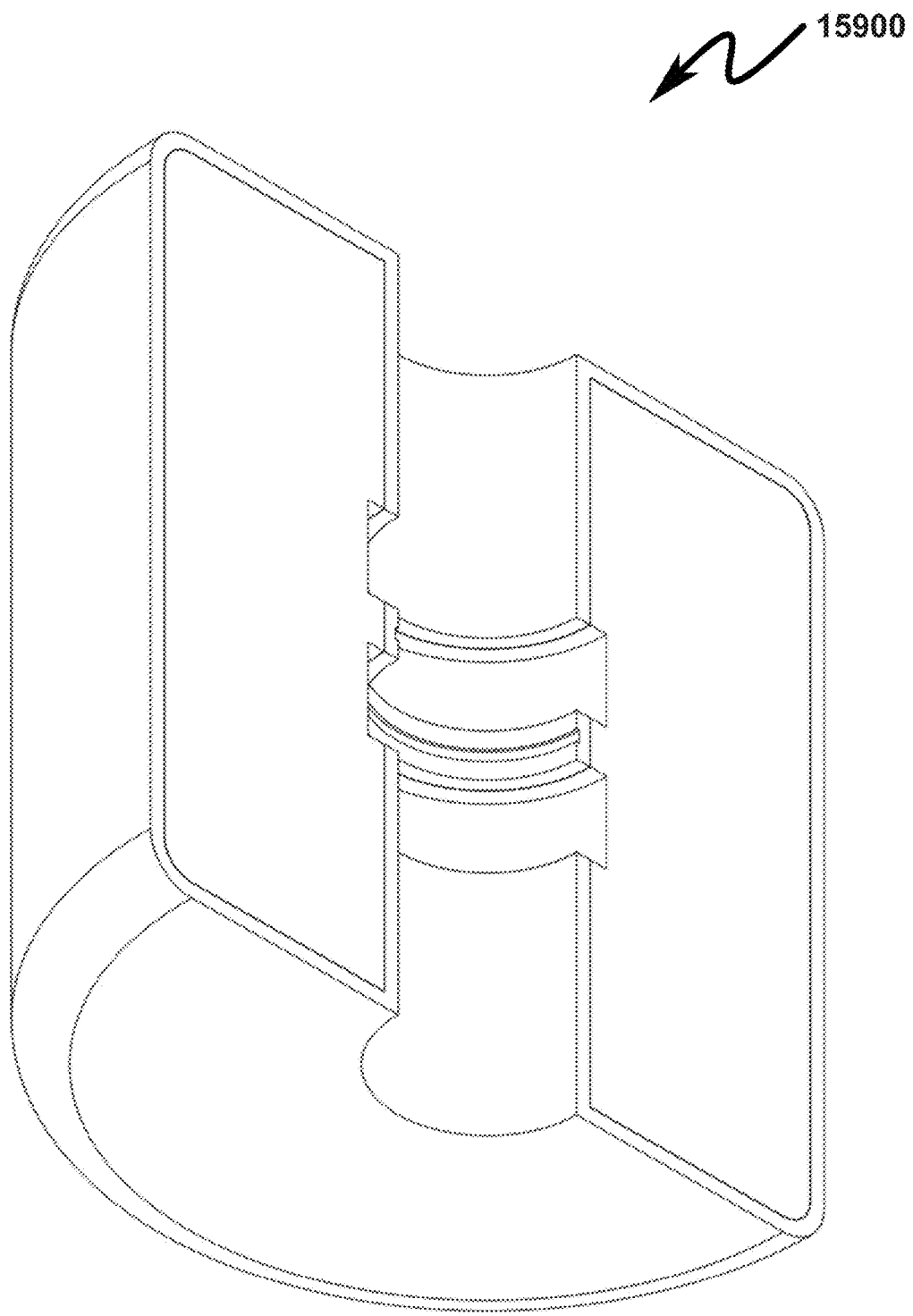
Figure 160:
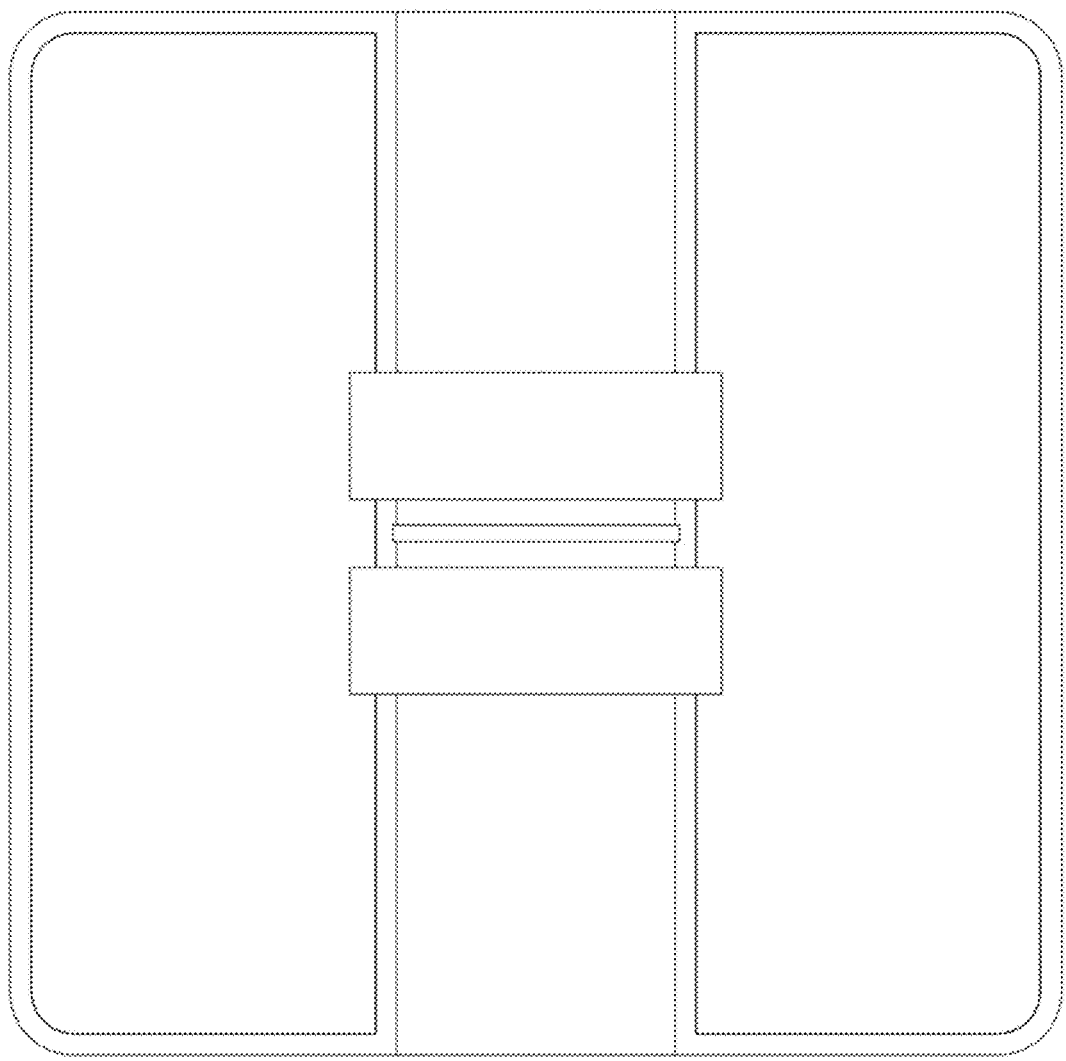
Figure 161:
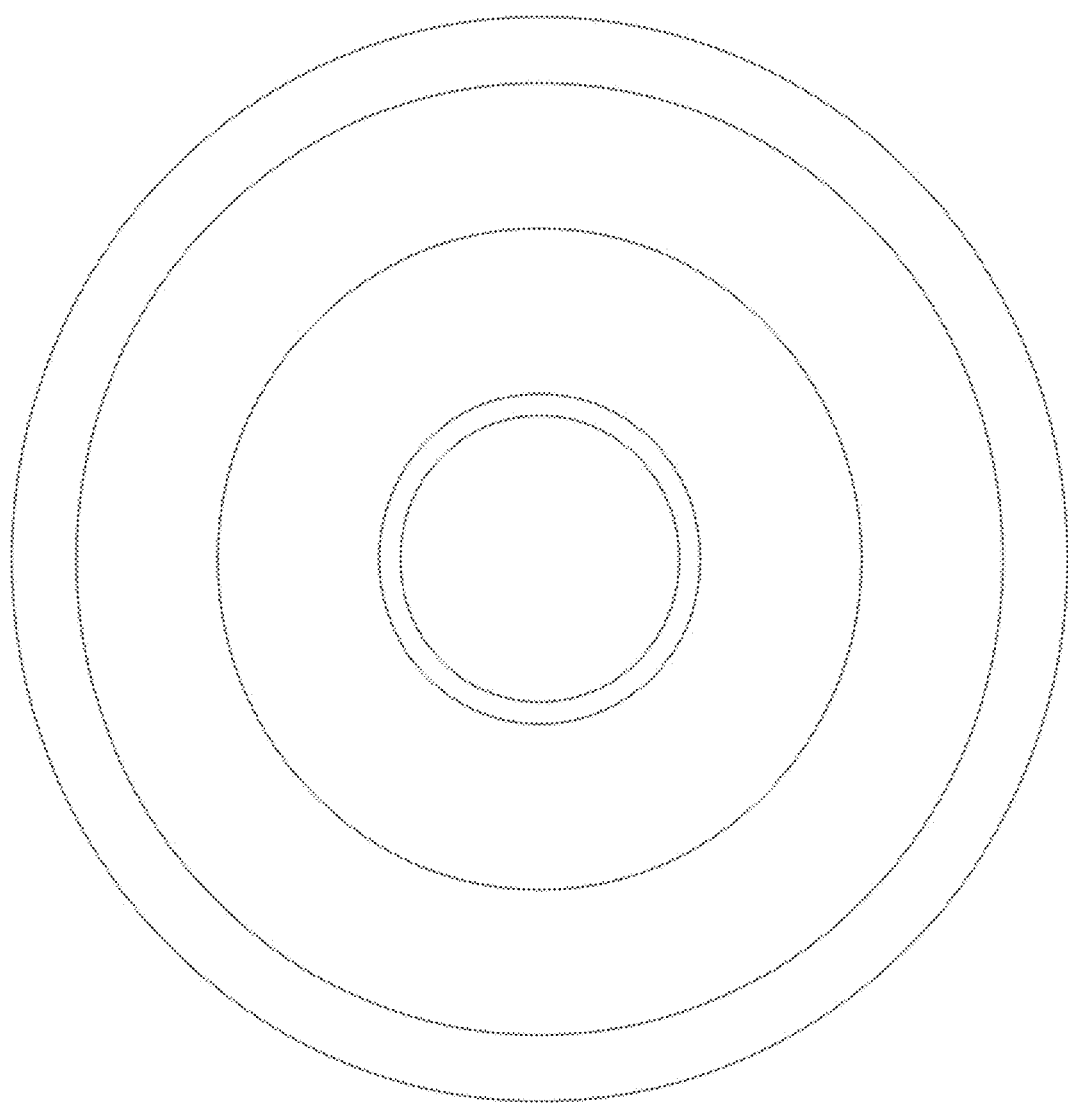
Figure 162:
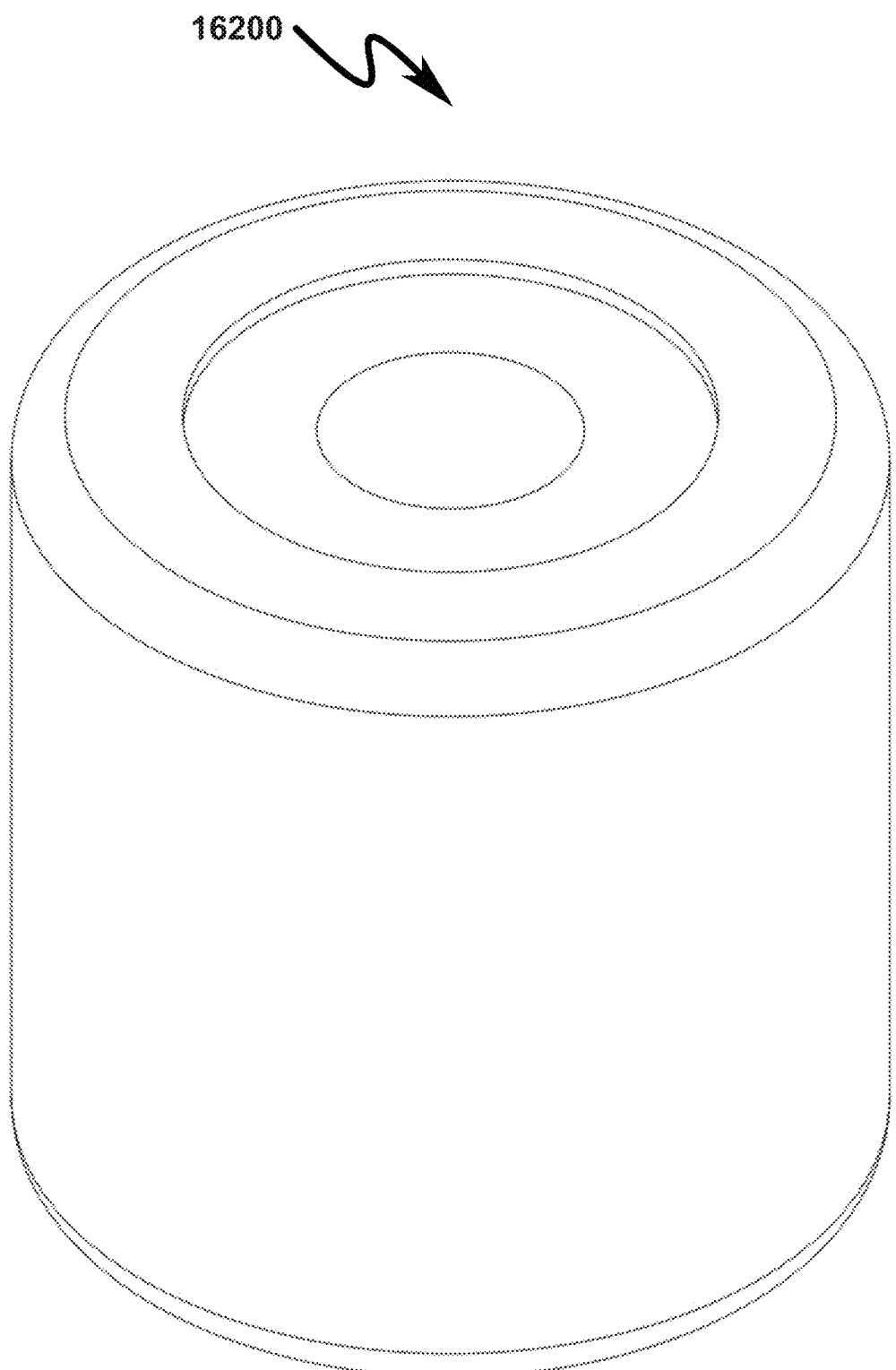
Figure 163:
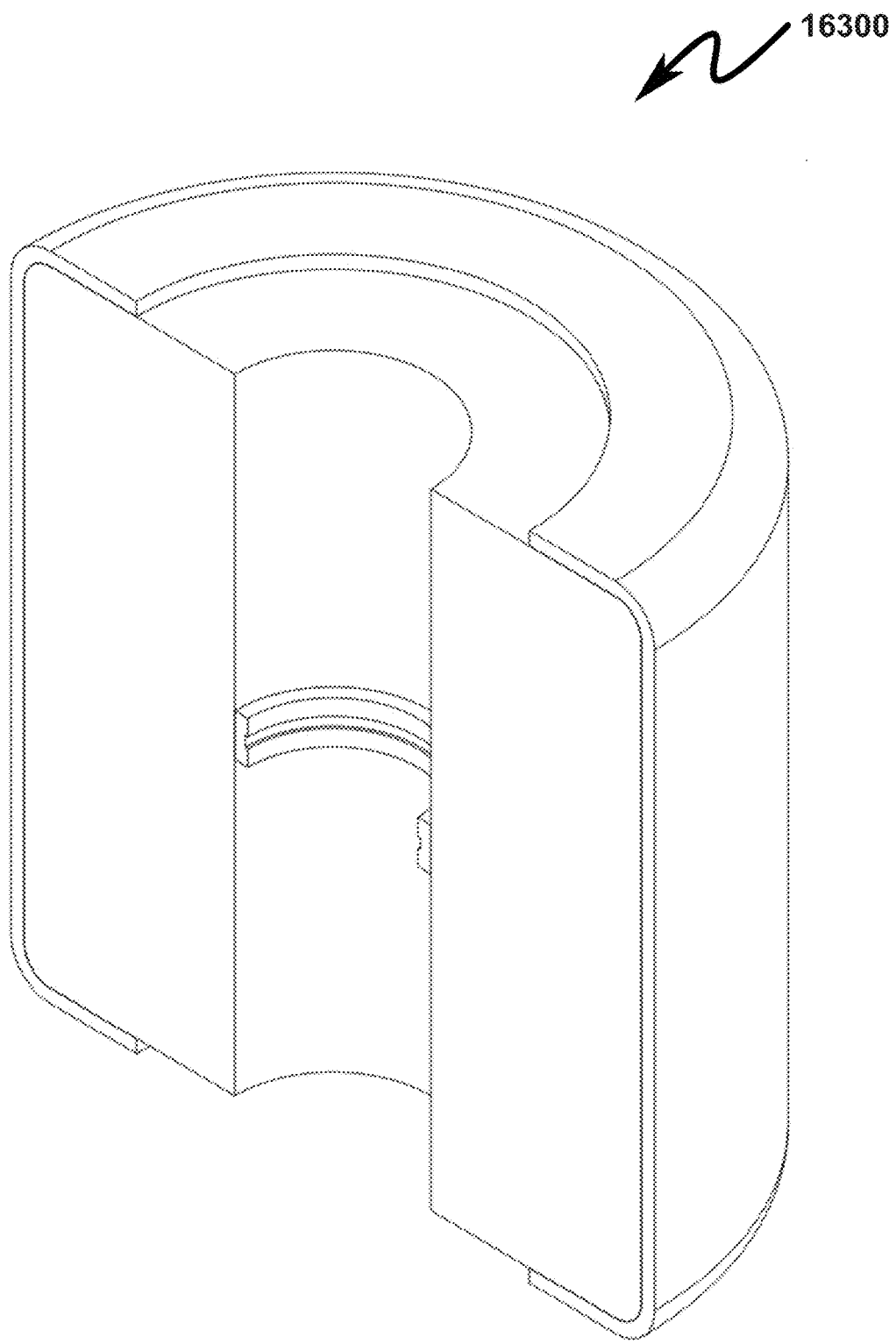
Figure 164:
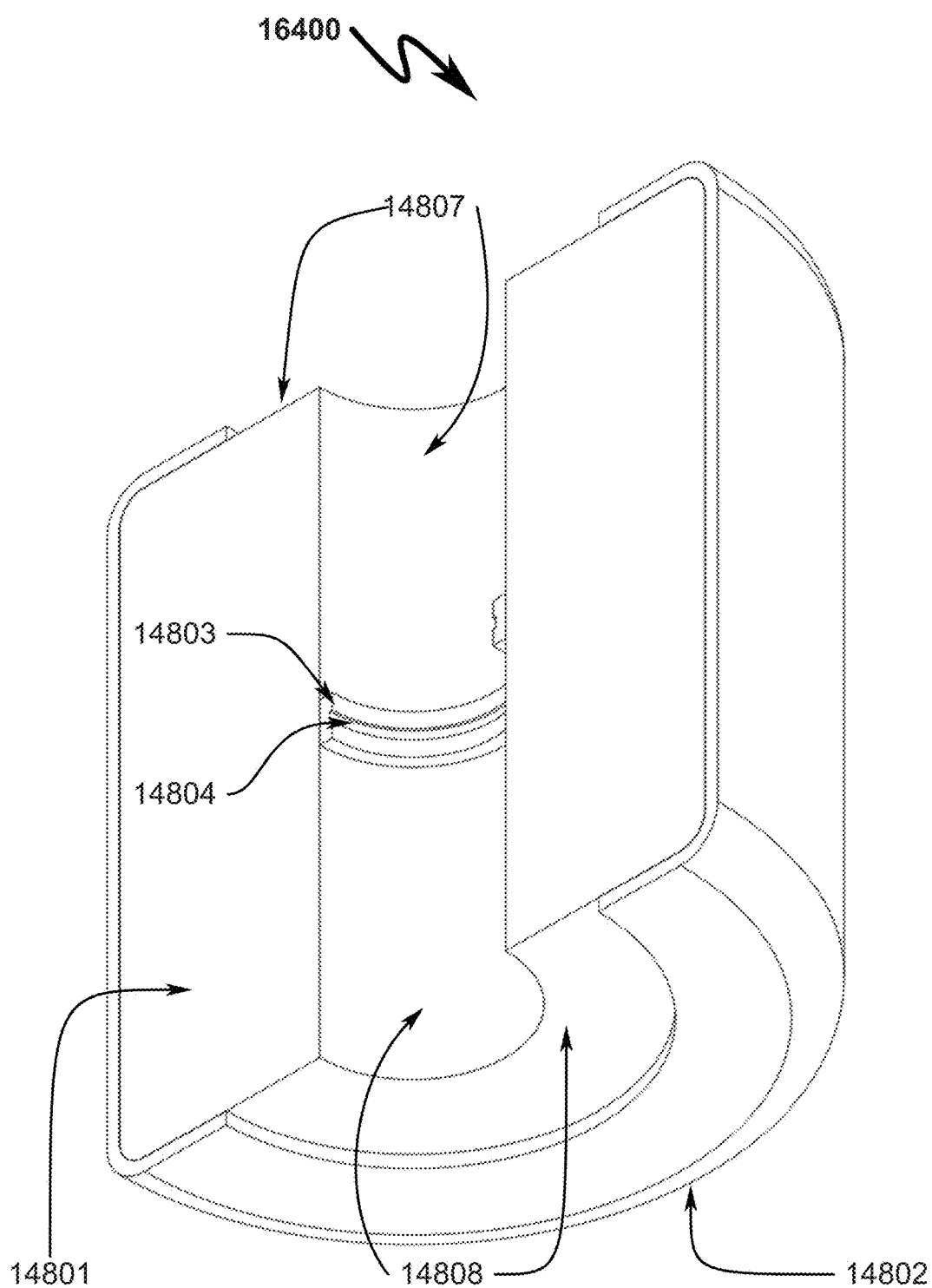
Figure 165:
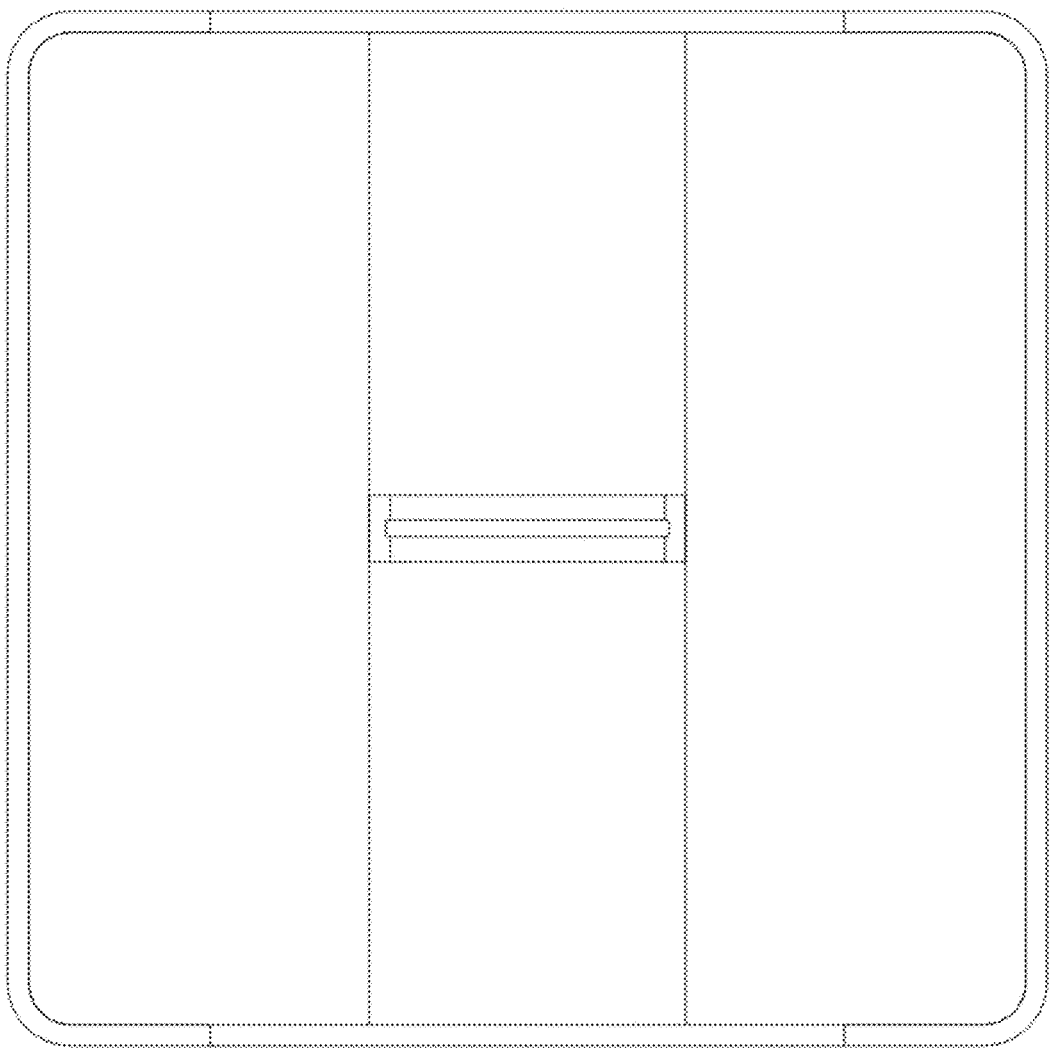
Figure 166:
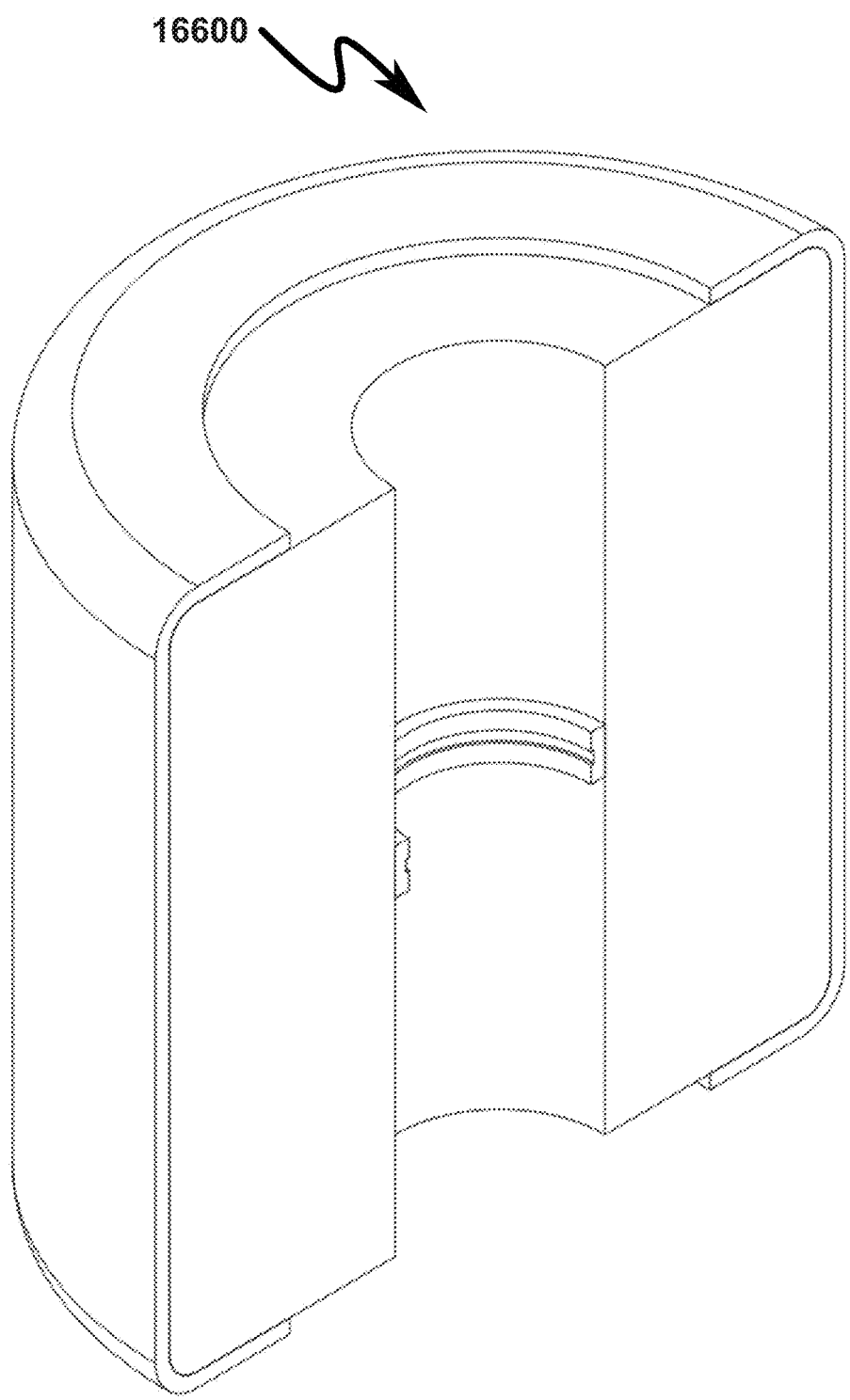
Figure 167:
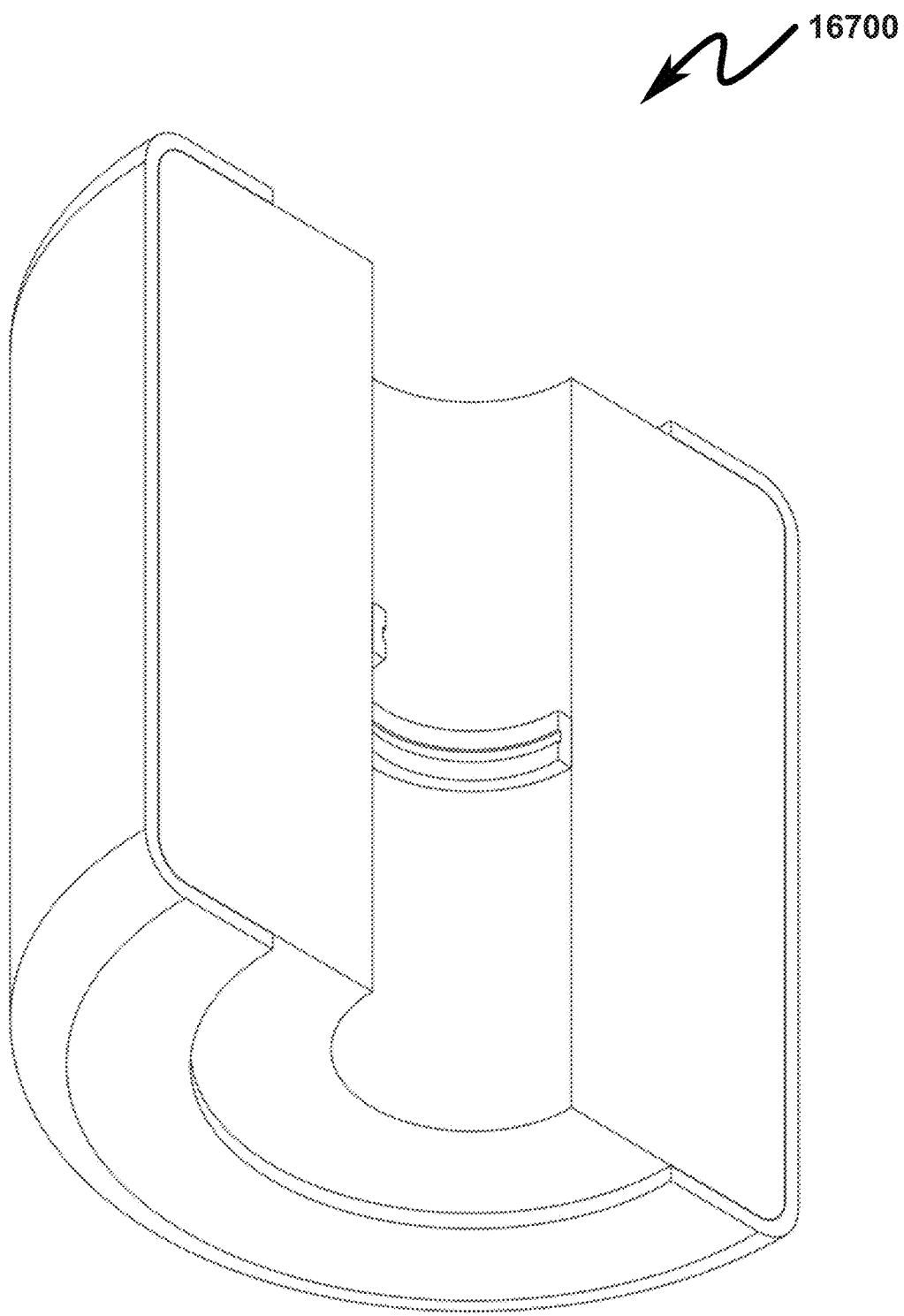
Figure 168:
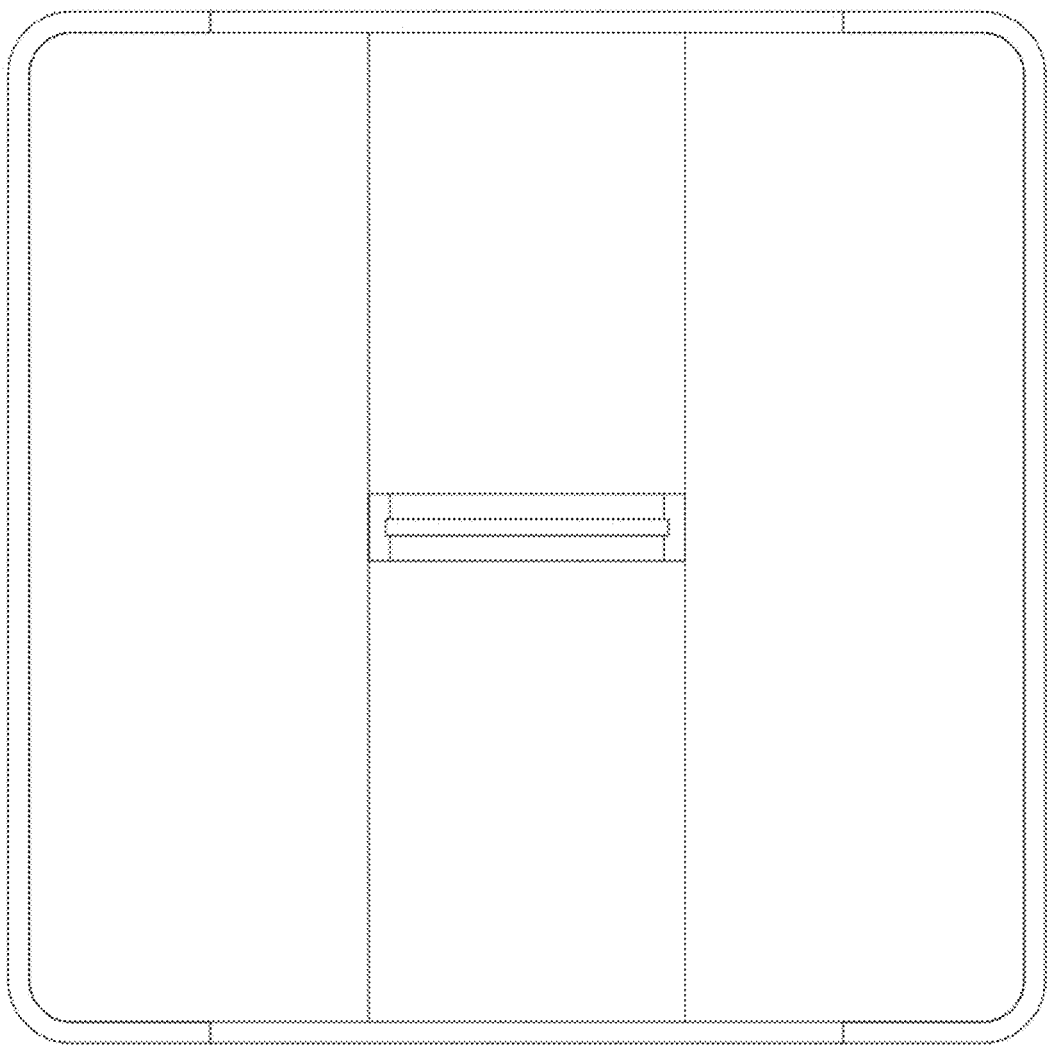
Figure 169:
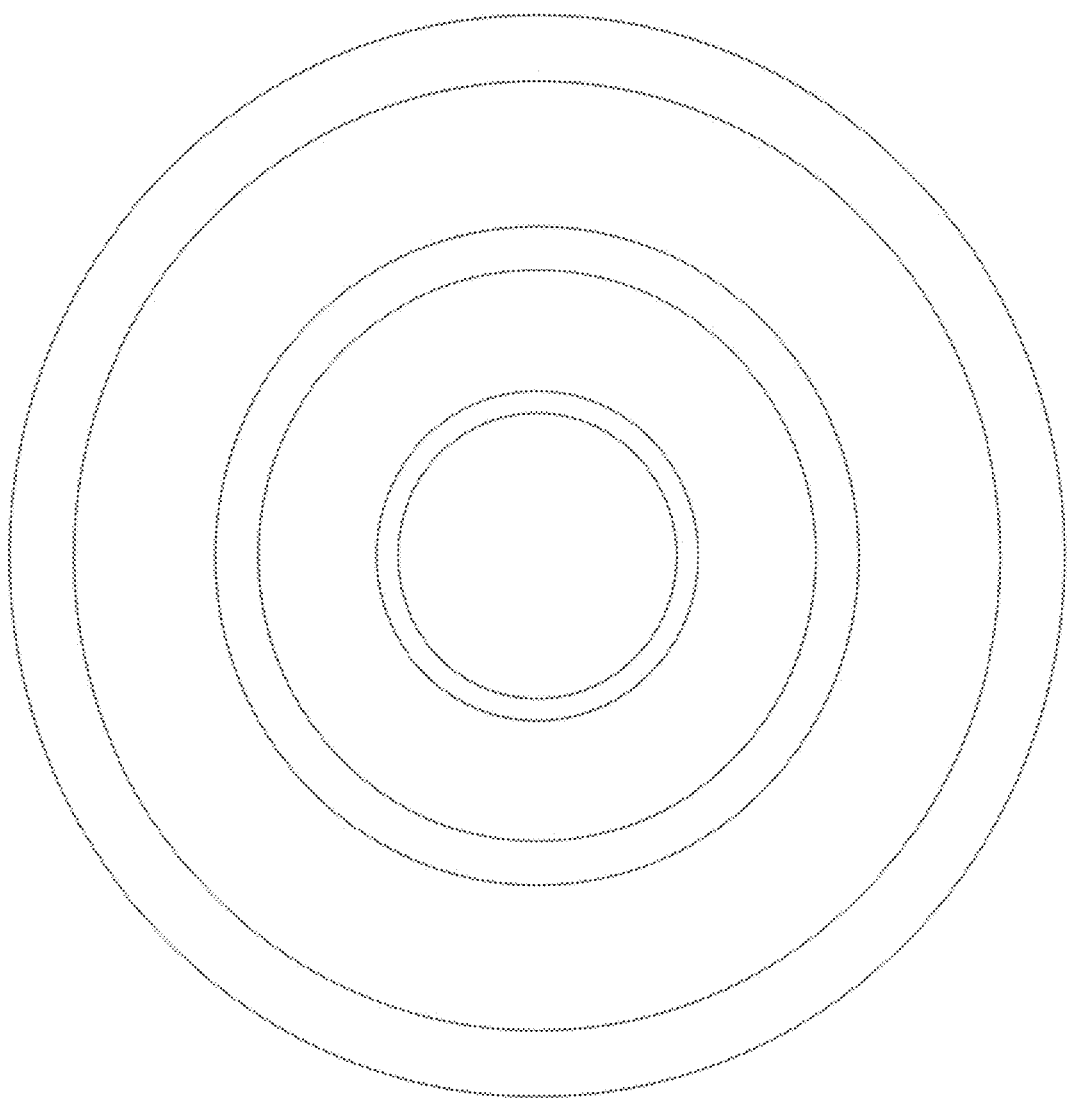
Figure 170:
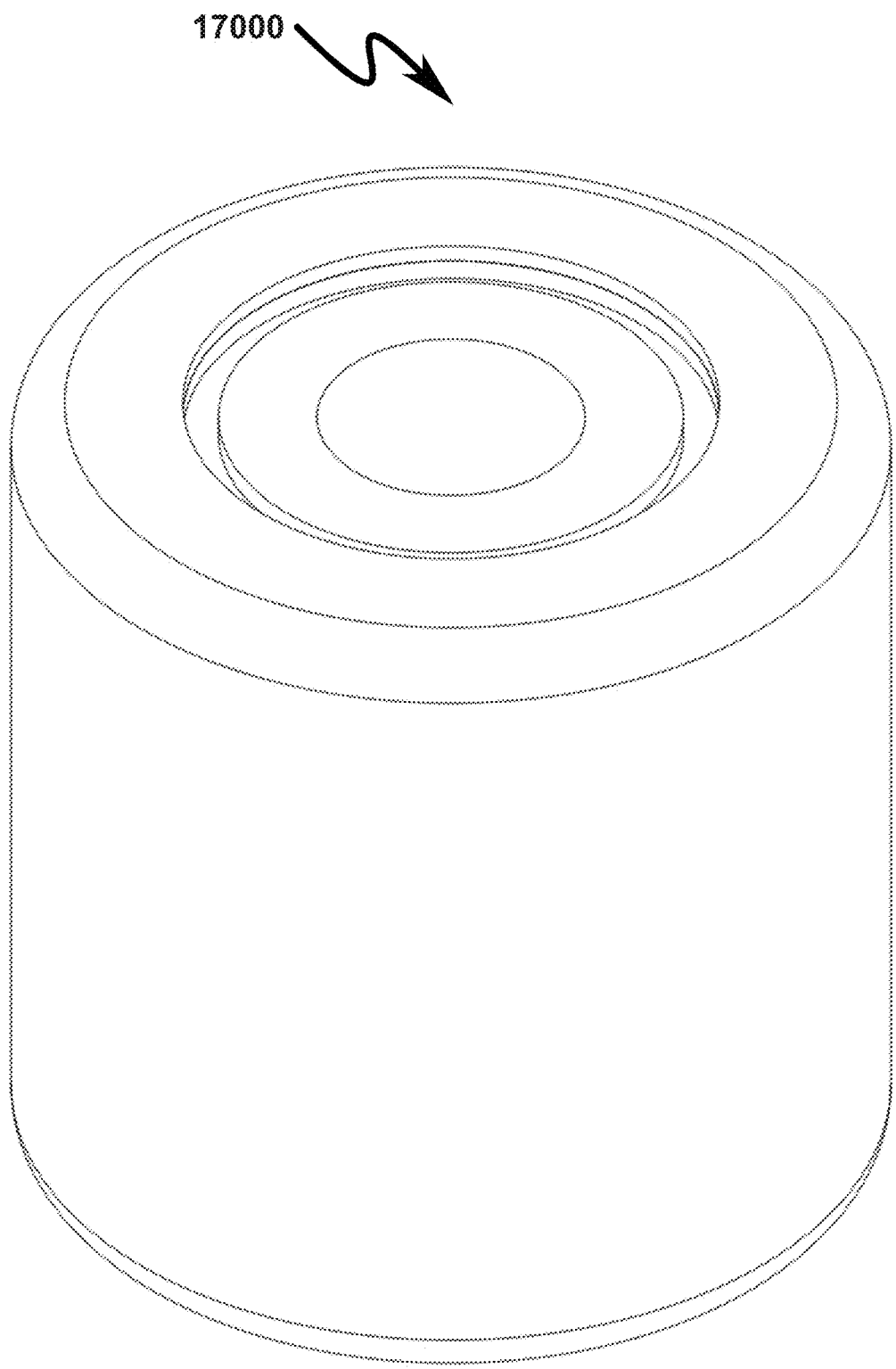
Figure 171:
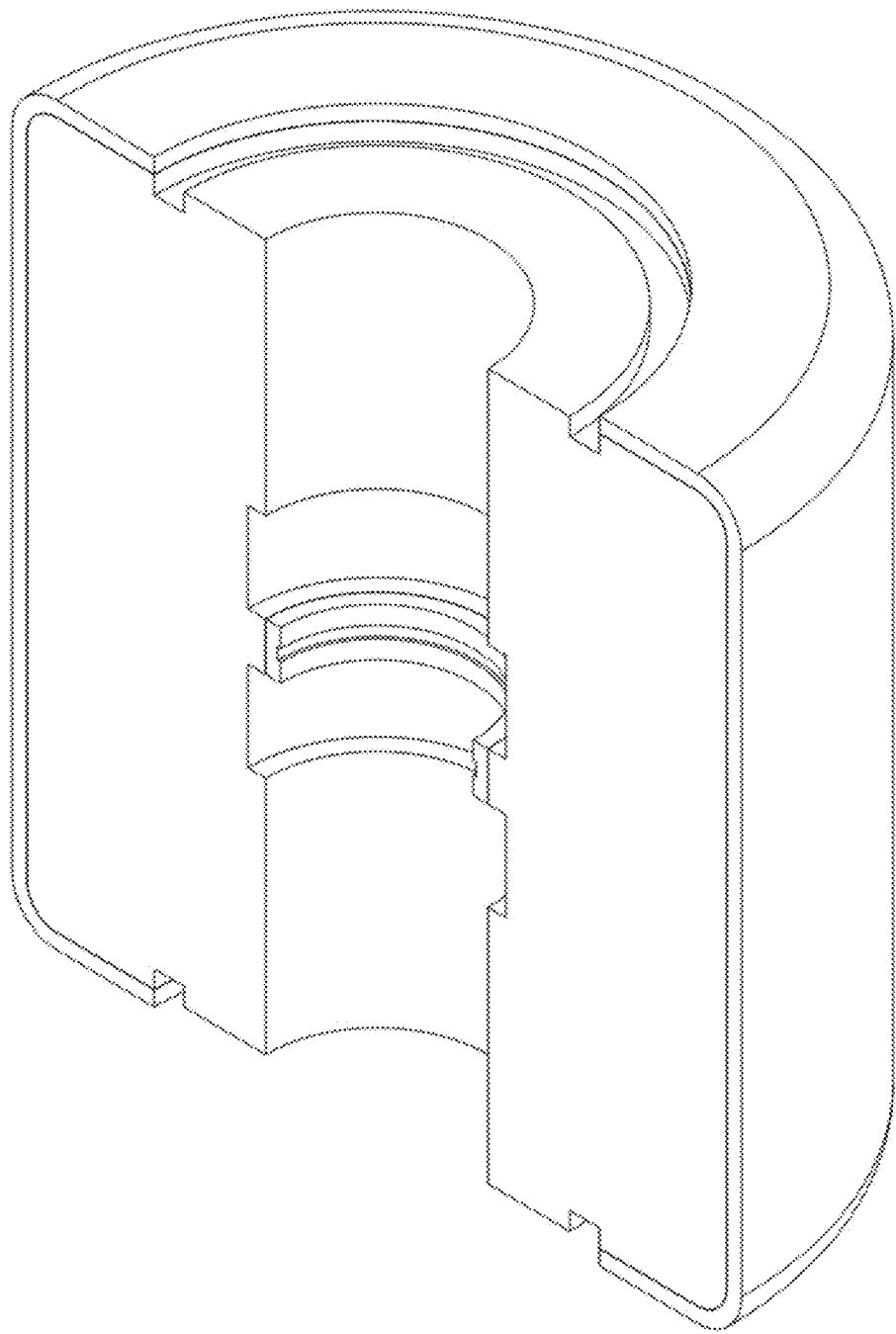
Figure 172:
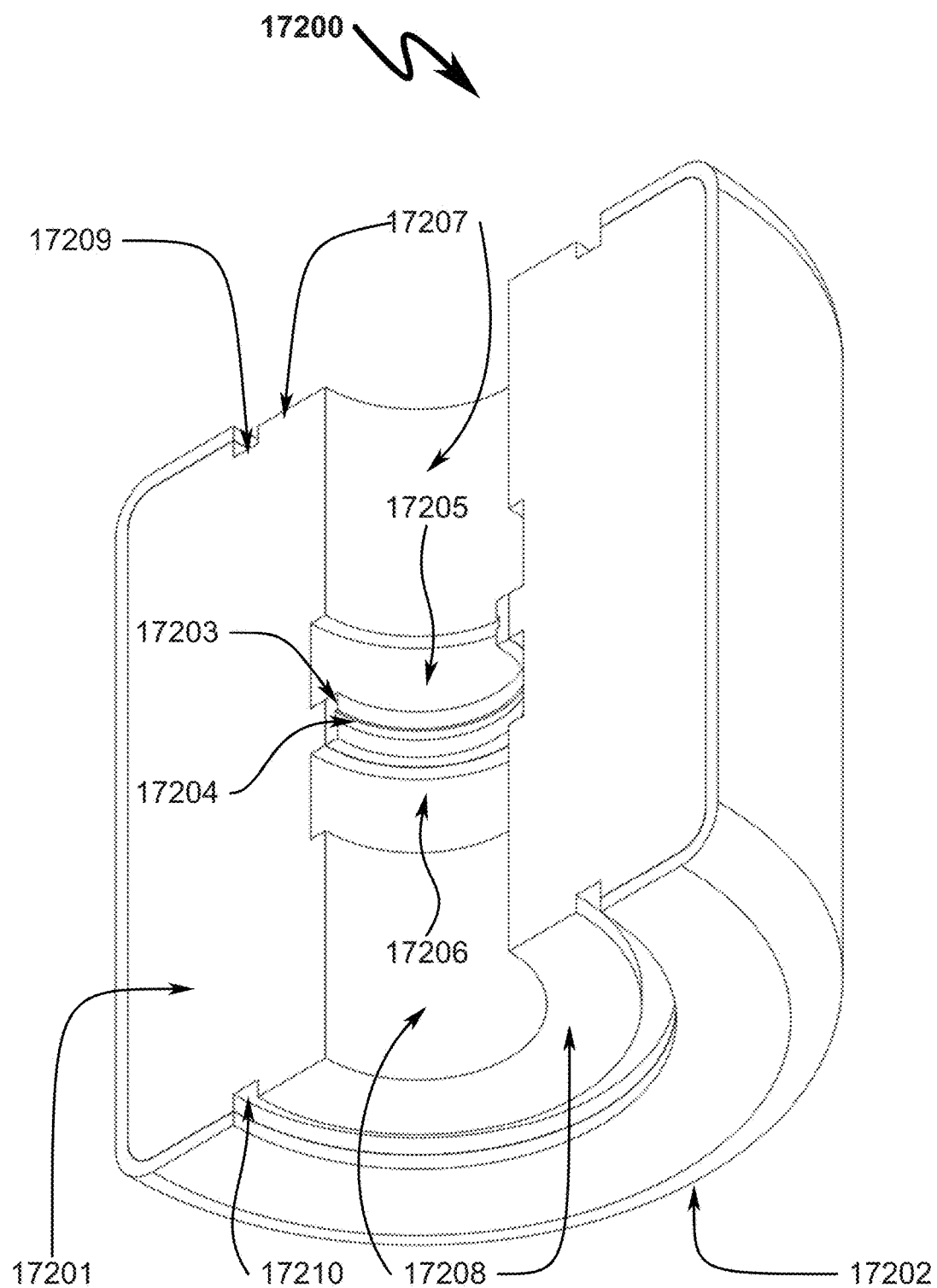
Figure 173:
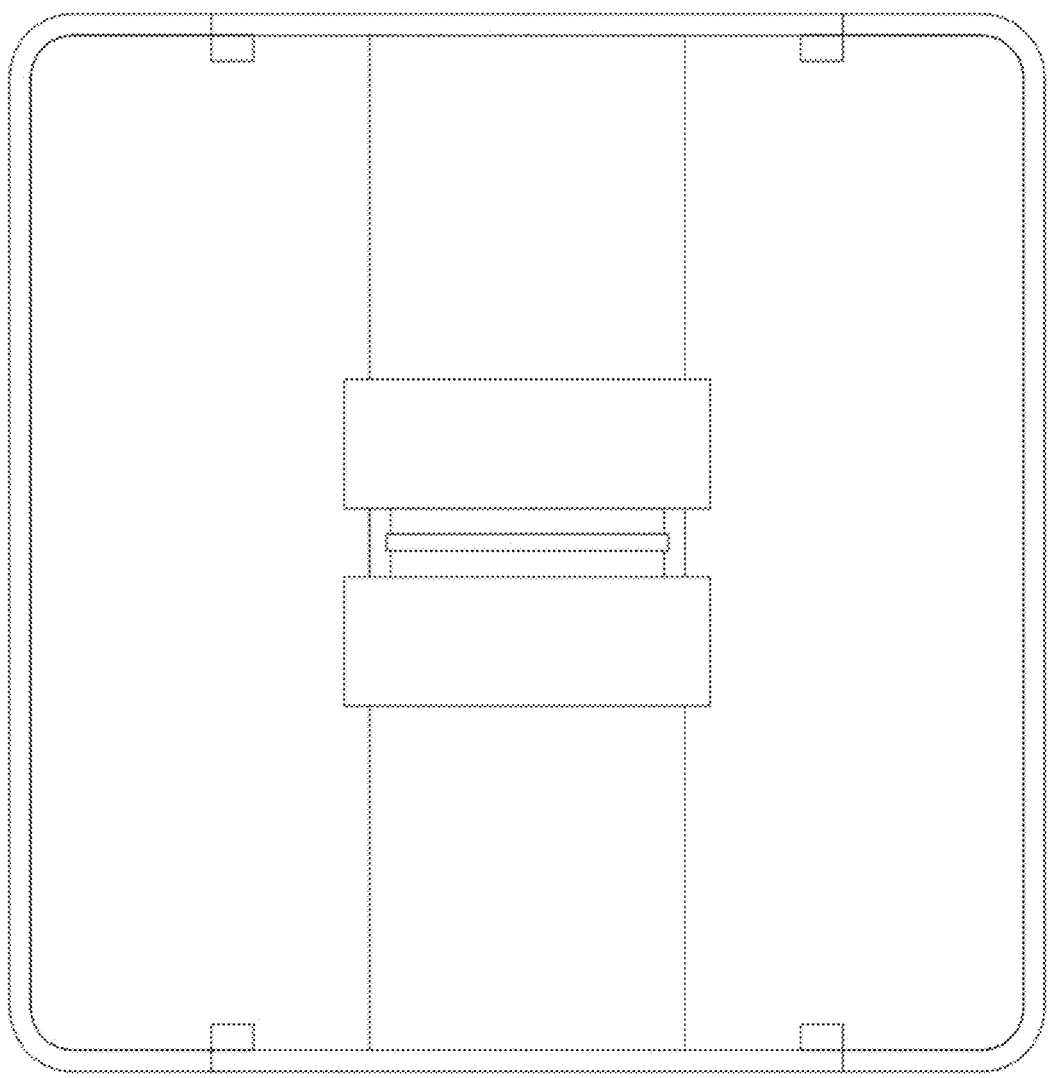
Figure 174:
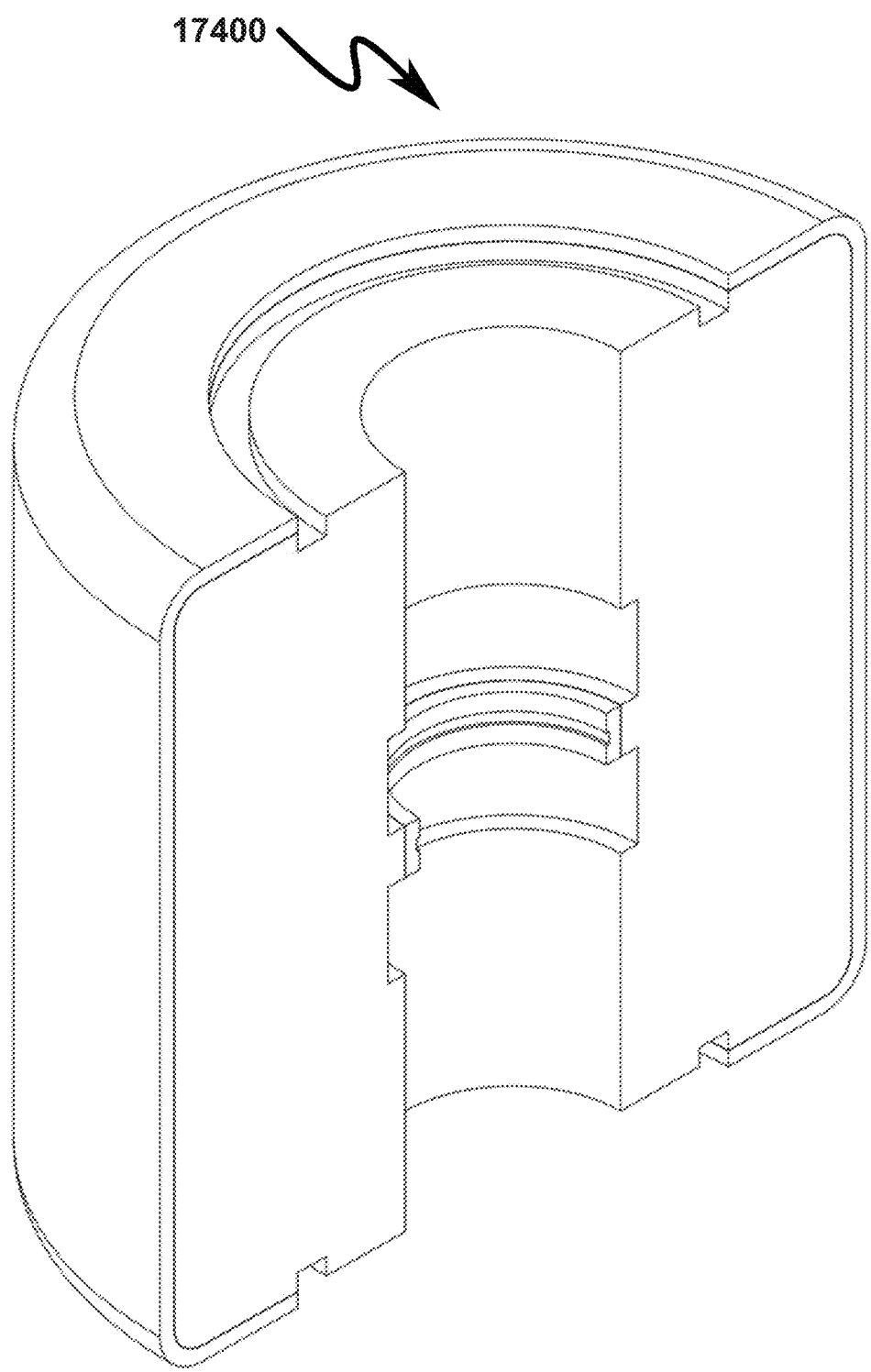
Figure 175:
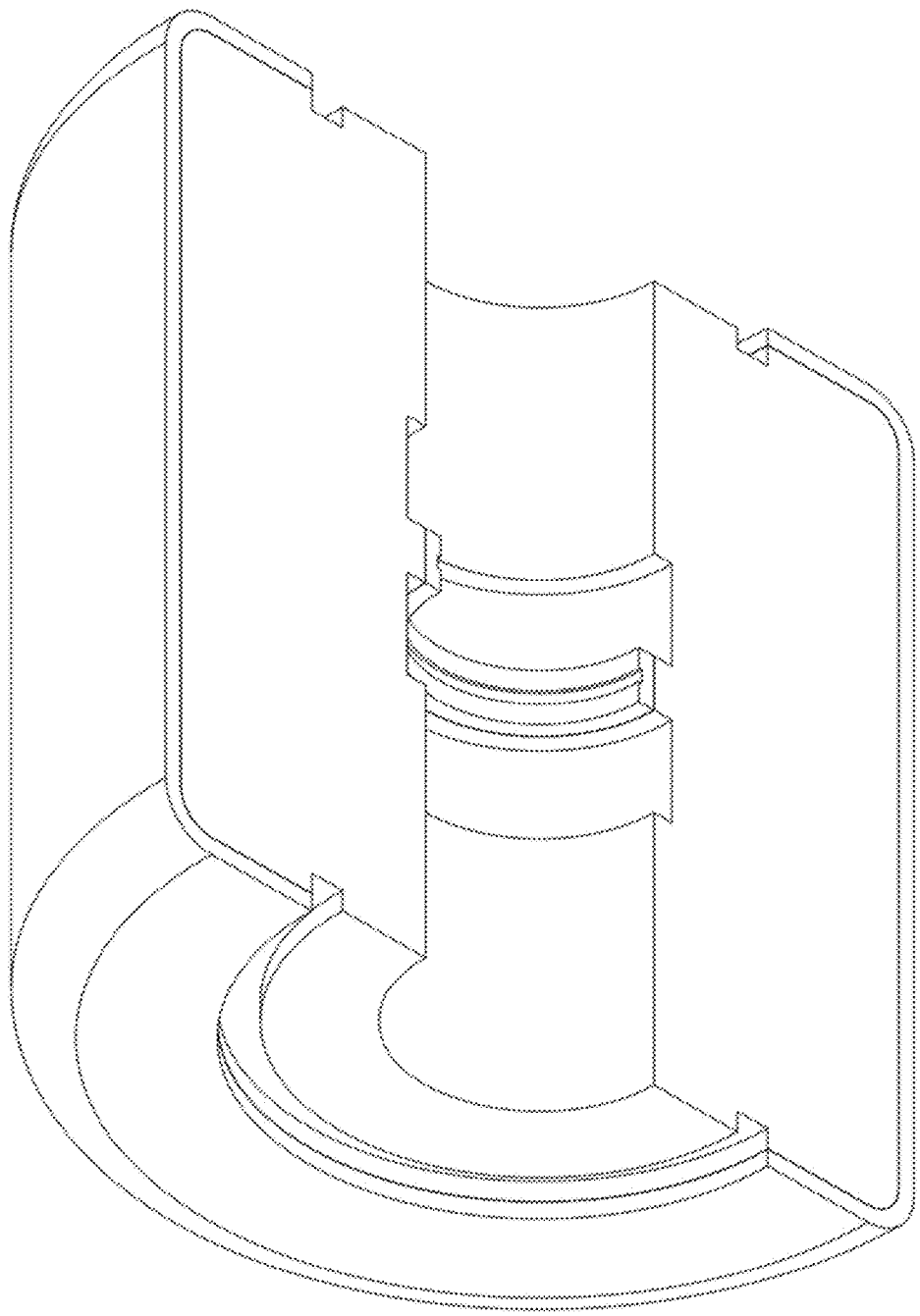
Figure 176:
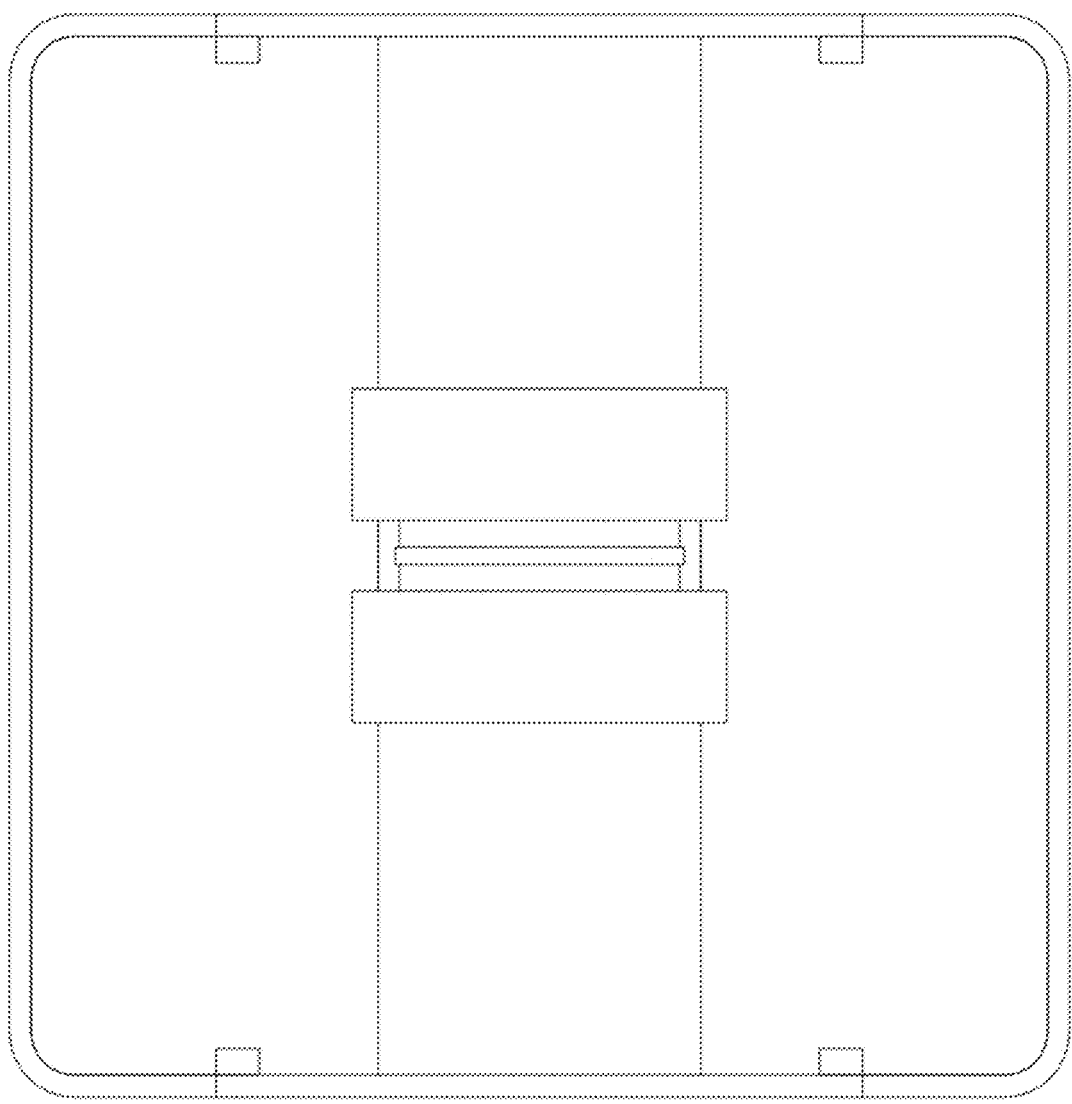
Figure 177:
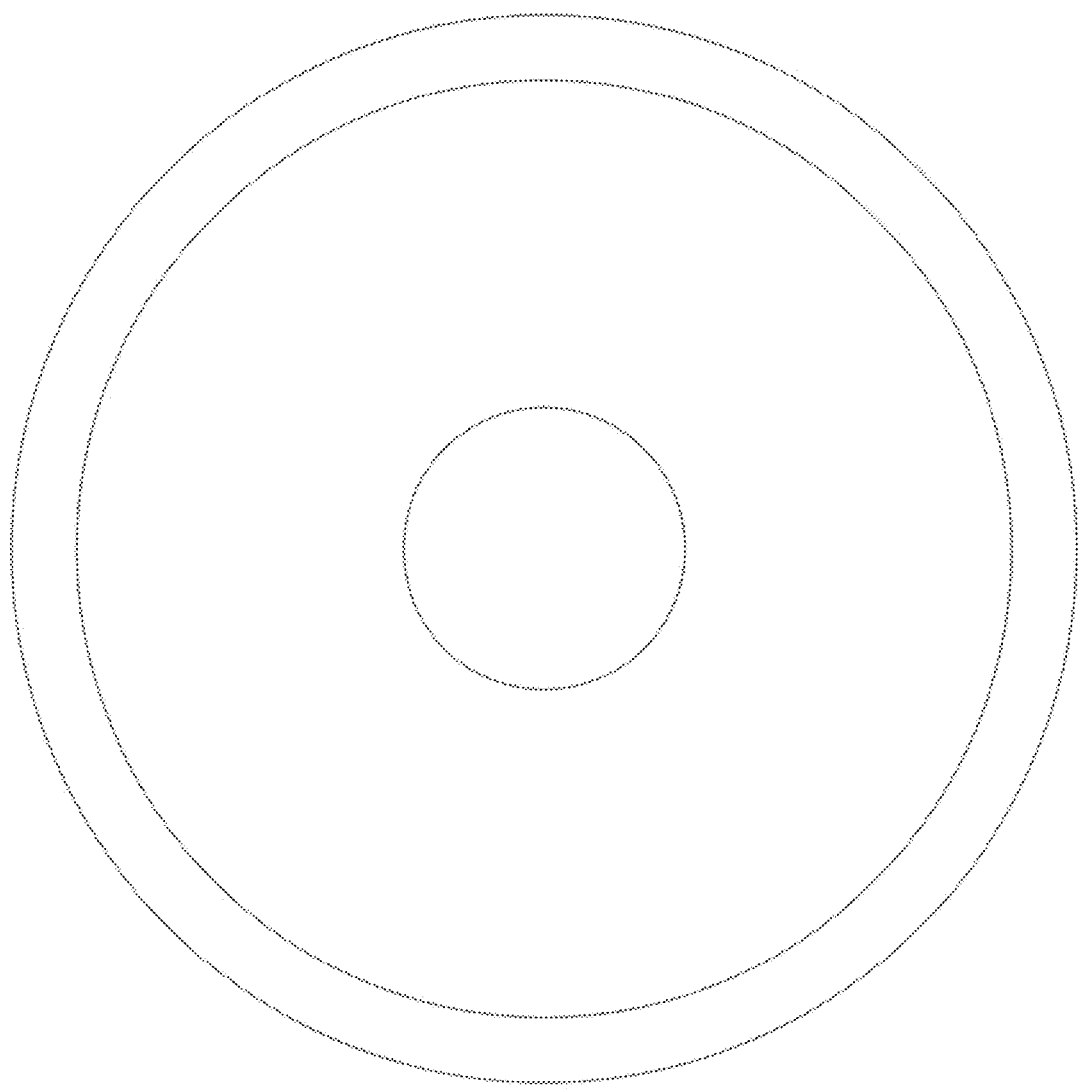
Figure 178:
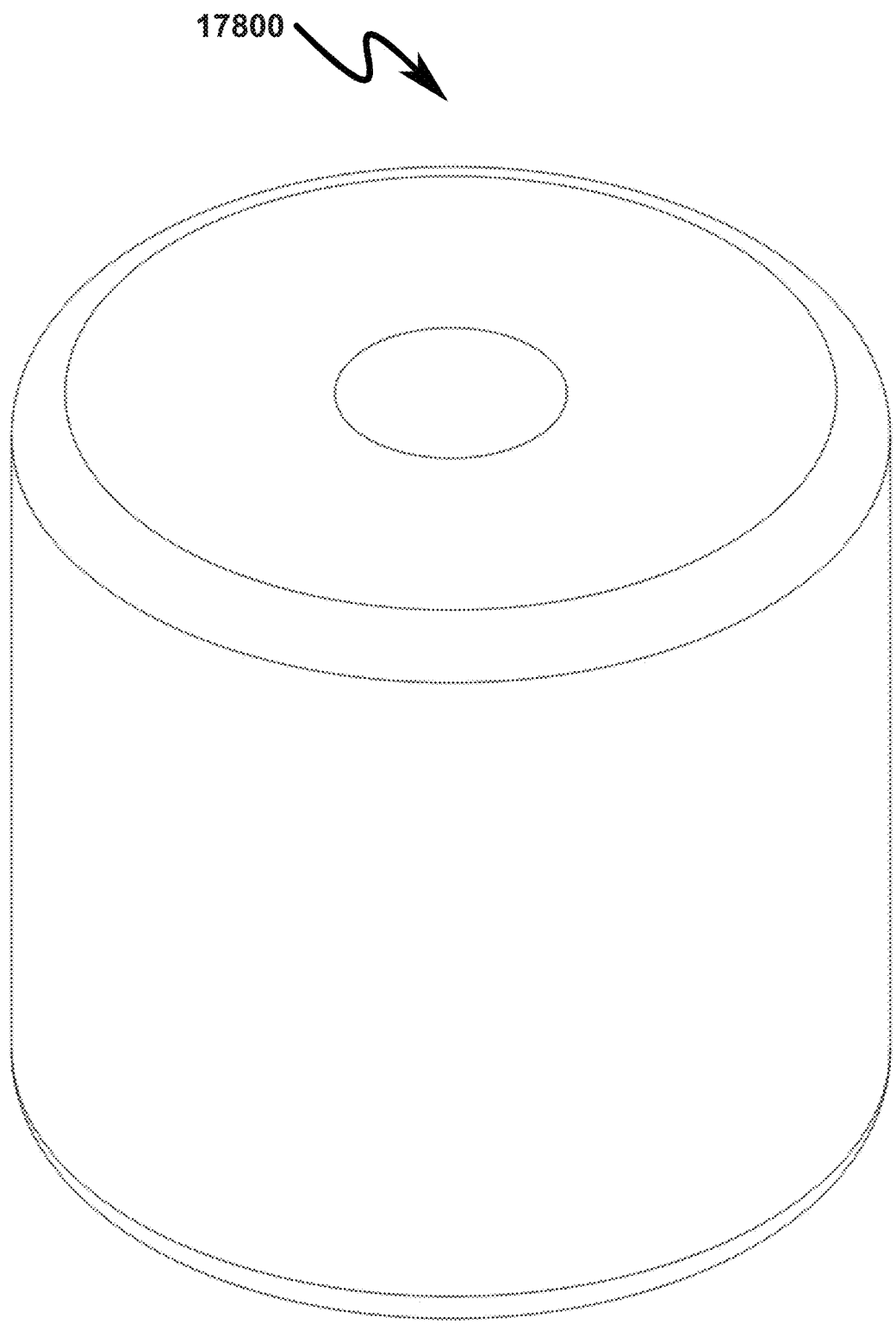
Figure 179:
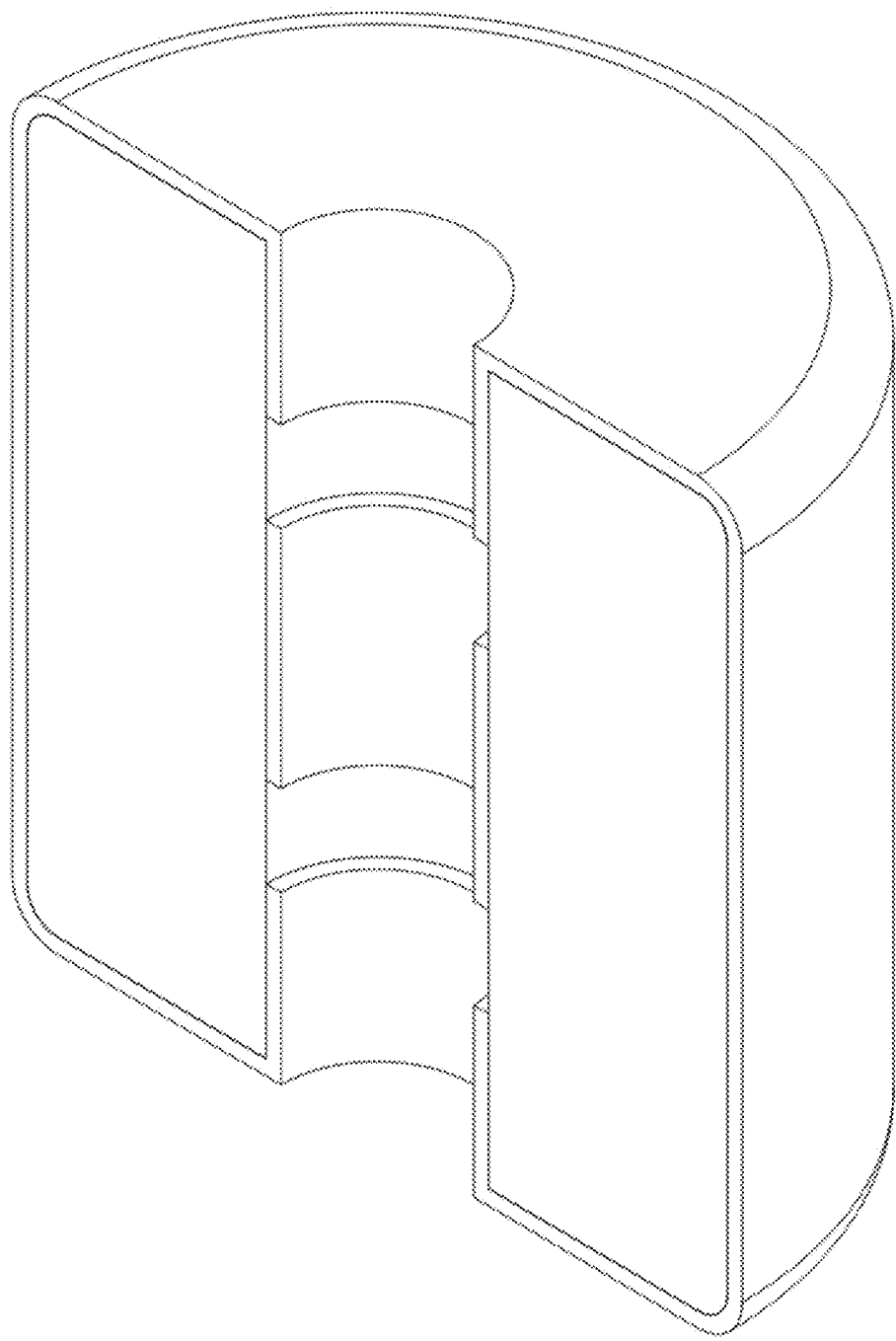
Figure 180:
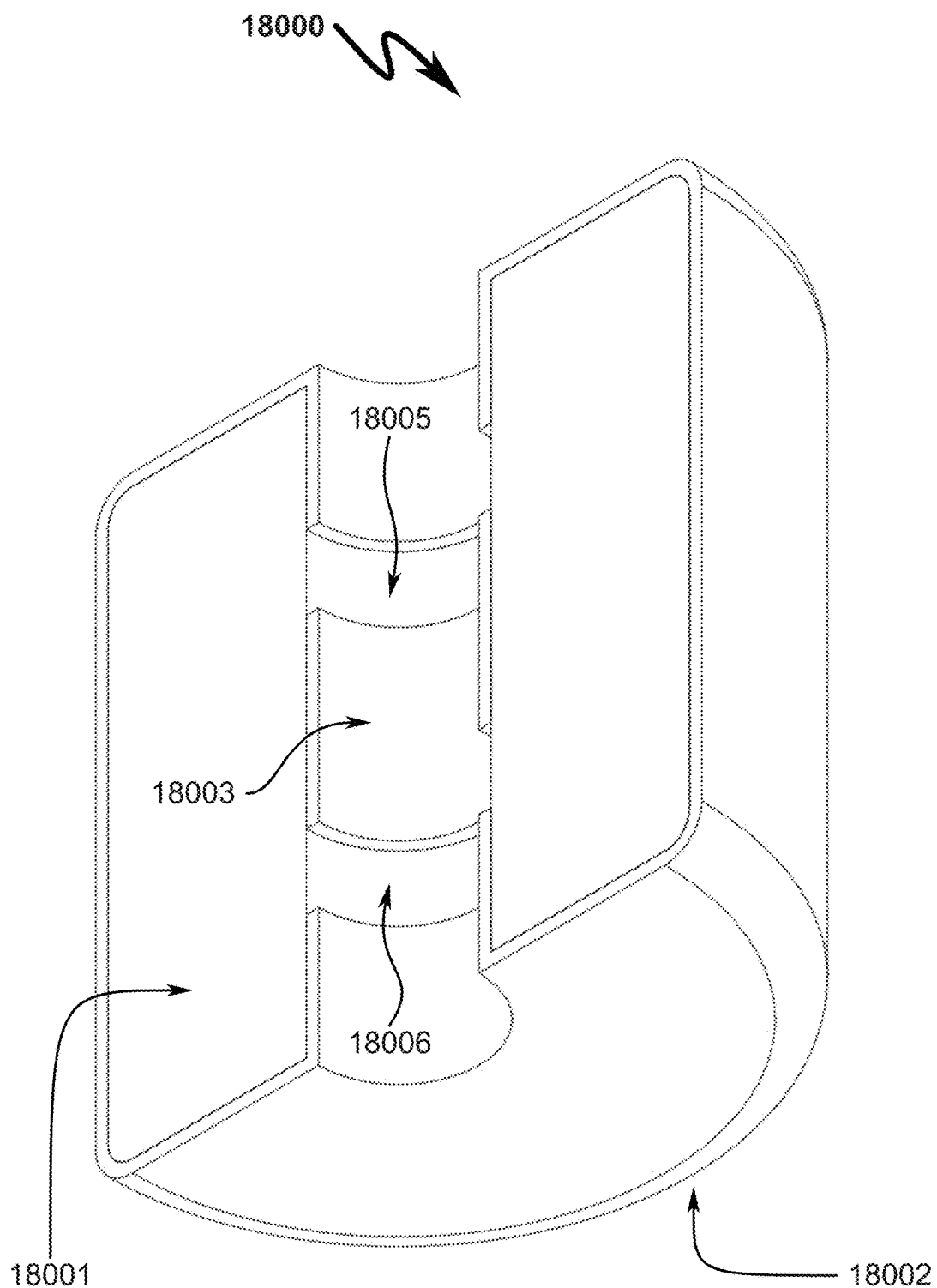
Figure 181:
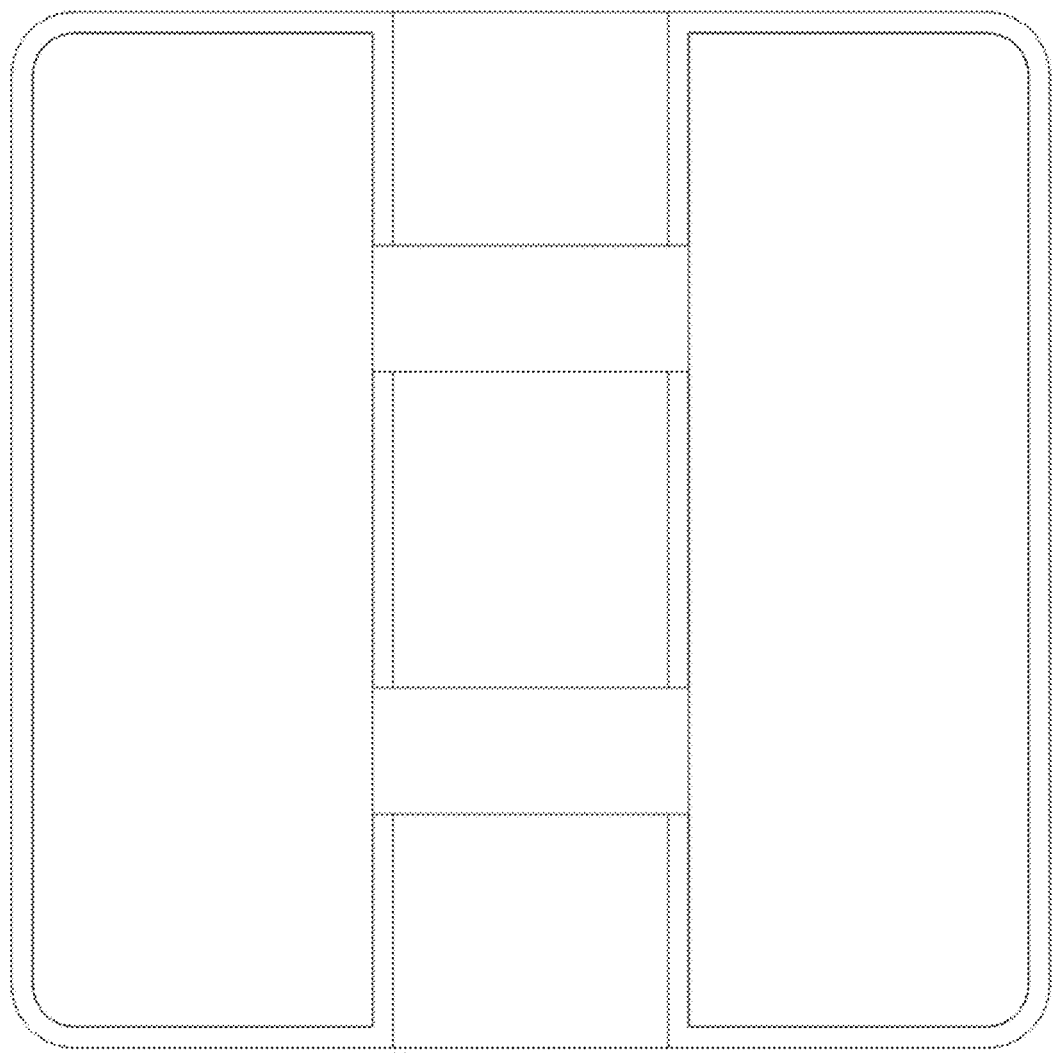
Figure 182:
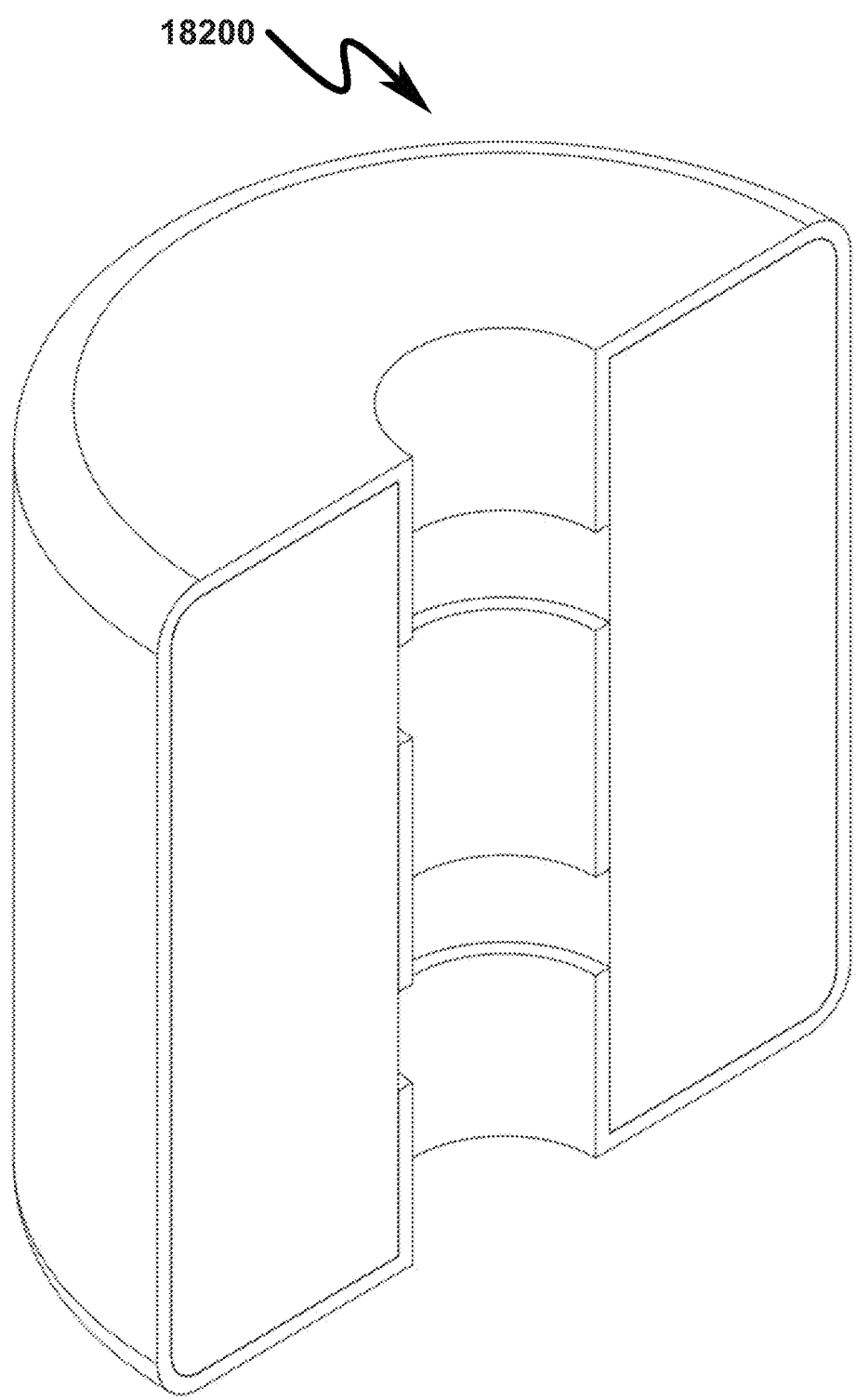
Figure 183:
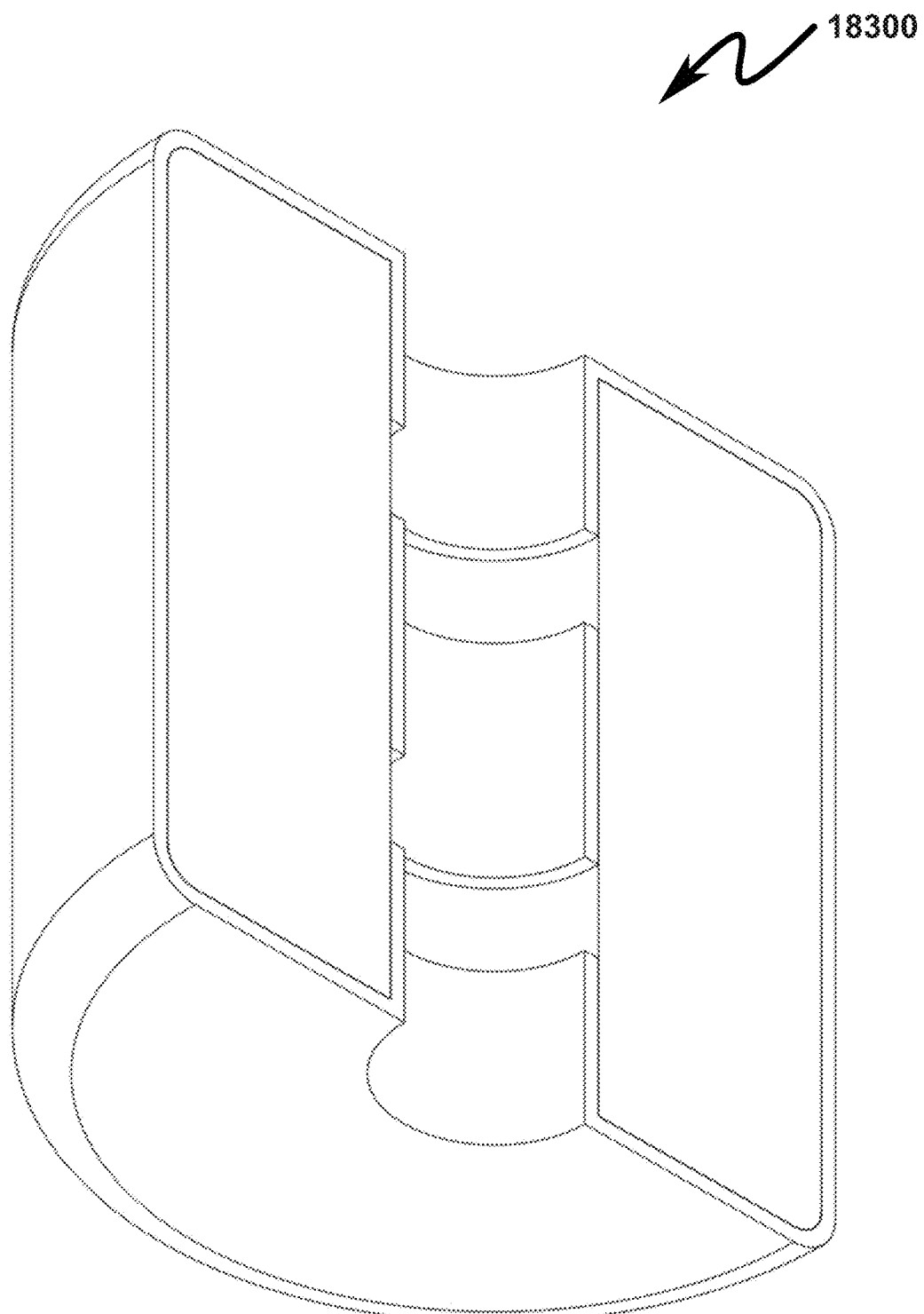
Figure 184:
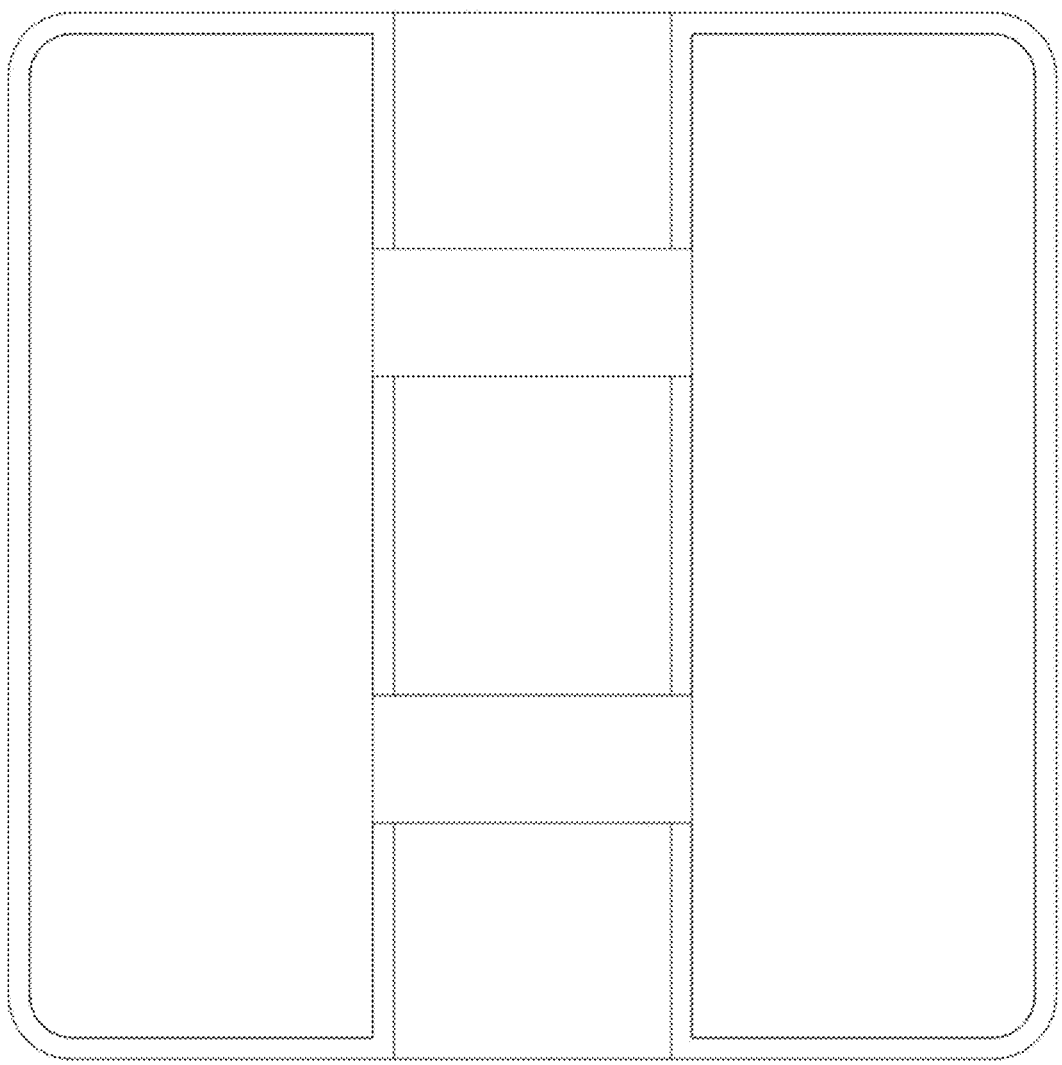
Figure 185:
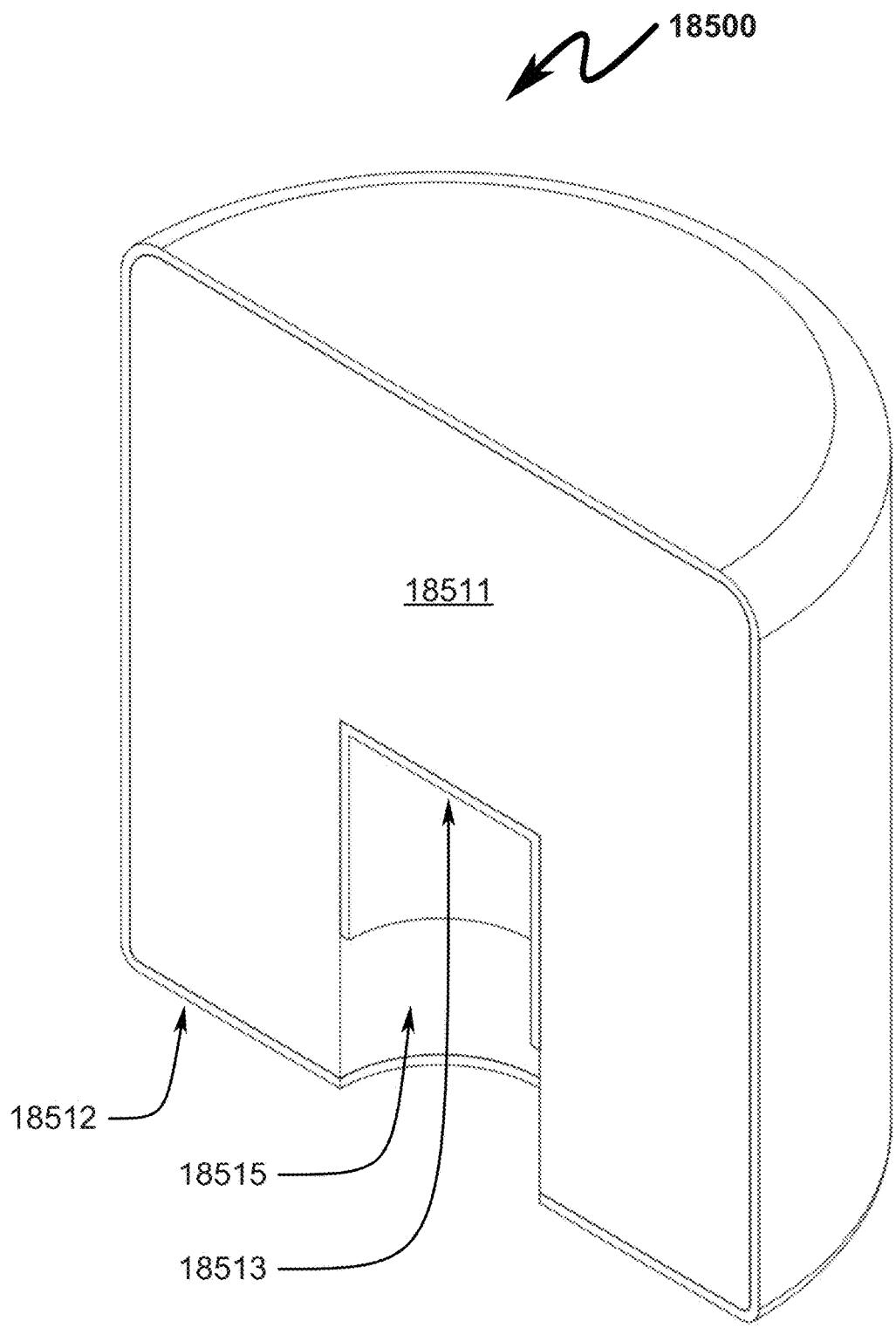
Figure 186:
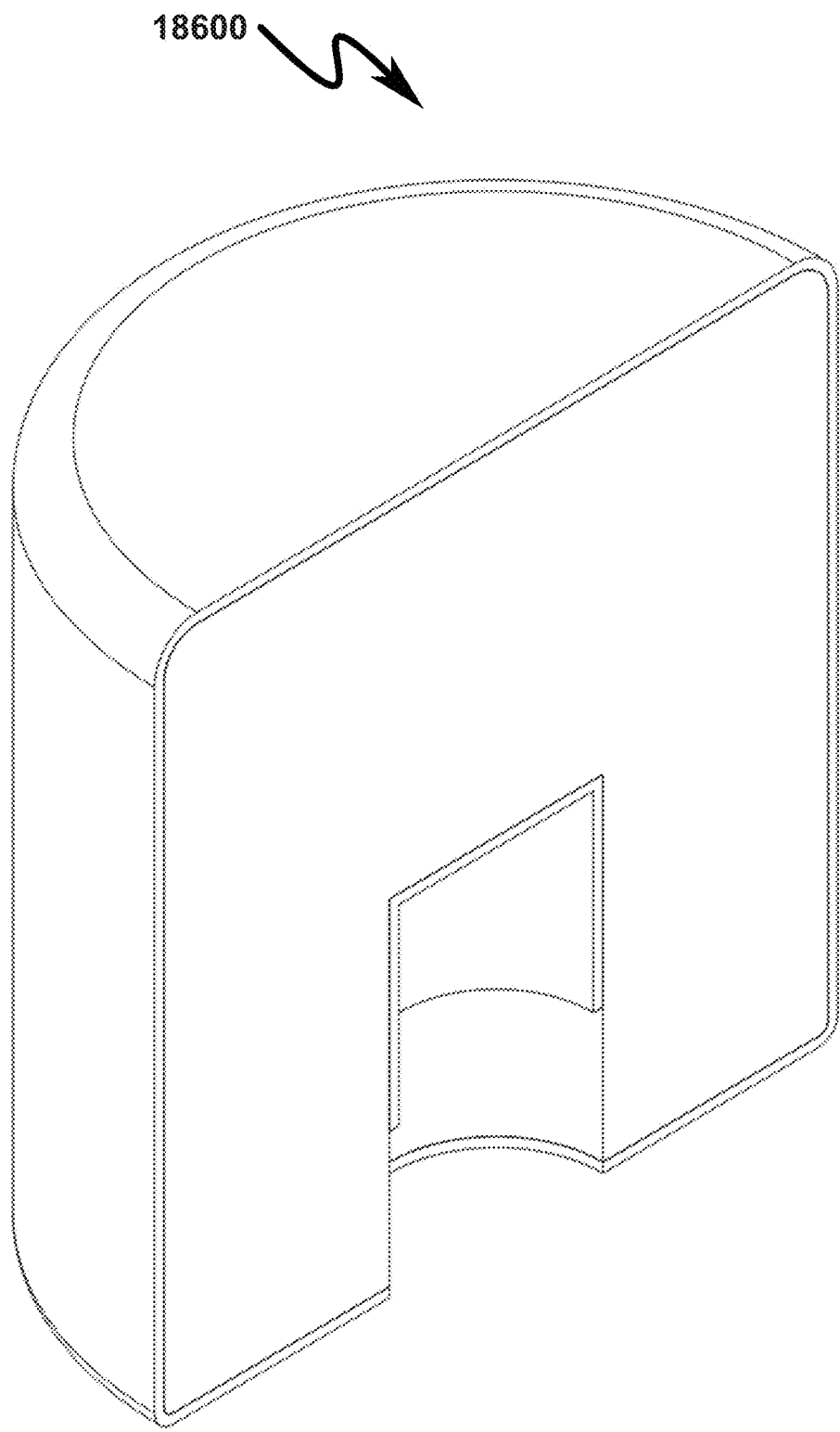
Figure 187:
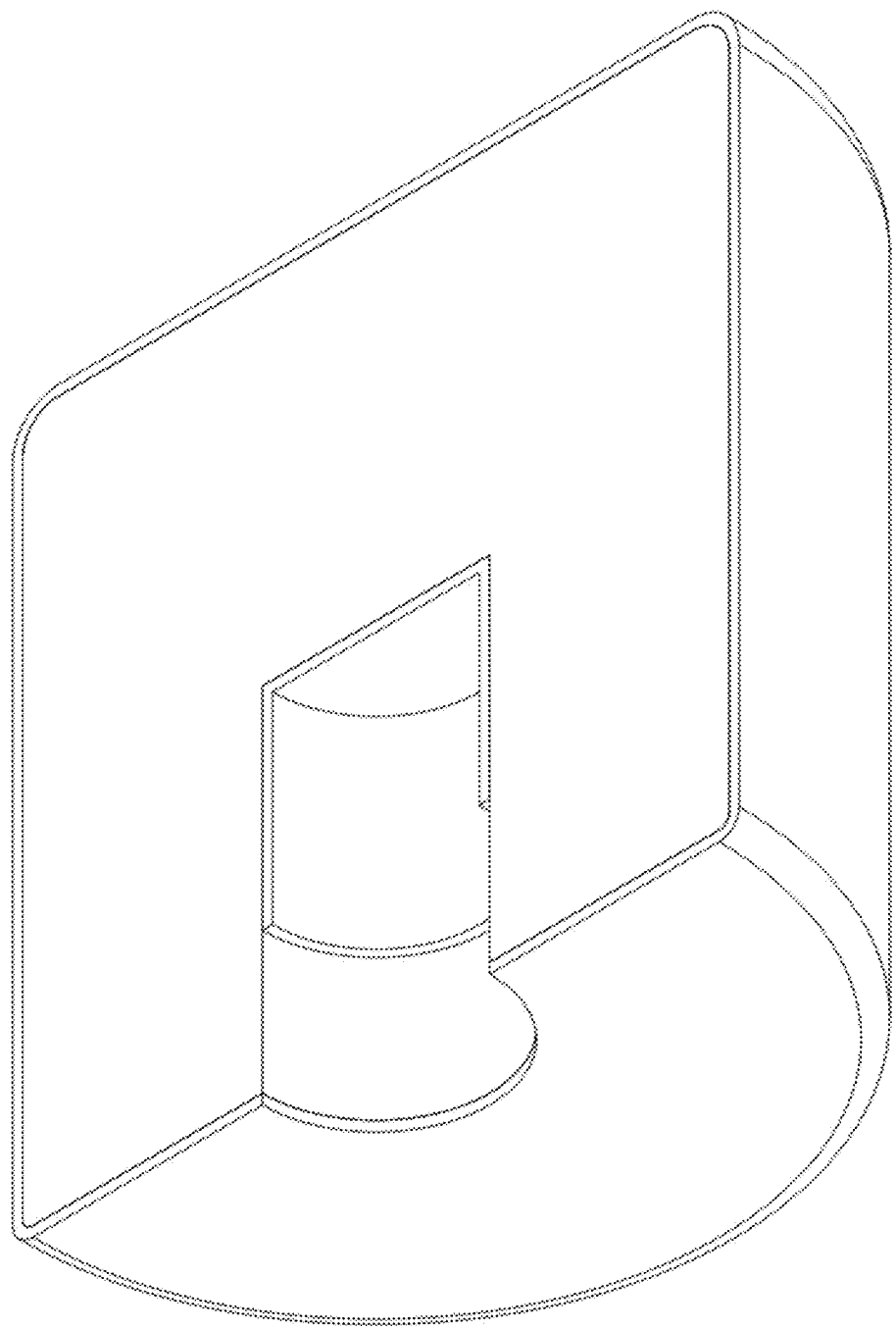
Figure 188:
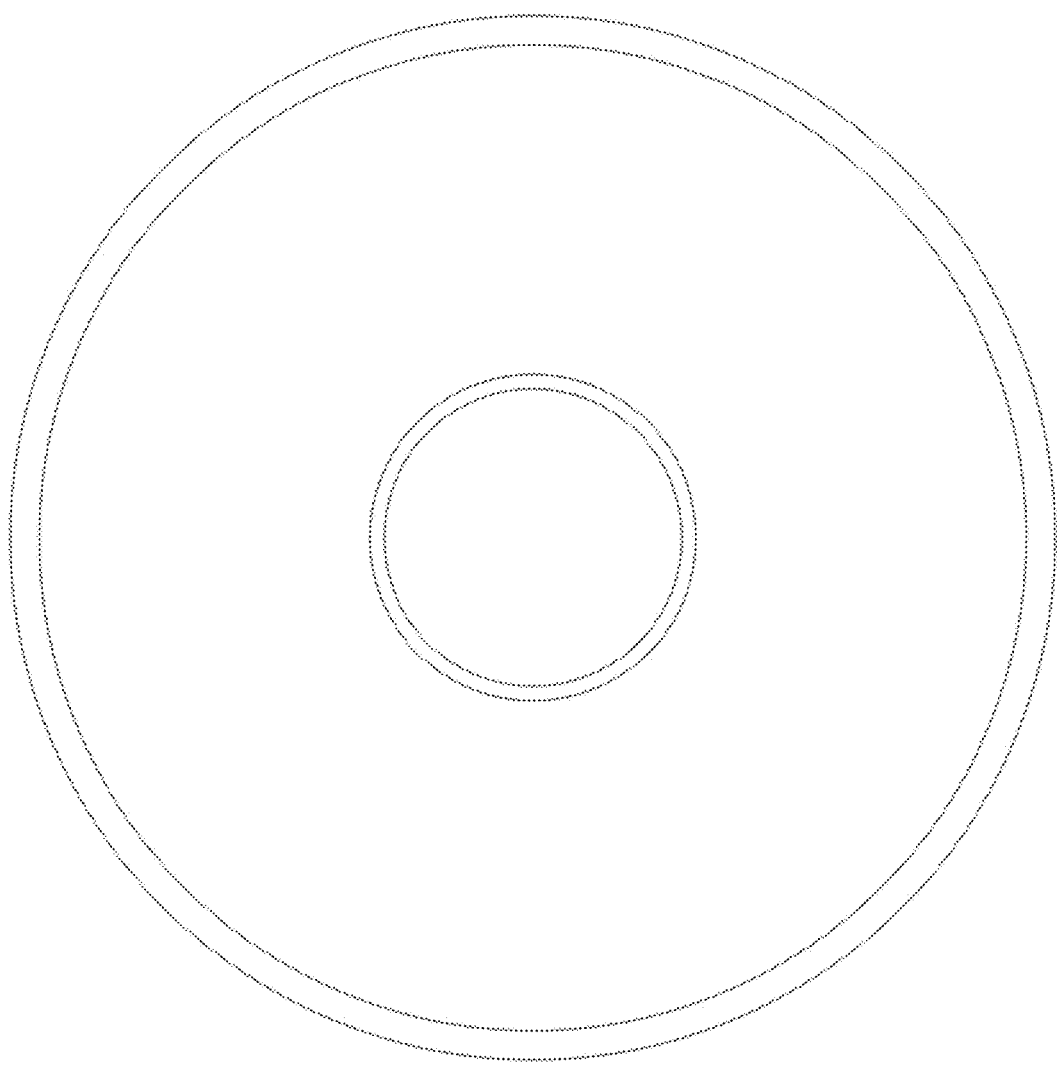
Figure 189:
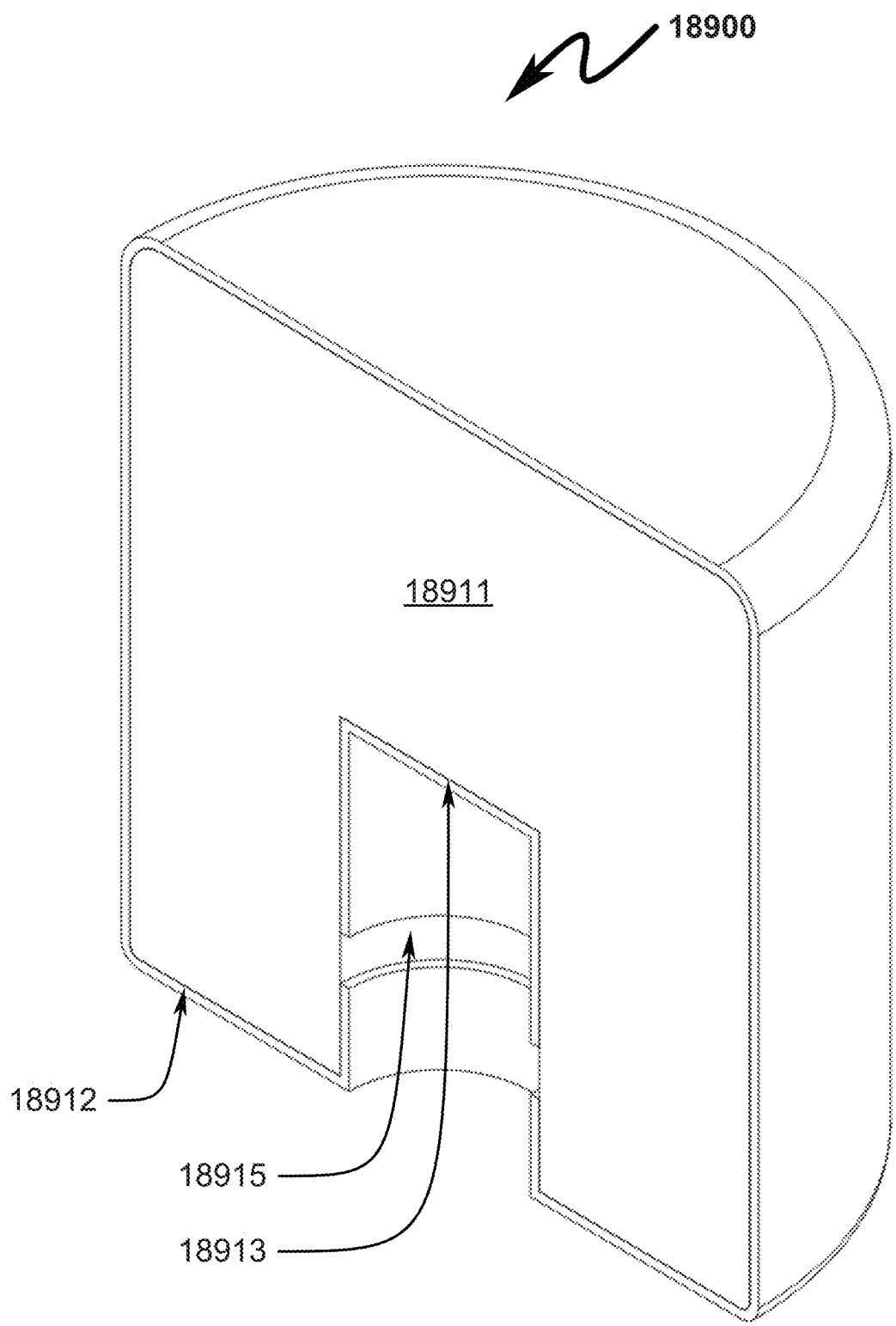
Figure 190:
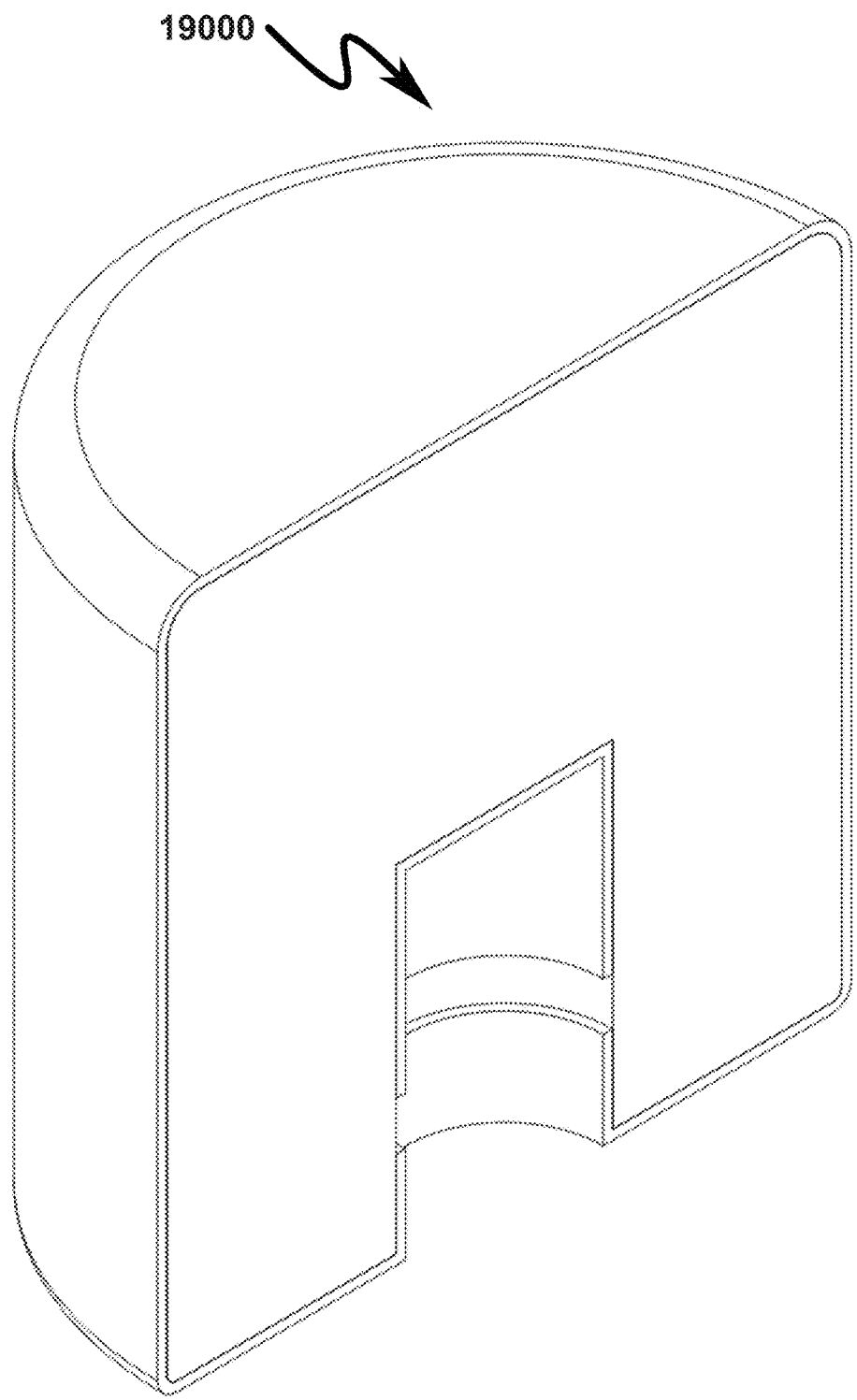
Figure 191:
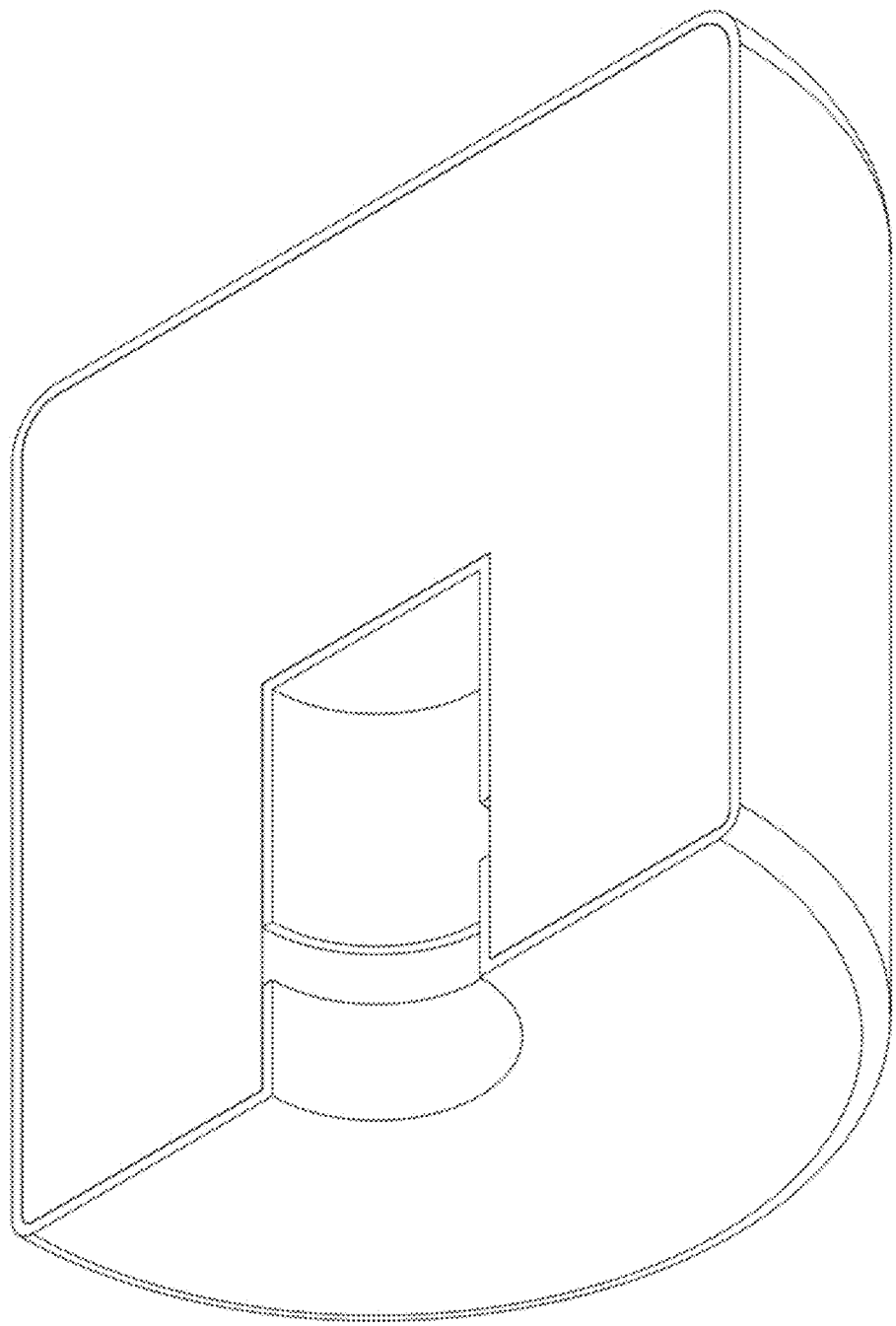
Figure 192:
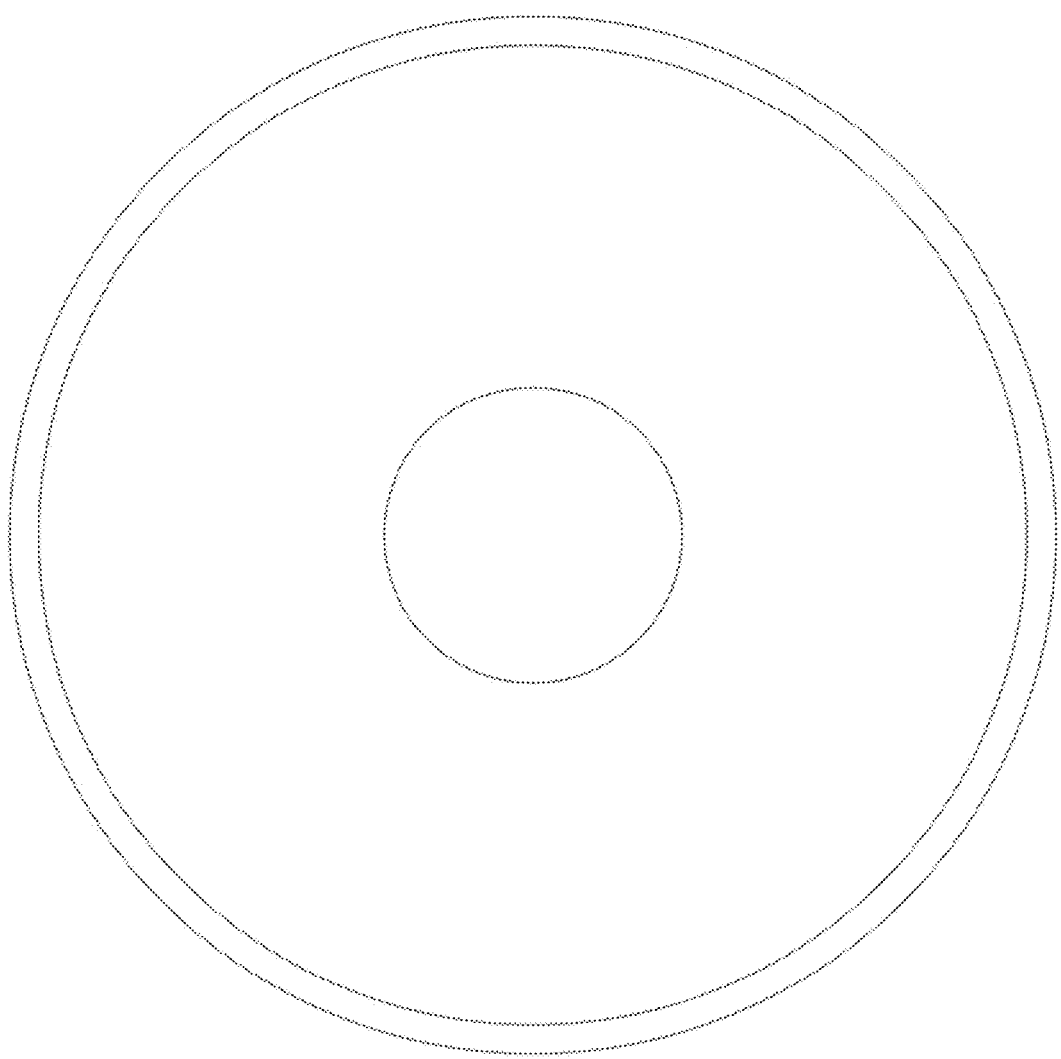

FIG. 131 illustrates a top right front perspective front section view of a preferred exemplary embodiment incorporating a wraparound P+ (or N+) outer contact and N+ (or P+) centroid inner contact;

FIG. 132 illustrates a bottom right front perspective front section view of a preferred exemplary embodiment incorporating a wraparound P+ (or N+) outer contact and N+ (or P+) centroid inner contact;

FIG. 133 illustrates a front section view of a preferred exemplary embodiment incorporating a wraparound P+ (or N+) outer contact and N+ (or P+) centroid inner contact;

FIG. 134 illustrates a top right side perspective front section view of a preferred exemplary embodiment incorporating a wraparound P+ (or N+) outer contact and N+ (or P+) centroid inner contact;

FIG. 135 illustrates a bottom right side perspective front section view of a preferred exemplary embodiment incorporating a wraparound P+ (or N+) outer contact and N+ (or P+) centroid inner contact;

FIG. 136 illustrates a side section view of a preferred exemplary embodiment incorporating a wraparound P+ (or N+) outer contact and N+ (or P+) centroid inner contact;

FIG. 137 illustrates a top view of a preferred exemplary embodiment incorporating a wraparound P+ (or N+) outer contact and N+ (or P+) centroid inner contact surrounded by intercontact junction regions (ICJR);

FIG. 138 illustrates a top right front perspective view of a preferred exemplary embodiment incorporating a wraparound P+ (or N+) outer contact and N+ (or P+) centroid inner contact surrounded by intercontact junction regions (ICJR);

FIG. 139 illustrates a top right front perspective front section view of a preferred exemplary embodiment incorporating a wraparound P+ (or N+) outer contact and N+ (or P+) centroid inner contact surrounded by intercontact junction regions (ICJR);

FIG. 140 illustrates a bottom right front perspective front section view of a preferred exemplary embodiment incorporating a wraparound P+ (or N+) outer contact and N+ (or P+) centroid inner contact surrounded by intercontact junction regions (ICJR);

FIG. 141 illustrates a front section view of a preferred exemplary embodiment incorporating a wraparound P+ (or N+) outer contact and N+ (or P+) centroid inner contact surrounded by intercontact junction regions (ICJR);

FIG. 142 illustrates a top right side perspective front section view of a preferred exemplary embodiment incorporating a wraparound P+ (or N+) outer contact and N+ (or P+) centroid inner contact surrounded by intercontact junction regions (ICJR);

FIG. 143 illustrates a bottom right side perspective front section view of a preferred exemplary embodiment incorporating a wraparound P+ (or N+) outer contact and N+ (or P+) centroid inner contact surrounded by intercontact junction regions (ICJR);

FIG. 144 illustrates a side section view of a preferred exemplary embodiment incorporating a wraparound P+ (or N+) outer contact and N+ (or P+) centroid inner contact surrounded by intercontact junction regions (ICJR);

FIG. 145 illustrates a top view of a preferred exemplary embodiment incorporating a wraparound P+ (or N+) outer diffused/implanted surface contact and N+ (or P+) centroid inner diffused/implanted surface contact surrounded by intercontact junction regions (ICJR);

FIG. 146 illustrates a top right front perspective view of a preferred exemplary embodiment incorporating a wraparound P+ (or N+) outer diffused/implanted surface contact and N+ (or P+) centroid inner diffused/implanted surface contact surrounded by intercontact junction regions (ICJR);

FIG. 147 illustrates a top right front perspective front section view of a preferred exemplary embodiment incorporating a wraparound P+ (or N+) outer diffused/implanted surface contact and N+ (or P+) centroid inner diffused/implanted surface contact surrounded by intercontact junction regions (ICJR);

FIG. 148 illustrates a bottom right front perspective front section view of a preferred exemplary embodiment incorporating a wraparound P+ (or N+) outer diffused/implanted surface contact and N+ (or P+) centroid inner diffused/implanted surface contact surrounded by intercontact junction regions (ICJR);

FIG. 149 illustrates a front section view of a preferred exemplary embodiment incorporating a wraparound P+ (or N+) outer diffused/implanted surface contact and N+ (or P+) centroid inner diffused/implanted surface contact surrounded by intercontact junction regions (ICJR);

FIG. 150 illustrates a top right side perspective front section view of a preferred exemplary embodiment incorporating a wraparound P+ (or N+) outer diffused/implanted surface contact and N+ (or P+) centroid inner diffused/implanted surface contact surrounded by intercontact junction regions (ICJR);

FIG. 151 illustrates a bottom right side perspective front section view of a preferred exemplary embodiment incorporating a wraparound P+ (or N+) outer diffused/implanted surface contact and N+ (or P+) centroid inner diffused/implanted surface contact surrounded by intercontact junction regions (ICJR);

FIG. 152 illustrates a side section view of a preferred exemplary embodiment incorporating a wraparound P+ (or N+) outer diffused/implanted surface contact and N+ (or P+) centroid inner diffused/implanted surface contact surrounded by intercontact junction regions (ICJR);

FIG. 153 illustrates a top view of a preferred exemplary embodiment incorporating a wraparound P+ (or N+) outer contact and N+ (or P+) centroid inner contact surrounded by grooved intercontact junction regions;

FIG. 154 illustrates a top right front perspective view of a preferred exemplary embodiment incorporating a wraparound P+ (or N+) outer contact and N+ (or P+) centroid inner contact surrounded by grooved intercontact junction regions;

FIG. 155 illustrates a top right front perspective front section view of a preferred exemplary embodiment incorporating a wraparound P+ (or N+) outer contact and N+ (or P+) centroid inner contact surrounded by grooved intercontact junction regions;

FIG. 156 illustrates a bottom right front perspective front section view of a preferred exemplary embodiment incorporating a wraparound P+ (or N+) outer contact and N+ (or P+) centroid inner contact surrounded by grooved intercontact junction regions;

FIG. 157 illustrates a front section view of a preferred exemplary embodiment incorporating a wraparound P+ (or N+) outer contact and N+ (or P+) centroid inner contact surrounded by grooved intercontact junction regions;

FIG. 158 illustrates a top right side perspective front section view of a preferred exemplary embodiment incorporating a wraparound P+ (or N+) outer contact and N+ (or P+) centroid inner contact surrounded by grooved intercontact junction regions;

FIG. 159 illustrates a bottom right side perspective front section view of a preferred exemplary embodiment incorporating a wraparound P+ (or N+) outer contact and N+ (or P+) centroid inner contact surrounded by grooved intercontact junction regions;

FIG. 160 illustrates a side section view of a preferred exemplary embodiment incorporating a wraparound P+ (or N+) outer contact and N+ (or P+) centroid inner contact surrounded by grooved intercontact junction regions;

FIG. 161 illustrates a top view of a preferred exemplary embodiment incorporating a peripheral surface P+ (or N+) outer contact and N+ (or P+) centroid inner contact;

FIG. 162 illustrates a top right front perspective view of a preferred exemplary embodiment incorporating a peripheral surface P+ (or N+) outer contact and N+ (or P+) centroid inner contact;

FIG. 163 illustrates a top right front perspective front section view of a preferred exemplary embodiment incorporating a peripheral surface P+ (or N+) outer contact and N+ (or P+) centroid inner contact;

FIG. 164 illustrates a bottom right front perspective front section view of a preferred exemplary embodiment incorporating a peripheral surface P+ (or N+) outer contact and N+ (or P+) centroid inner contact;

FIG. 165 illustrates a front section view of a preferred exemplary embodiment incorporating a peripheral surface P+ (or N+) outer contact and N+ (or P+) centroid inner contact;

FIG. 166 illustrates a top right side perspective front section view of a preferred exemplary embodiment incorporating a peripheral surface P+ (or N+) outer contact and N+ (or P+) centroid inner contact;

FIG. 167 illustrates a bottom right side perspective front section view of a preferred exemplary embodiment incorporating a peripheral surface P+ (or N+) outer contact and N+ (or P+) centroid inner contact;

FIG. 168 illustrates a side section view of a preferred exemplary embodiment incorporating a peripheral surface P+ (or N+) outer contact and N+ (or P+) centroid inner contact;

FIG. 169 illustrates a top view of a preferred exemplary embodiment incorporating a peripheral surface P+ (or N+) outer contact surrounded by grooved intercontact junction regions and N+ (or P+) centroid inner contact surrounded by grooved intercontact junction regions;

FIG. 170 illustrates a top right front perspective view of a preferred exemplary embodiment incorporating a peripheral surface P+ (or N+) outer contact surrounded by grooved intercontact junction regions and N+ (or P+) centroid inner contact surrounded by grooved intercontact junction regions;

FIG. 171 illustrates a top right front perspective front section view of a preferred exemplary embodiment incorporating a peripheral surface P+ (or N+) outer contact surrounded by grooved intercontact junction regions and N+ (or P+) centroid inner contact surrounded by grooved intercontact junction regions;

FIG. 172 illustrates a bottom right front perspective front section view of a preferred exemplary embodiment incorporating a peripheral surface P+ (or N+) outer contact surrounded by grooved intercontact junction regions and N+ (or P+) centroid inner contact surrounded by grooved intercontact junction regions;

FIG. 173 illustrates a front section view of a preferred exemplary embodiment incorporating a peripheral surface P+ (or N+) outer contact surrounded by grooved intercontact junction regions and N+ (or P+) centroid inner contact surrounded by grooved intercontact junction regions;

FIG. 174 illustrates a top right side perspective front section view of a preferred exemplary embodiment incorporating a peripheral surface P+ (or N+) outer contact surrounded by grooved intercontact junction regions and N+ (or P+) centroid inner contact surrounded by grooved intercontact junction regions;

FIG. 175 illustrates a bottom right side perspective front section view of a preferred exemplary embodiment incorporating a peripheral surface P+ (or N+) outer contact surrounded by grooved intercontact junction regions and N+ (or P+) centroid inner contact surrounded by grooved intercontact junction regions;

FIG. 176 illustrates a side section view of a preferred exemplary embodiment incorporating a peripheral surface P+ (or N+) outer contact surrounded by grooved intercontact junction regions and N+ (or P+) centroid inner contact surrounded by grooved intercontact junction regions;

FIG. 177 illustrates a top view of a preferred exemplary embodiment incorporating a wraparound P+ (or N+) outer contact and N+ (or P+) expanded centroid inner contact surrounded by intercontact junction regions (ICJR);

FIG. 178 illustrates a top right front perspective view of a preferred exemplary embodiment incorporating a wraparound P+ (or N+) outer contact and N+ (or P+) expanded centroid inner contact surrounded by intercontact junction regions (ICJR);

FIG. 179 illustrates a top right front perspective front section view of a preferred exemplary embodiment incorporating a wraparound P+ (or N+) outer contact and N+ (or P+) expanded centroid inner contact surrounded by intercontact junction regions (ICJR);

FIG. 180 illustrates a bottom right front perspective front section view of a preferred exemplary embodiment incorporating a wraparound P+ (or N+) outer contact and N+ (or P+) expanded centroid inner contact surrounded by intercontact junction regions (ICJR);

FIG. 181 illustrates a front section view of a preferred exemplary embodiment incorporating a wraparound P+ (or N+) outer contact and N+ (or P+) expanded centroid inner contact surrounded by intercontact junction regions (ICJR);

FIG. 182 illustrates a top right side perspective front section view of a preferred exemplary embodiment incorporating a wraparound P+ (or N+) outer contact and N+ (or P+) expanded centroid inner contact surrounded by intercontact junction regions (ICJR);

FIG. 183 illustrates a bottom right side perspective front section view of a preferred exemplary embodiment incorporating a wraparound P+ (or N+) outer contact and N+ (or P+) expanded centroid inner contact surrounded by intercontact junction regions (ICJR);

FIG. 184 illustrates a side section view of a preferred exemplary embodiment incorporating a wraparound P+ (or N+) outer contact and N+ (or P+) expanded centroid inner contact surrounded by intercontact junction regions (ICJR);

FIG. 185 illustrates a top right perspective front sectional view of a preferred exemplary cylindrical invention system embodiment incorporating an expanded width/height centroid signal contact;

FIG. 186 illustrates a top right perspective right sectional view of a preferred exemplary cylindrical invention system embodiment incorporating an expanded width/height centroid signal contact;

FIG. 187 illustrates a bottom front perspective front sectional view of a preferred exemplary cylindrical invention system embodiment incorporating an expanded width/height centroid signal contact;

FIG. 188 illustrates a bottom view of a preferred exemplary cylindrical invention system embodiment incorporating an expanded width/height centroid signal contact;

FIG. 189 illustrates a top right perspective front sectional view of a preferred exemplary cylindrical invention system embodiment incorporating an expanded width/height centroid signal contact and outer contact extending within the central cavity void;

FIG. 190 illustrates a top right perspective right sectional view of a preferred exemplary cylindrical invention system embodiment incorporating an expanded width/height centroid signal contact and outer contact extending within the central cavity void;

FIG. 191 illustrates a bottom front perspective front sectional view of a preferred exemplary cylindrical invention system embodiment incorporating an expanded width/height centroid signal contact and outer contact extending within the central cavity void; and FIG. 192 illustrates a bottom view of a preferred exemplary cylindrical invention system embodiment incorporating an expanded width/height centroid signal contact and outer contact extending within the central cavity void.

DESCRIPTION OF THE PRESENTLY PREFERRED EXEMPLARY EMBODIMENTS

While this invention is susceptible of embodiment in many different forms, there is shown in the drawings and will herein be described in detailed preferred embodiment of the invention with the understanding that the present disclosure is to be considered as an exemplification of the principles of the invention and is not intended to limit the broad aspect of the invention to the embodiment illustrated.

The numerous innovative teachings of the present application will be described with particular reference to the presently preferred embodiment, wherein these innovative teachings are advantageously applied to the particular problems of a CENTROID CONTACT RADIATION DETECTOR SYSTEM AND METHOD. However, it should be understood that this embodiment is only one example of the many advantageous uses of the innovative teachings herein. In general, statements made in the specification of the present application do not necessarily limit any of the various claimed inventions. Moreover, some statements may apply to some inventive features but not to others.

Signal Contact Thickness not Limitive

Throughout the depiction of the present invention embodiments within the attached drawings there will be a variety of signal contacts depicted. These signal contacts (inner and/or outer) are intentionally exaggerated with respect to their layer thickness in the drawings in order to clearly delineate the position and scope of the contacts in relation to the bulk semiconductor material. One skilled in the art will recognize that these signal contacts may be of arbitrary thickness and in many implementations may be very thinly deposited or implanted structures.

Centroid Contact Width

The present invention anticipates that the best mode of implementing the present invention involves construction of the centroid contact having a width/height less than or equal to 30% of the overall height of the detector. Thus, an annular centroid contact ring would have an annulus width less than or equal to 30% of the overall height of the overall detector and a small centroid contact may extend up to 30% of the height of the overall detector along the inner sidewalls of the cavity void as constructed along the longitudinal axis of the detector.

Method Steps not Limitive

The general method steps described herein may be modified heavily depending on a number of factors, with rearrangement and/or addition/deletion of steps anticipated by the scope of the present invention. Integration of the described methods and other preferred exemplary embodiment methods in conjunction with a variety of preferred exemplary embodiment systems described herein is anticipated by the overall scope of the present invention.

Radiation Detector not Limitive

The present invention may be utilized as a radiation detector in a wide variety of contexts which may include radiation monitoring and/or scanning applications. Thus, the term "detector" or "detection" should be given its broadest possible meaning to include, among other things, radiation monitoring and/or radiation scanning.

Outer Surface Configuration not Limitive

While the present invention may be constructed using a wide variety of outer surface profiles as depicted herein, many exemplary embodiments utilize a cylindrical or conic frustum outer surface profile to improve the detector efficiency in many preferred embodiments. It should be noted that the P-type bulk germanium volume (PGEV) may have a wide variety of volumetric configurations not necessarily limited to those having cylindrical, conic, or frustum-based profiles. For example, the present invention anticipates polyhedral outer surface profiles in some configurations. Additionally, a "portion" of the outer surface should be interpreted to include situations in which the "portion" is the entire outer surface of the PGEV. Therefore, the interpretation of the "outer surface" of the PGEV (or a "portion" thereof) should be given its broadest possible interpretation consistent with the operation of the radiation detection device as described herein.

Electrical Coupling not Limitive

The present invention may utilize the term "electrically coupled" or its equivalent in describing communication between a radiation detector (RD), detector electronics (DE), and a computing device (CD). This electrical coupling should be construed broadly to include both physical electrical coupling as well as communication via any form of wireless communication such as BLUETOOTH®, WiFi, or other wireless communication means.

N+ and P+ Contacts not Limitive

The present invention may utilize a wide variety of N+ and P+ contact types in the formation of the SAGe detector, including but not limited one or more contact types selected from a group consisting of: implanted donor species; implanted acceptor species; diffused donor species; diffused acceptor species; surface barrier contact; amorphous semiconductor contact; metal oxide semiconductor (MOS) contact; metal insulator semiconductor (MIS) contact; Schottky barrier contacts; rectifying semiconductor contact; blocking semiconductor contact; and ohmic semiconductor contact. This selection may include any contact type used to create reverse biased diodes incorporating low leakage current characteristics. Within this context, the selection of N+ and/or P+ contacts implemented may incorporate any combination of N+ and/or P+ contacts exhibiting this behavior.

Computing Device not Limitive

The present invention may utilize the term "computer system", "computing device (CD)" or its equivalent in describing various control systems used within the present invention. These synonymous terms should be given their widest possible interpretation in this context, and are specifically anticipated to include mobile/portable computing devices such as handheld computers, tablet computers, smartphones, cell phones, laptop computer, and the like. Within the scope of the present invention, the radiation probe as described herein may be integrated with the computing device (CD) in a unitary enclosure in some preferred embodiments.

System Overview

Prior Art Deficiencies
The present invention addresses radiation detection application contexts that are traditionally covered by SAGe Well, BEGe, and LEGe radiation detectors currently address this need. While these alternative devices allow low noise, they do so at the expense of extremely low charge collecting electric fields due to the fact the small signal contacts are located on an external surface resulting in an electric field distribution with 2π symmetry. Devices such as REGe and SEGe detectors with axial symmetry have high electric fields, but at the expense of high capacitance which limits their usefulness as low noise detectors.
Present Invention Improvement
The present invention addresses these performance deficiencies in the prior art by implementing a centroid contact configuration that results in a detector with low noise, low capacitance, and symmetric electric field distribution like the alternate technologies described above. The unique aspect of this new design is that it has these same positive attributes of the prior art detectors while achieving a higher overall electric field strength and improved 4π electric field symmetry. This translates into one, or some combination of, the following: relaxed germanium material requirements, improved pulse shape analysis (PSA), improved charge collection, improved energy resolution, greater high energy efficiency, higher Peak/Compton ratios, and/or lower noise.
Typical Applications
The Centroid Contact Configuration for HPGe detectors allows the creation of large mass/volume detectors while maintaining a small device capacitance. This combination of properties is particularly well suited for:
Dark matter research and neutrinoless double-beta decay projects
UHV detector applications where more common vibration mitigation techniques like elastomers cannot be used
Additionally, standard detector product ranges can be complimented with this new geometry as this realizes a step change improvement in noise performance and low energy resolution.

Typical Application Context (0900)-(3200)

Figure 1:
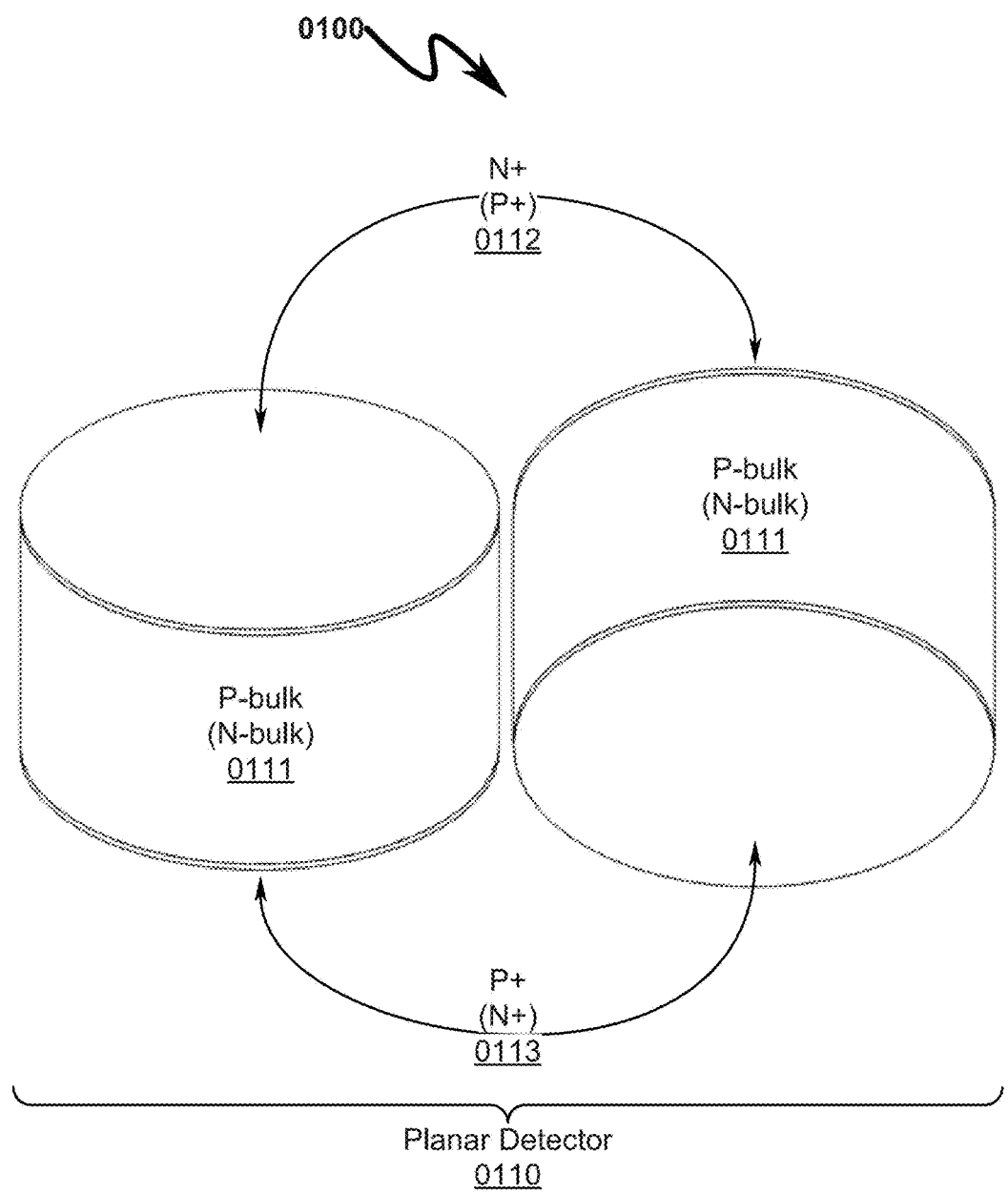
FIG. 1 illustrates top and bottom right front perspective views of a prior art planar radiation detector.
Figure 2:
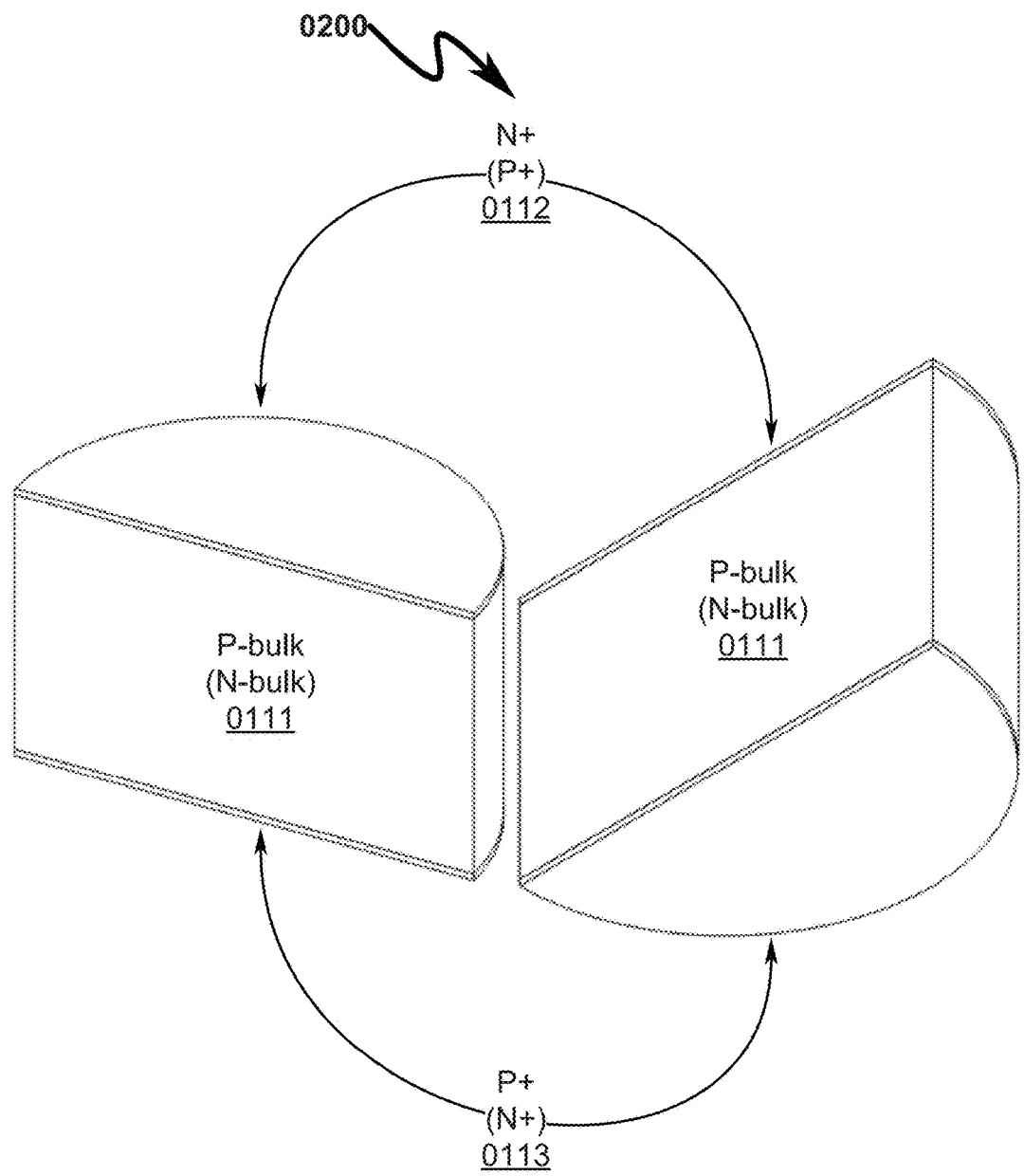
FIG. 2 illustrates top and bottom right front perspective front section views of a prior art planar radiation detector.
Figure 3:
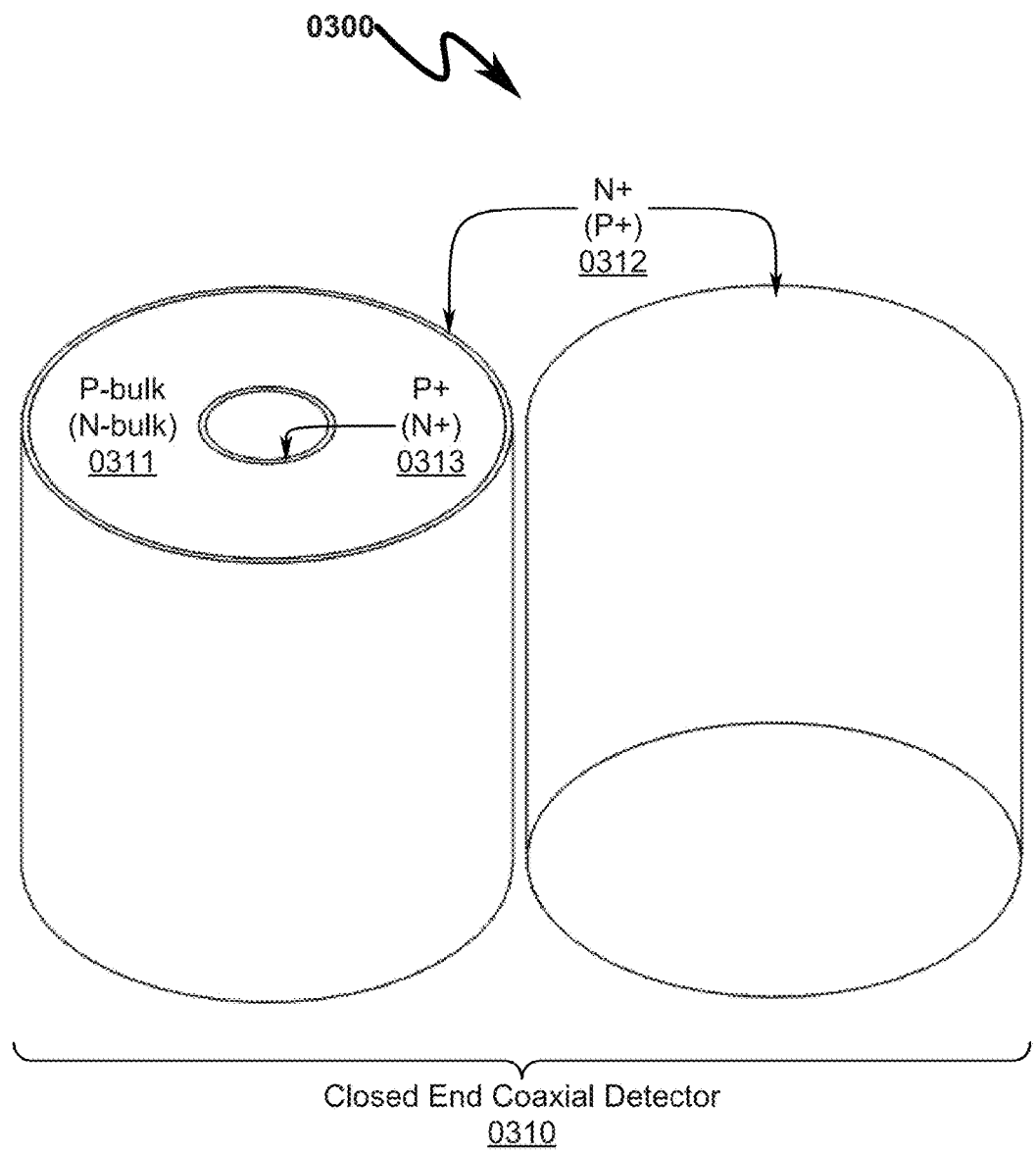
FIG. 3 illustrates top and bottom right front perspective views of a prior art closed end coaxial radiation detector.
Figure 4:
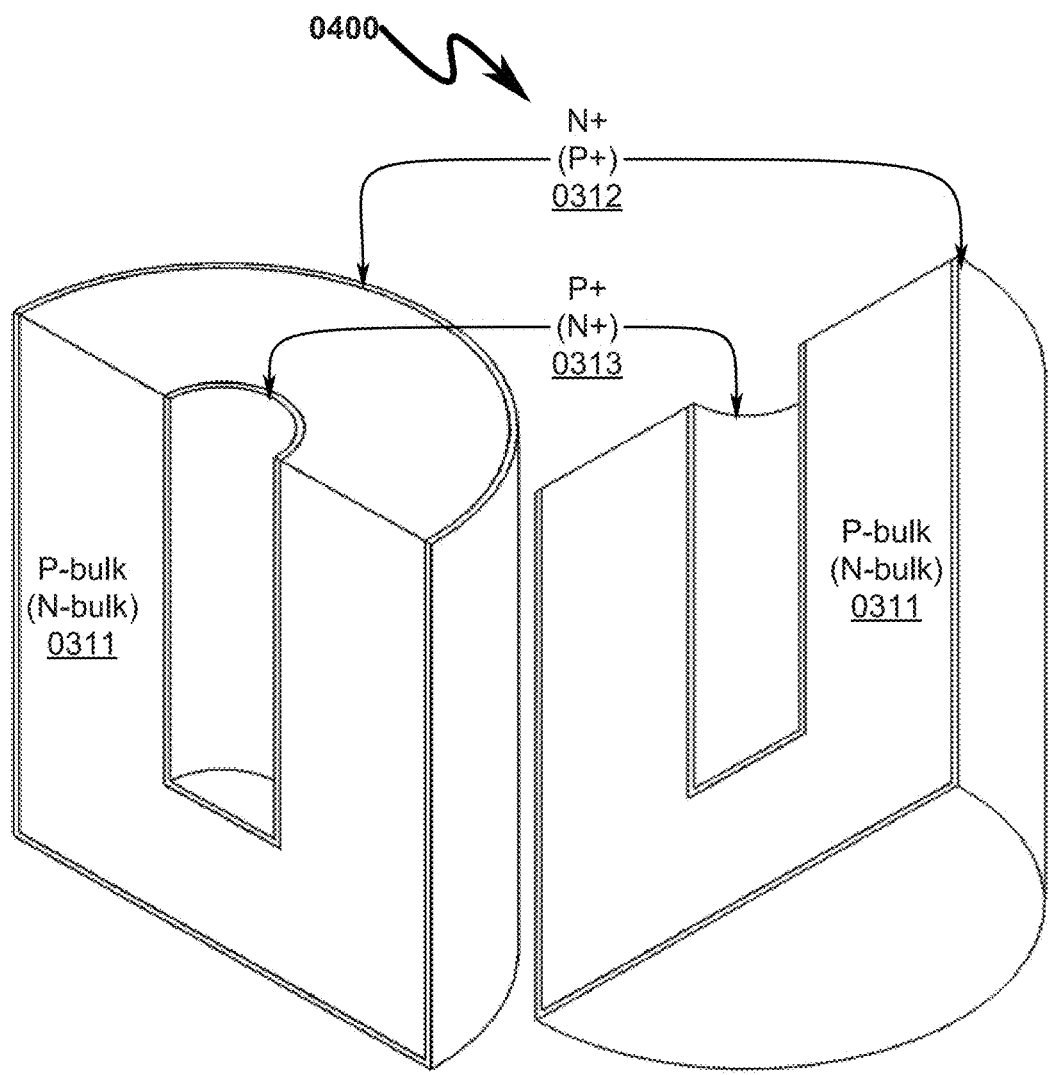
FIG. 4 illustrates top and bottom right front perspective front section views of a prior art closed end coaxial radiation detector.
Figure 5:
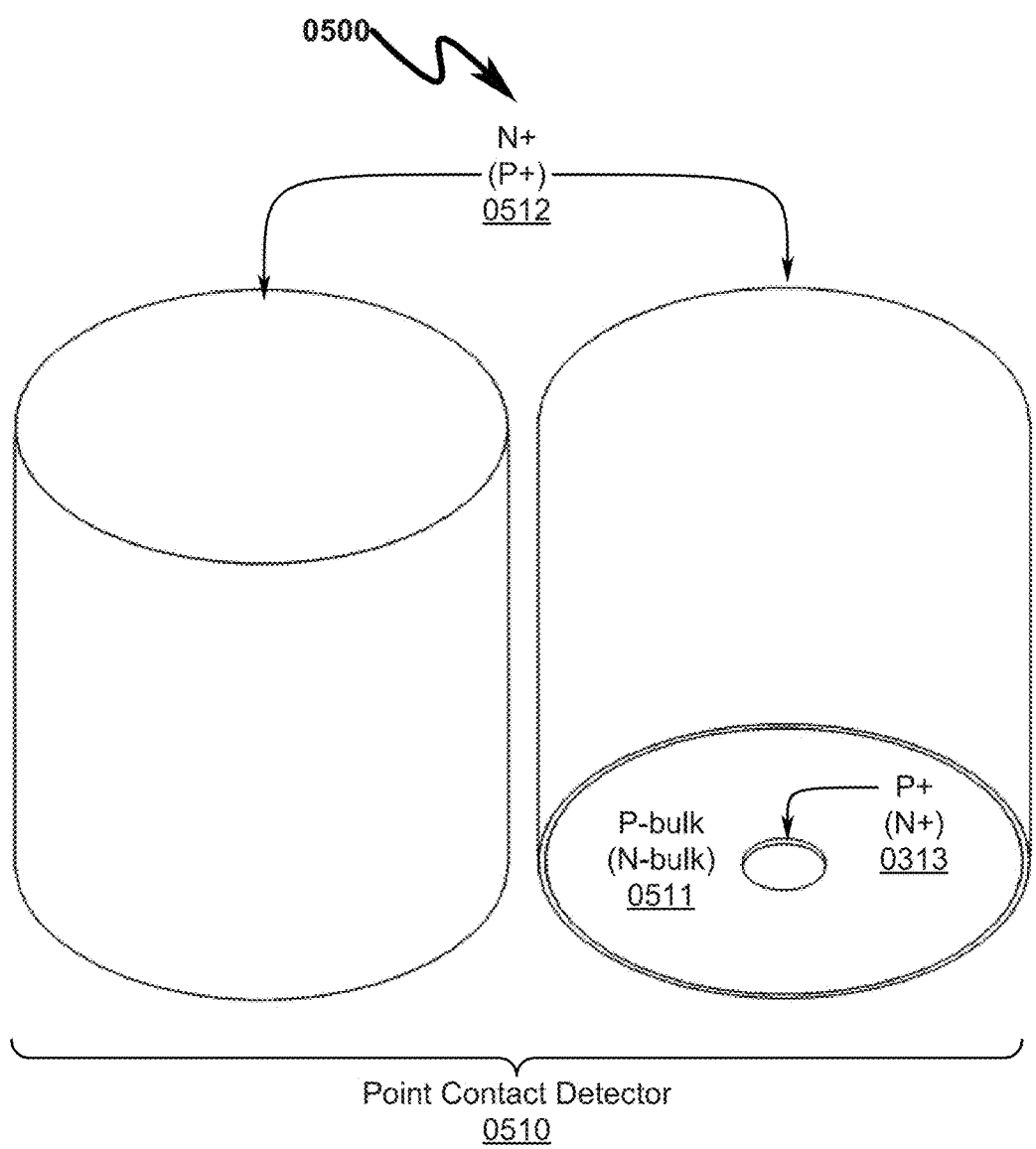
FIG. 5 illustrates top and bottom right front perspective views of a prior art point contact radiation detector.
Figure 6:
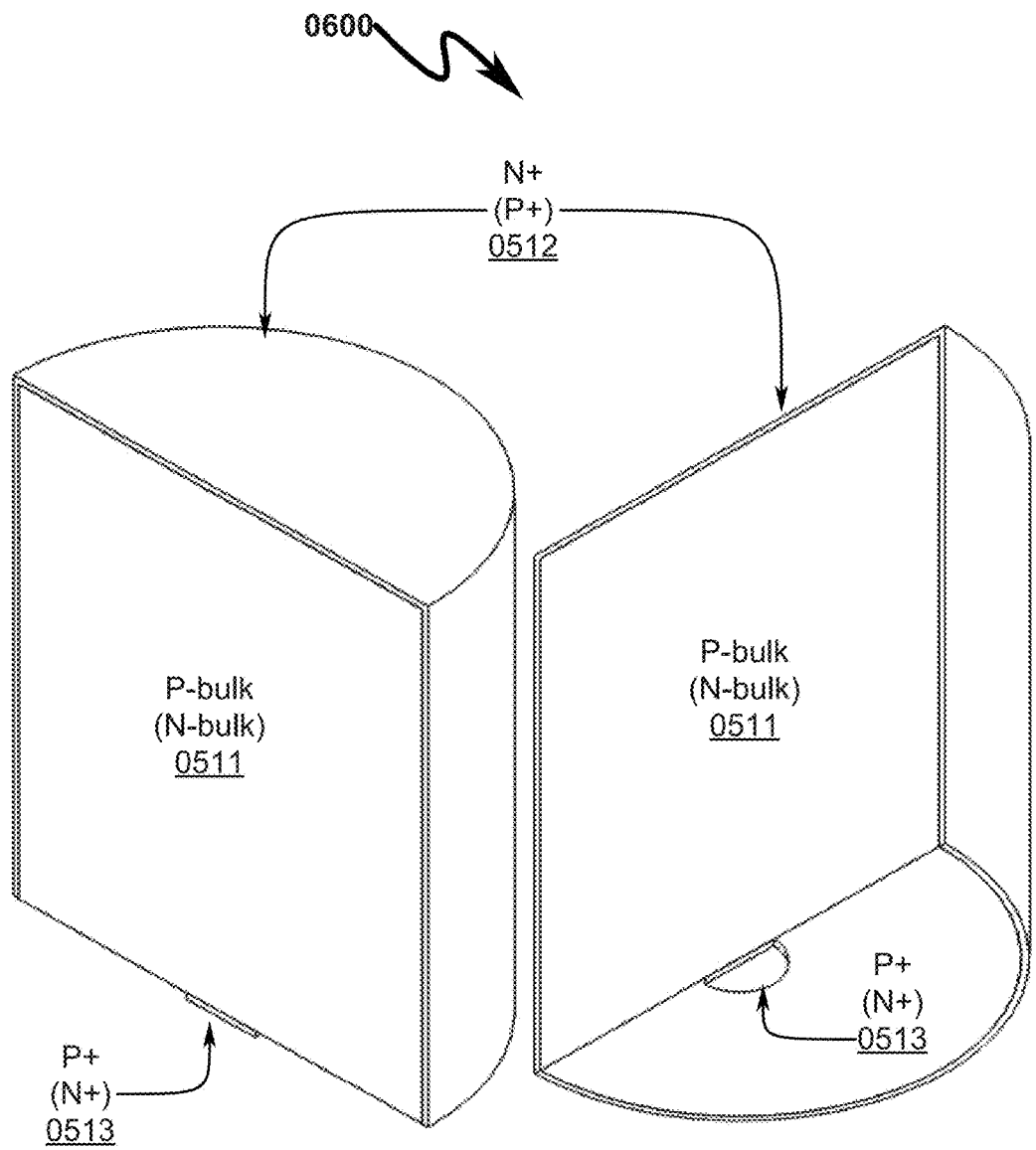
FIG. 6 illustrates top and bottom right front perspective front section views of a prior art point contact radiation detector.
Figure 7:
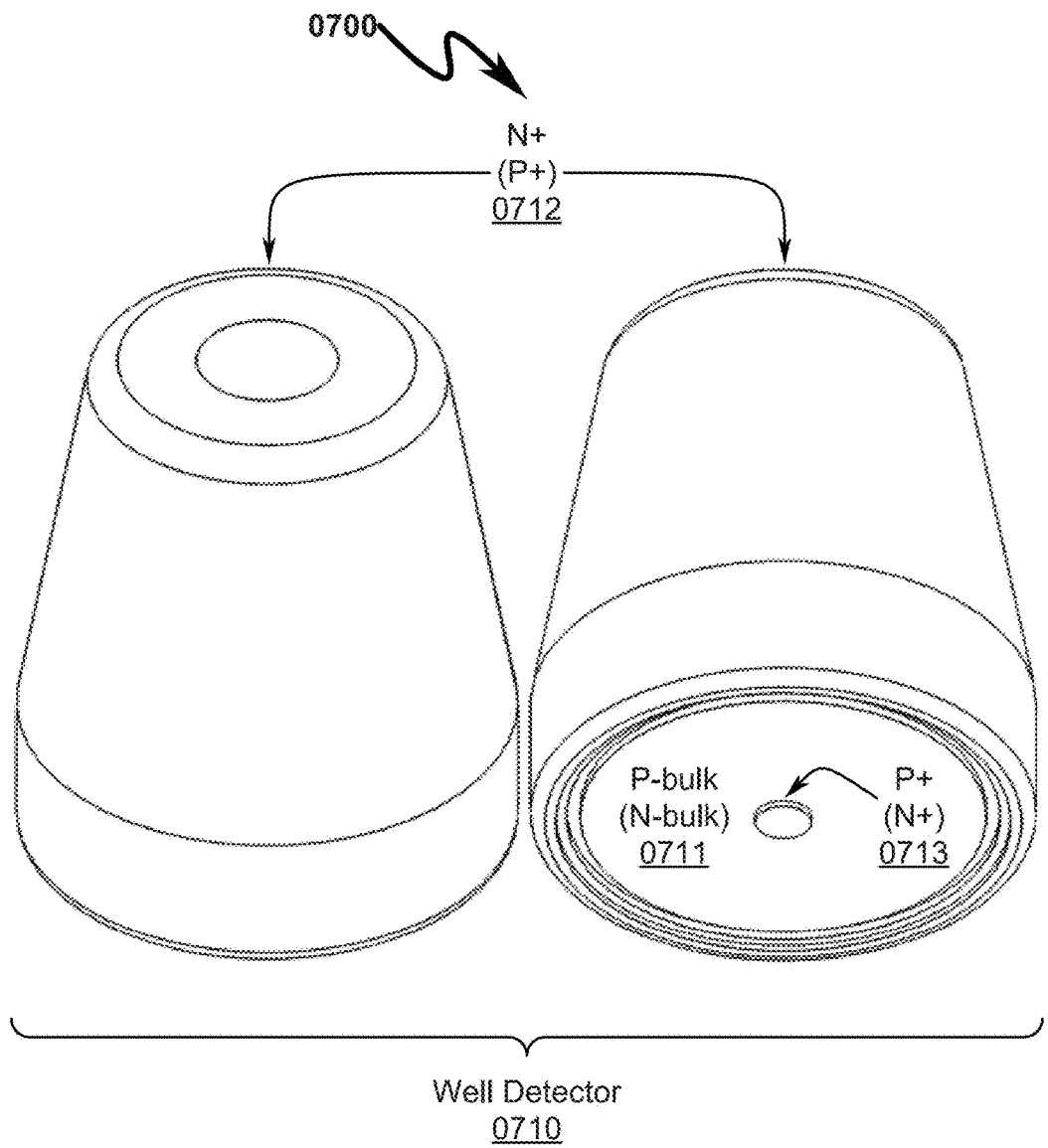
FIG. 7 illustrates top and bottom right front perspective views of a prior art well radiation detector.
Figure 8:
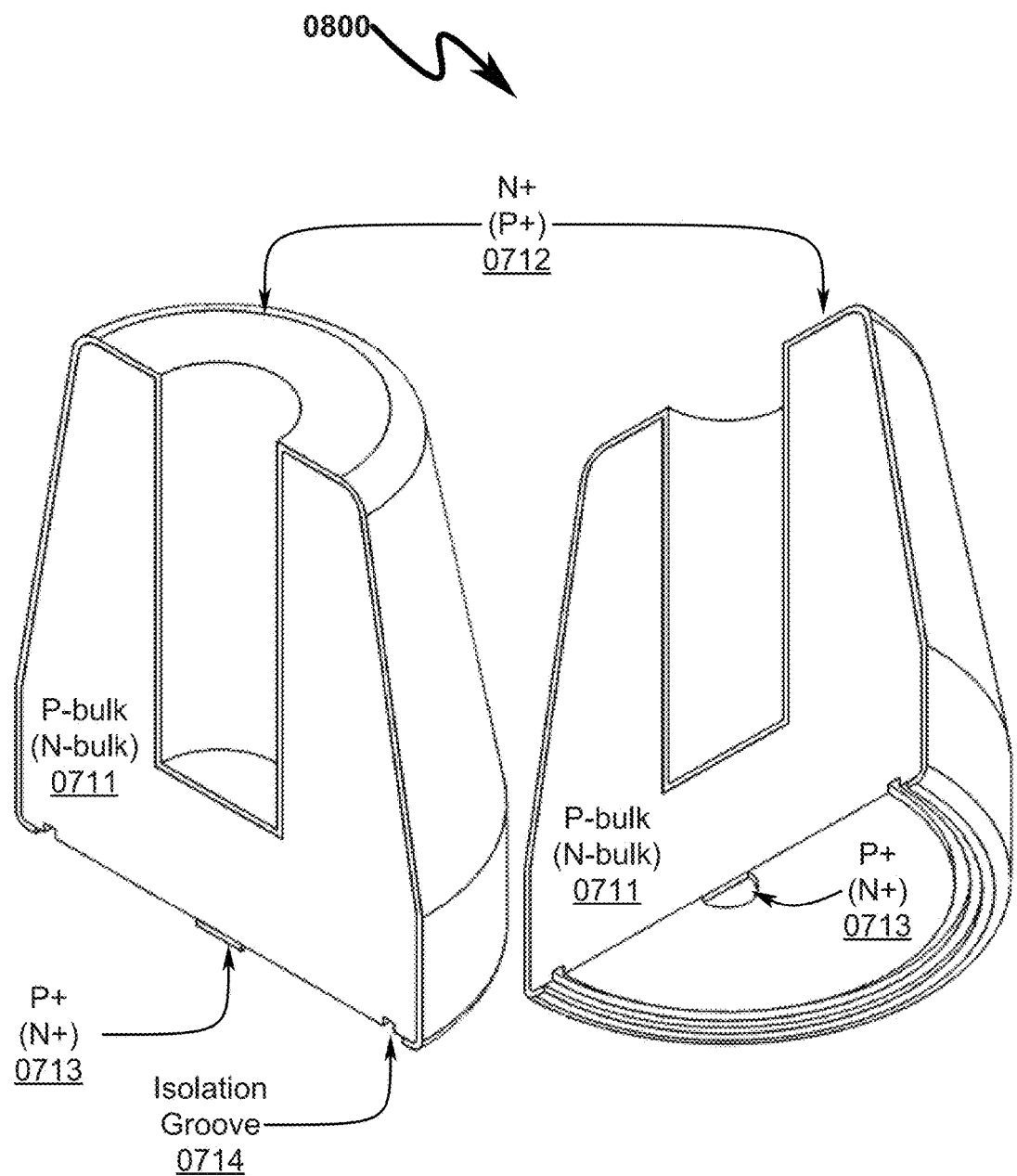
FIG. 8 illustrates top and bottom right front perspective front section views of a prior art well radiation detector.
Figure 9:
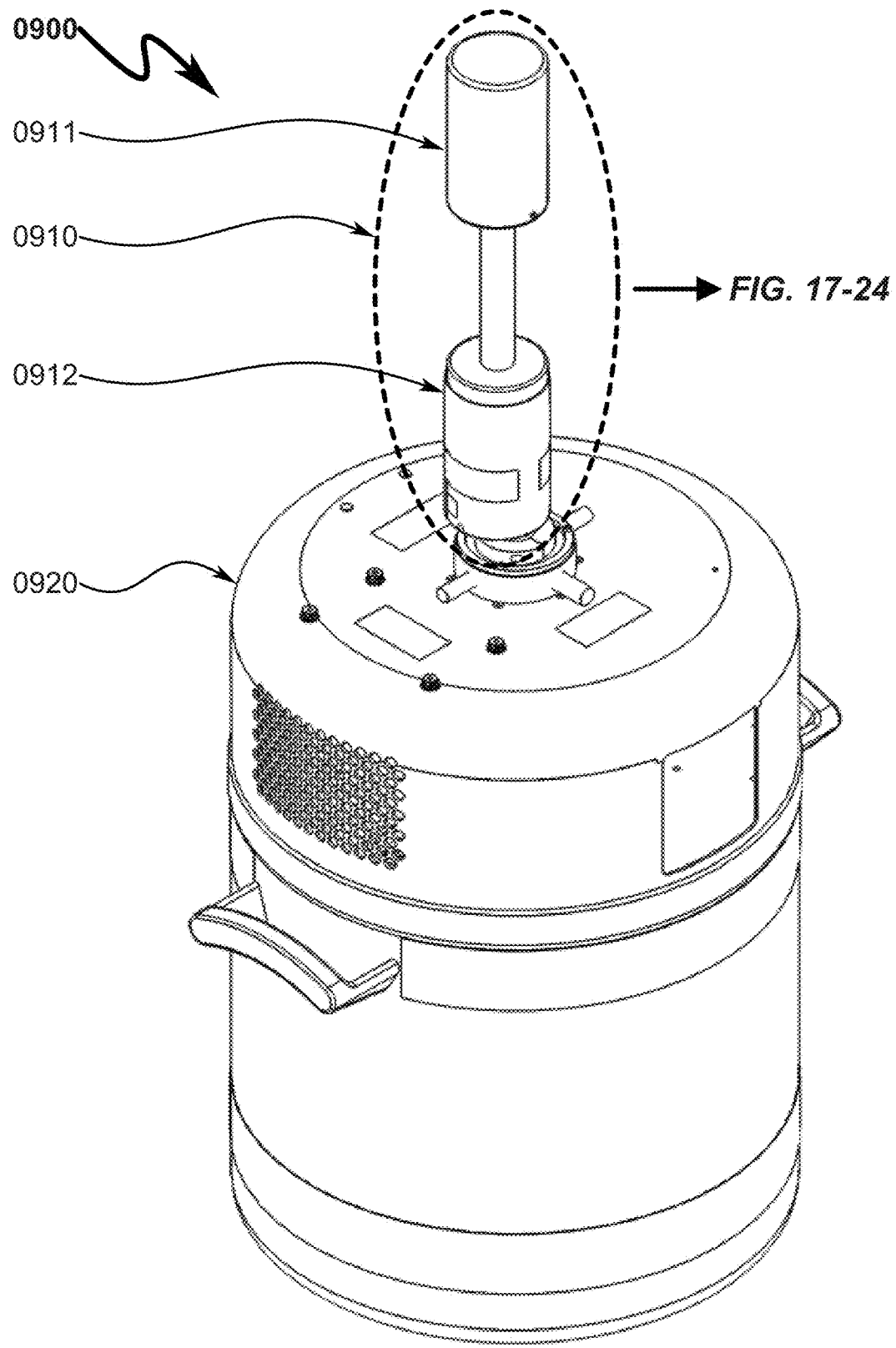
FIG. 9 illustrates a top right front perspective view of a typical application context for the present invention as applied to a combined radiation detector and cryostat apparatus.
Figure 10:
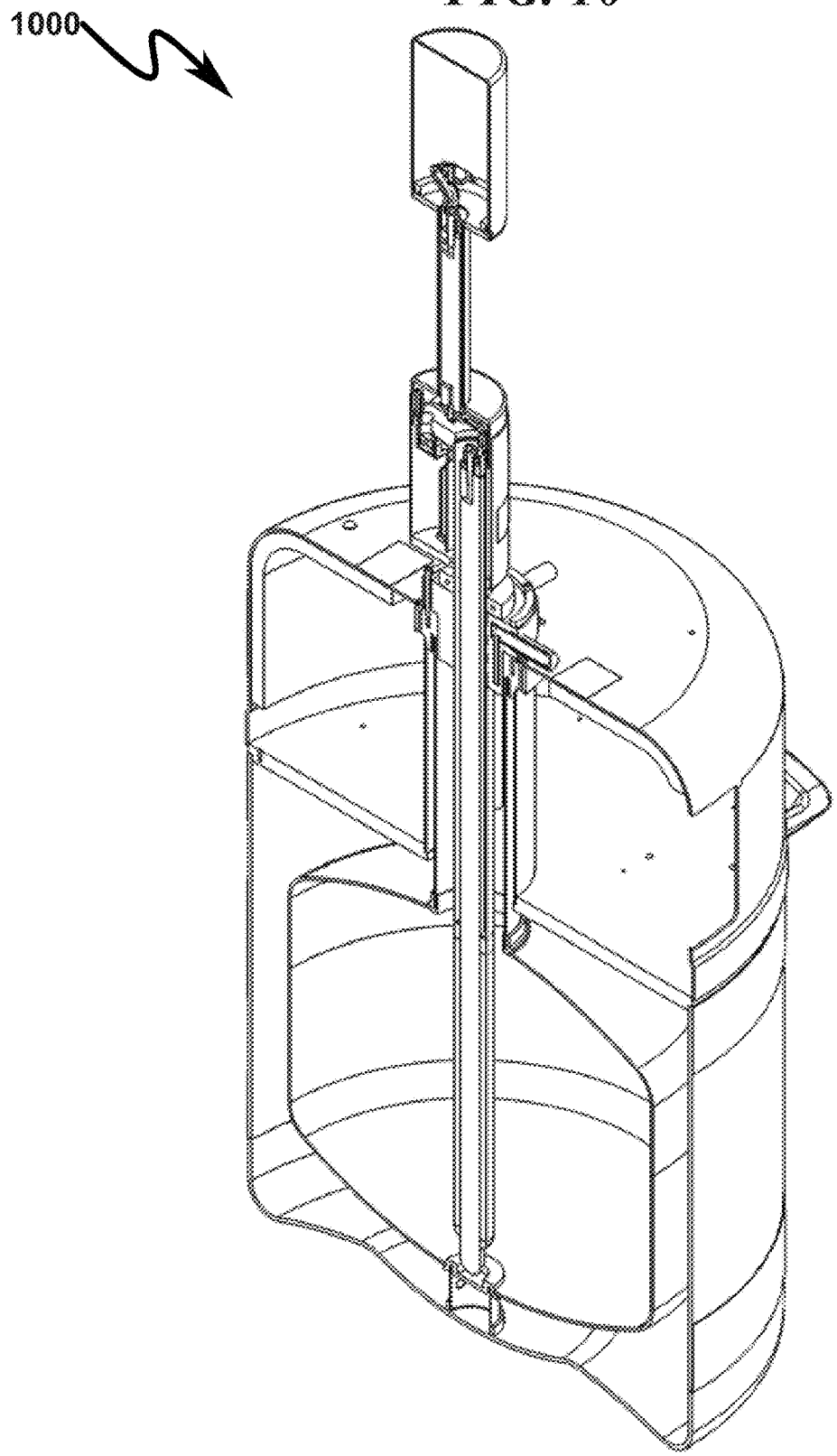
FIG. 10 illustrates a top right front perspective front side section view of a typical application context for the present invention as applied to a combined radiation detector and cryostat apparatus.
Figure 11:
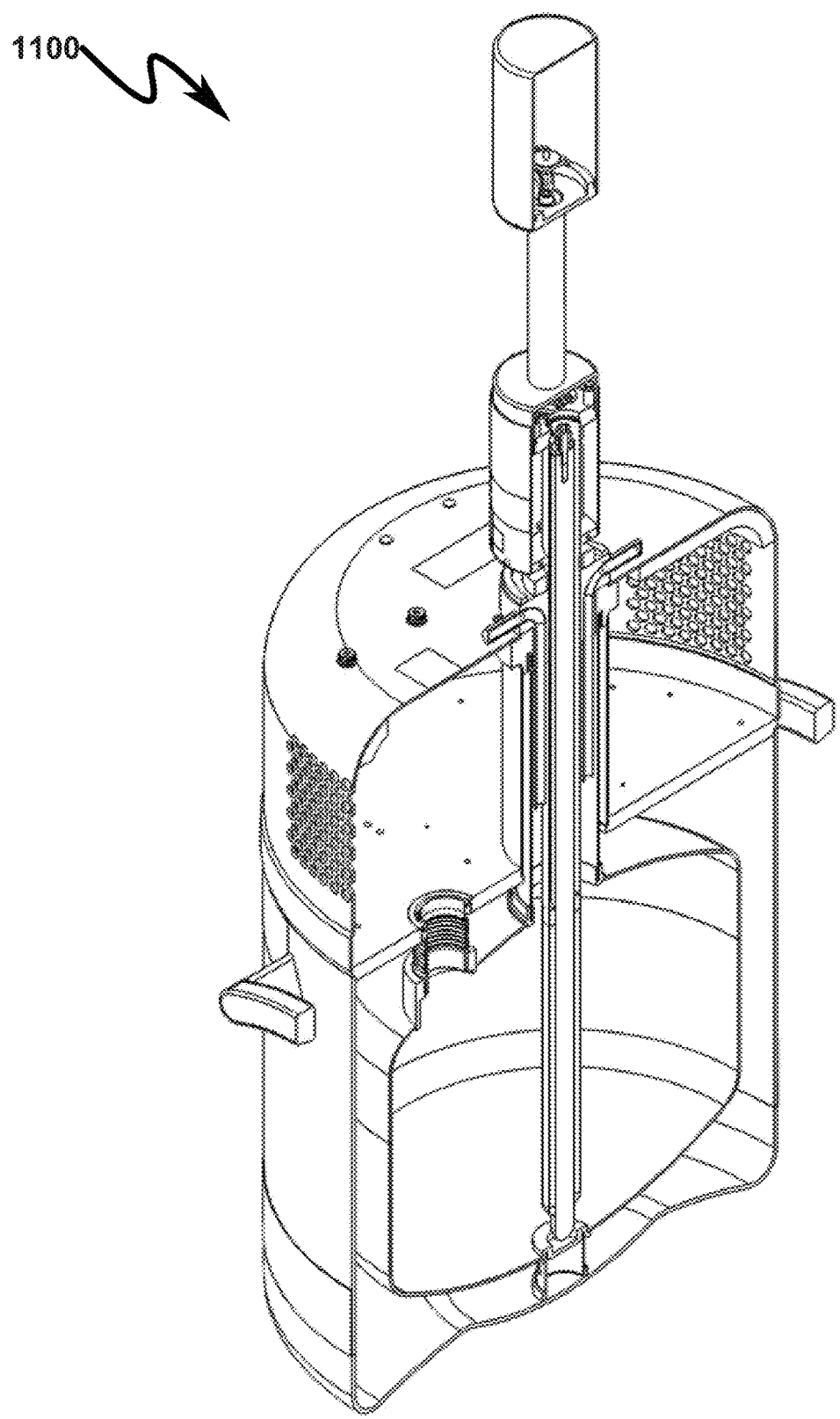
FIG. 11 illustrates a top right front perspective right side section view of a typical application context for the present invention as applied to a combined radiation detector and cryostat apparatus.
Figure 12:
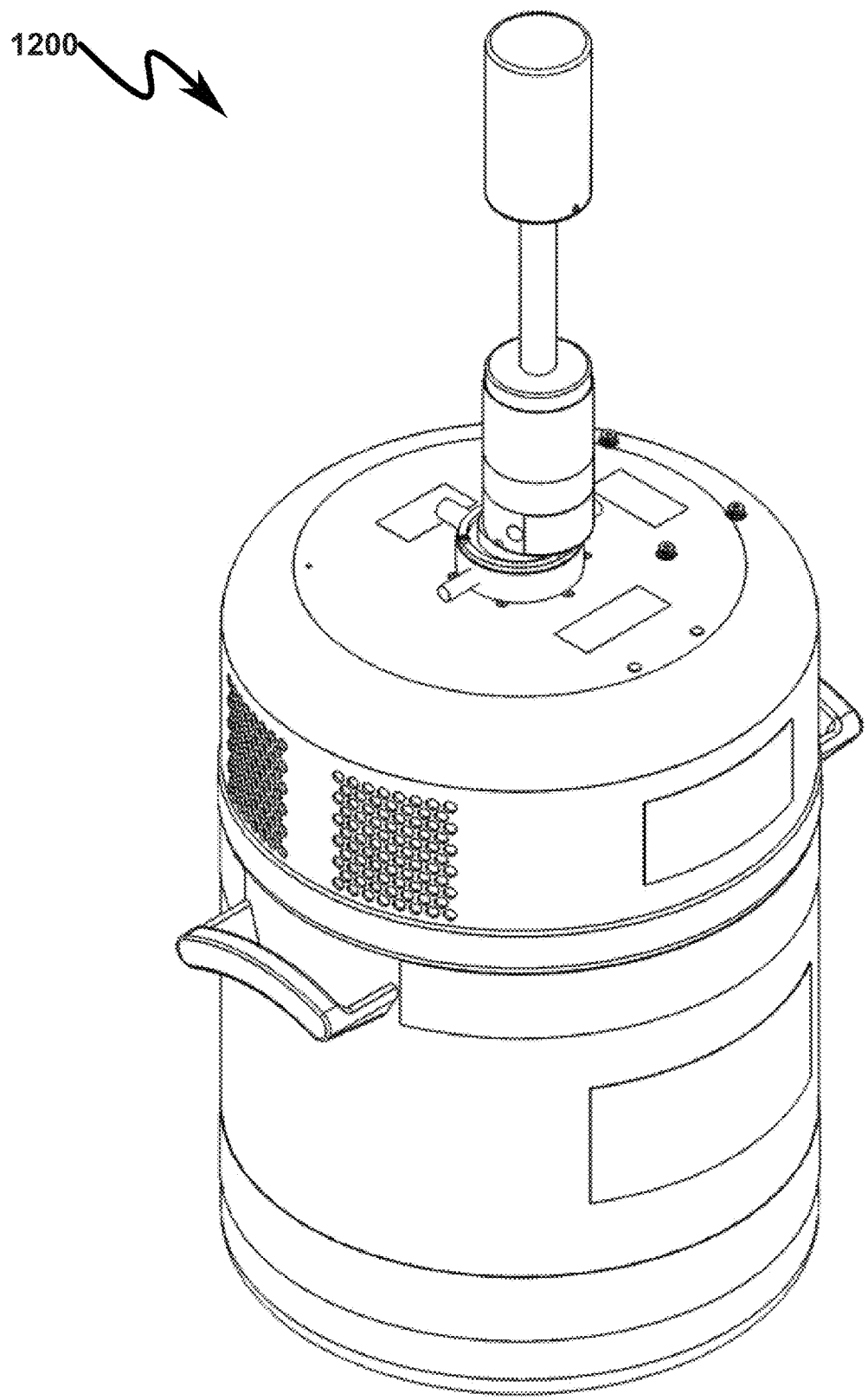
FIG. 12 illustrates a top left rear perspective view of a typical application context for the present invention as applied to a combined radiation detector and cryostat apparatus.
Figure 13:
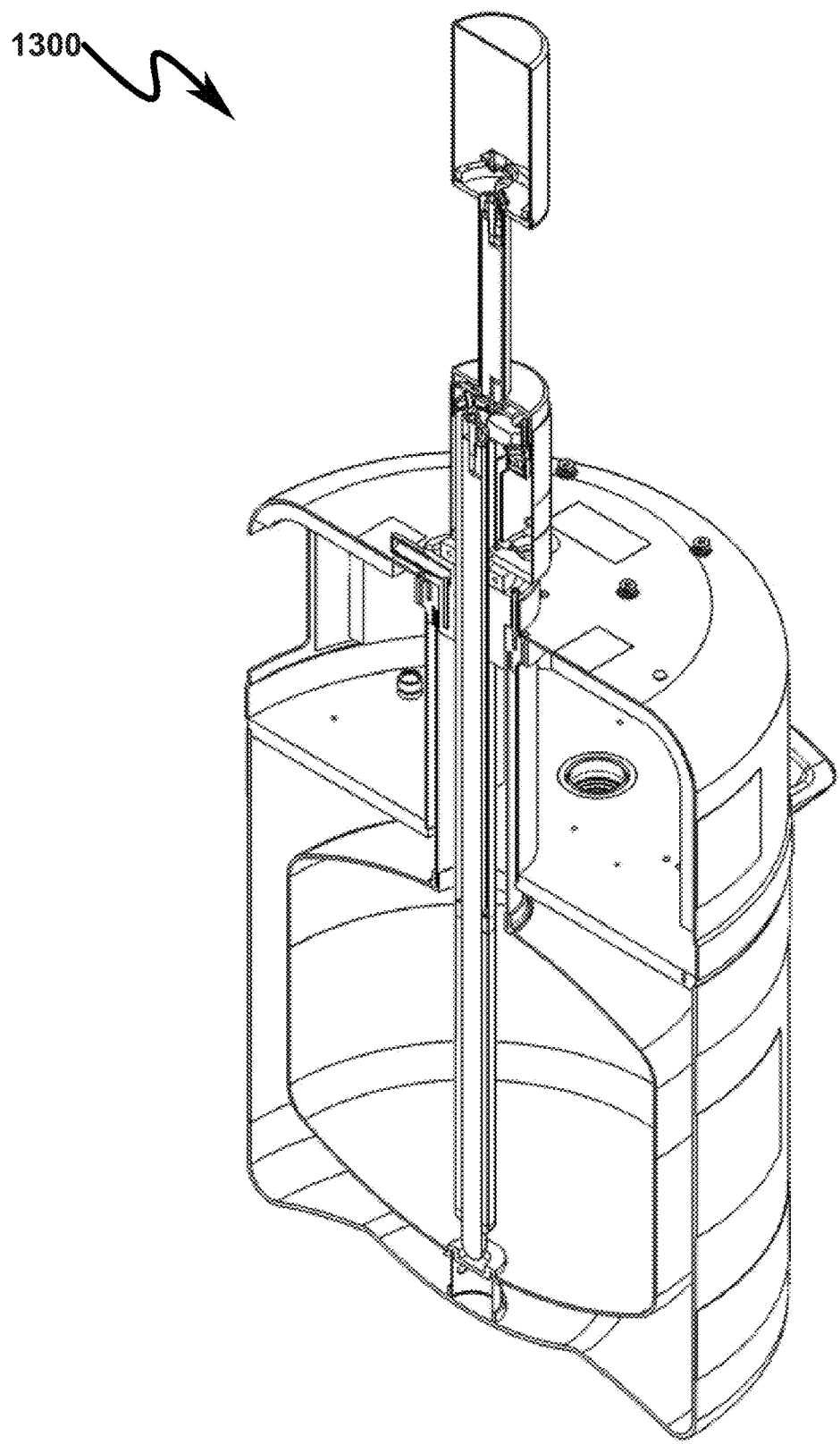
FIG. 13 illustrates a top left rear perspective rear side section view of a typical application context for the present invention as applied to a combined radiation detector and cryostat apparatus.
Figure 14:
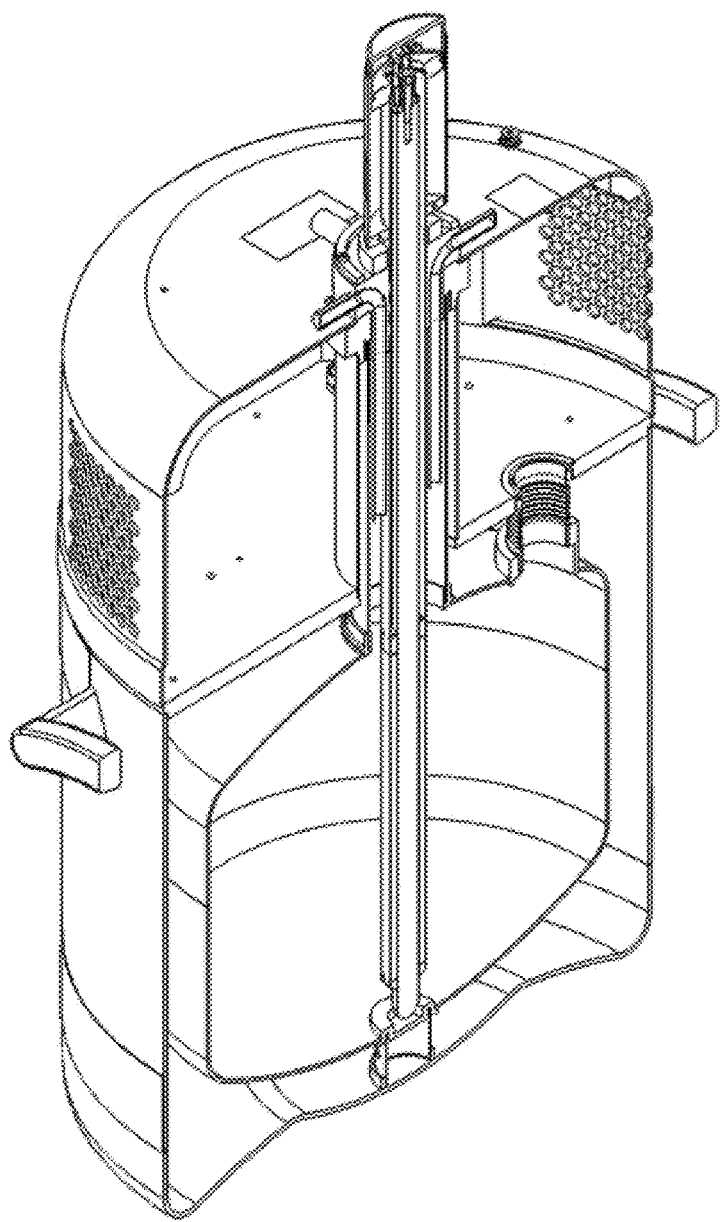
FIG. 14 illustrates a top left rear perspective left side section view of a typical application context for the present invention as applied to a combined radiation detector and cryostat apparatus.
Figure 15:
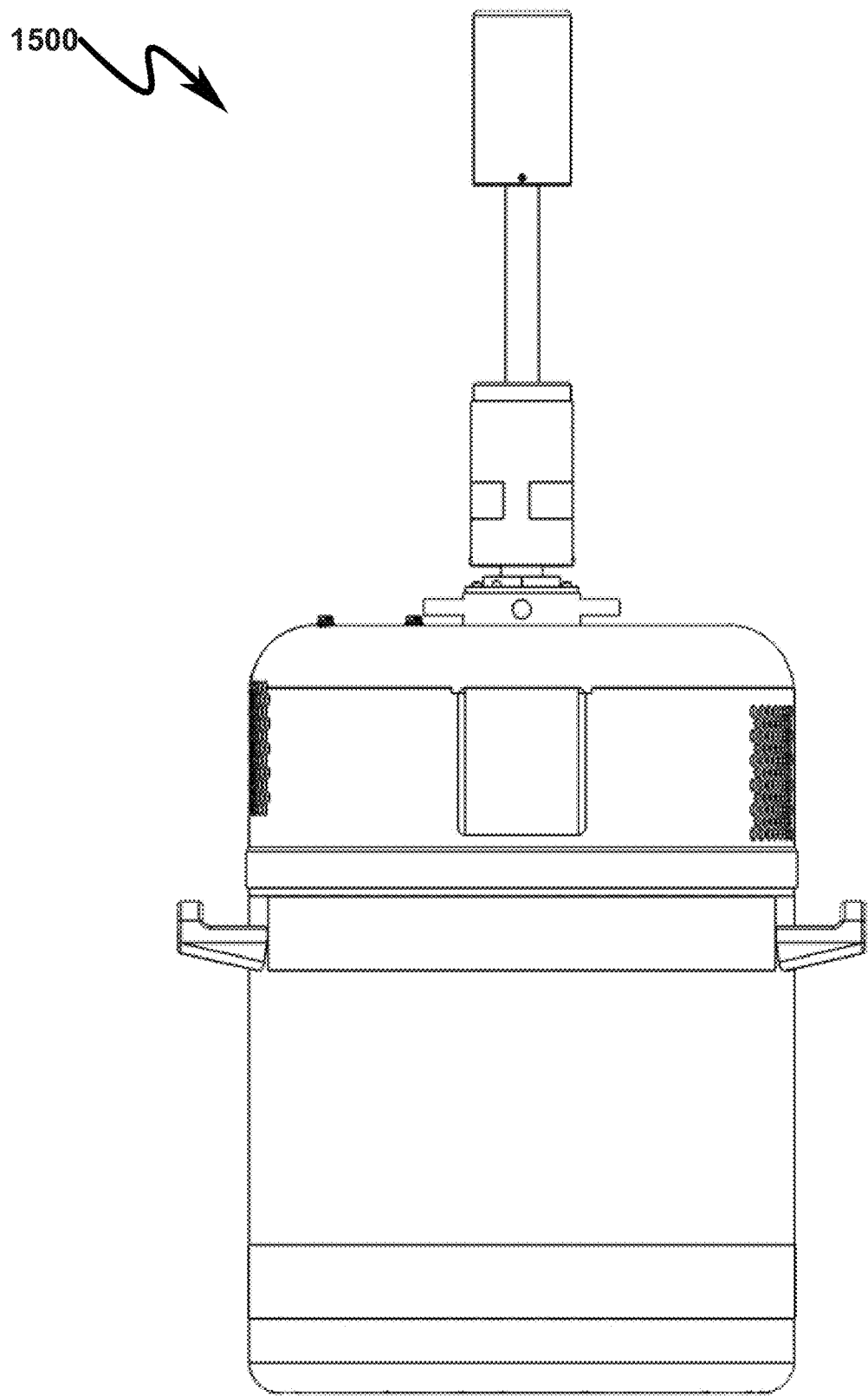
FIG. 15 illustrates a front side view of a typical application context for the present invention as applied to a combined radiation detector and cryostat apparatus.
Figure 16:
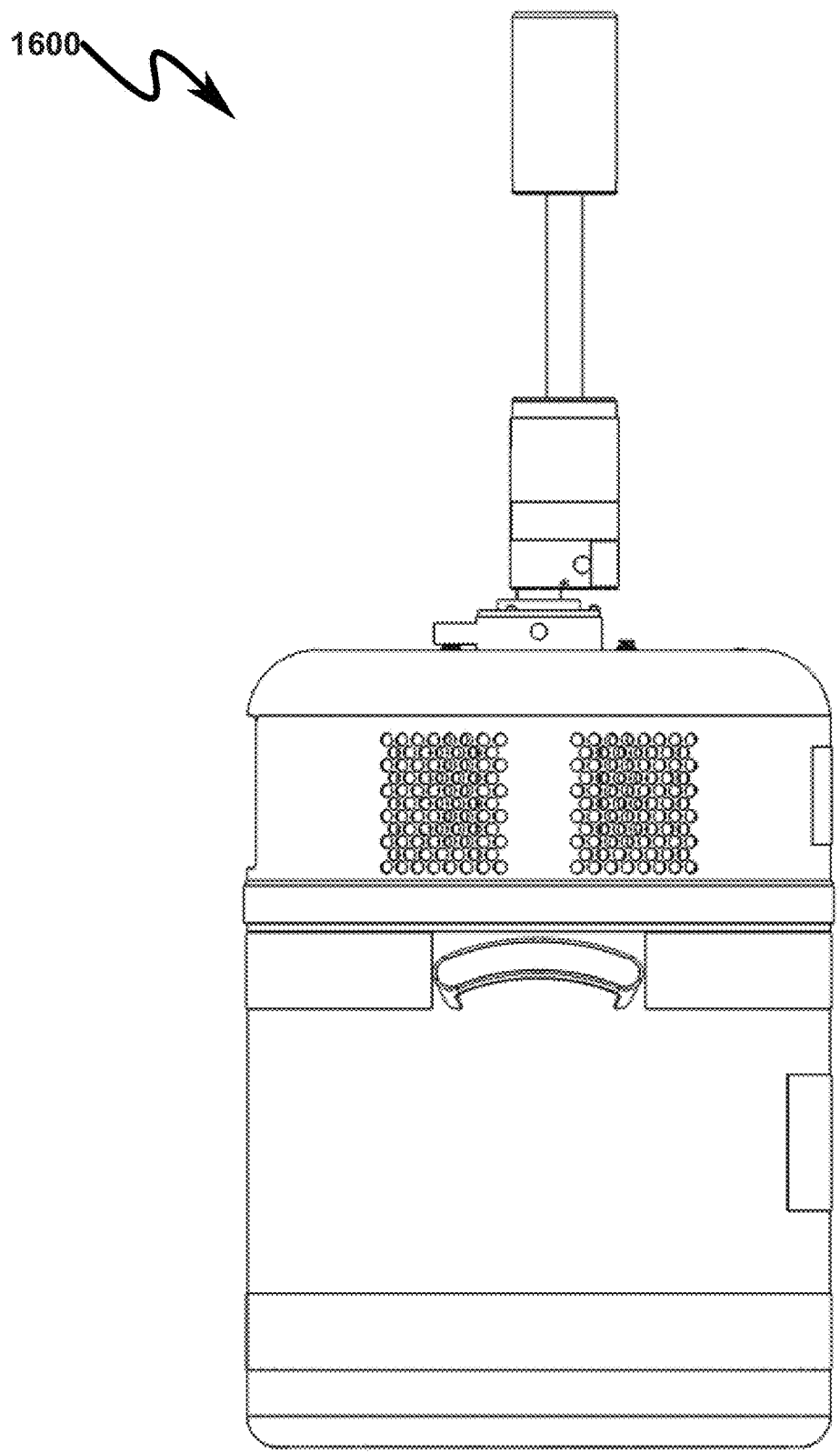
FIG. 16 illustrates a right side view of a typical application context for the present invention as applied to a combined radiation detector and cryostat apparatus.
Figure 17:
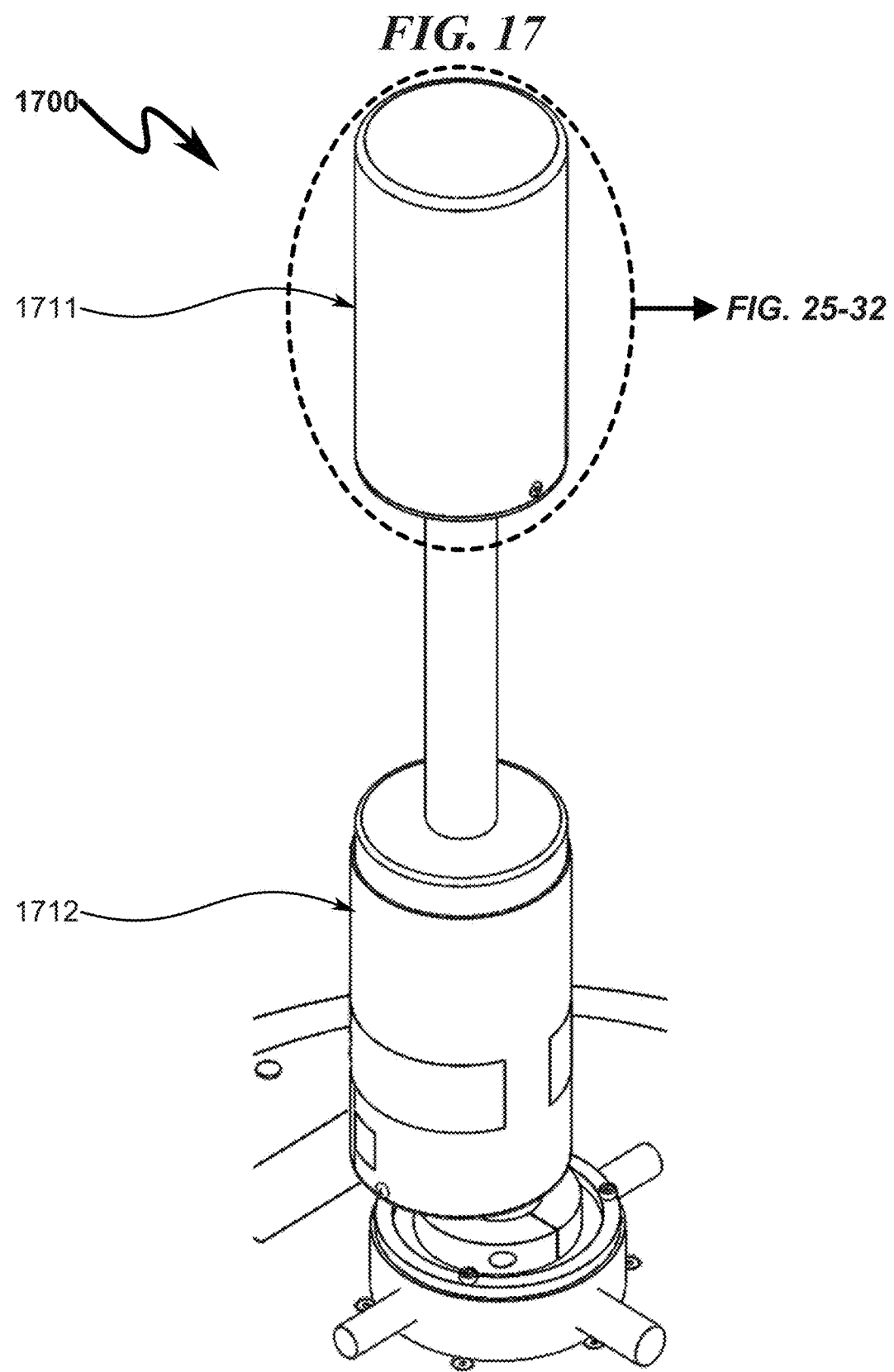
FIG. 17 illustrates a top right front perspective detector/chamber detail view of a typical application context for the present invention as applied to a combined radiation detector and cryostat apparatus.
Figure 18:
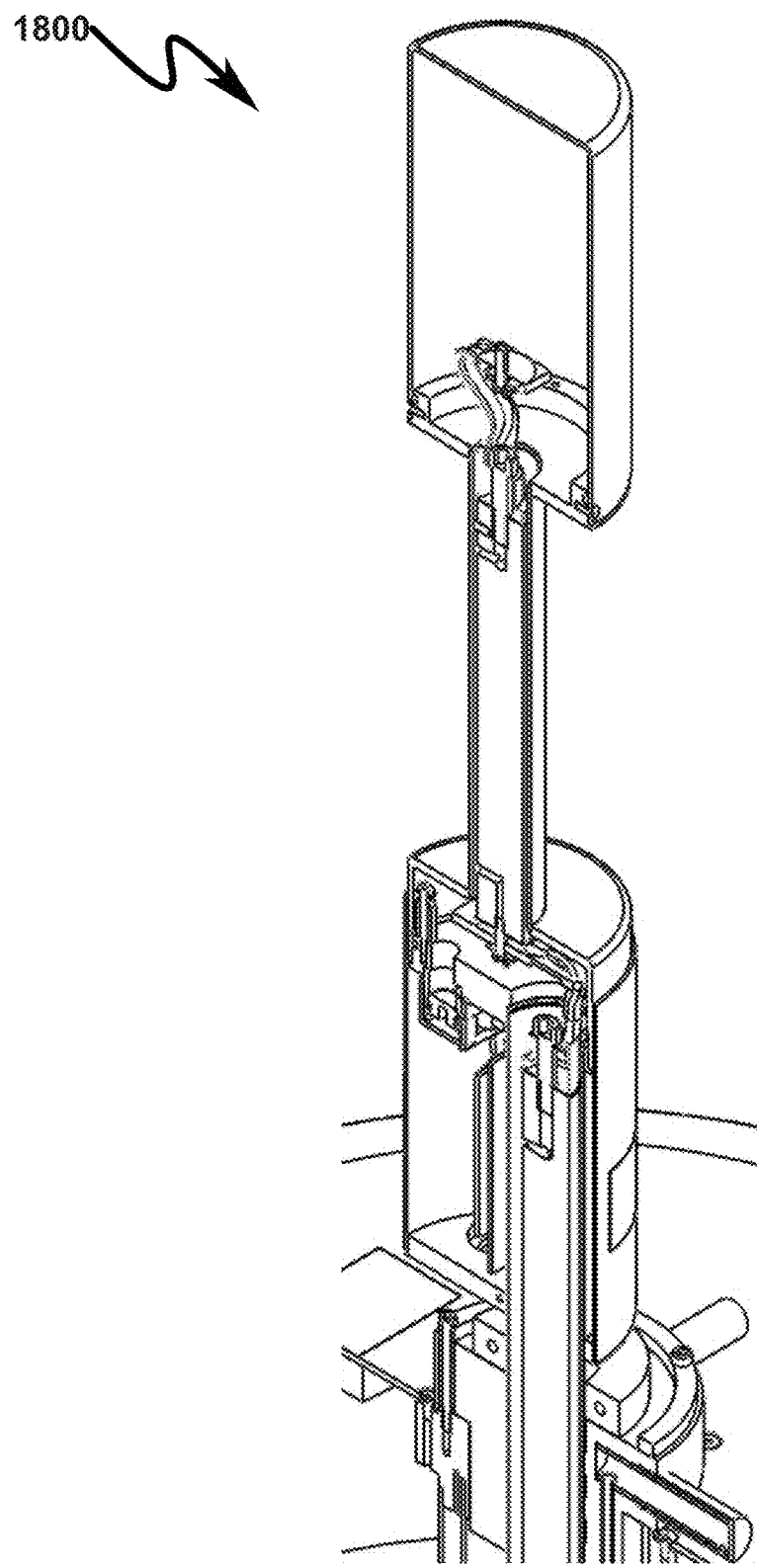
FIG. 18 illustrates a top right front perspective front side section detector/chamber detail view of a typical application context for the present invention as applied to a combined radiation detector and cryostat apparatus.
Figure 19:
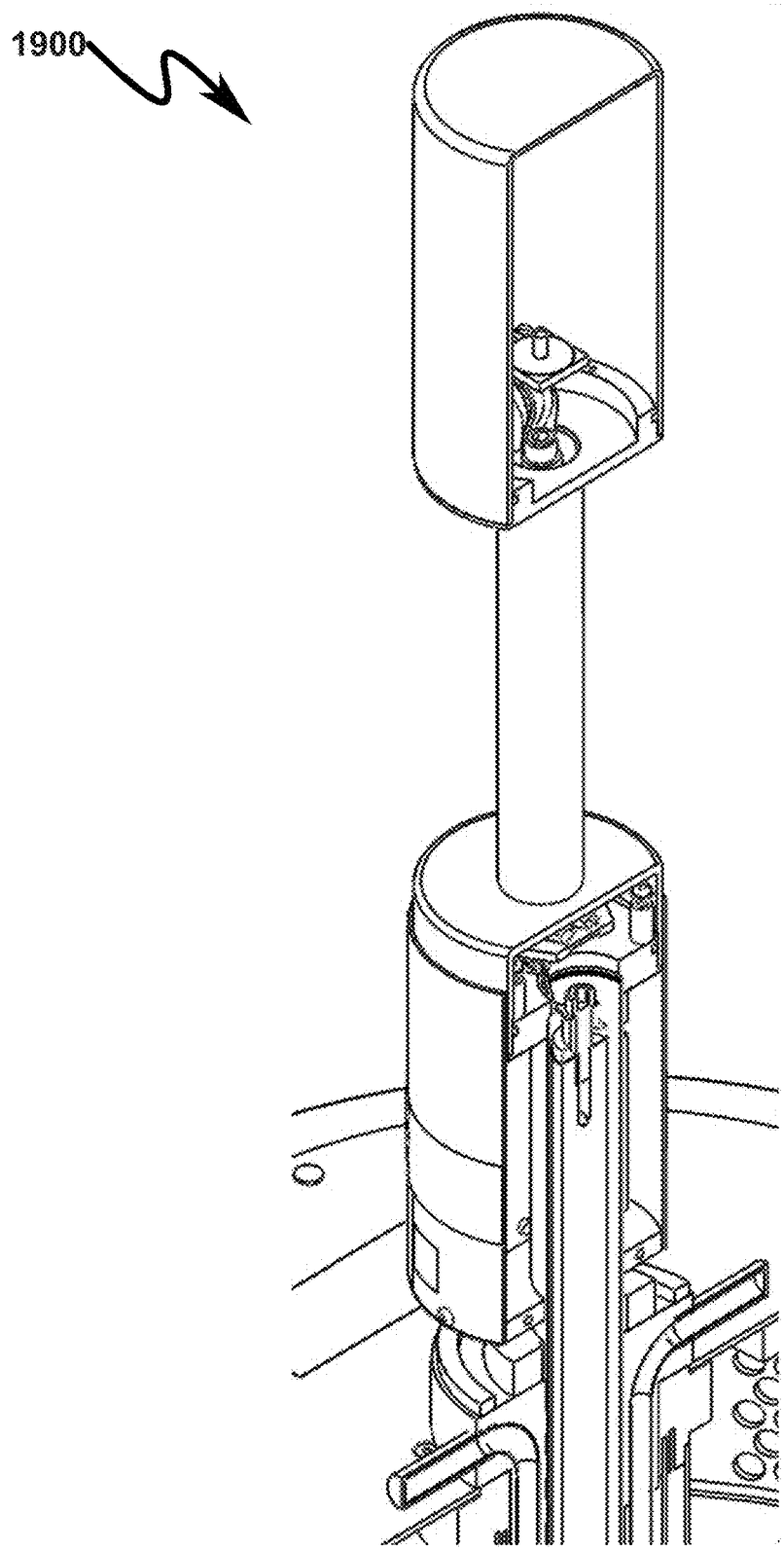
FIG. 19 illustrates a top right front perspective right side section detector/chamber detail view of a typical application context for the present invention as applied to a combined radiation detector and cryostat apparatus.
Figure 20:
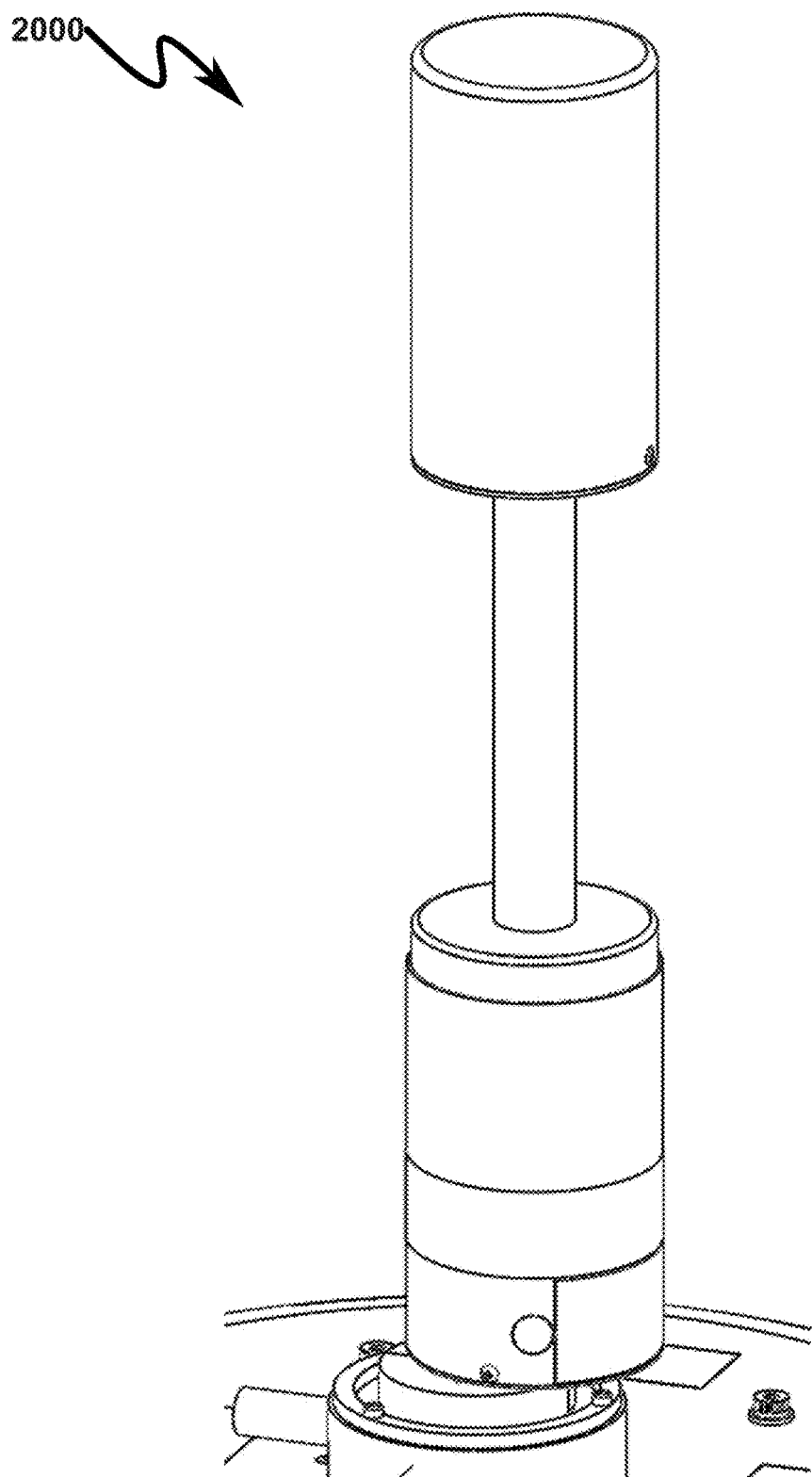
FIG. 20 illustrates a top left rear perspective detector/chamber detail view of a typical application context for the present invention as applied to a combined radiation detector and cryostat apparatus.
Figure 21:
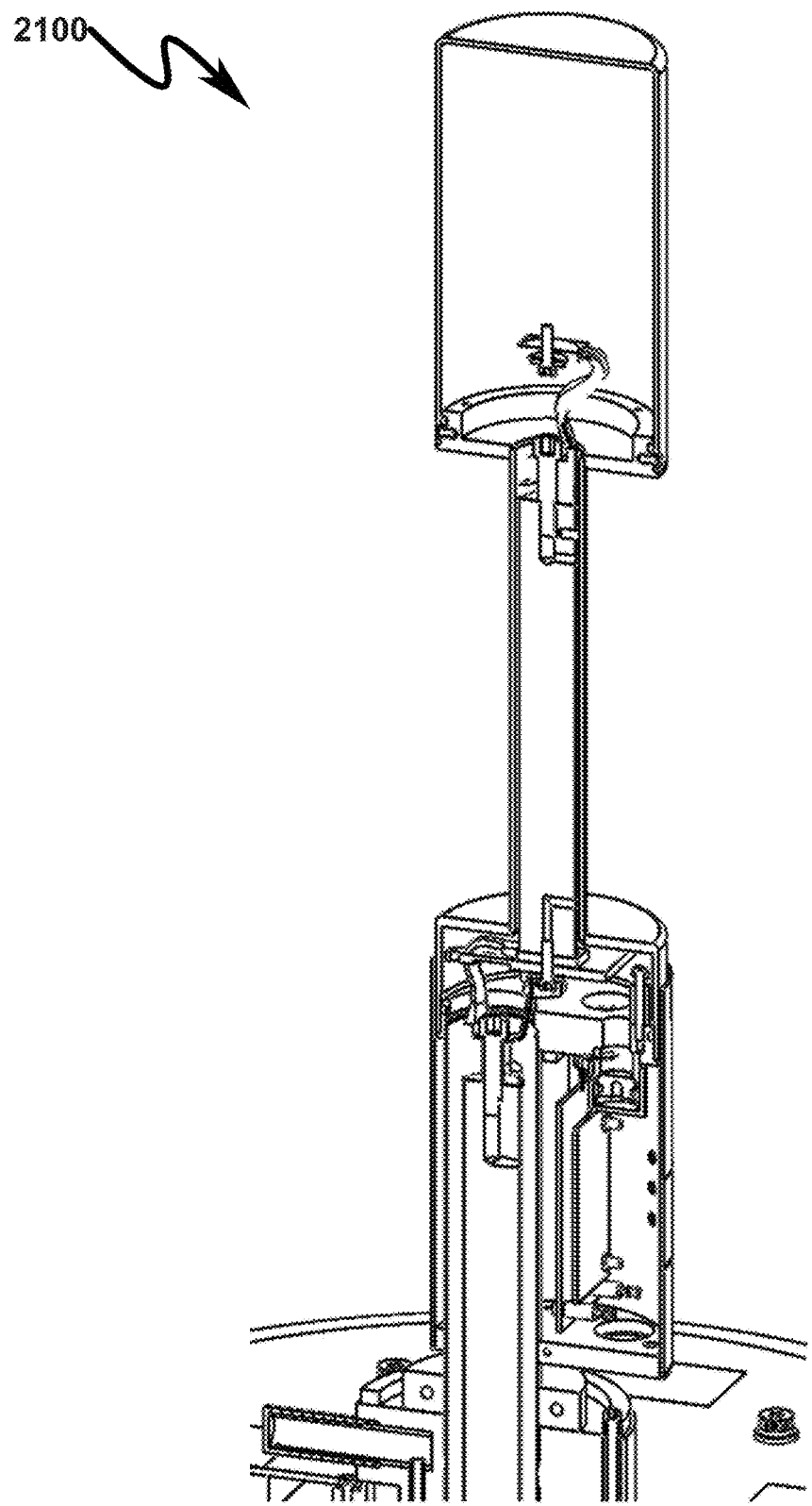
FIG. 21 illustrates a top left rear perspective rear side section detector/chamber detail view of a typical application context for the present invention as applied to a combined radiation detector and cryostat apparatus.
Figure 22:
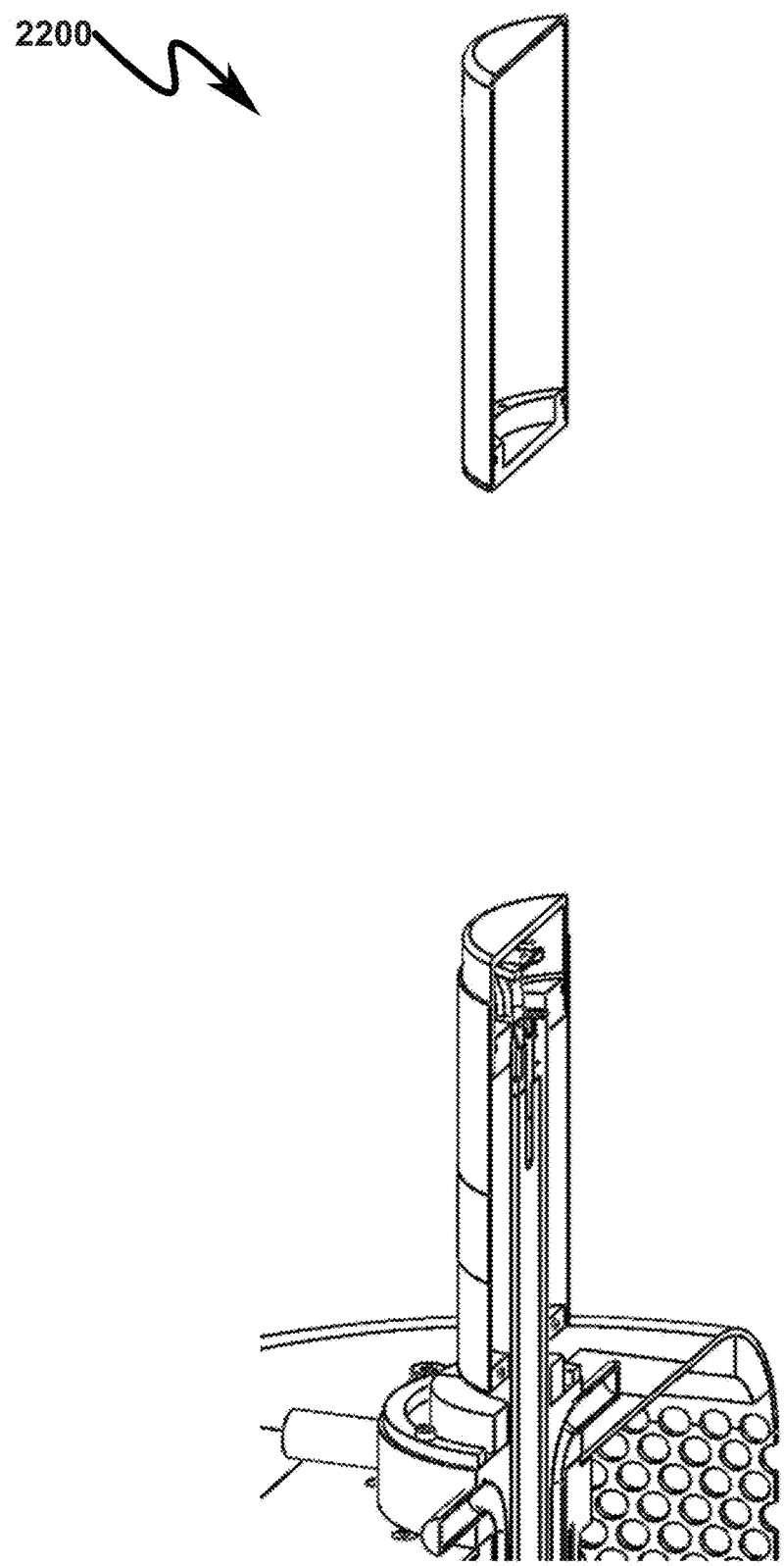
FIG. 22 illustrates a top left rear perspective left side section detector/chamber detail view of a typical application context for the present invention as applied to a combined radiation detector and cryostat apparatus.
Figure 23:
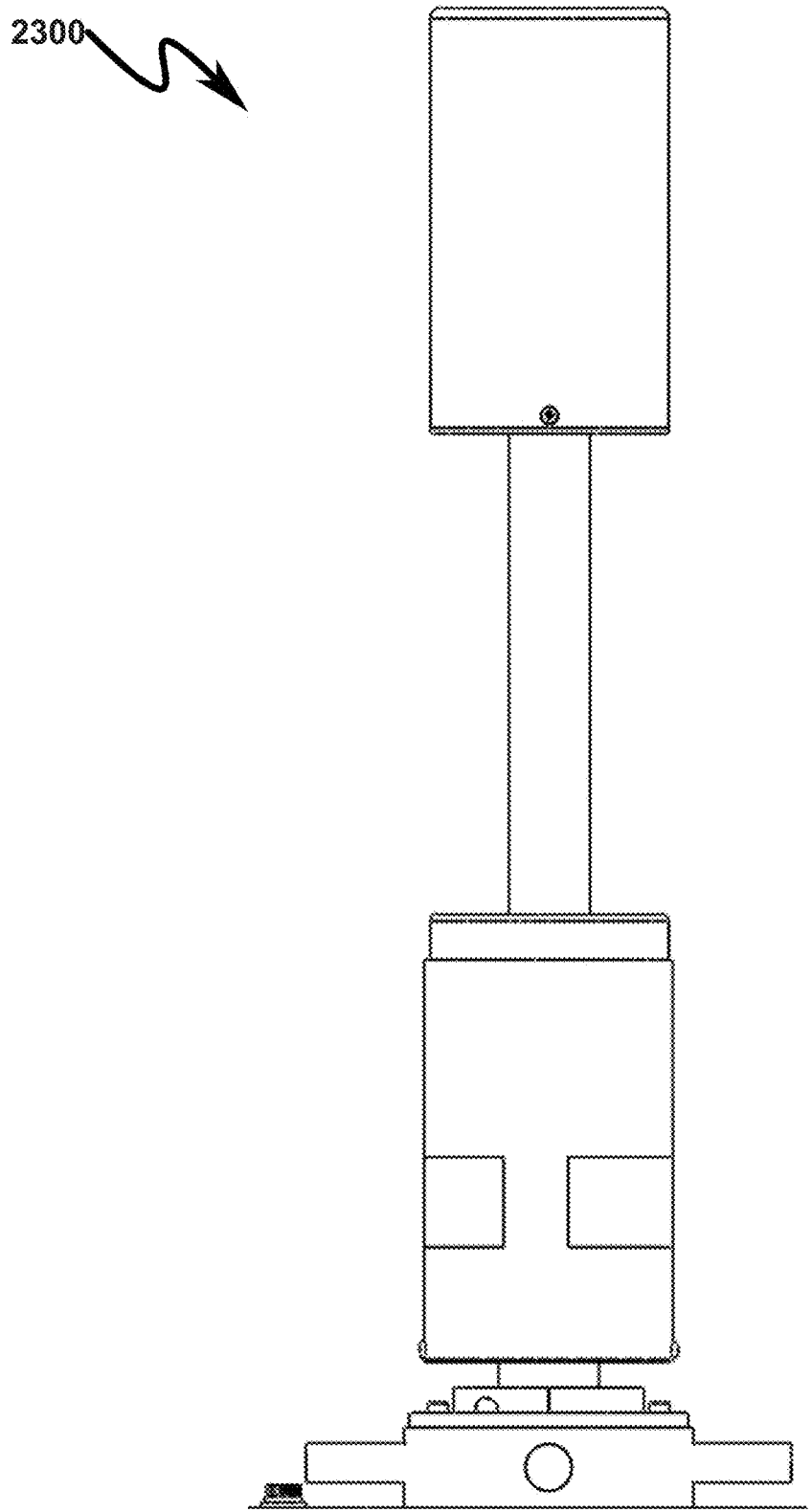
FIG. 23 illustrates a front side detector/chamber detail view of a typical application context for the present invention as applied to a combined radiation detector and cryostat apparatus.
Figure 24:
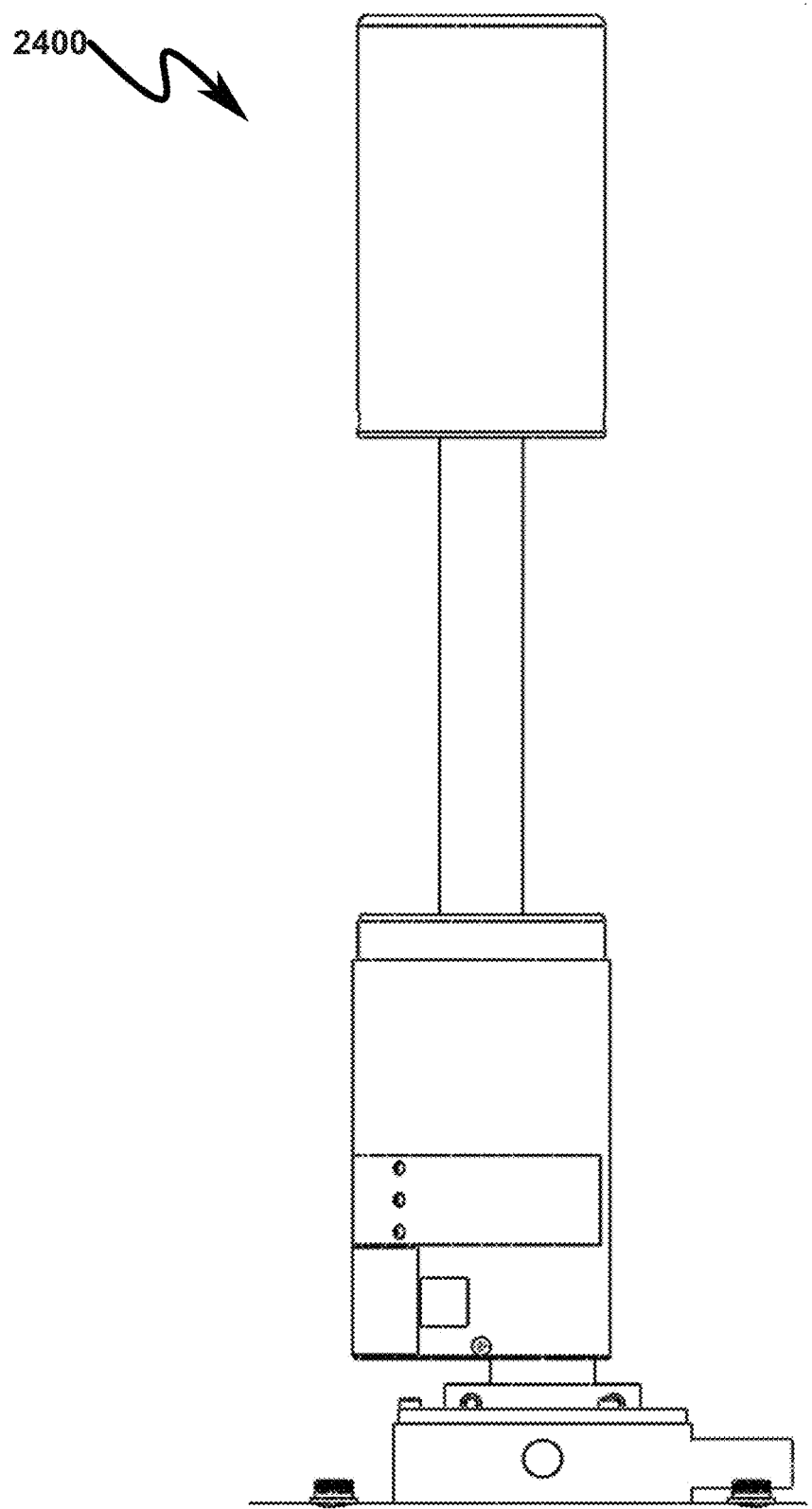
FIG. 24 illustrates a right side detector/chamber detail view of a typical application context for the present invention as applied to a combined radiation detector and cryostat apparatus.
Figure 32:
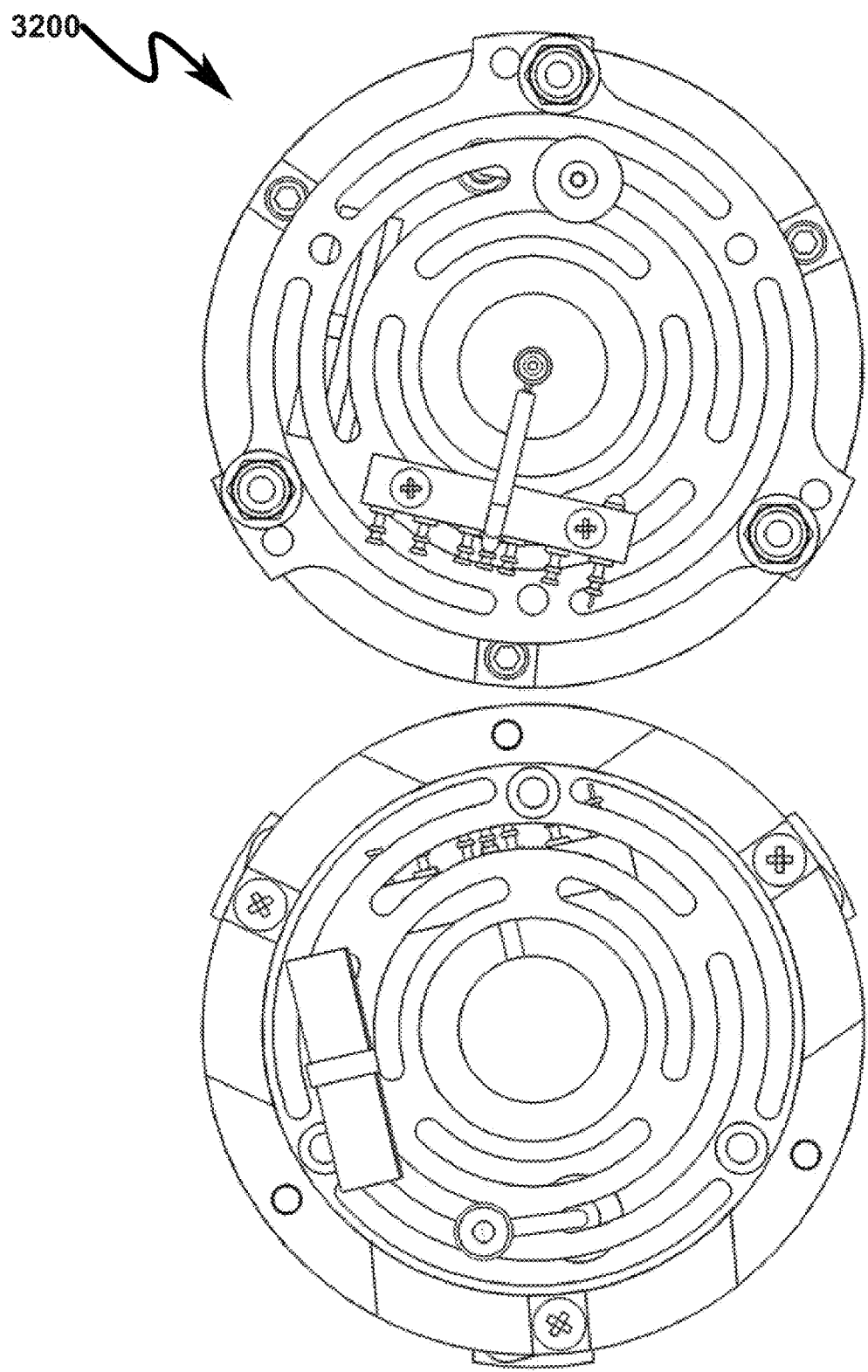
FIG. 32 illustrates a top and bottom detector assembly detail views of a typical application context for the present invention as applied to a combined radiation detector and cryostat apparatus (detector cover, detector retainer, and detector removed)

The present invention may be implemented in a variety of application contexts but a preferred application context is provided as detailed in FIG. 9 (0900)-FIG. 32 (3200) in which a detector/chamber assembly (0910) is combined with a cryostat (0920) to form an integrated radiation detection system. Overview drawings of this assembly (0910, 0920) are provided in FIG. 9 (0900)-FIG. 16 (1600) with detail views of the detector/chamber (0911, 1711/0912,1712) provided in FIG. 17 (1700)-FIG. 24 (2400) and breakdown views of the detector assembly (0911, 1711, 2511) provided in FIG. 25 (2500)-FIG. 32 (3200).

Figure 25:
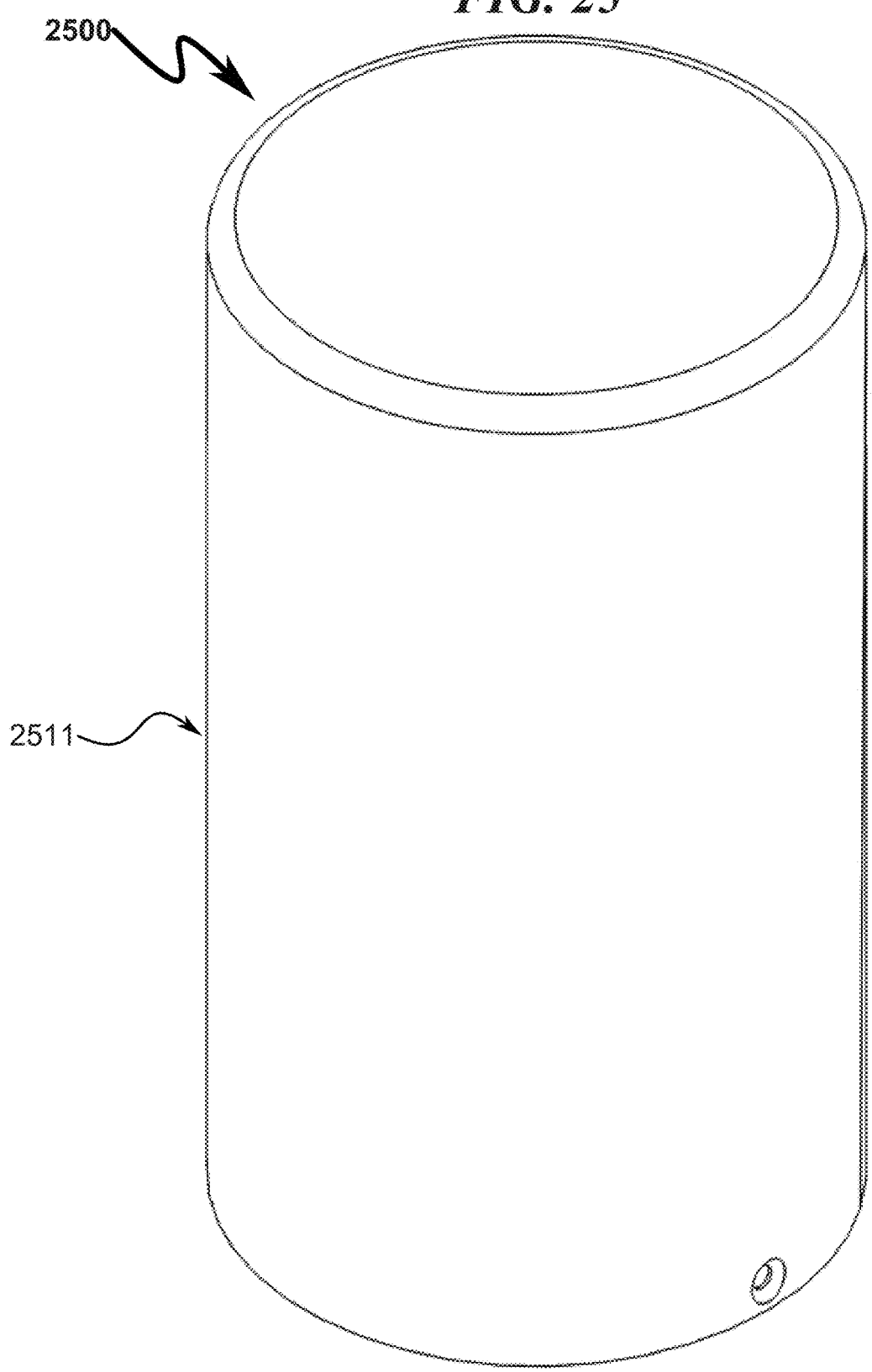
FIG. 25 illustrates a top right front perspective detector assembly detail view of a typical application context for the present invention as applied to a combined radiation detector and cryostat apparatus (detector cover installed)
Figure 26:
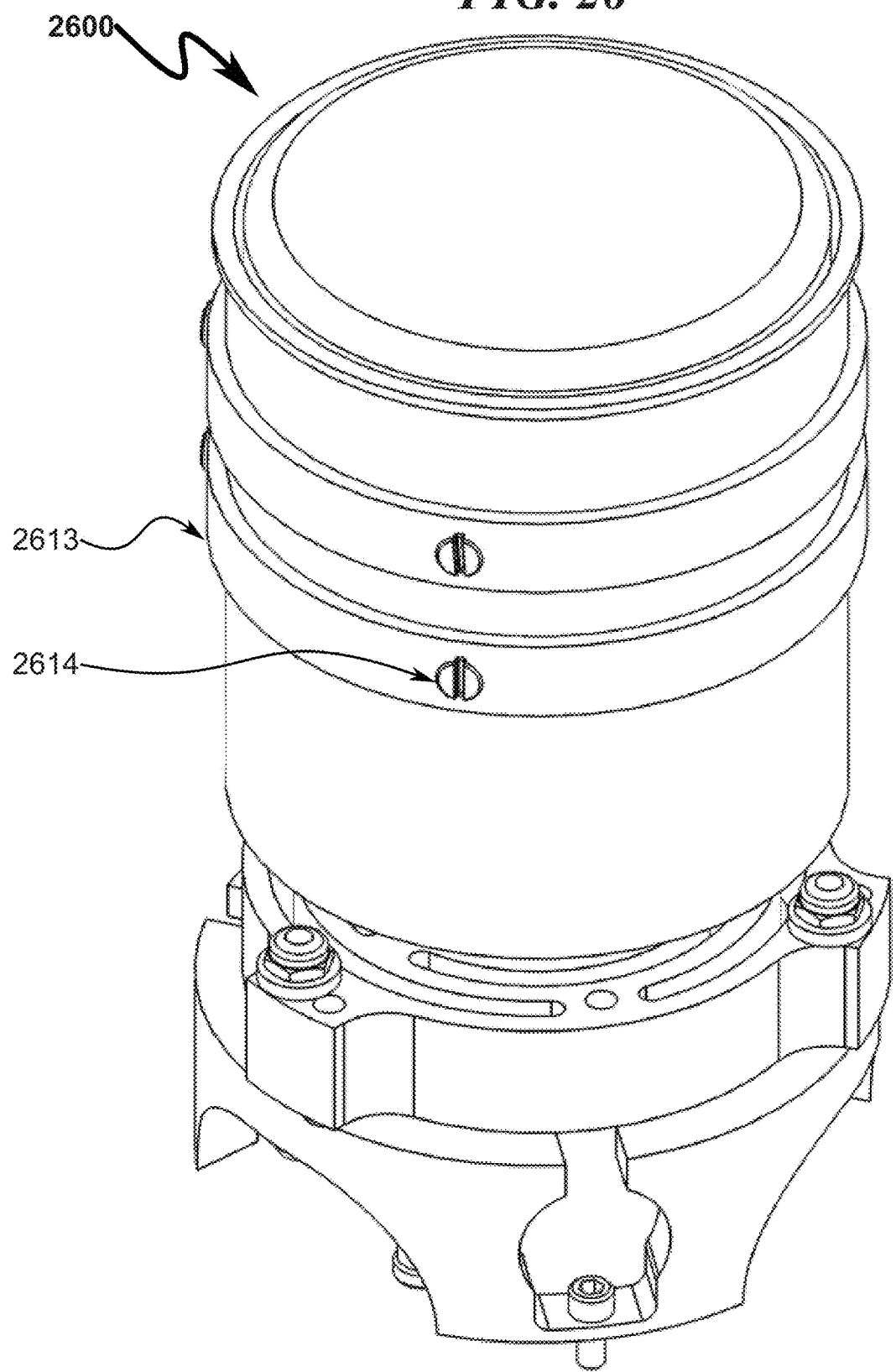
FIG. 26 illustrates a top right front perspective detector assembly detail view of a typical application context for the present invention as applied to a combined radiation detector and cryostat apparatus (detector cover removed)
Figure 27:
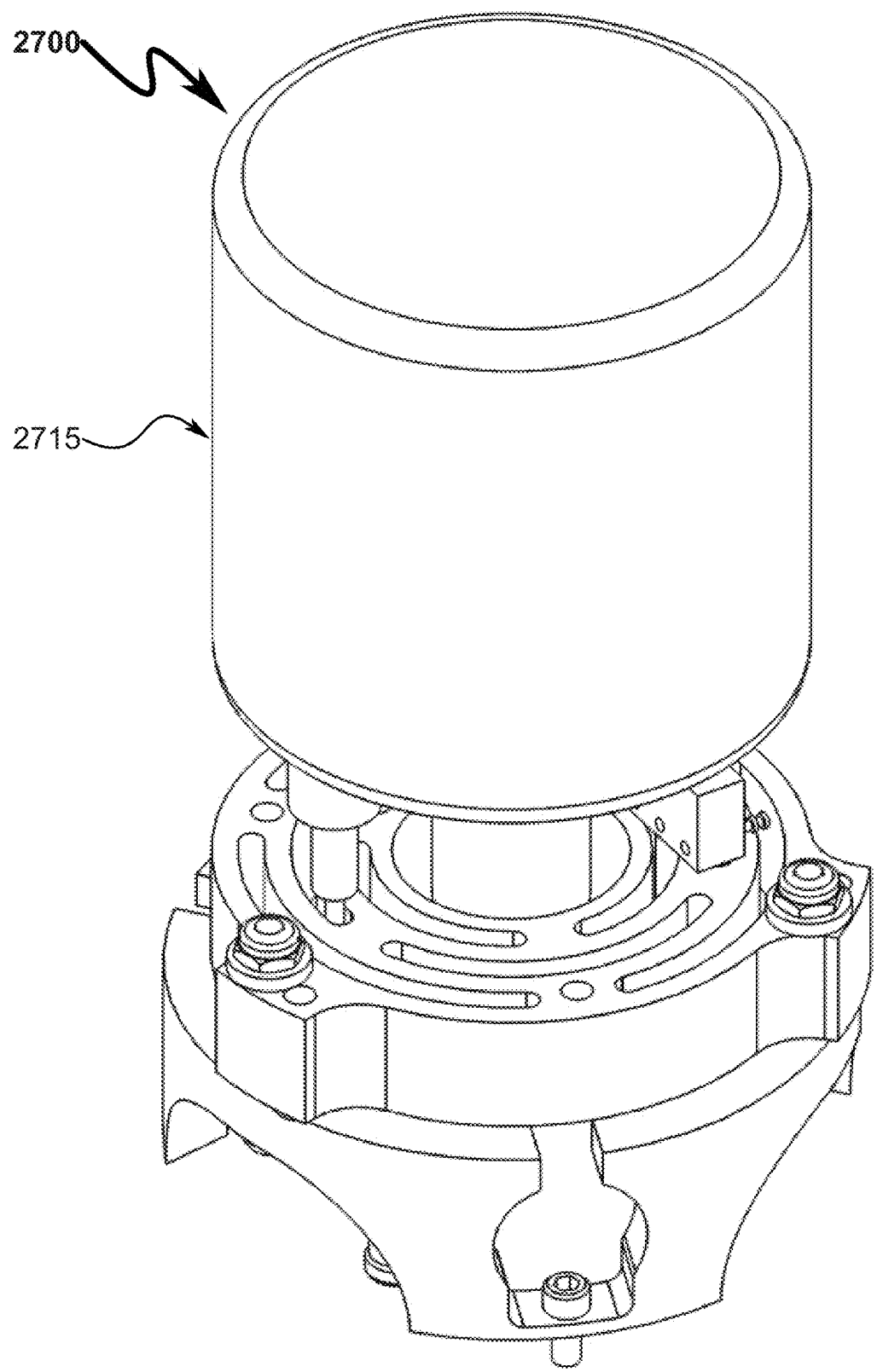
FIG. 27 illustrates a top right front perspective detector assembly detail view of a typical application context for the present invention as applied to a combined radiation detector and cryostat apparatus (detector cover and detector retainer removed)
Figure 28:
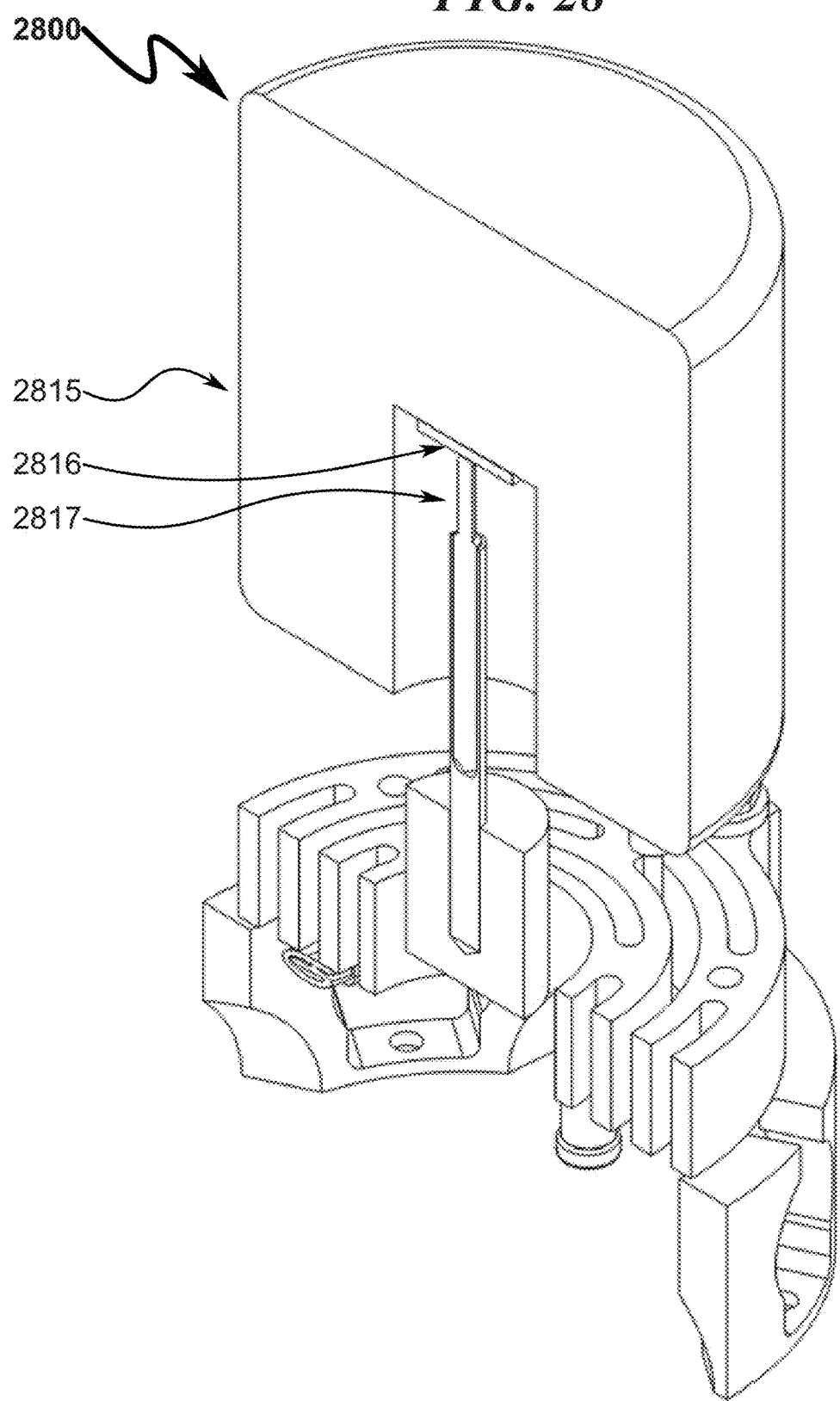
FIG. 28 illustrates a top right front perspective detector assembly detail front side section view of a typical application context for the present invention as applied to a combined radiation detector and cryostat apparatus (detector cover and detector retainer removed)
Figure 29:
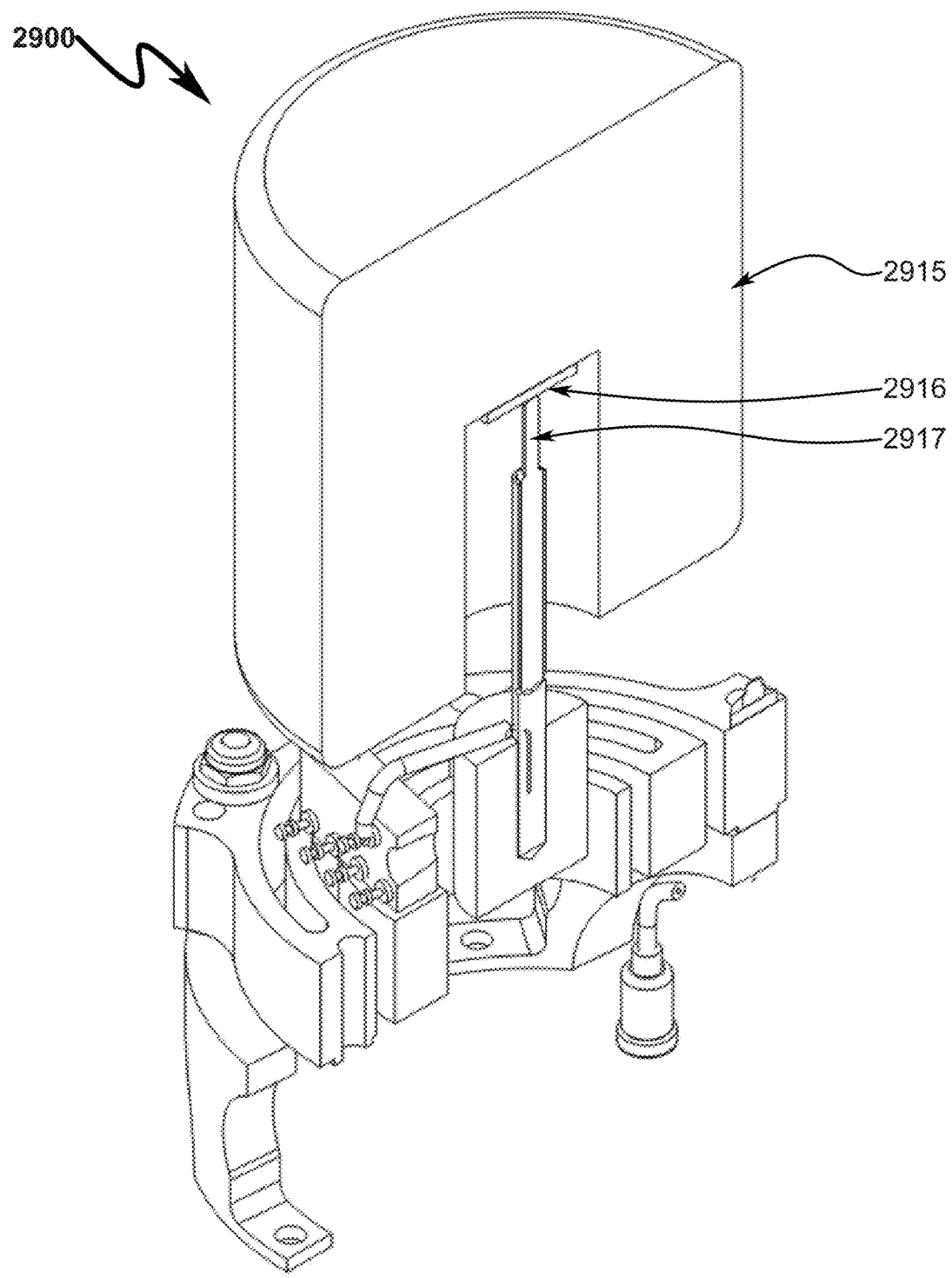
FIG. 29 illustrates a top right front perspective detector assembly detail right side section view of a typical application context for the present invention as applied to a combined radiation detector and cryostat apparatus (detector cover and detector retainer removed)
Figure 30:
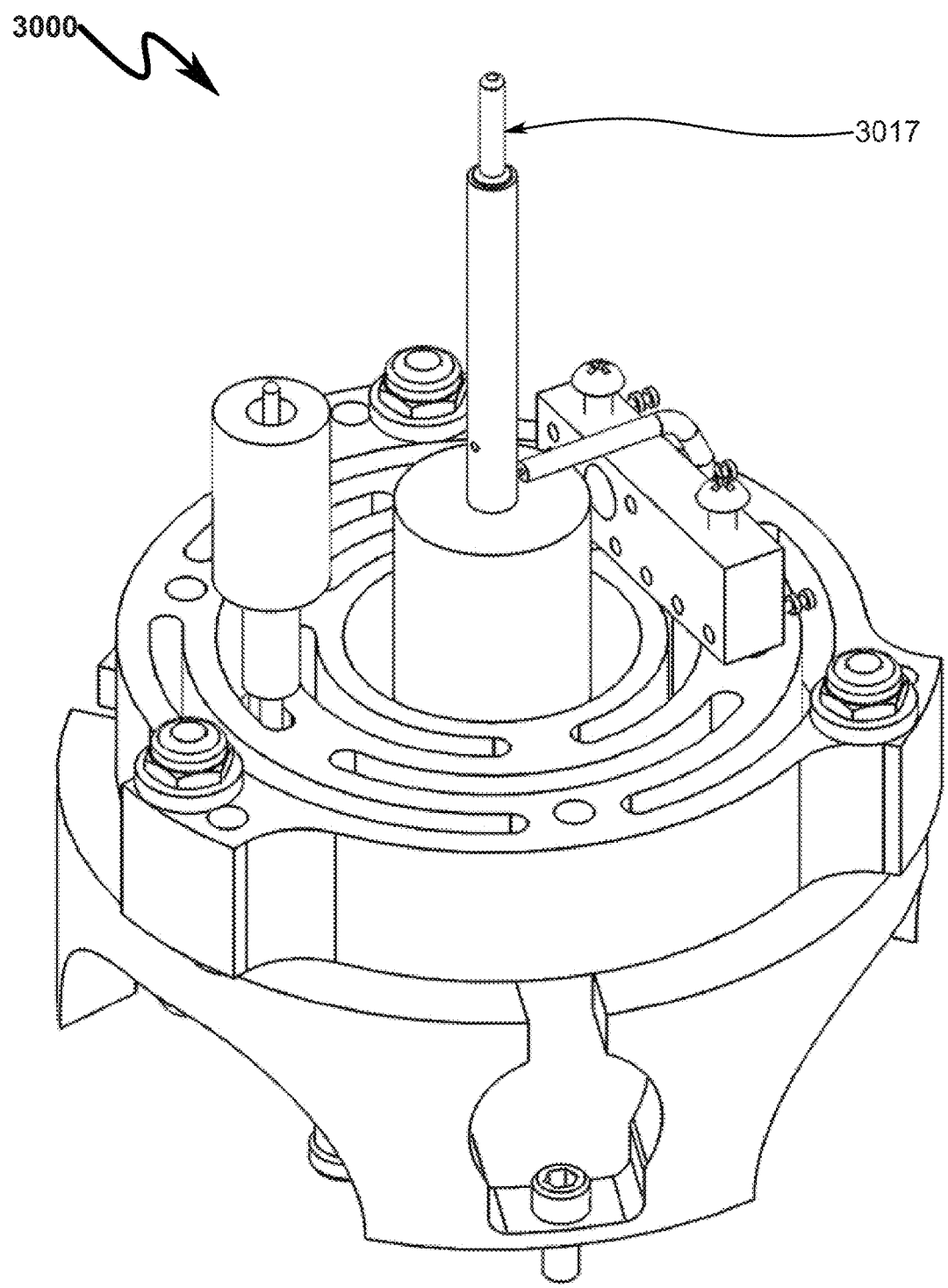
FIG. 30 illustrates a top right front perspective detector assembly detail view of a typical application context for the present invention as applied to a combined radiation detector and cryostat apparatus (detector cover, detector retainer, and detector removed)
Figure 31:
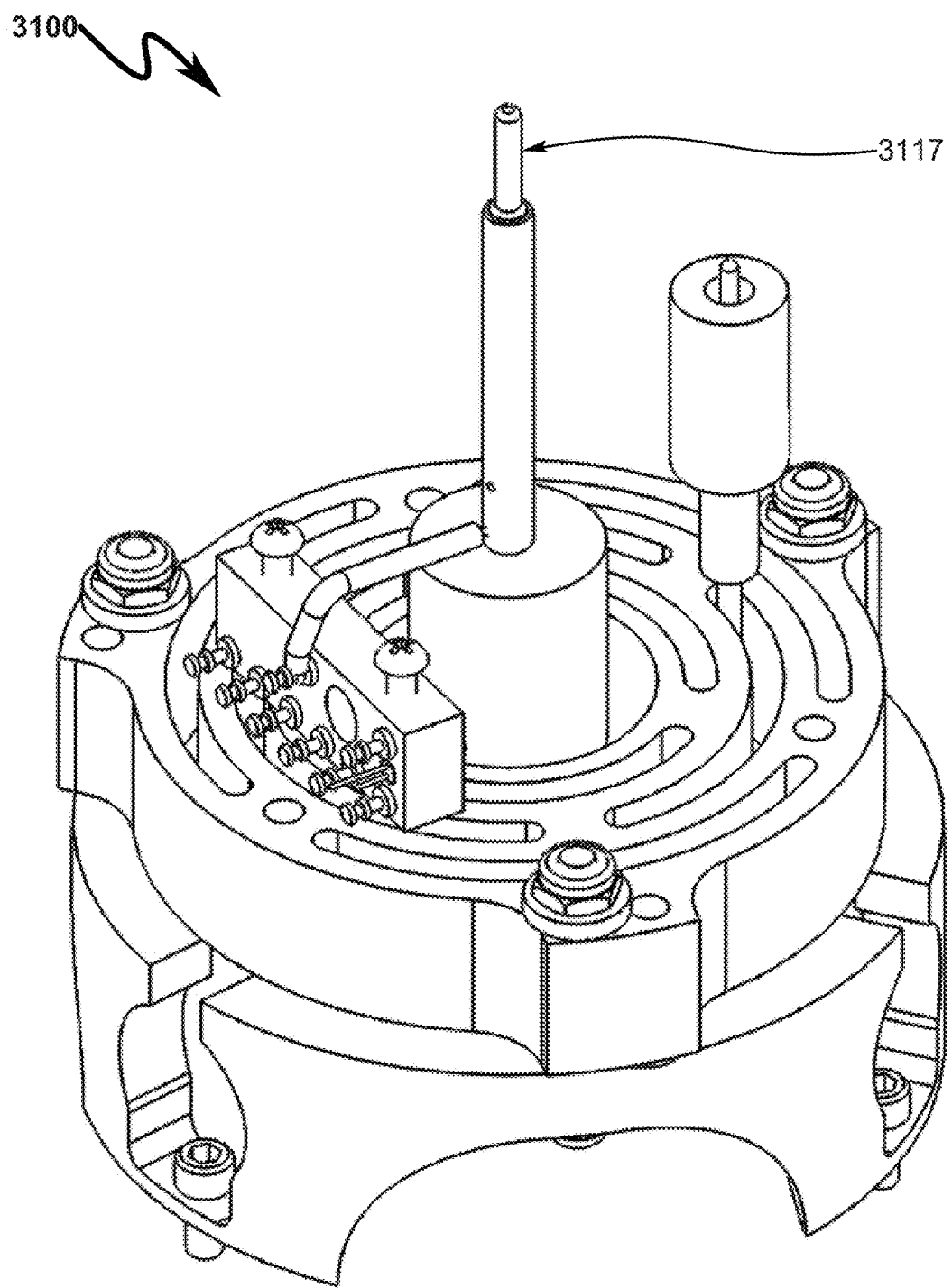
FIG. 31 illustrates a top left rear perspective detector assembly detail view of a typical application context for the present invention as applied to a combined radiation detector and cryostat apparatus (detector cover, detector retainer, and detector removed)

The detector assembly breakdown view detail provided in FIG. 25 (2500)-FIG. 32 (3200) illustrate the detector housing (2511) and the detector mounting cover (2613) that is typically affixed using one or more setscrews (2614) to the centroid contact radiation detector (2715, 2815, 2915). The detector mounting cover (2613) makes mechanical/electrical contact with the outer N+ contact surrounding the outside of the centroid contact radiation detector (2715, 2815, 2915), while the centroid P+ contact (2816, 2916) located within the interior cavity void of the centroid contact radiation detector (2715, 2815, 2915) makes mechanical/electrical contact with a spring loaded POGO mechanical contact (2817, 2917, 3017, 3117) through the bottom of the cavity void of the detector.

Prior Art (3300)-(4000) Vs. Exemplary Embodiment (4100)-(4800) Comparison

Figure 33:
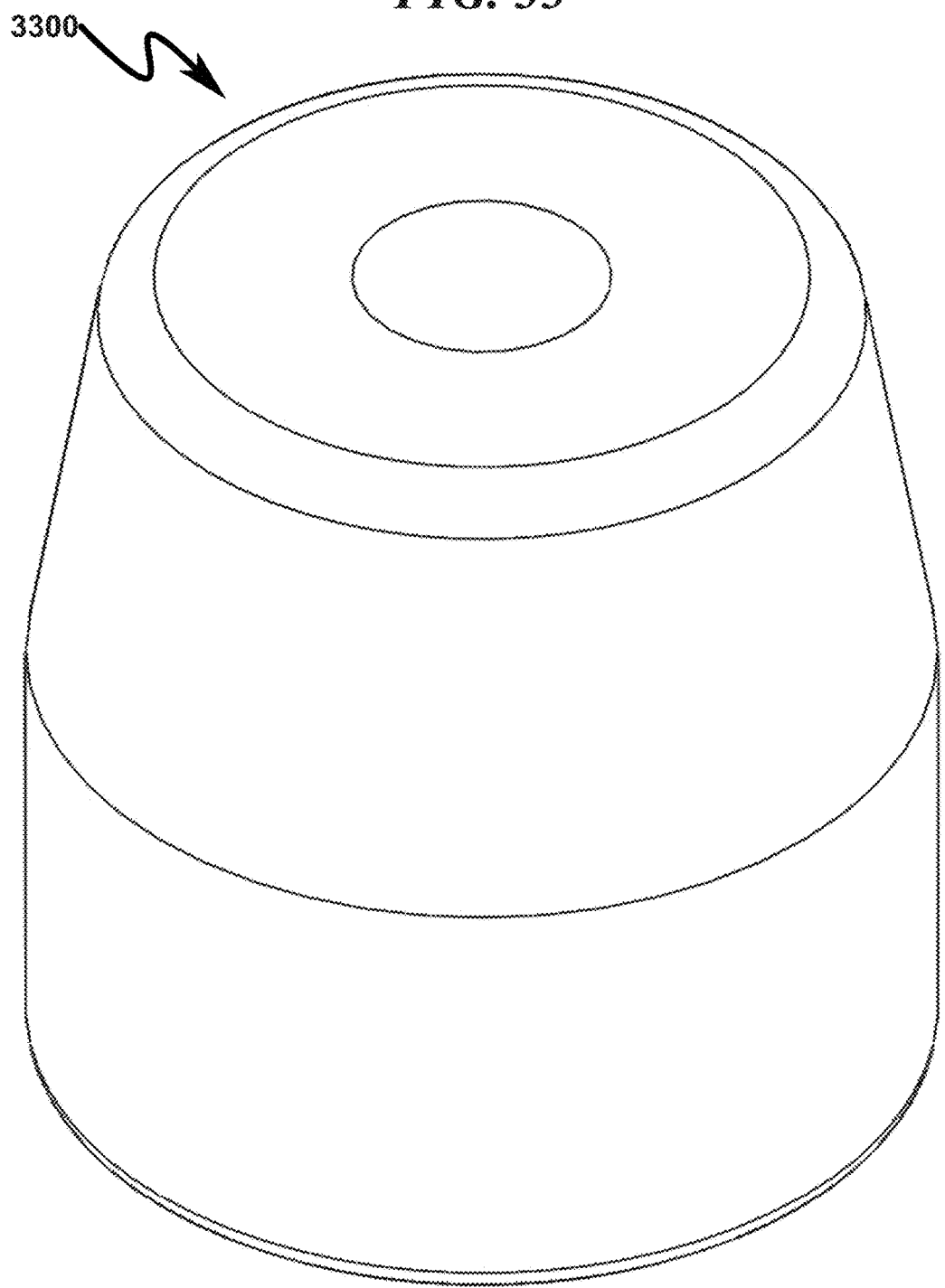
FIG. 33 illustrates a top right front perspective view of a prior art tapered-cylinder radiation detector.
Figure 40:
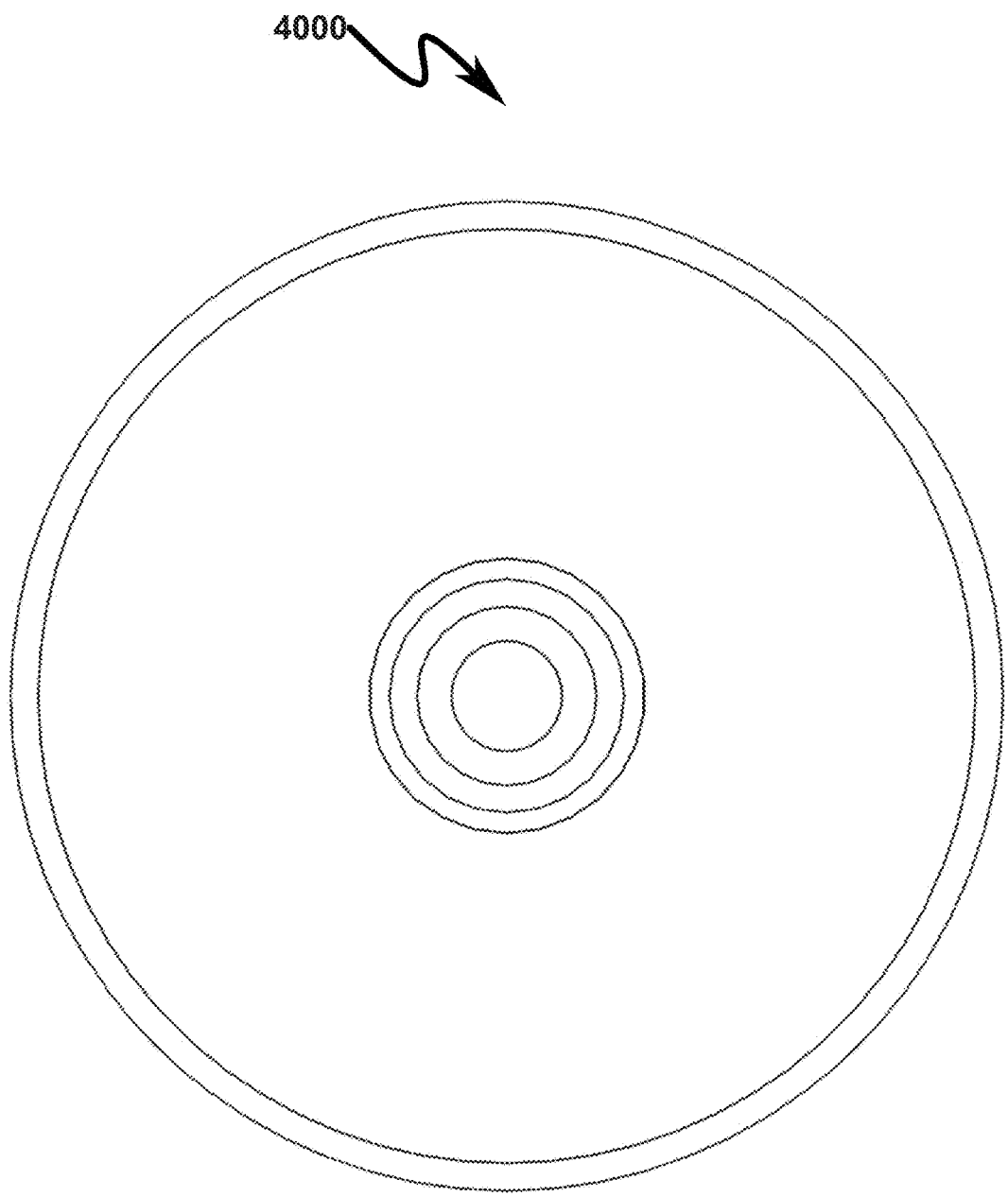
FIG. 40 illustrates a bottom view of a prior art tapered-cylinder radiation detector.
Figure 41:
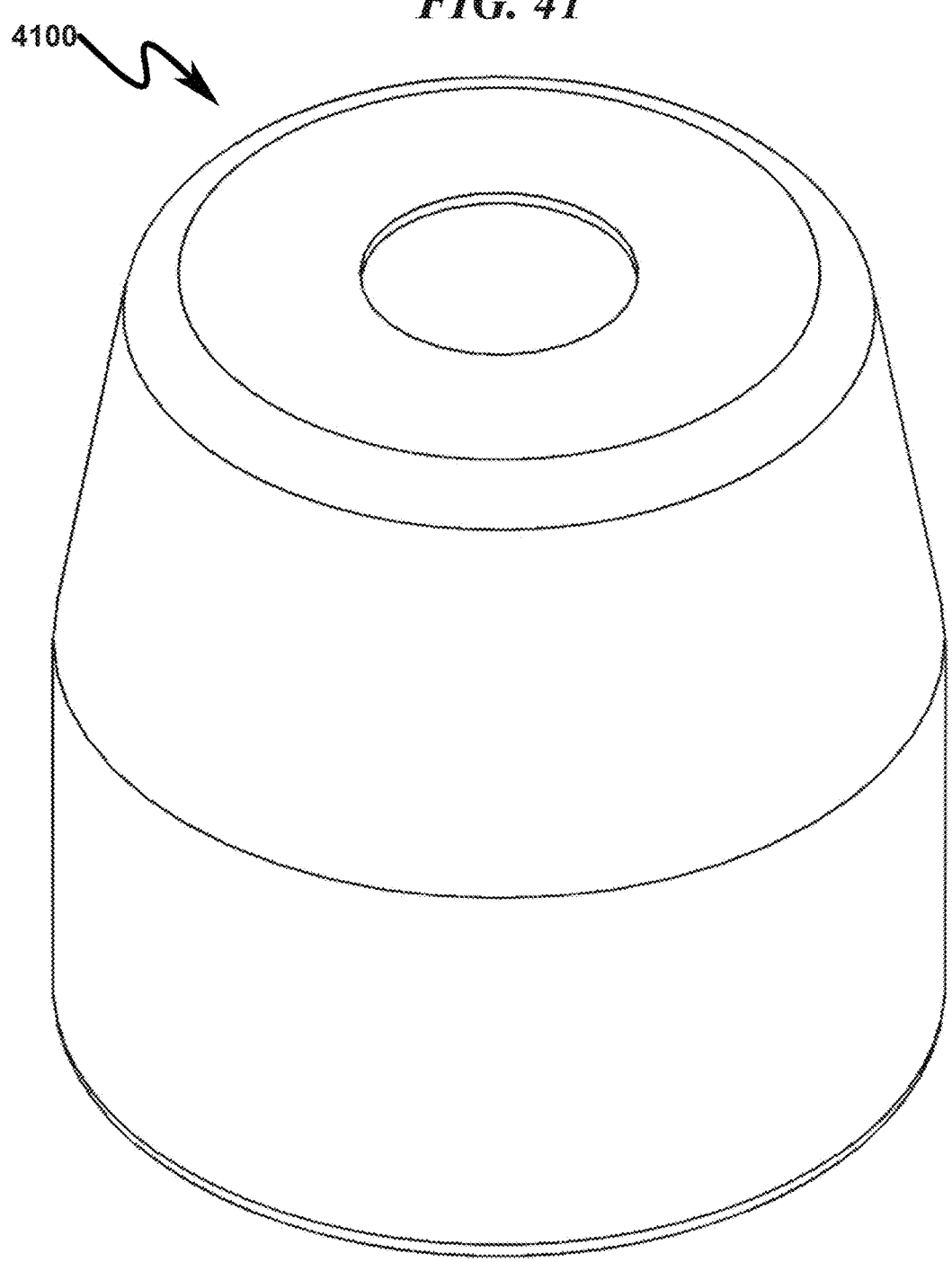
FIG. 41 illustrates a top right front perspective view of an exemplary invention embodiment tapered-cylinder radiation detector.
Figure 48:
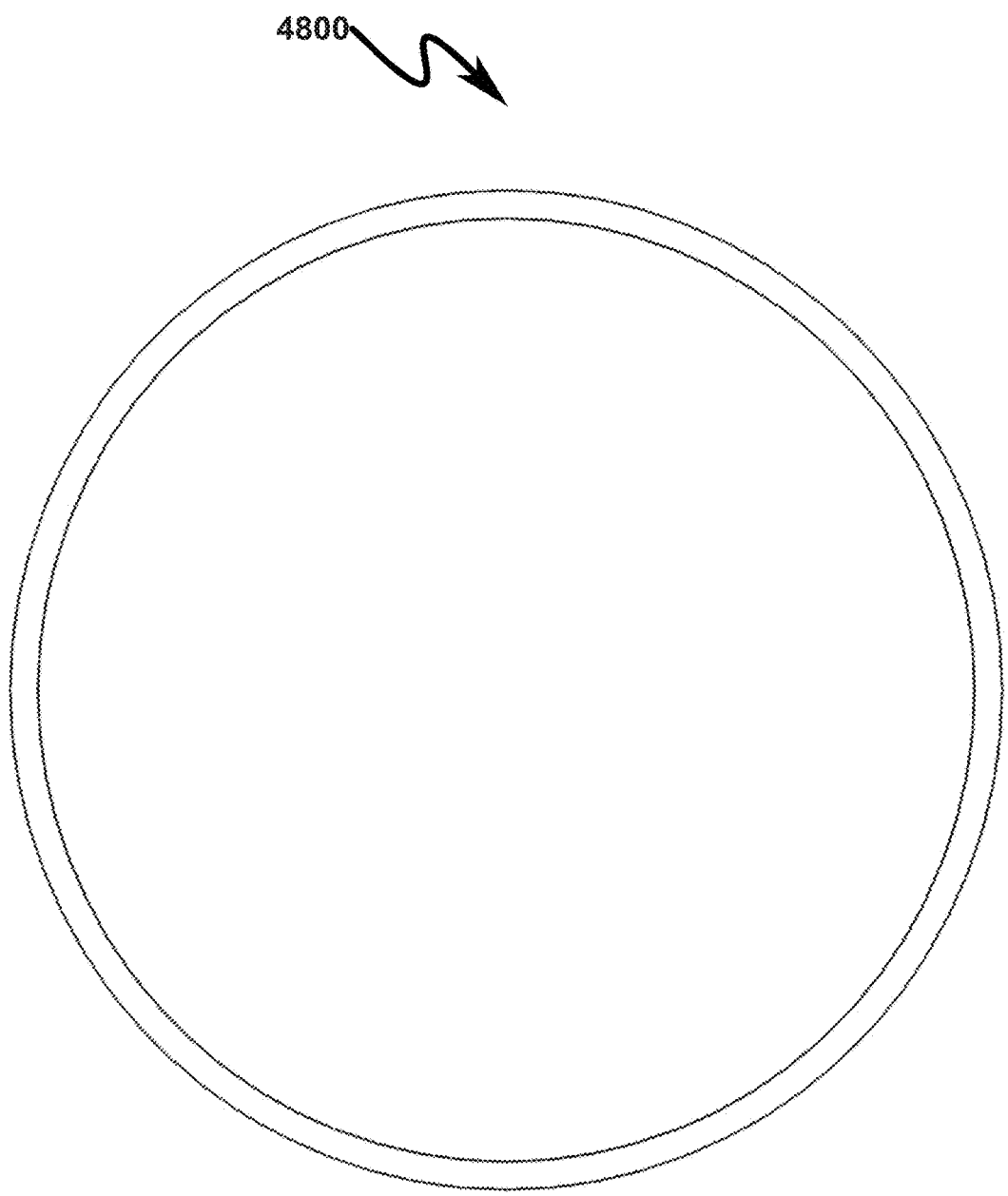
FIG. 48 illustrates a bottom view of an exemplary invention embodiment tapered-cylinder radiation detector.

As an aid to distinguishing the present invention concepts as compared to the prior art, contrasting tapered-cylinder radiation detectors of comparable dimensions are presented in FIG. 33 (3300)-FIG. 40 (4000) for the prior art as contrasted with a corresponding present invention embodiment presented in FIG. 41 (4100)-FIG. 48 (4800). As with other diagrams presented in this document, the contact thicknesses have been exaggerated so as to make their placement in the radiation structures clear to one of ordinary skill in the art.

Figure 34:
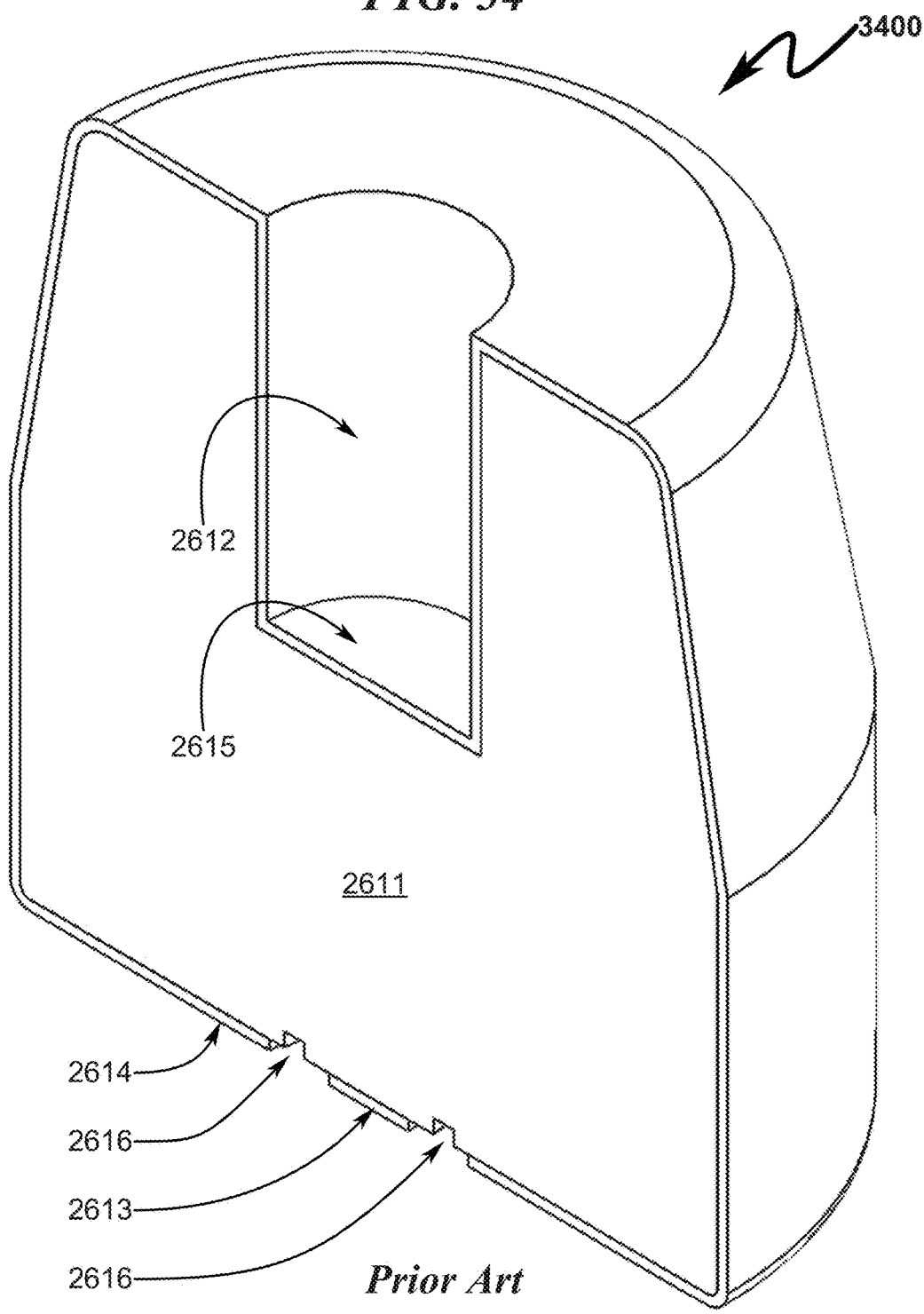
FIG. 34 illustrates a top right front perspective front sectional view of a prior art tapered-cylinder radiation detector.
Figure 35:
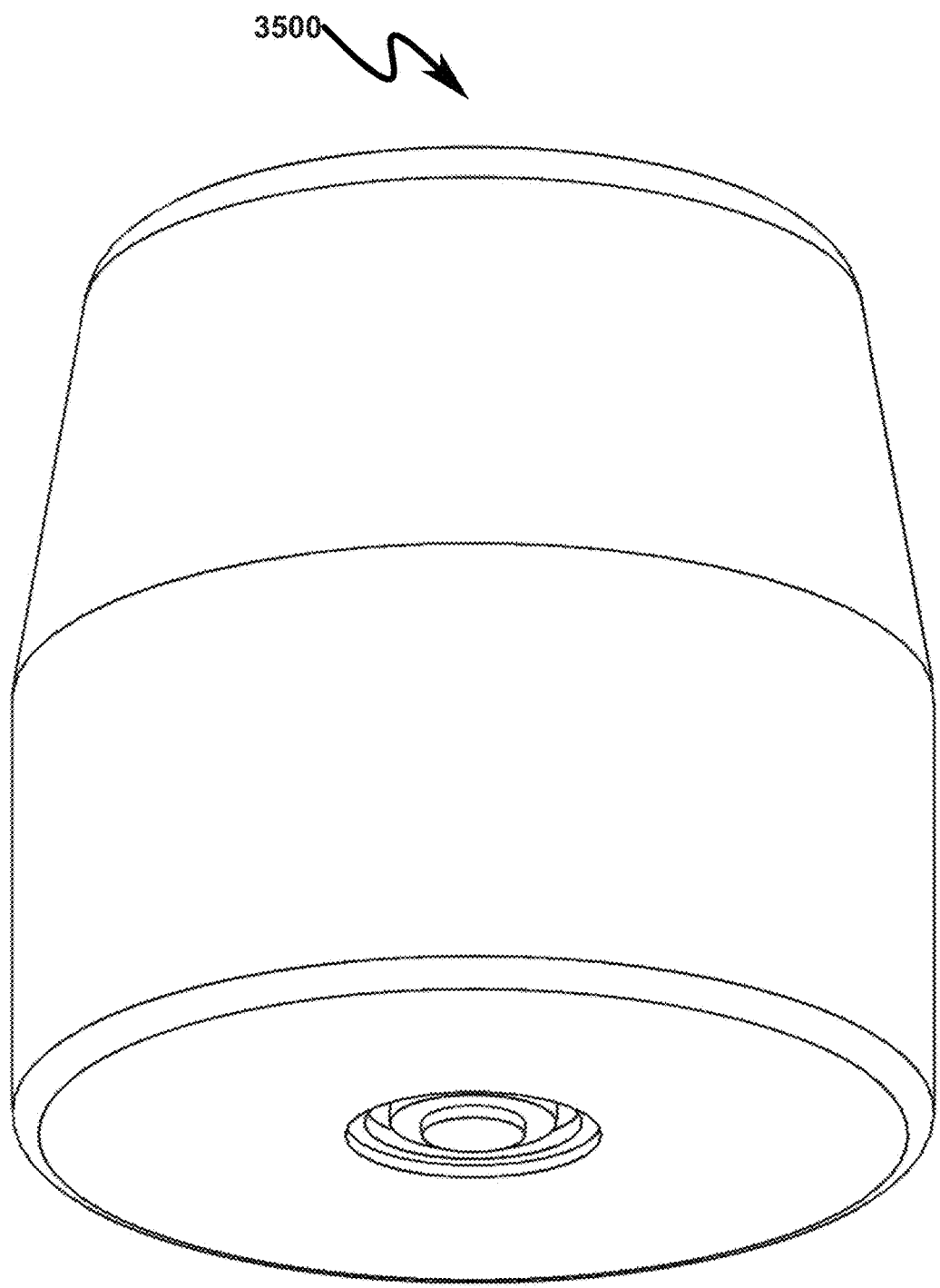
FIG. 35 illustrates a bottom right front perspective view of a prior art tapered-cylinder radiation detector.
Figure 36:
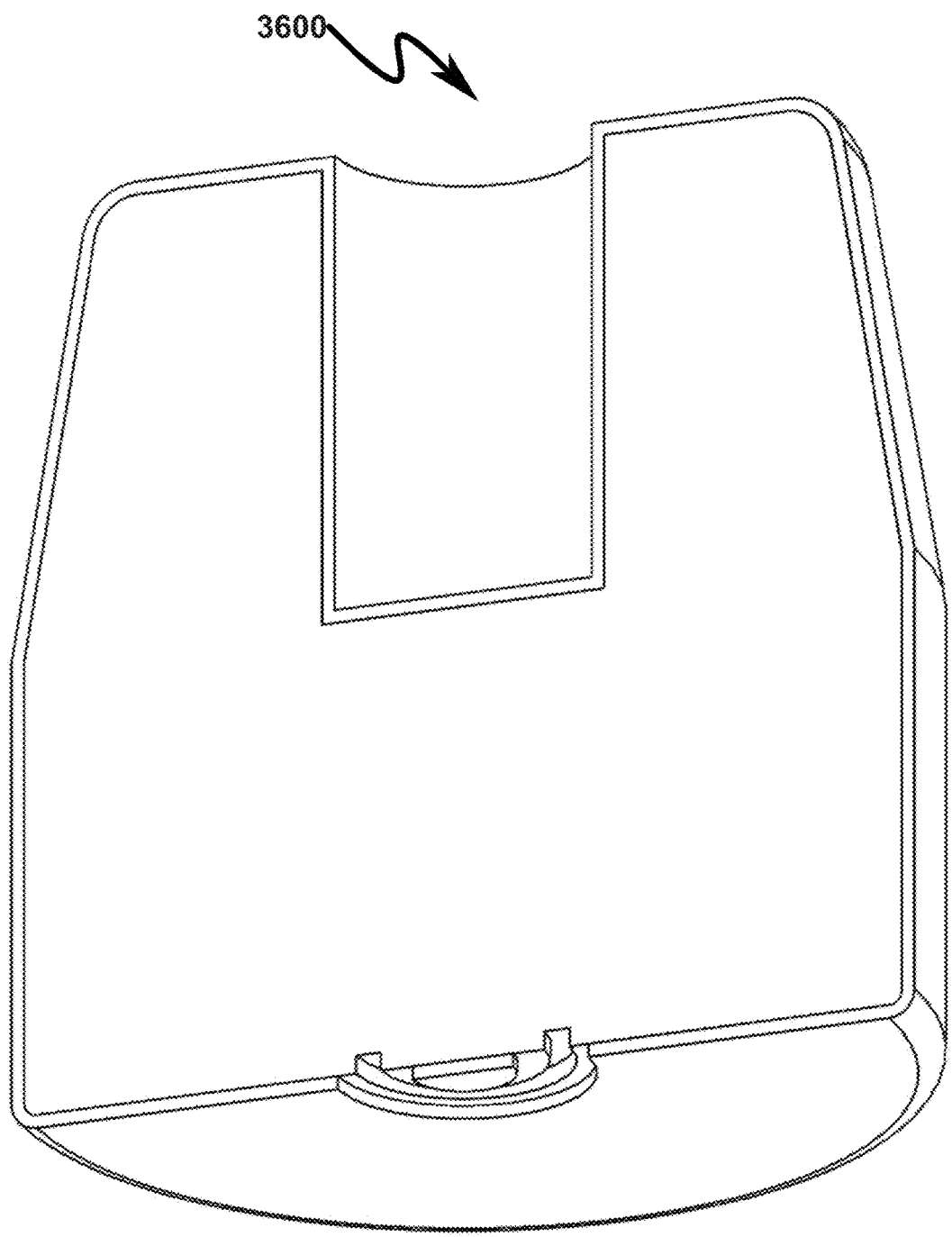
FIG. 36 illustrates a bottom right front perspective front sectional view of a prior art tapered-cylinder radiation detector.
Figure 37:
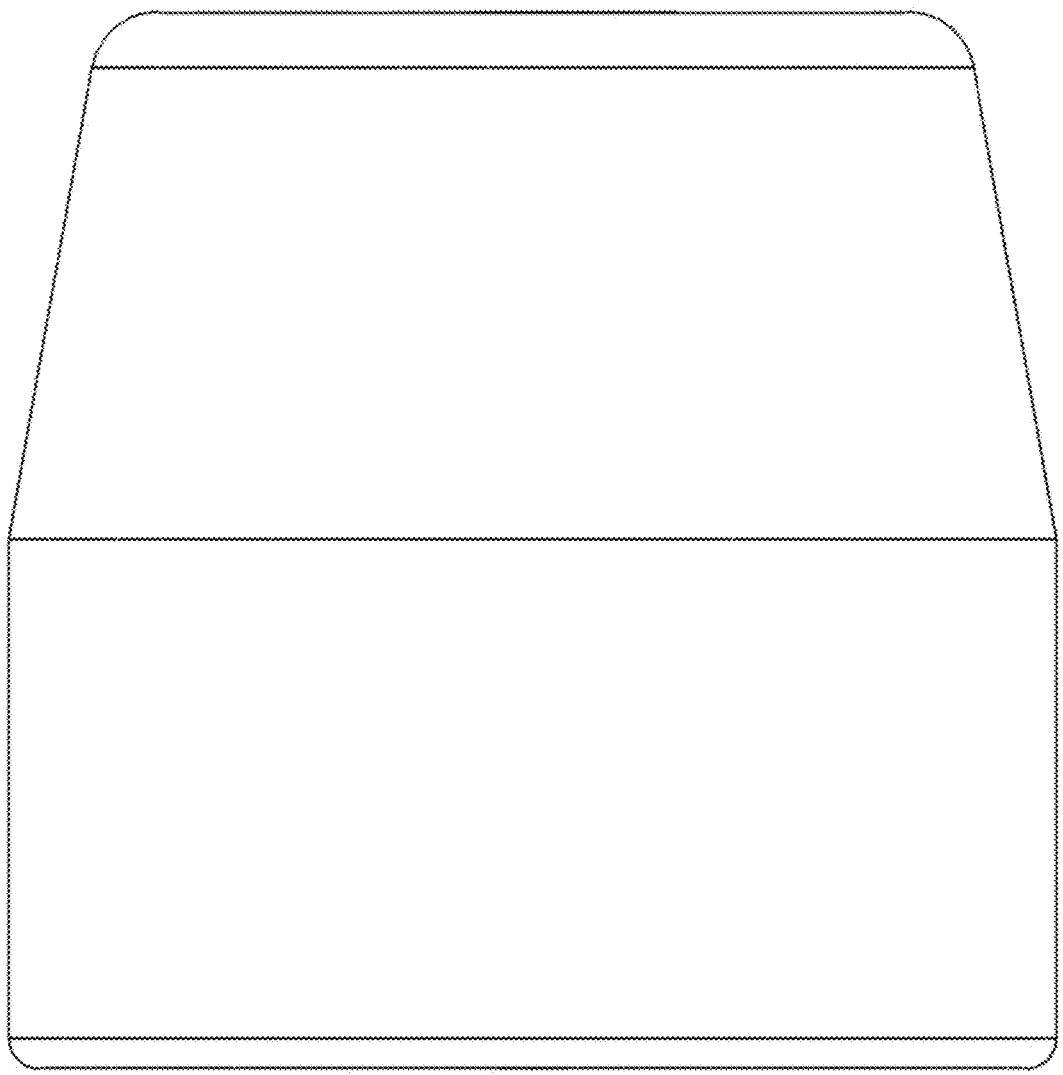
FIG. 37 illustrates a front side view of a prior art tapered-cylinder radiation detector.
Figure 38:
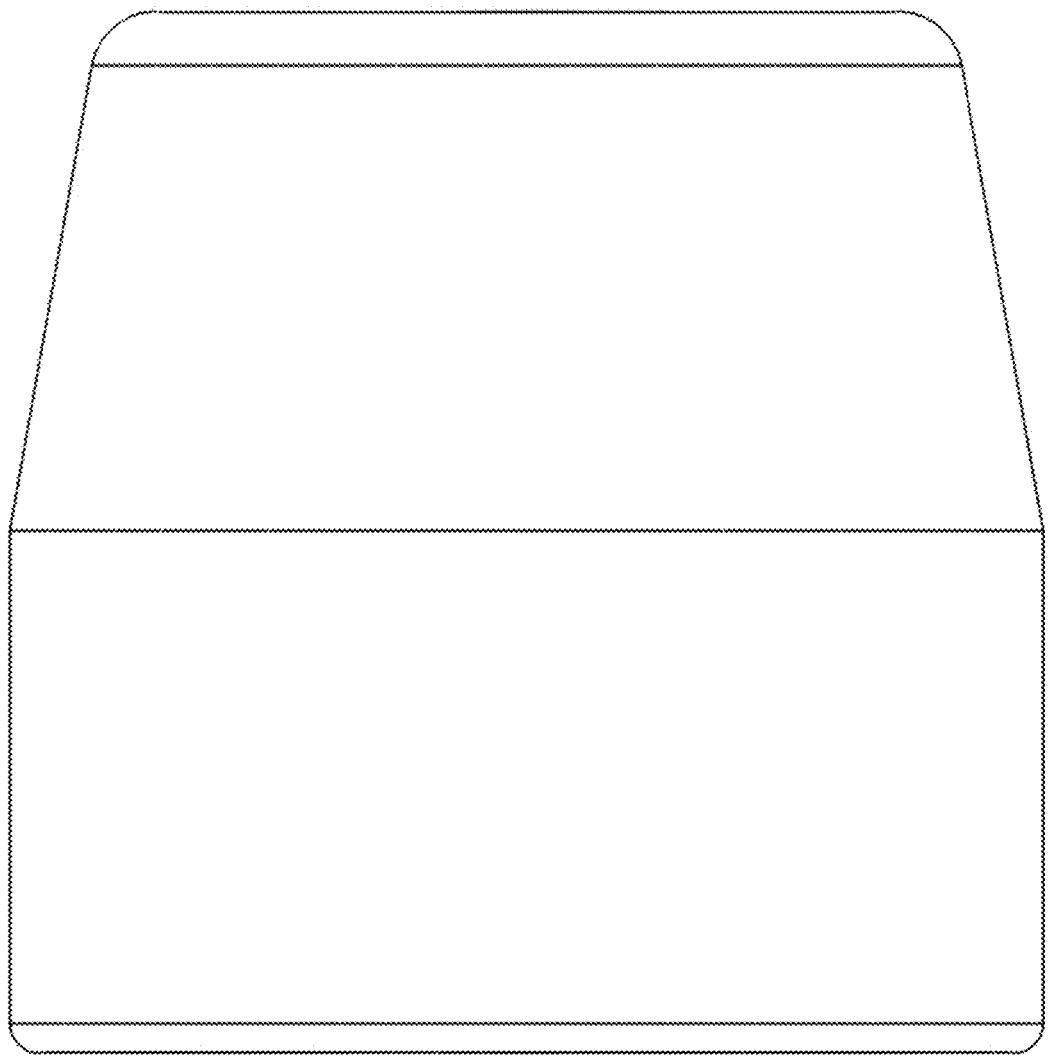
FIG. 38 illustrates a right side view of a prior art tapered-cylinder radiation detector.
Figure 39:
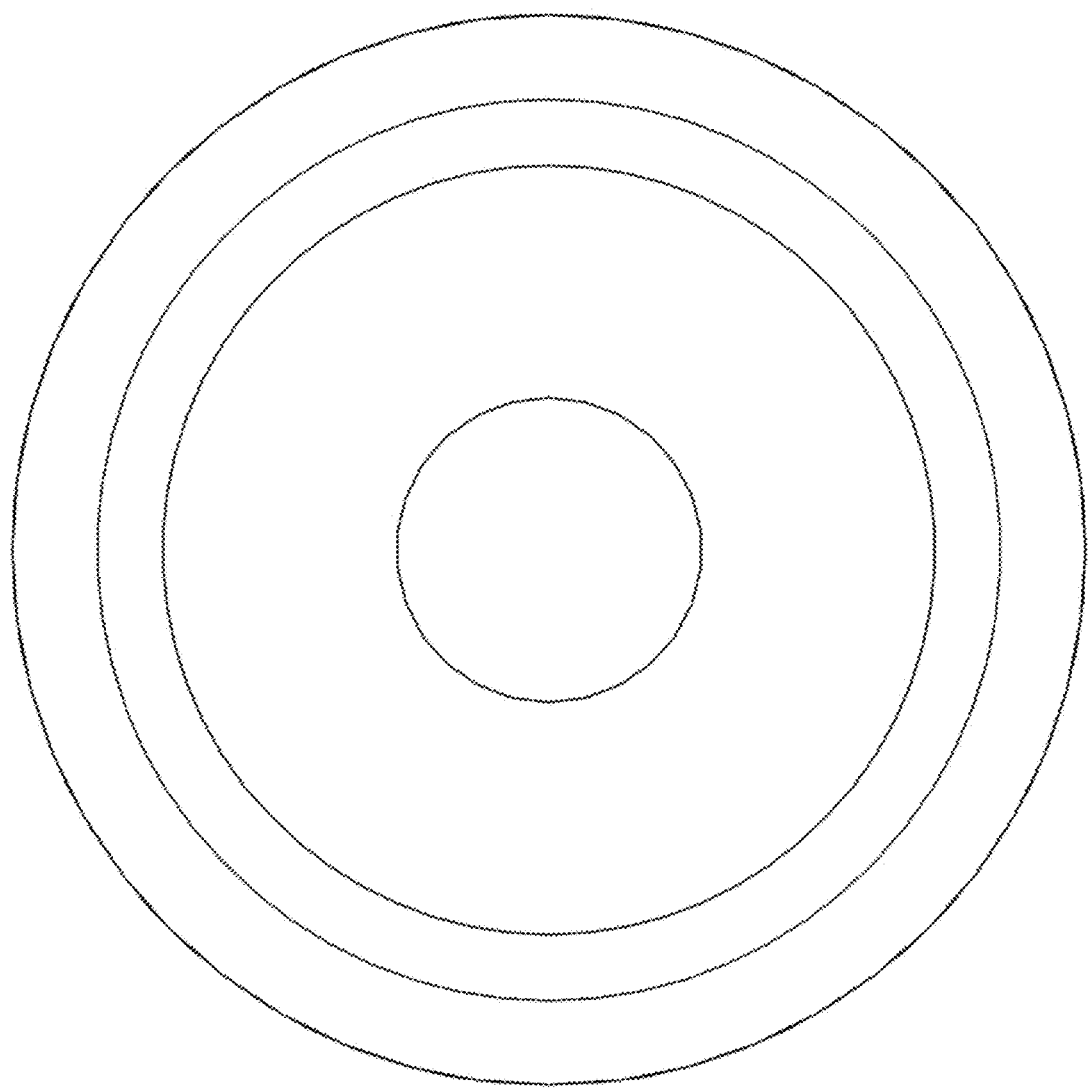
FIG. 39 illustrates a top view of a prior art tapered-cylinder radiation detector.
Figure 42:
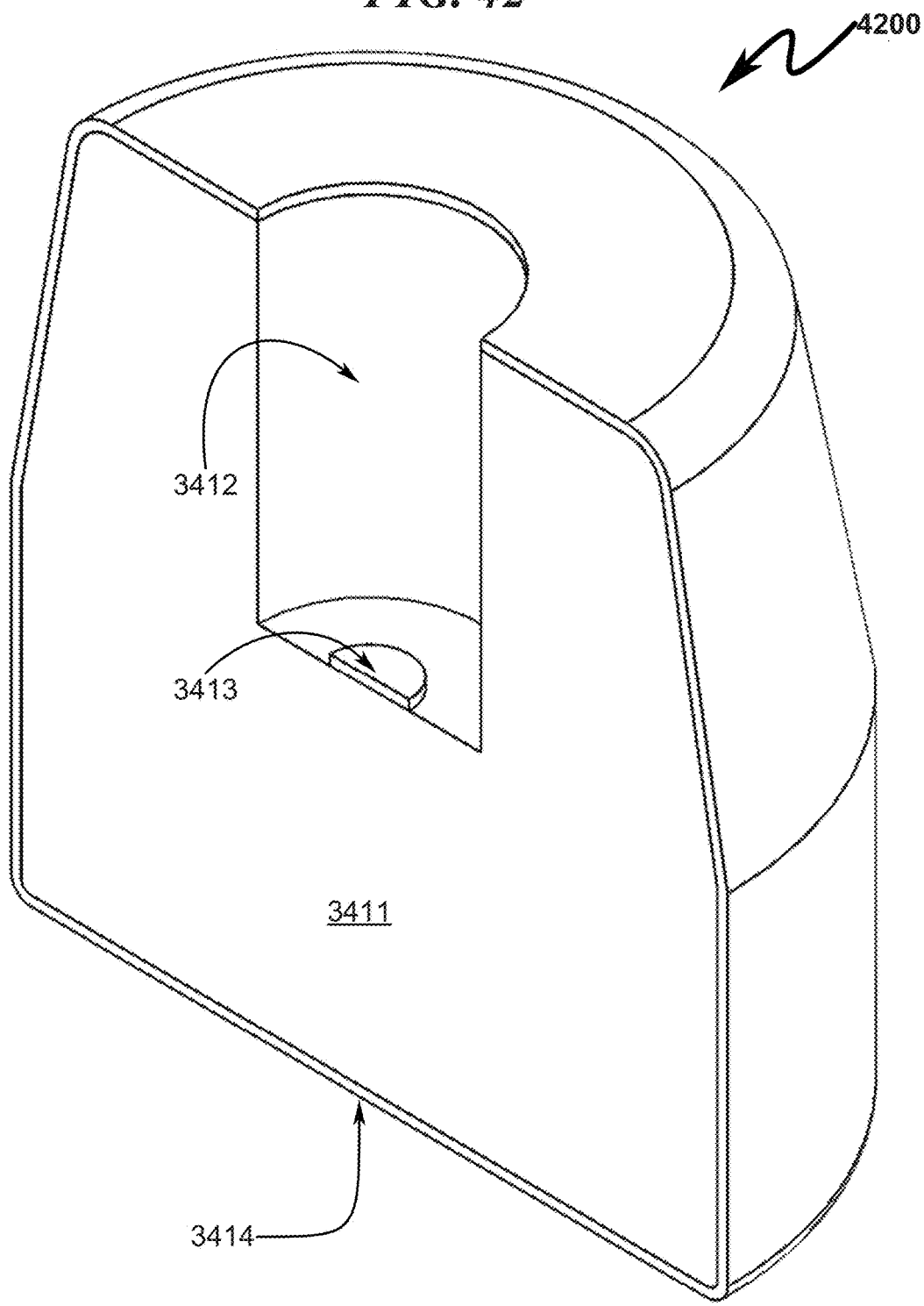
FIG. 42 illustrates a top right front perspective front sectional view of an exemplary invention embodiment tapered-cylinder radiation detector.
Figure 43:
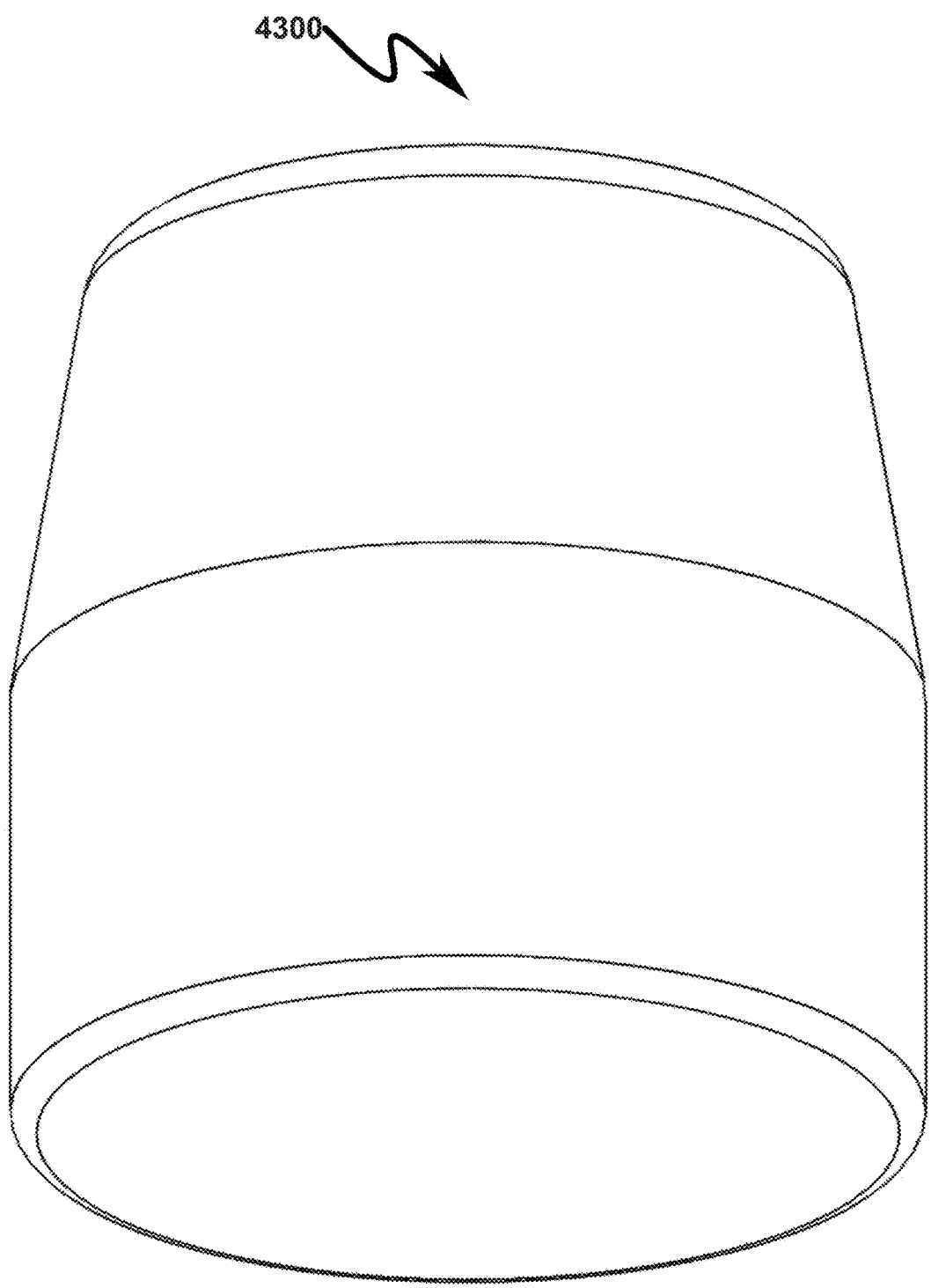
FIG. 43 illustrates a bottom right front perspective view of an exemplary invention embodiment tapered-cylinder radiation detector.
Figure 44:
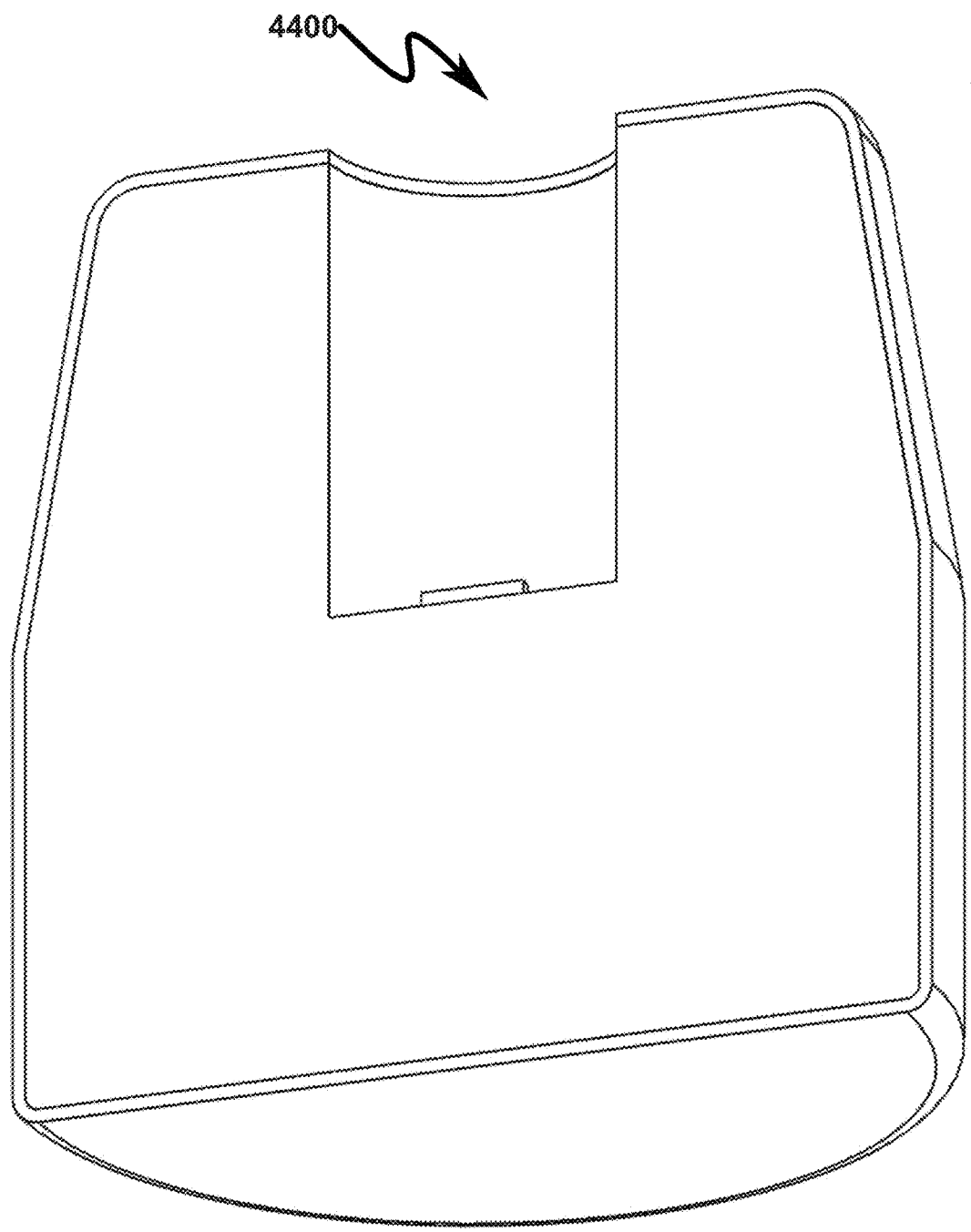
FIG. 44 illustrates a bottom right front perspective front sectional view of an exemplary invention embodiment tapered-cylinder radiation detector.
Figure 45:
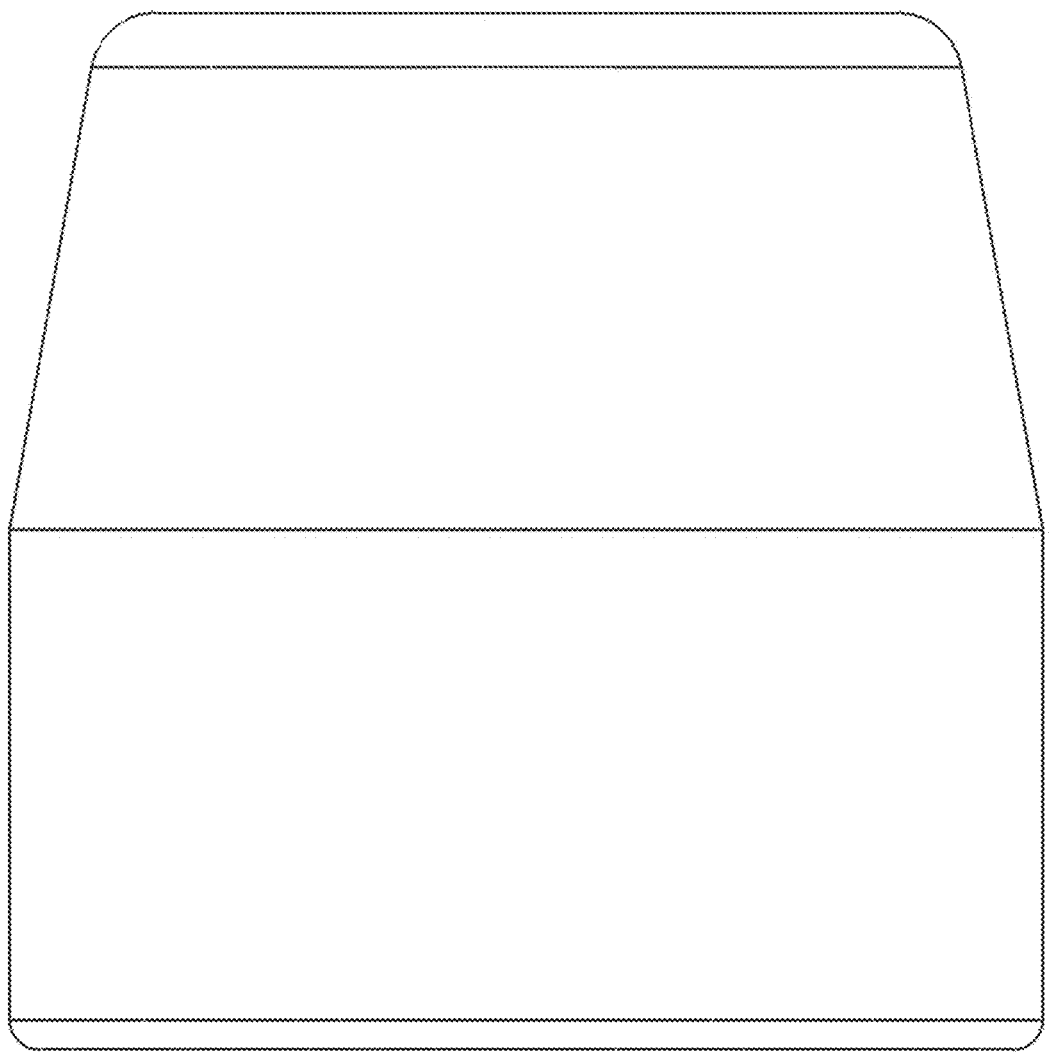
FIG. 45 illustrates a front side view of an exemplary invention embodiment tapered-cylinder radiation detector.
Figure 46:
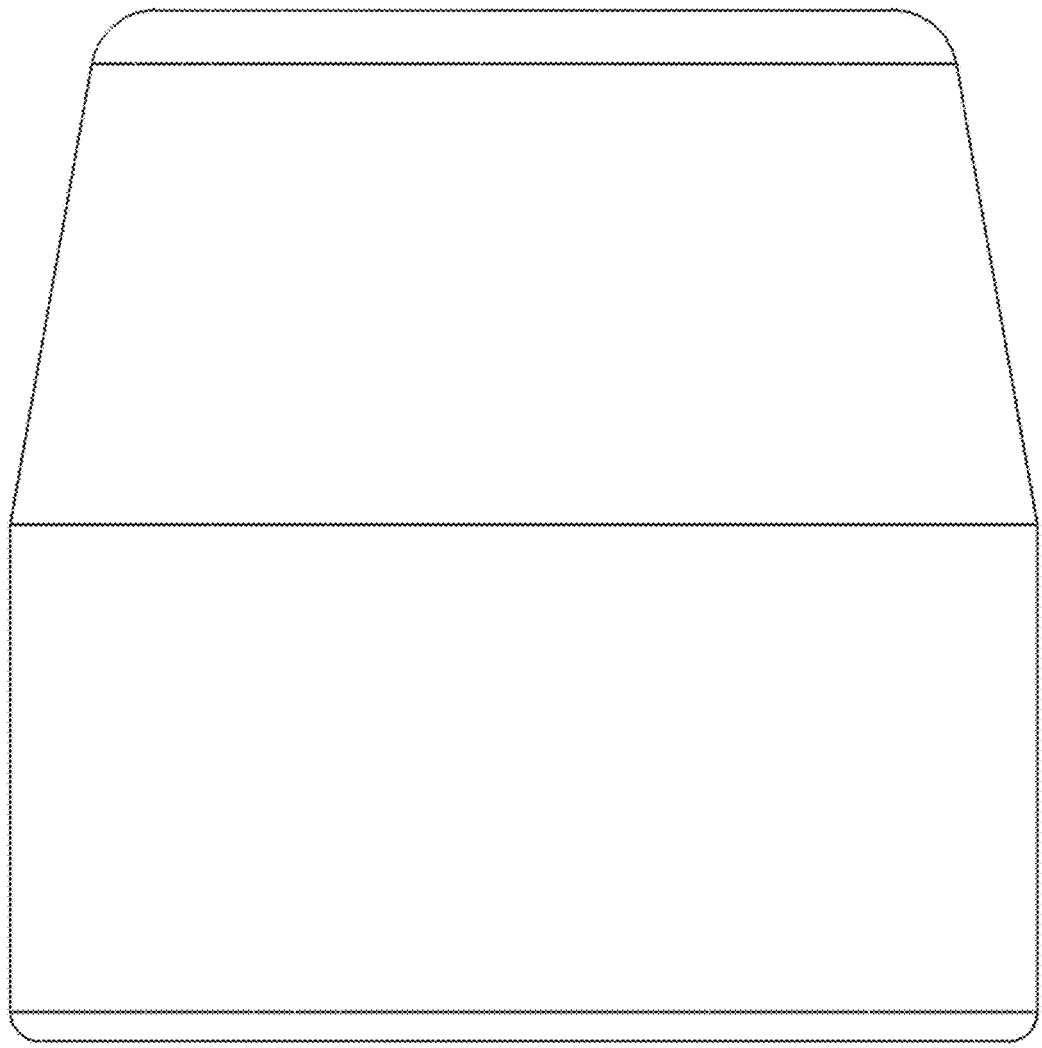
FIG. 46 illustrates a right side view of an exemplary invention embodiment tapered-cylinder radiation detector.
Figure 47:
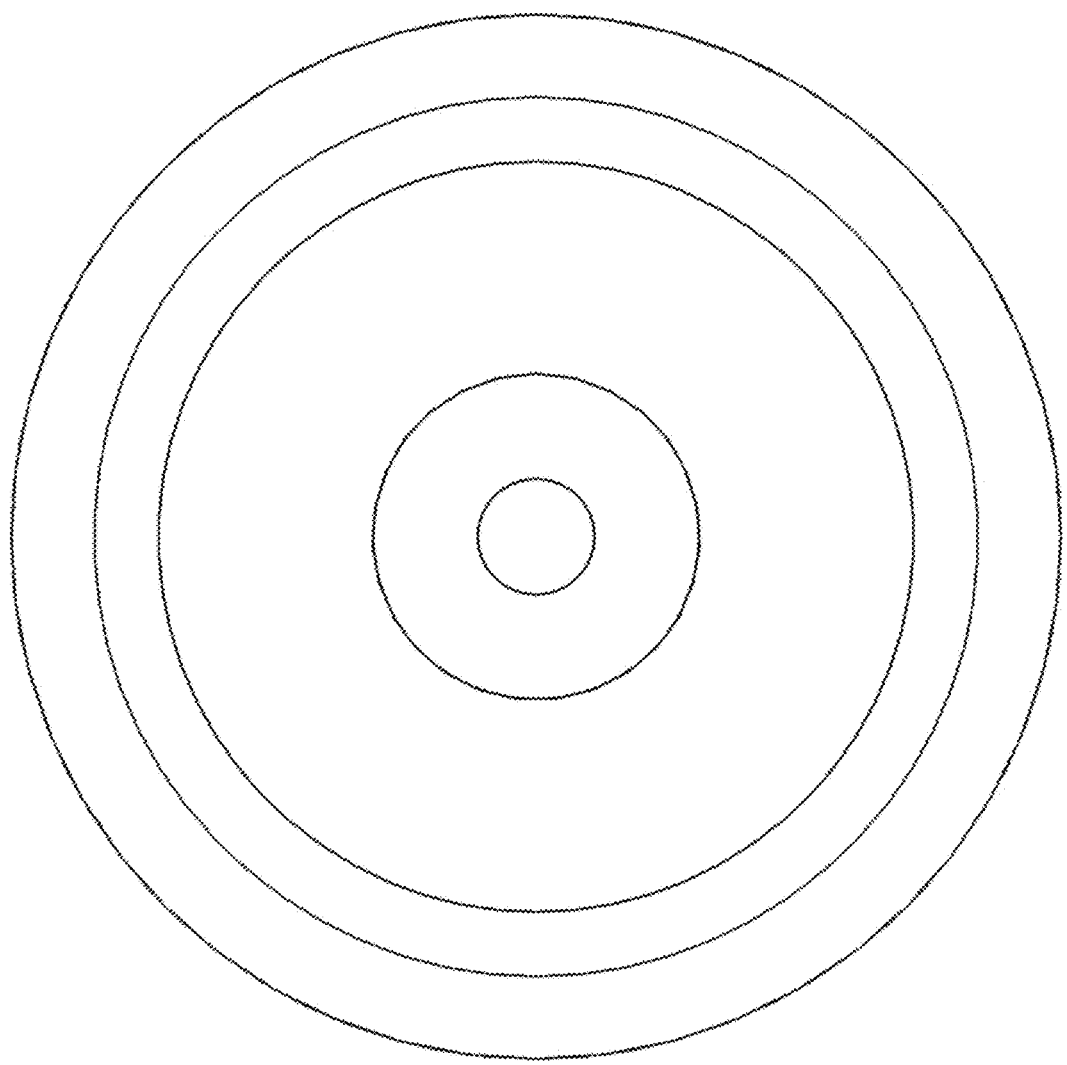
FIG. 47 illustrates a top view of an exemplary invention embodiment tapered-cylinder radiation detector.

The key differentiating features of the prior art (see FIG. 33 (3300)-FIG. 40 (4000)) and present invention exemplary embodiment (see FIG. 41 (4100)-FIG. 48 (4800)) may be generally discerned by comparing the front section views for the prior art (see FIG. 34 (3400)) and present invention exemplary embodiment (see FIG. 42 (4200)).

Here it can be seen that the prior art radiation detector depicted in FIG. 34 (3400) includes a bulk semiconductor (3411) in which a central void detection cavity (CVDC) (3412) is removed from the bulk semiconductor (3411). The main signal collection contact (3413) is located on one face of the tapered cylinder. The outer surface (3414) as well as the inner cavity surface (3415) constitute the bulk signal collection contact. An inscribed groove (3416) may be incorporated in the bulk semiconductor (3411) to isolate the main signal collection contact (3413).

In contrast to the prior art radiation detector depicted in FIG. 34 (3400), the exemplary present invention embodiment depicted in FIG. 42 (4200) section view is constructed differently. Specifically, while the bulk semiconductor material (4211) may be constructed similarly (3411) to that of FIG. 34 (3400), the central void detection cavity (4212) does not include the bulk signal collection contact (3415) as depicted in FIG. 34 (3400), but is rather not included in the outer bulk signal collection contact (4214) as depicted in FIG. 42 (4200). Furthermore, the main signal contact (4213) is positioned at or near the geometric center (centroid contact) of the bulk semiconductor material (4211) as compared to placement on the outer face (3413) as constructed in the prior art depicted in FIG. 34 (3400). This centroid contact (4213) provides for the improved detector performance that is outlined in the OBJECTIVES section previously presented herein.

Figure 65:
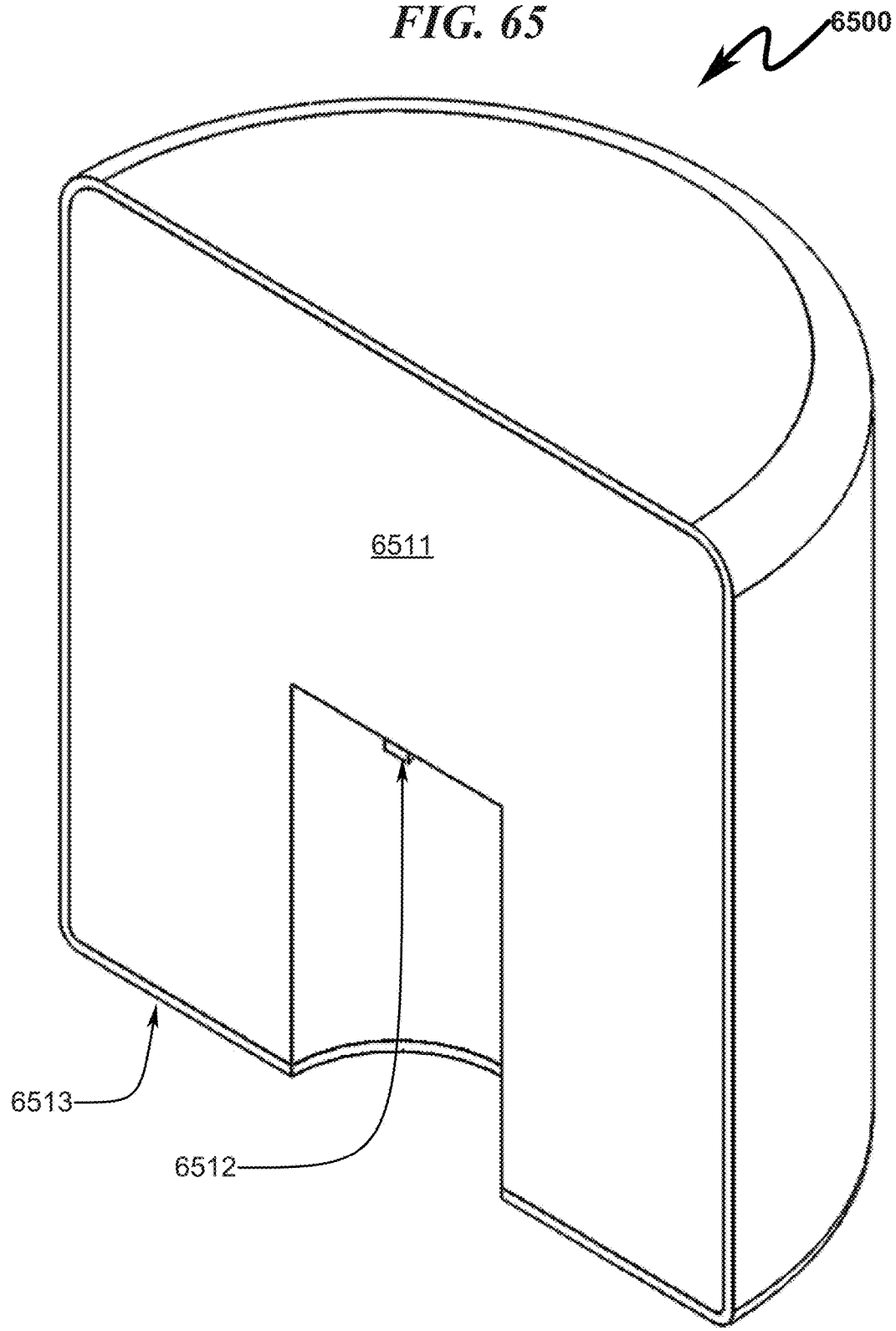
FIG. 65 illustrates a top right perspective front sectional view of a preferred exemplary cylindrical invention system embodiment incorporating a point-contact centroid signal contact.
Figure 66:
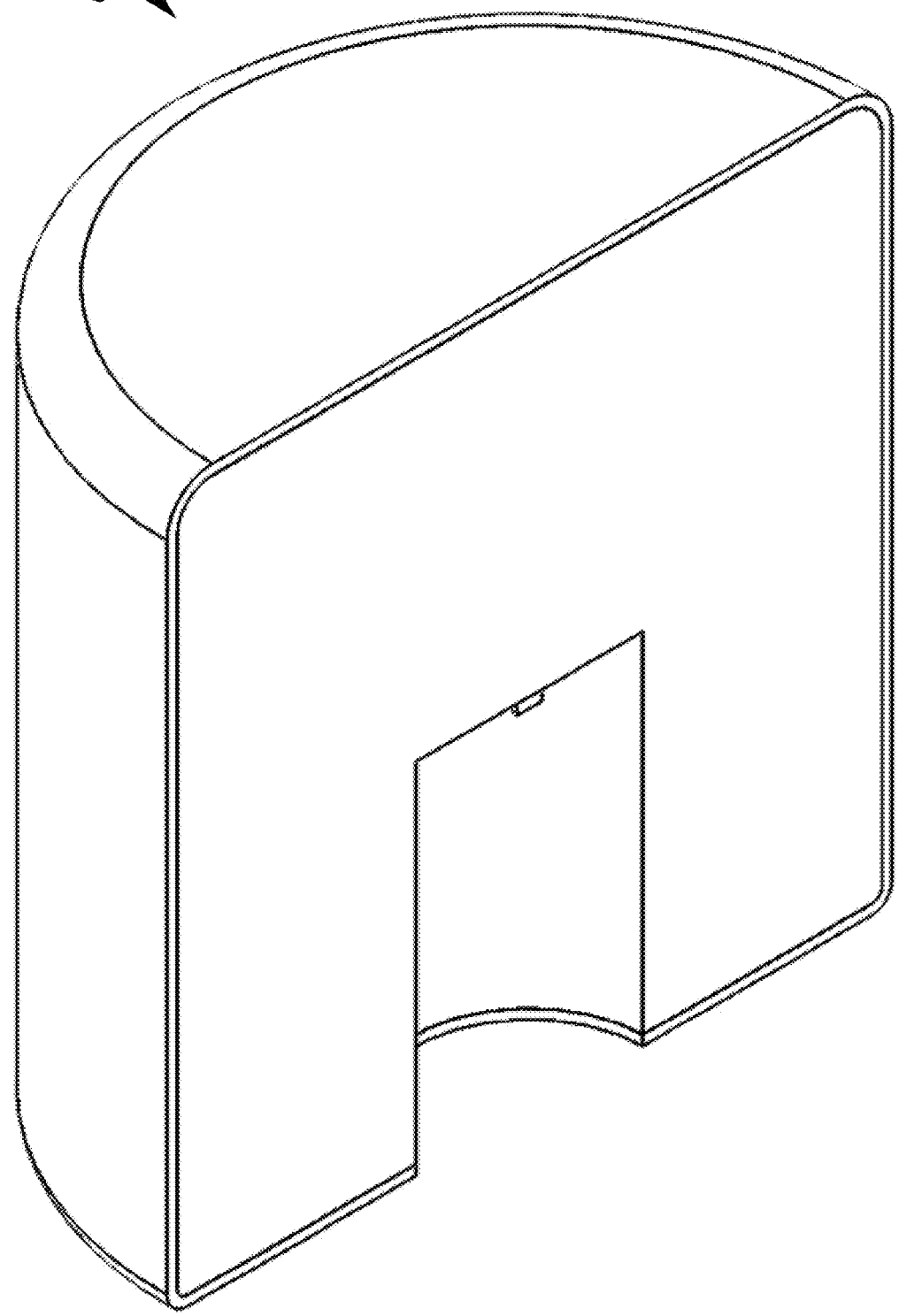
FIG. 66 illustrates a top right perspective right sectional view of a preferred exemplary cylindrical invention system embodiment incorporating a point-contact centroid signal contact.
Figure 67:
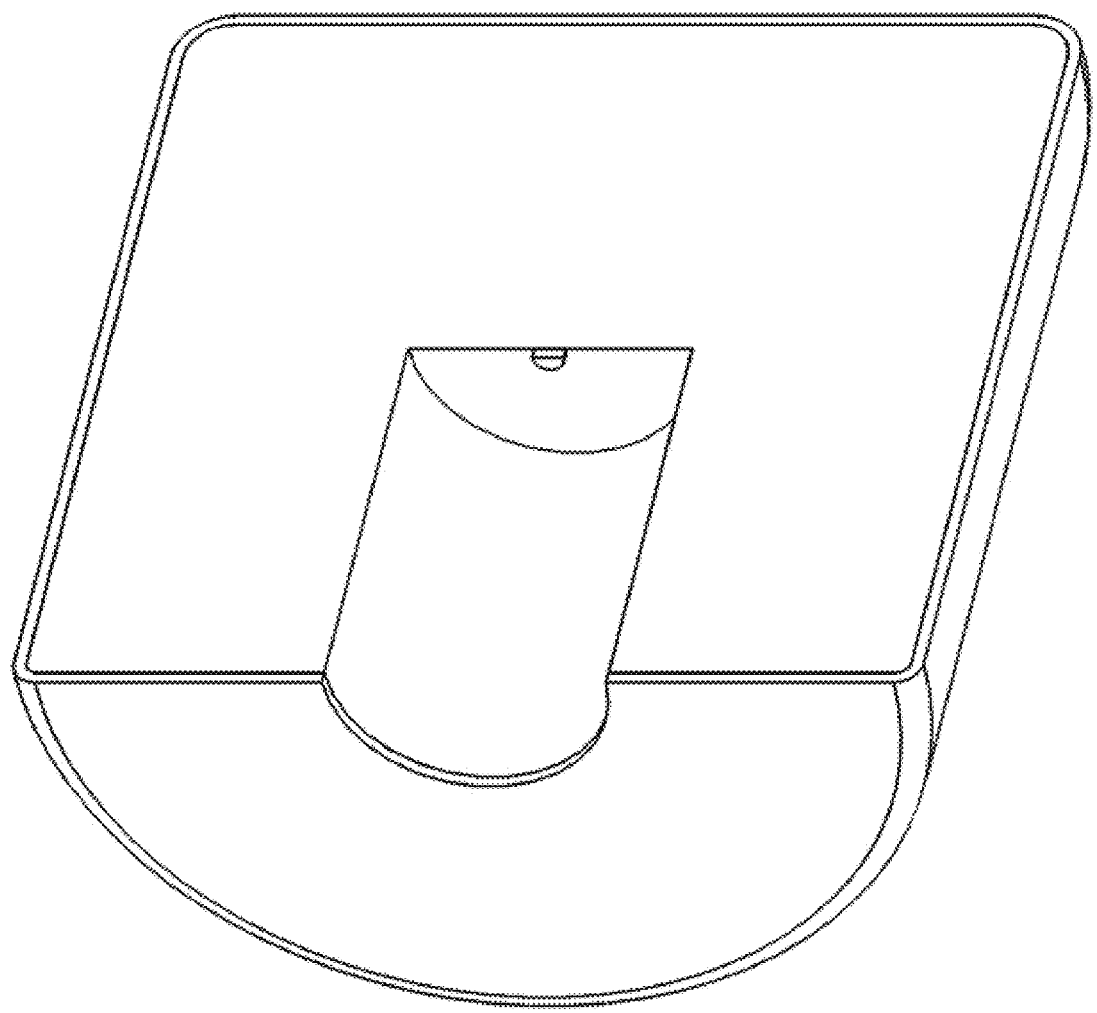
FIG. 67 illustrates a bottom front perspective front sectional view of a preferred exemplary cylindrical invention system embodiment incorporating a point-contact centroid signal contact.
Figure 128:
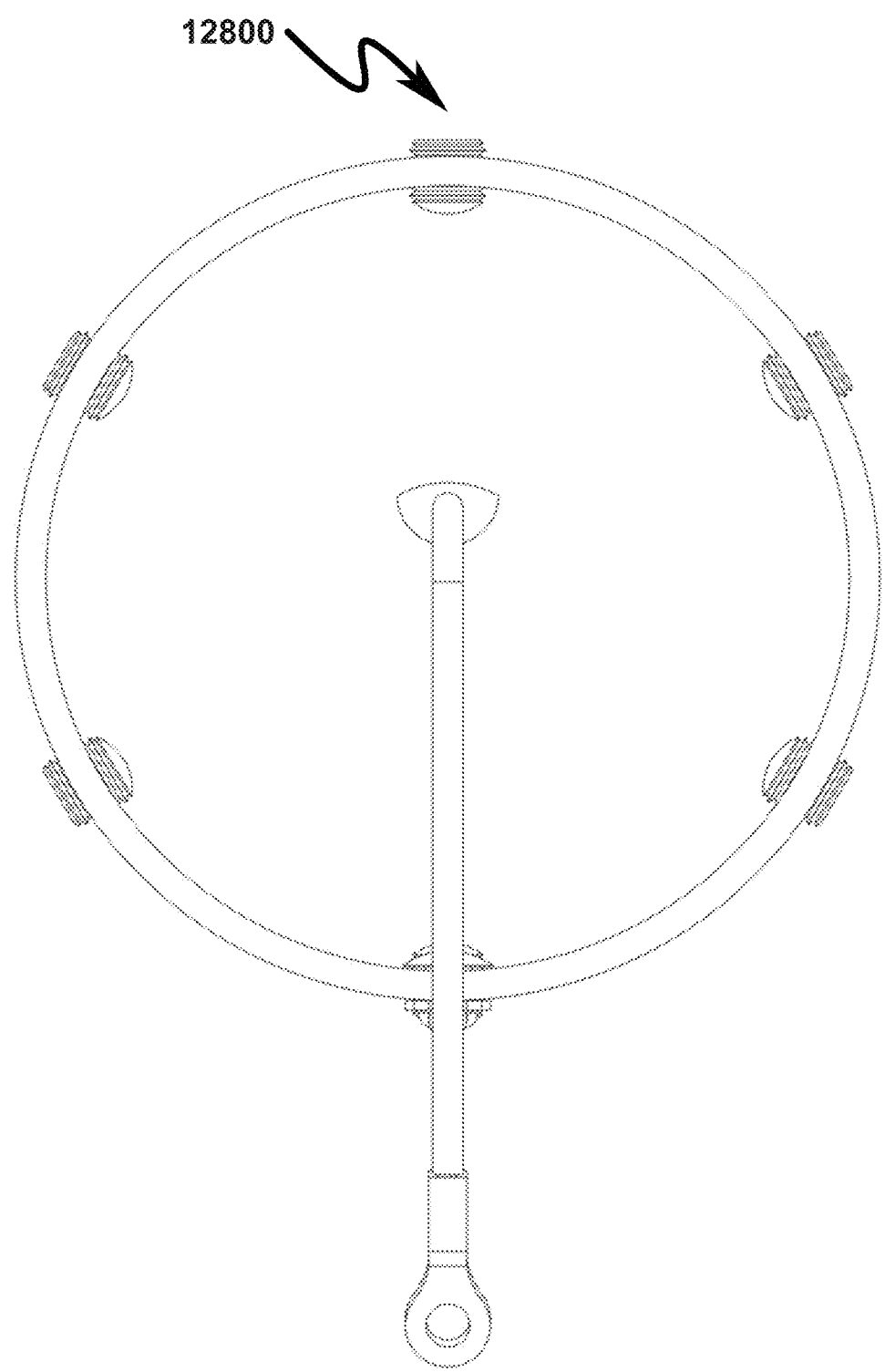

The preferred exemplary embodiment depicted in FIG. 41 (4100)-FIG. 48 (4800) may be modified in a wide variety of variants as depicted in FIG. 65 (6500)-FIG. 128 (12800), but generally have the following characteristics:

- The bulk semiconductor material (or combined segments of bulk semiconductor material) is symmetric around a central longitudinal axis.
- The bulk semiconductor material includes a central void detection cavity (CVDC) located along the central longitudinal axis of the bulk semiconductor material.
- The bulk semiconductor material includes a bulk signal collection contact that covers at least a portion of the outer surface of the bulk semiconductor material but does not contact the surface of the central void detection cavity (CVDC). Alternatively the bulk signal collection contact may cover the outer surface of the bulk semiconductor material and extend within the CVDC up to but not contacting a main signal contact within the central void detection cavity (CVDC) within the bulk semiconductor material.
- A main signal contact makes contact with the bulk semiconductor material and is located at the base of the central void detection cavity (CVDC) within the bulk semiconductor material. Alternatively, the main signal contact may make contact with the bulk semiconductor material as an annulus at the center of the CVDC along a central plane dividing the bulk semiconductor material.

These general construction parameters distinguish the present invention from prior art radiation detectors and permit improved performance over prior art constructions.

Exemplary Enclosure/Connections (4900)-(5600)

Figure 49:
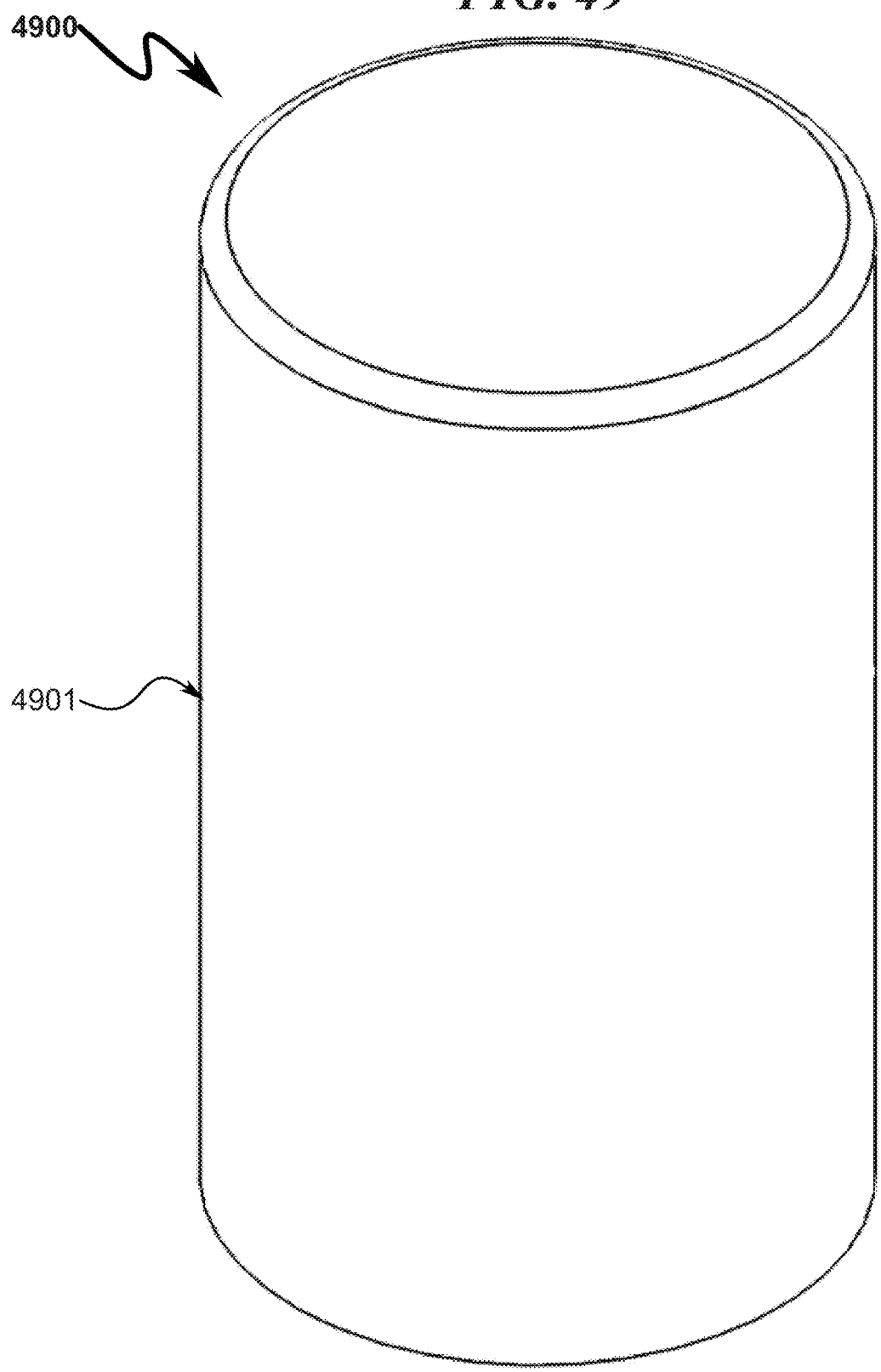
FIG. 49 illustrates a top right front perspective view of an exemplary invention embodiment centroid contact radiation detector assembly with enclosure installed.
Figure 50:
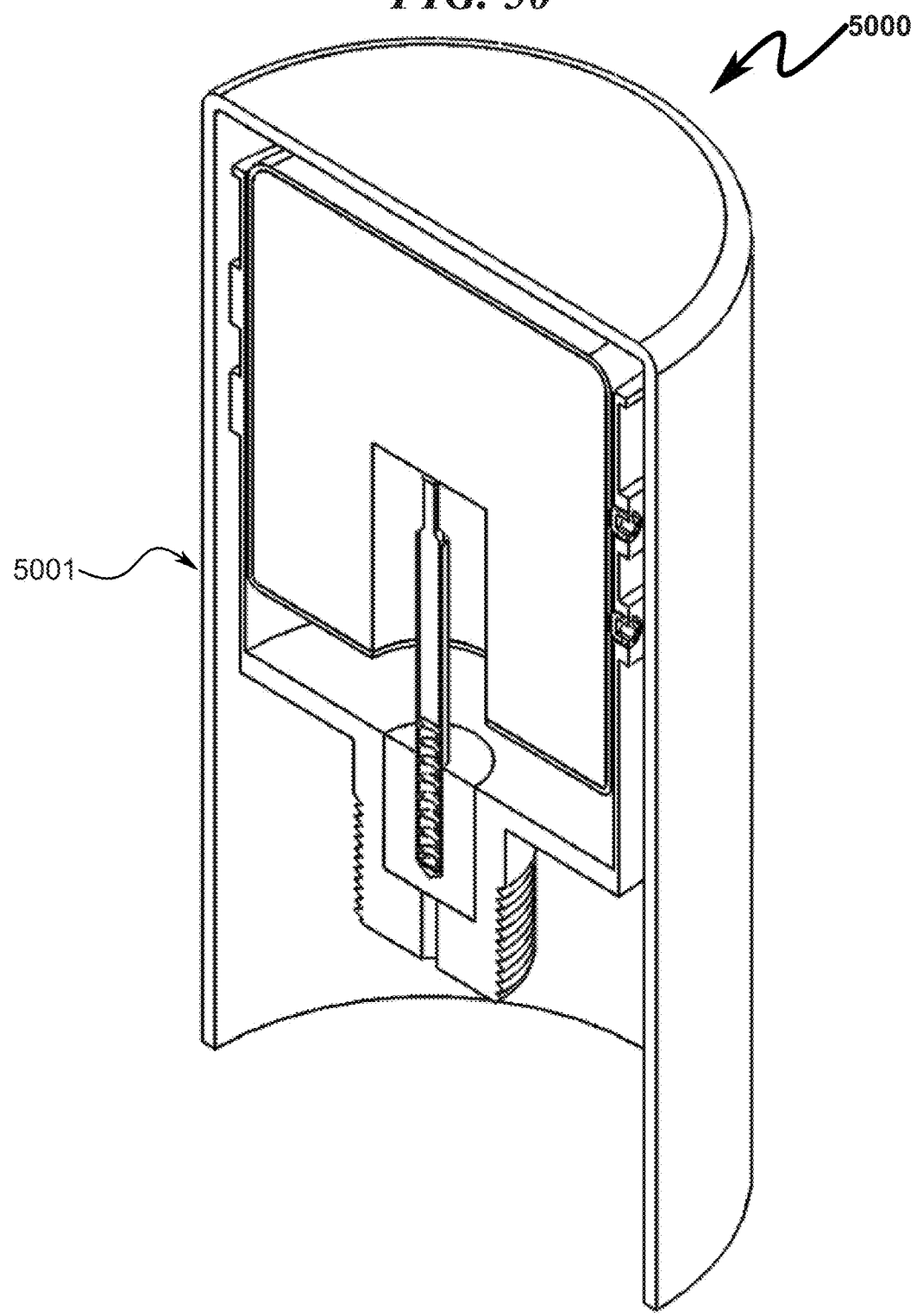
FIG. 50 illustrates a top right front perspective front section view of an exemplary invention embodiment centroid contact radiation detector assembly with enclosure installed.
Figure 51:
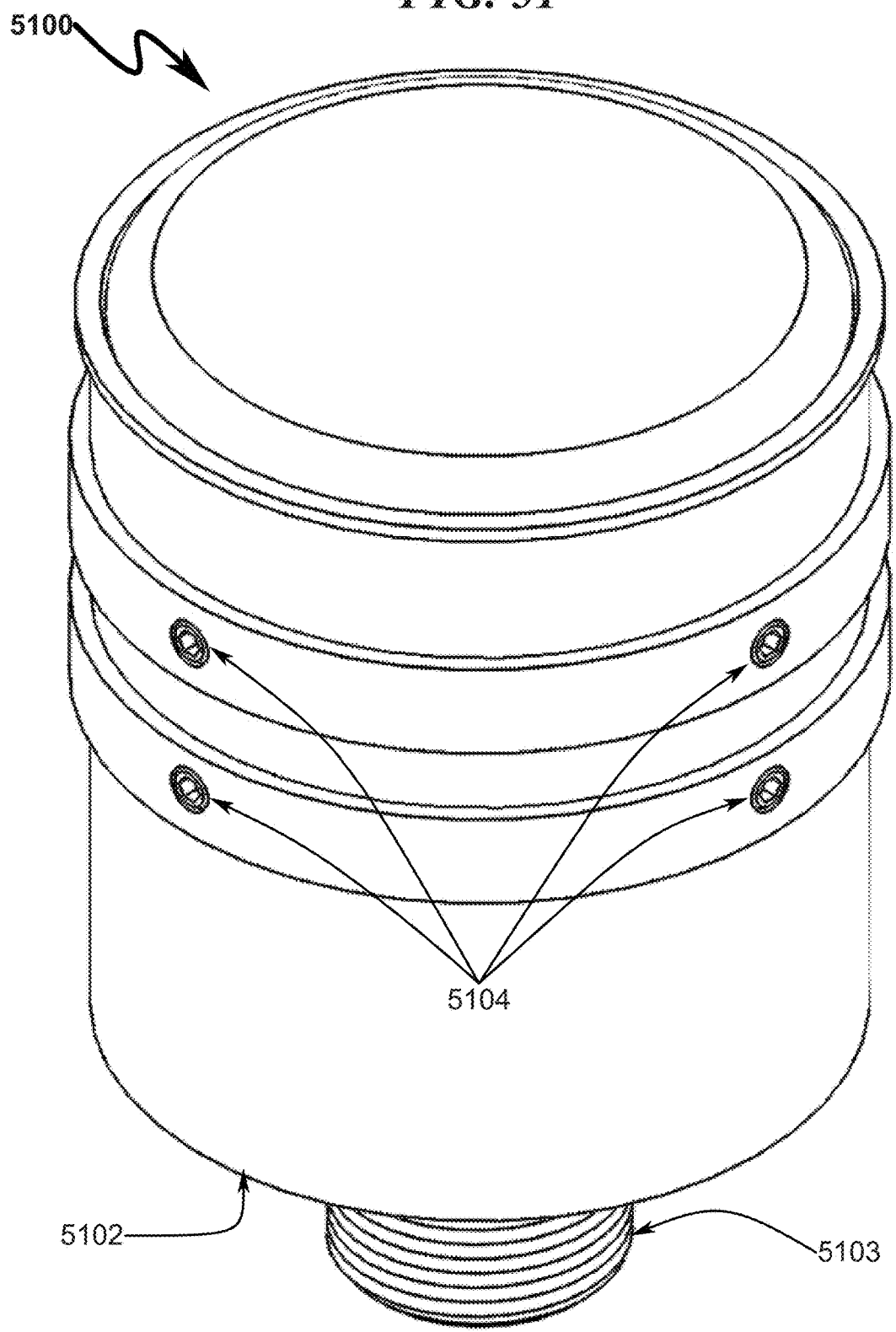
FIG. 51 illustrates a top right front perspective view of an exemplary invention embodiment centroid contact radiation detector with enclosure removed.
Figure 56:
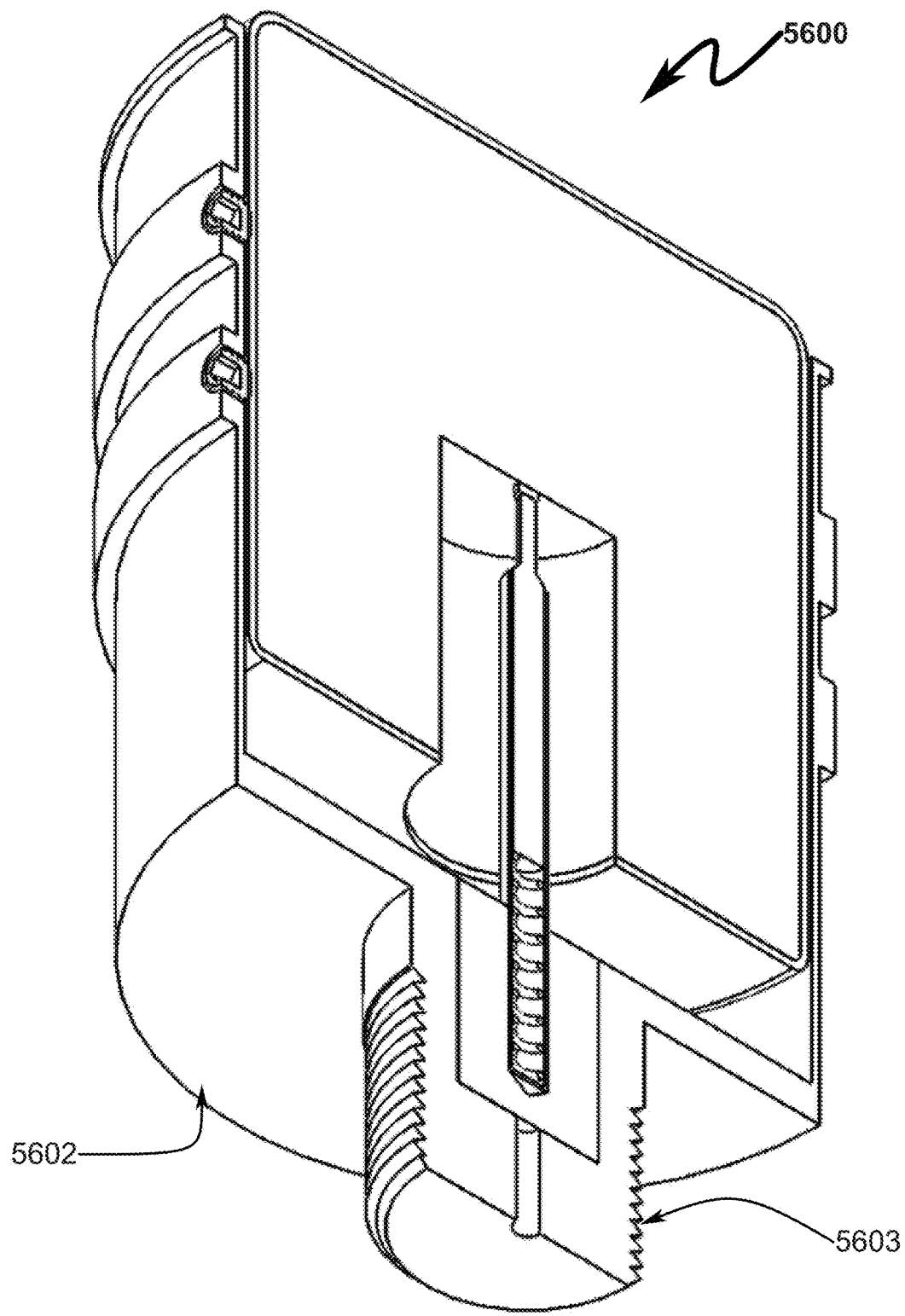
FIG. 56 illustrates a bottom right front perspective right side section view of an exemplary invention embodiment centroid contact radiation detector with enclosure removed.

Additional detail of electrical connections to an exemplary detector is presented in the drawing views of FIG. 49 (4900)-FIG. 56 (5600). Here it can be seen that the radiation detector assembly incorporates a covering enclosure (4901, 5001) that encompasses the centroid contact radiation detector (5100, 5200, 5300, 5400, 5500, 5600). The exemplary detector as shown is of a cylindrical form and incorporates a detector retaining bracket (5102, 5202, 5302, 5402, 5502, 5602) having provisions for treaded fastening (5103, 5203, 5303, 5403, 5503, 5603) to the remainder of the radiation detection system (not shown) and attachment to the bulk radiation detector semiconductor material via setscrews (5104) or other mechanical fastening means.

Figure 52:
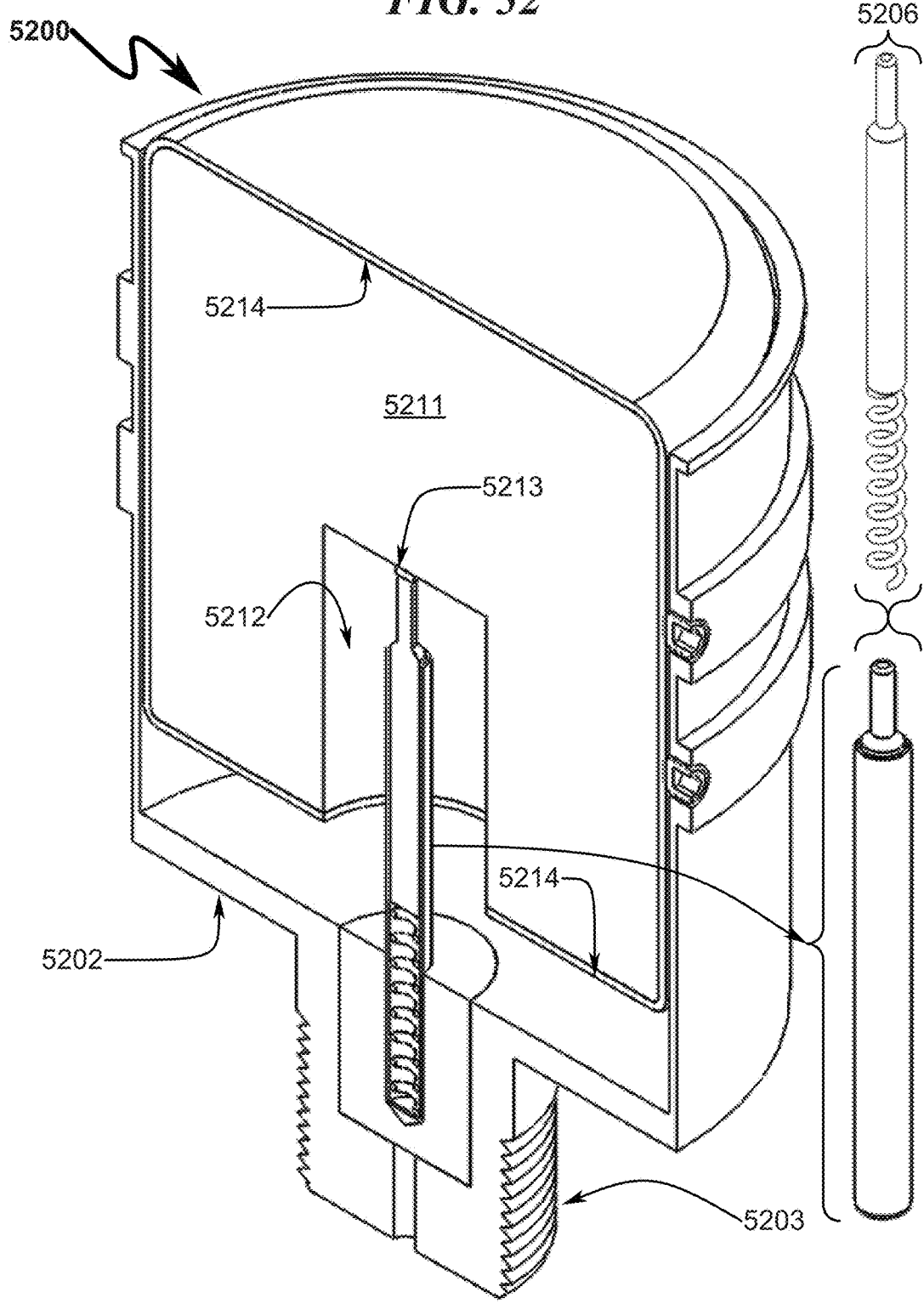
FIG. 52 illustrates a top right front perspective front side section view of an exemplary invention embodiment centroid contact radiation detector with enclosure removed.
Figure 53:
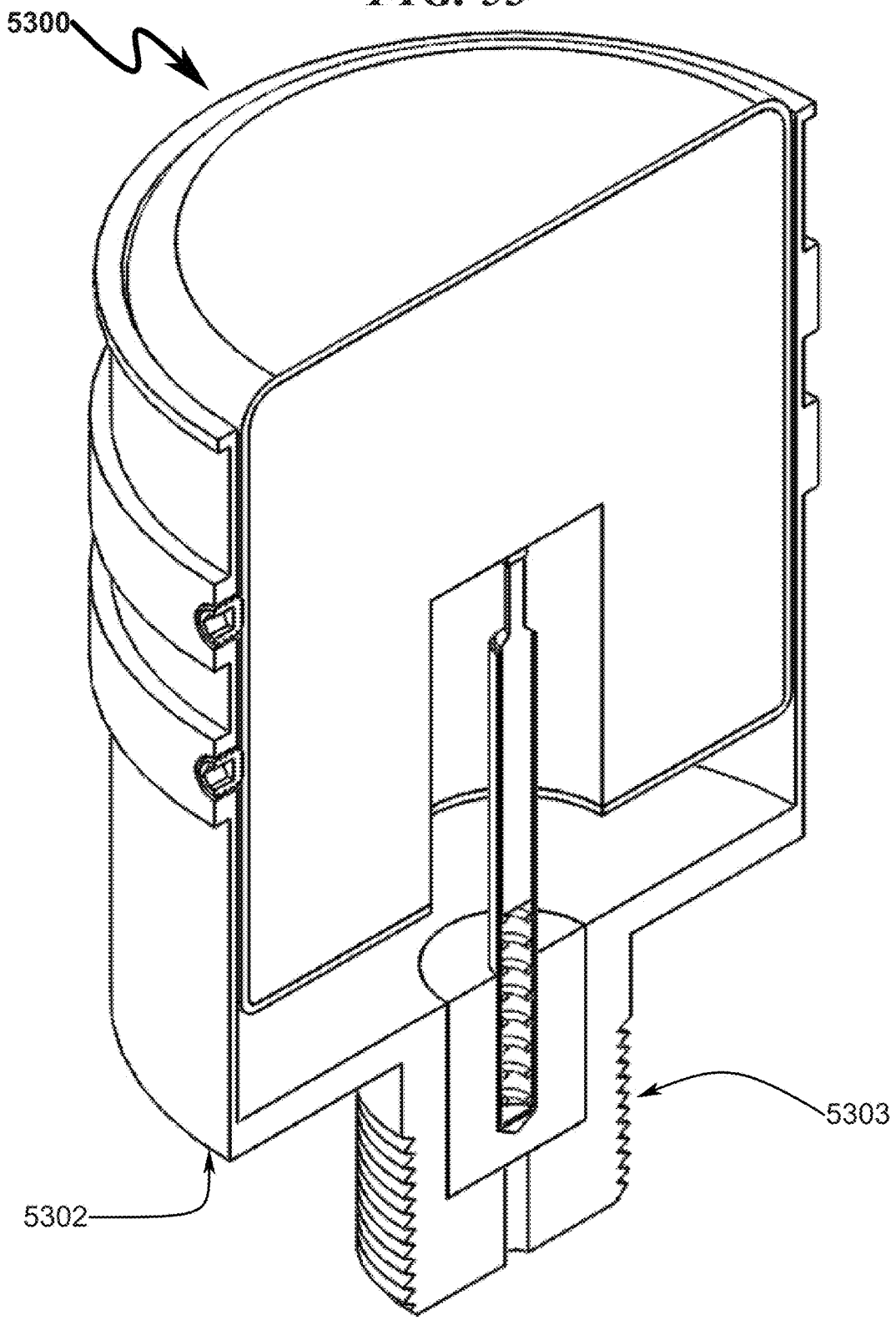
FIG. 53 illustrates a top right front perspective right side section view of an exemplary invention embodiment centroid contact radiation detector with enclosure removed.
Figure 54:
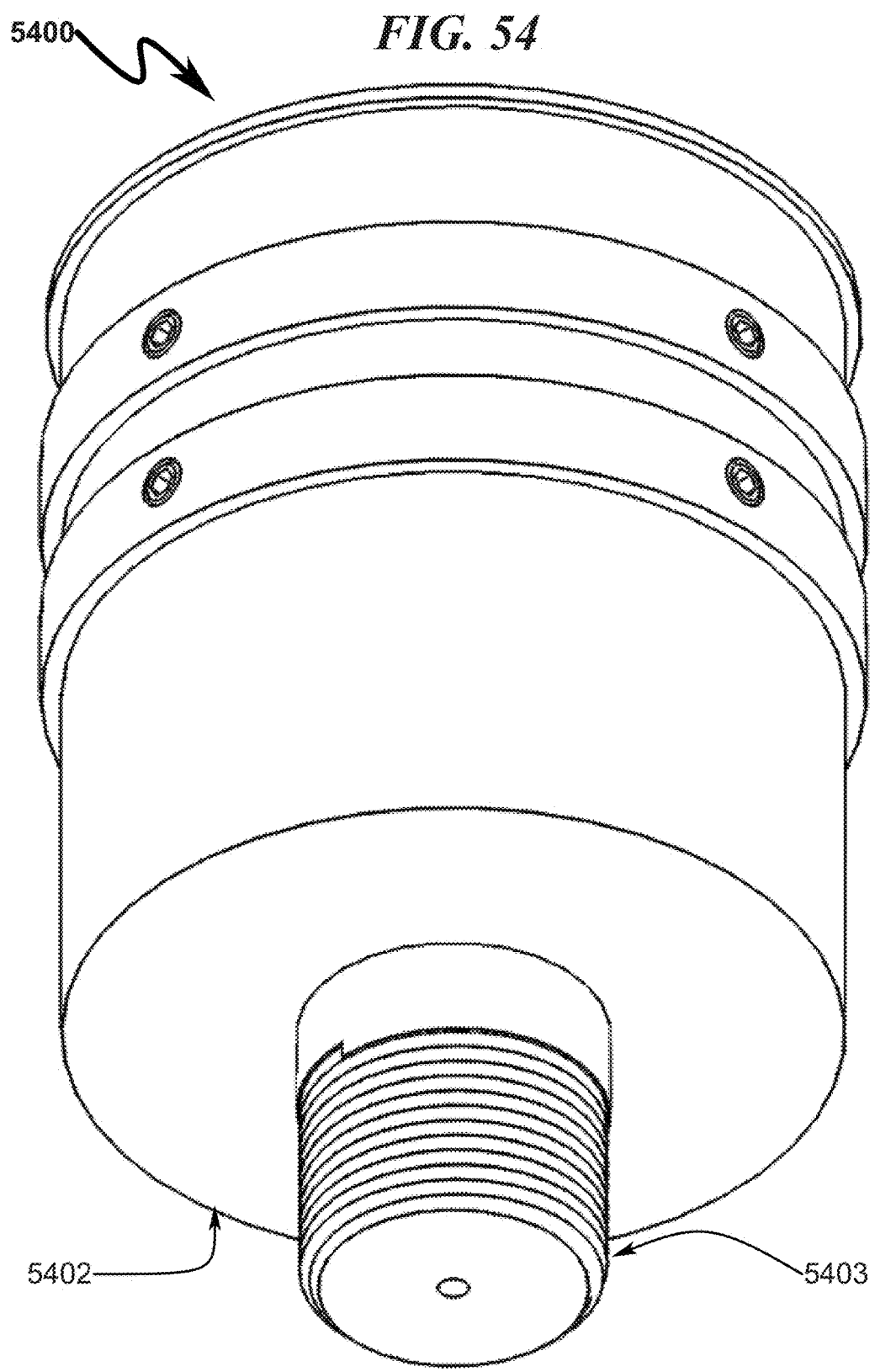
FIG. 54 illustrates a bottom right front perspective view of an exemplary invention embodiment centroid contact radiation detector with enclosure and detector housing removed.
Figure 55:
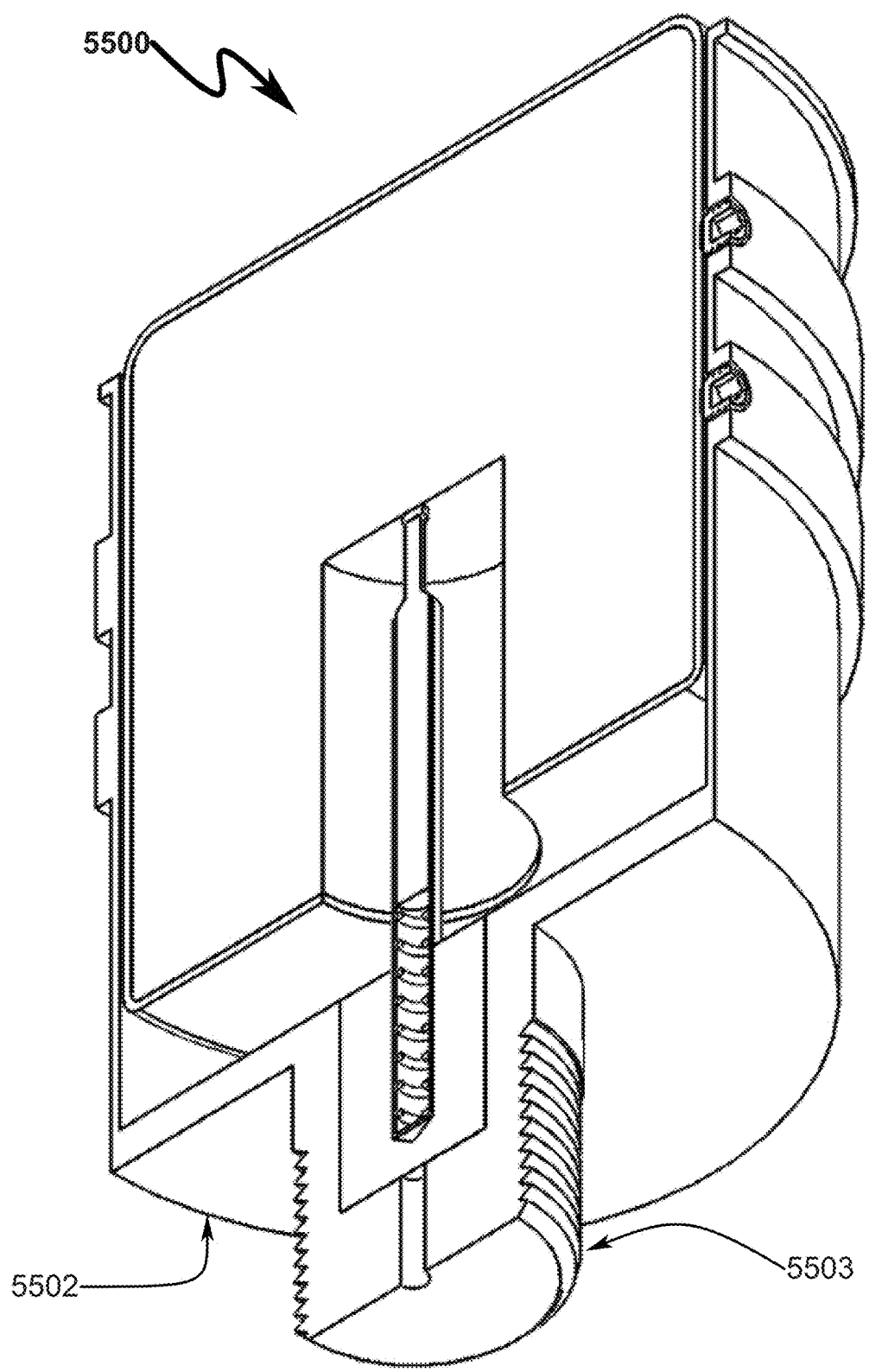
FIG. 55 illustrates a bottom right front perspective front side section view of an exemplary invention embodiment centroid contact radiation detector with enclosure removed.

Referencing the perspective sectional view of FIG. 52 (5200), it can be seen that the bulk semiconductor detector (5211) incorporates a central void cavity (5212) in which a P+ contact (5213) positioned centroidally with respect to the outer perimeter N+ contact (5214) surface of the bulk detector material (5211).

Mechanical/electrical contact with the centroid contact (5213) is accomplished using a spring-loaded POGO contactor (5206) that is detailed in cross-section and exploded assembly views in FIG. 52 (5200). It should be noted that the spring-loaded POGO contactor (5206) may be utilized to make mechanical/electrical contact with any of the centroid contact configurations presented herein such as the point contact, reduced-area contact, medium-area contact, large-area contact, hemispherical contact, semi-hemispherical contact, and radial contact configurations depicted in FIG. 65 (6500)-FIG. 128 (12800).

Centroid Signal Electrode Volume Proximity (5700)

Figure 57:
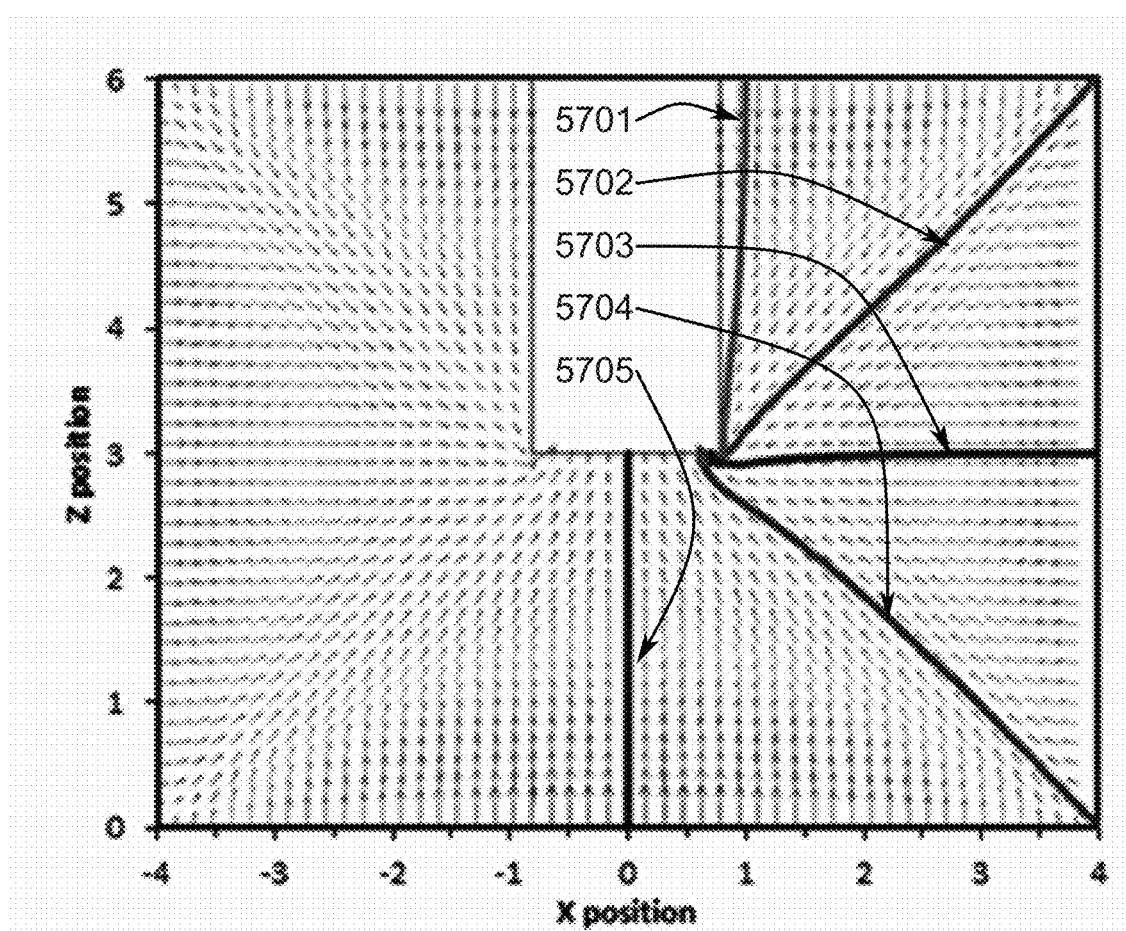
FIG. 57 illustrates a preferred exemplary invention embodiment of a centroid contact SAGe depicting proximity of the centroid signal electrode to all reaches of the PGEV volume.

One of the advantages to the present invention is the near equal proximity of the centroid contact to the volume of the PGEV. As generally depicted in FIG. 57 (5700), the transit paths (5701, 5702, 5703, 5704, 5705) are relatively equal with respect to the centroid contact design. This symmetry of construction results in a variety of performance improvements over the prior art and generally results in a more efficient and lower noise radiation detector than is current possible using prior art construction techniques.

Prior Art/Present Invention Performance Comparison (5800)

Figure 58:
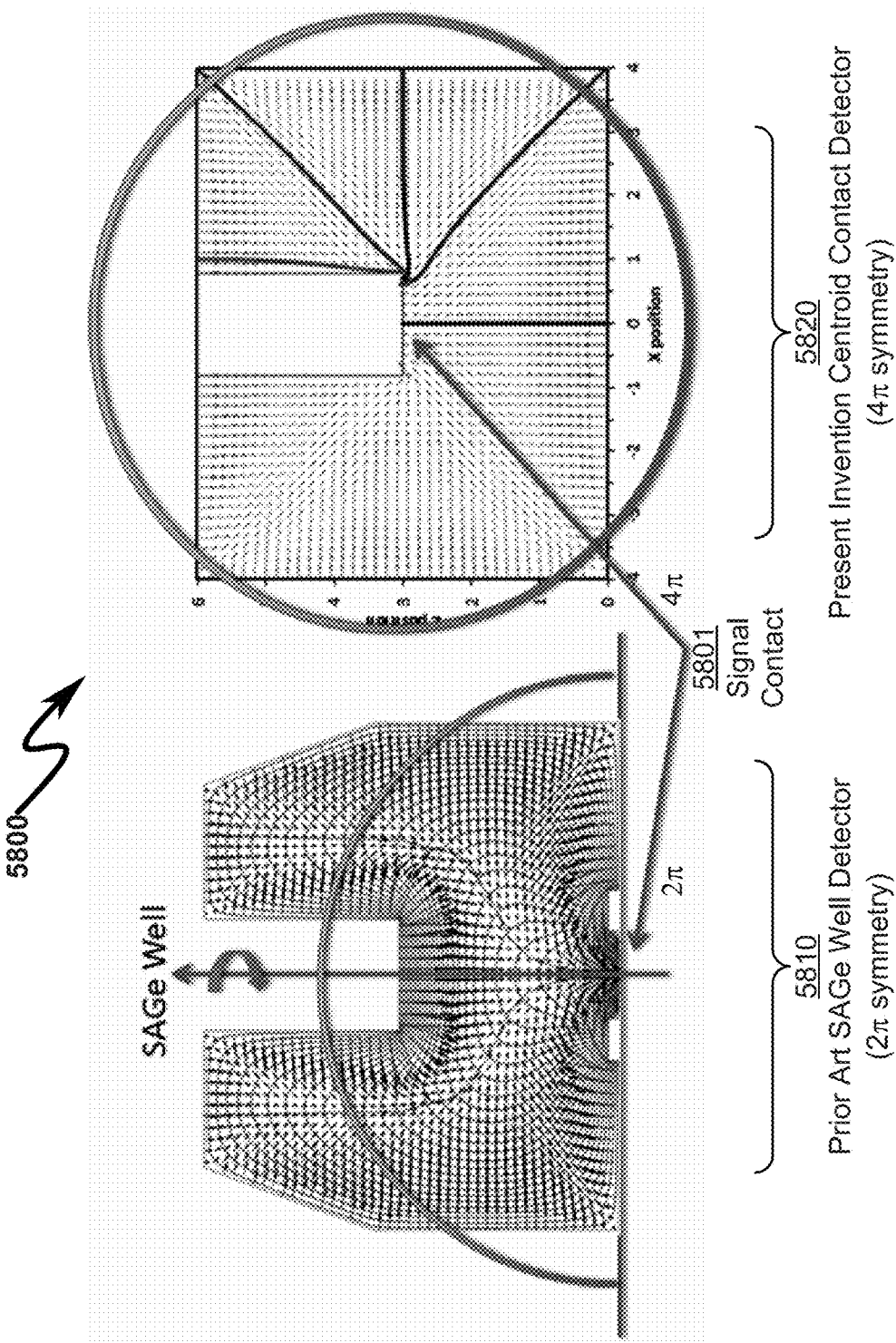
FIG. 58 illustrates side section views of a prior art SAGe well detector as compared to a similarly sized present invention centroid contact radiation detector and contrasts the electric field lines within the PGEV of both configurations.

FIG. 58 (5800) depicts a performance comparison between a prior art SAGe well detector (5810) and a similarly sized cylindrical construction of a centroid contact present invention embodiment (5820). The positions of the signal contacts (5801) are depicted in each example along with the equipotential and field line distributions with the PGEV for each example. As can be seen from the cross section analysis, the field lines are equally distributed in the present invention embodiment (5820) as compared to the prior art (5810) with more uniform equipotential distribution. This characteristic served to provide improved signal detection capability for the present invention (5820) as compared to the prior art (5810). This construction also provides for $4\pi$ field symmetry within the present invention (5820) as compared to the $2\pi$ symmetry available within the prior art detector (5810).

Exemplary Electric Field Distribution (5900)-(6000)

Figure 59:
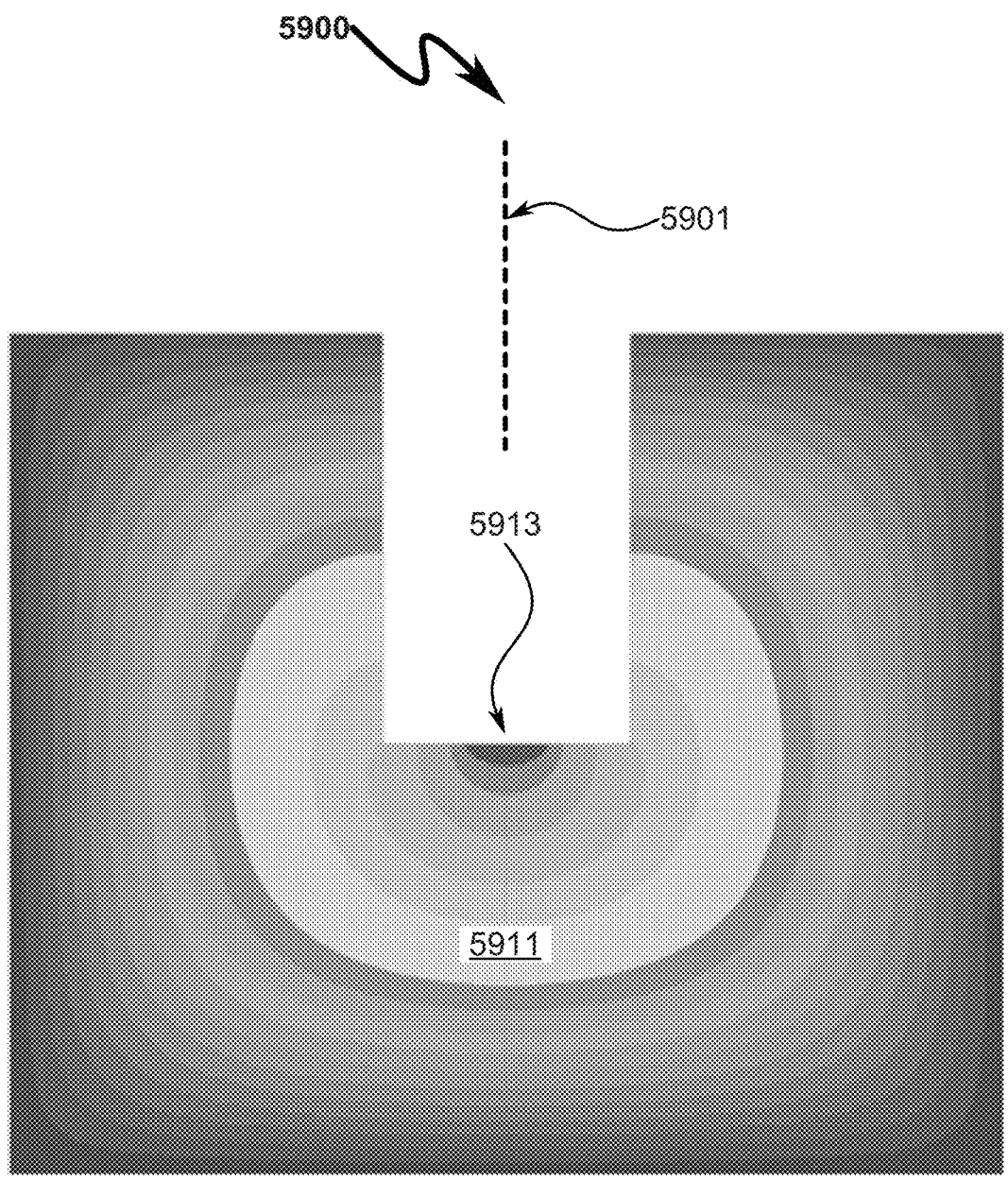
FIG. 59 illustrates a side section view of a preferred exemplary cylindrical invention embodiment depicting equipotential lines within the PGEV detector structure.
Figure 60:
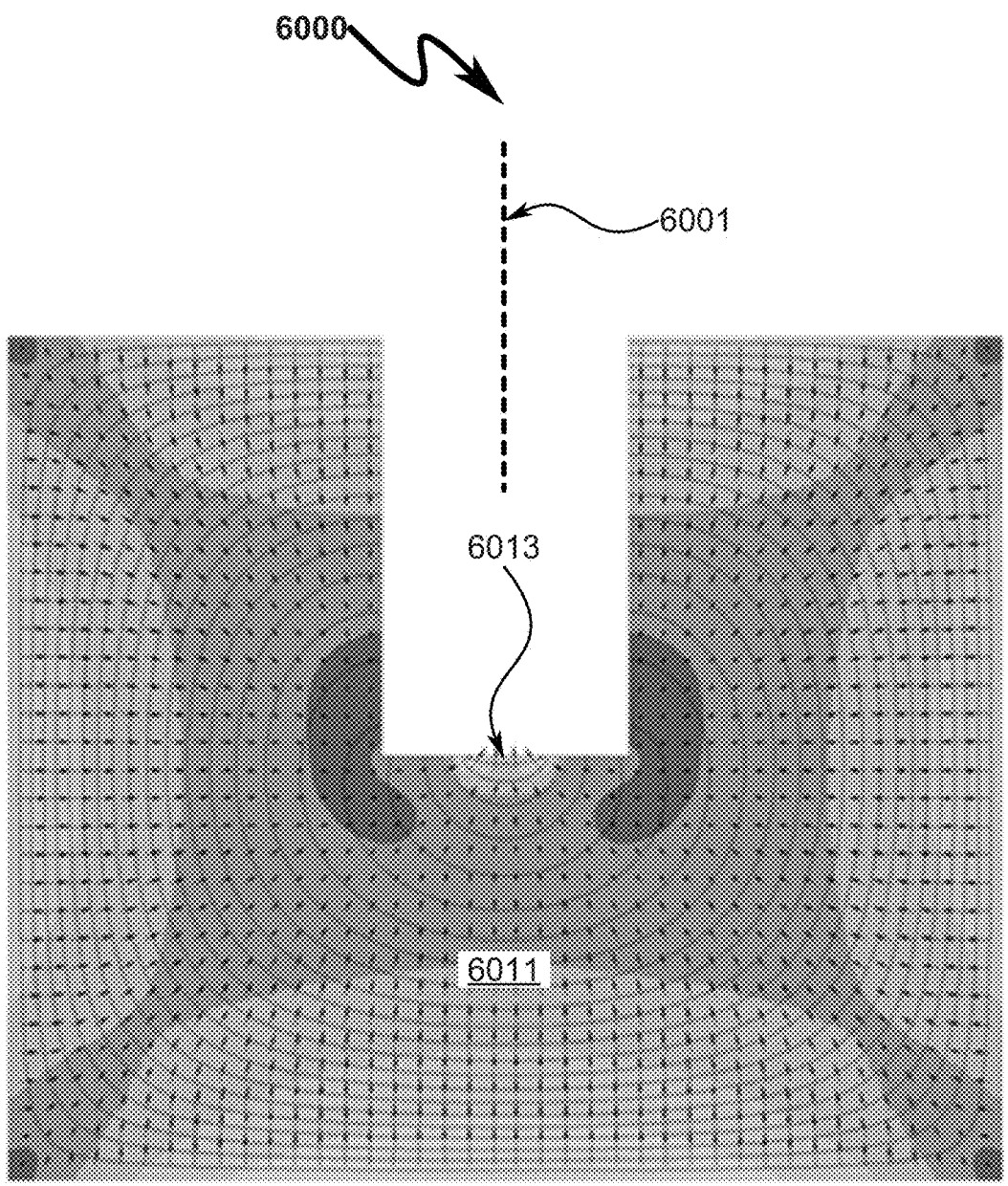
FIG. 60 illustrates a side section view of a preferred exemplary cylindrical invention embodiment depicting electric field vectors and equipotential lines within the PGEV detector structure.

FIG. 59 (5900) and FIG. 60 (6000) depict side section views of exemplary field distributions within a preferred exemplary cylinder form of the centroid contact radiation detector invention. Here it can be seen that the field distributions are symmetrically uniform about a common centroidal longitudinal axis (5901, 6001) common to the centroid contact (5913, 6013) on the PGEV (5911, 6011). This symmetric field uniformity aids in the improved radiation detection capabilities of the present invention.

Exemplary System Application Context (6100)

Figure 61:
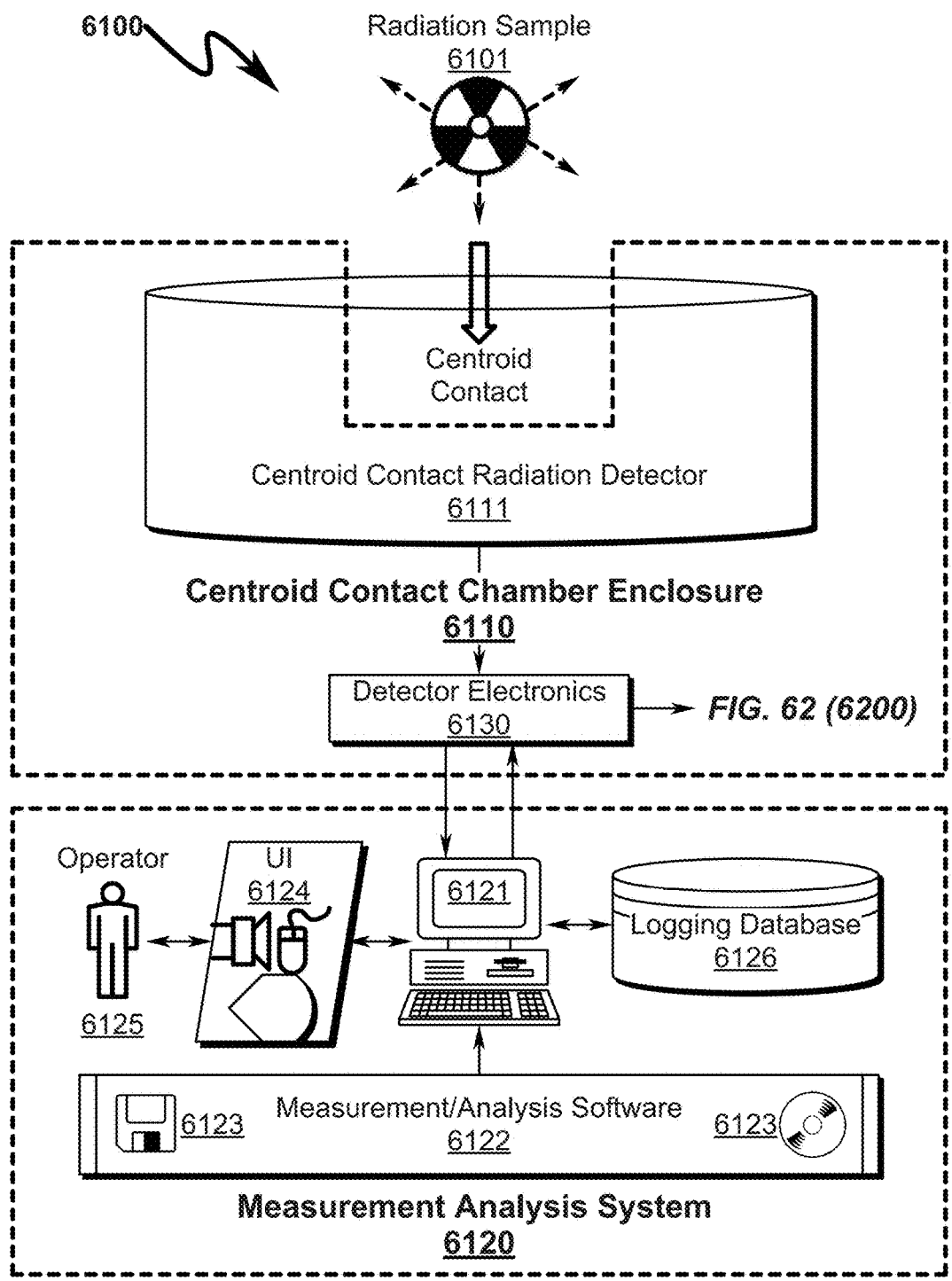
FIG. 61 illustrates an exemplary system application embodiment of the present invention as applied to a radiation analysis system.

The present invention centroid contact radiation detector may be seen in an overview system application context as generally illustrated in FIG. 61 (6100), wherein the centroid contact radiation detector (6111) may operate in conjunction with a computer system (6121) running under control of software (6122) read from a computer readable medium (6123) that generates a user interface (UI) (6124). This computer system (6121) may interact with an operator (6125) who typically interfaces with the computer system (6121) and/or software application/operating system (6122) using a user interface (6124) that may include a graphical user interface and/or an audible (speech-driven) user interface.

The present invention radiation detector may be utilized within a system application context as generally illustrated in FIG. 61 (6100) and graphically depicted in FIG. 9 (0900)-FIG. 32 (3200) in a cryostat application context. Within this radiation detector system application context, the centroid contact chamber enclosure (CCCE) (6110) enclosing the centroid contact radiation detector (6111) is configured to electrically connect the N+ and P+ electrodes of the centroid contact detector (6111) to detector electronics (6130) that interface to a measurement analysis system (MAS) (6120). The MAS (6120) incorporates a computing device (6121) to collect the radiation count information from the detector electronics (6130) and process this using measurement/analysis software (6122) read from a computer readable medium (6123). This software provides for a user interface (6124) enabling an operator (6125) to direct operation of the computing device (6121) and thus supervision of the detector electronics (6130) operation. Data collected by the measurement analysis software (6122) may be logged to a database (6126) for archiving and further analysis purposes.

Exemplary Analog/Digital Signal Processing Chain (6200)

Figure 62:
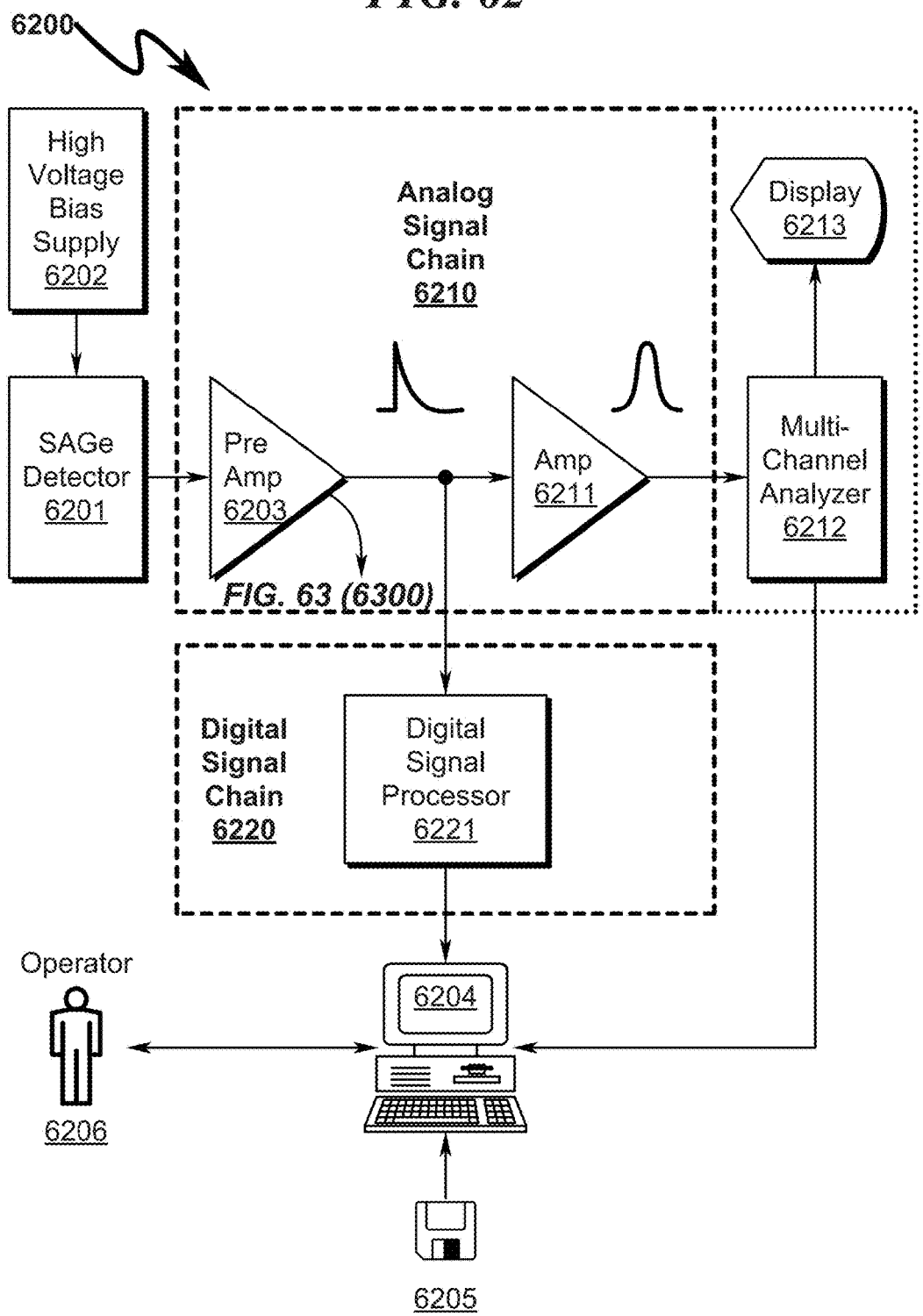
FIG. 62 illustrates exemplary schematics of radiation detector analog/digital processing chains useful in implementing a number of preferred invention embodiments.

While many forms of signal processing chains are anticipated to be useful within the present invention application context, exemplary signal processing schematics incorporating analog (6210) and digital (6220) processing variations are provided in FIG. 62 (6200) as illustrative examples of typical signal processing chains that may be used with the SAGe well radiation detector described herein. Within this context the following statements are generally applicable:
  The preamplifier (6203) is generally attached to or built into the detector assembly (6201) as generally illustrated in FIG. 25 (2500)-FIG. 32 (3200).
  The amplifier (6211) provides signal gain and shaping to improve the signal-to-noise ratio.
  For analog signal chain configurations (6210), the MCA (multi-channel analyzer) (6212) comprises an ADC (analog-to-digital converter) and histogramming memory and a display (6213) that shows the acquired spectrum counts.
  For digital signal chain configurations (6220), the DSP (digital signal processor) (6221) comprises a fast ADC which digitizes the analog input signal and uses digital filtering algorithms to optimize the signal-to-noise ratio. The resultant data is stored and accessed by a computer (6204) (running under control of software read from a computer readable medium (6205)) which displays spectra and processed the data for qualitative and quantitative analysis.
  For radioisotope identification and quantitative analysis a computer system (6204) is usually included that incorporates gamma analysis software read from a computer readable medium (6205), and provides for an operator (6206) control interface.

One skilled in the art will recognize that mixed analog/digital signal processing chains are also possible and that the depicted signal chains may be augmented within a wide range without departing from the spirit of the invention.

Exemplary Detector Circuitry (6300)

While many forms of detector circuitry are anticipated to be useful within the present invention application context, exemplary detector schematics incorporating AC-coupled (6310) and DC-coupled (6320) variations are provided in FIG. 63 (6300) as illustrative examples of typical detector circuits that may be used with the SAGe well radiation detector described herein. One skilled in the art will recognize that many other types of detector circuits are possible and that these circuits may be augmented in a wide variety of applications. The present invention anticipates that these detector circuits may be implemented as standalone component assemblies within the detector enclosure as generally depicted in FIG. 25 (2500)-FIG. 32 (3200), or in some embodiments integrated within one or more active circuitry layers of the PGEV body.

Preferred Exemplary Method Embodiment (6400)

Figure 64:
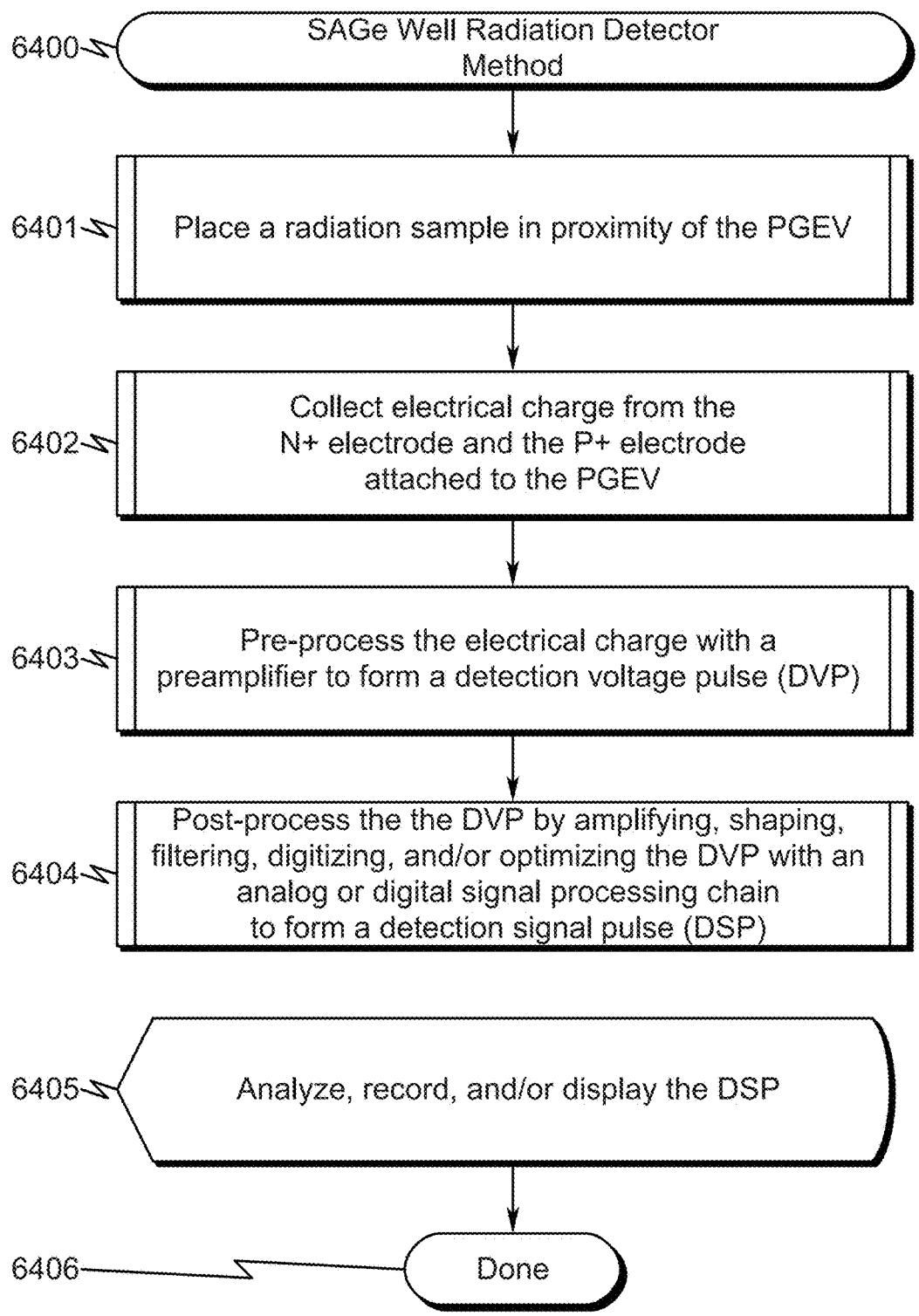
FIG. 64 illustrates a generalized flowchart depicting steps associated with a preferred exemplary invention method.

As generally seen in the flowchart of FIG. 64 (6400), the present invention SAGe well radiation detector method used in conjunction with the system embodiments described herein may be generally described in terms of the following steps:
  (1) placing a radiation sample in the external VECE sample cavity formed by the surface profile of the IWCV in a SAGe well radiation detector (6401);
  (2) collecting electrical charge from the N+ electrode and the P+ electrode attached to the PGEV (6402);
  (3) pre-processing the electrical charge with a preamplifier to form a detection voltage pulse (DVP) (6403);
  (4) post-processing the DVP by amplifying, shaping, filtering, digitizing, and/or optimizing the DVP with an analog and/or digital signal processing chain to form a detection signal pulse (DSP) (6404); and
  (5) analyzing, recording, and/or displaying the DSP (6405).

Note that this method may incorporate displays, audible alarms, or other type of human and/or computer interfaces in conjunction with data logging and/or mathematical analysis of the collected radiation detector information. This general method summary may be augmented by the various elements described herein to produce a wide variety of invention embodiments consistent with this overall design description.

Point Contact Cylindrical Embodiment (6500)-(6800)

Figure 68:
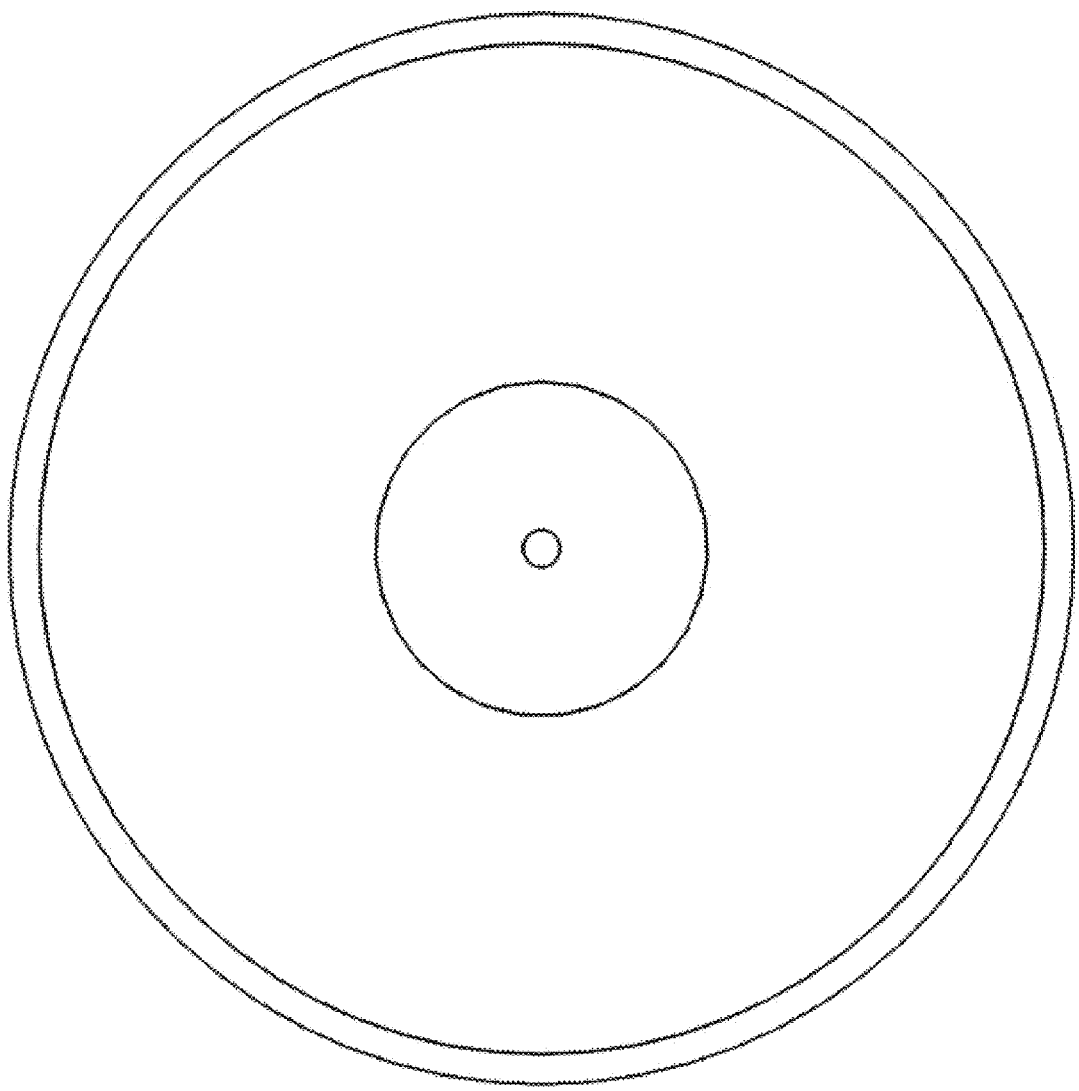
FIG. 68 illustrates a bottom view of a preferred exemplary cylindrical invention system embodiment incorporating a point-contact centroid signal contact.

FIG. 65 (6500)-FIG. 68 (6800) depict a preferred exemplary cylindrical invention embodiment in which the centroid contact (6512) is implemented as a point contact structure.

Reduced-Area Contact Cylindrical Embodiment (6900)-(7200)

Figure 69:
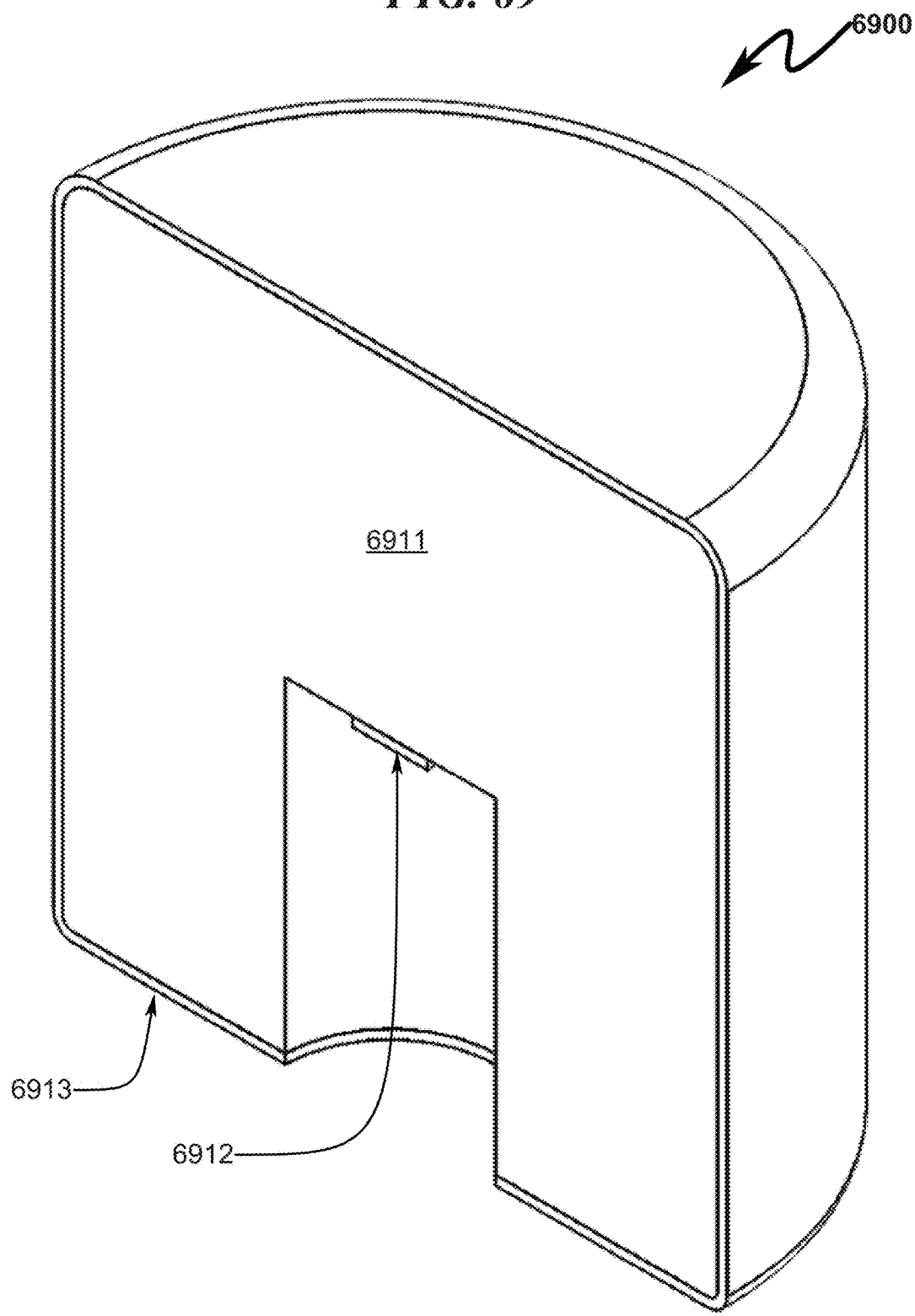
FIG. 69 illustrates a top right perspective front sectional view of a preferred exemplary cylindrical invention system embodiment incorporating a reduced-area centroid signal contact.
Figure 70:
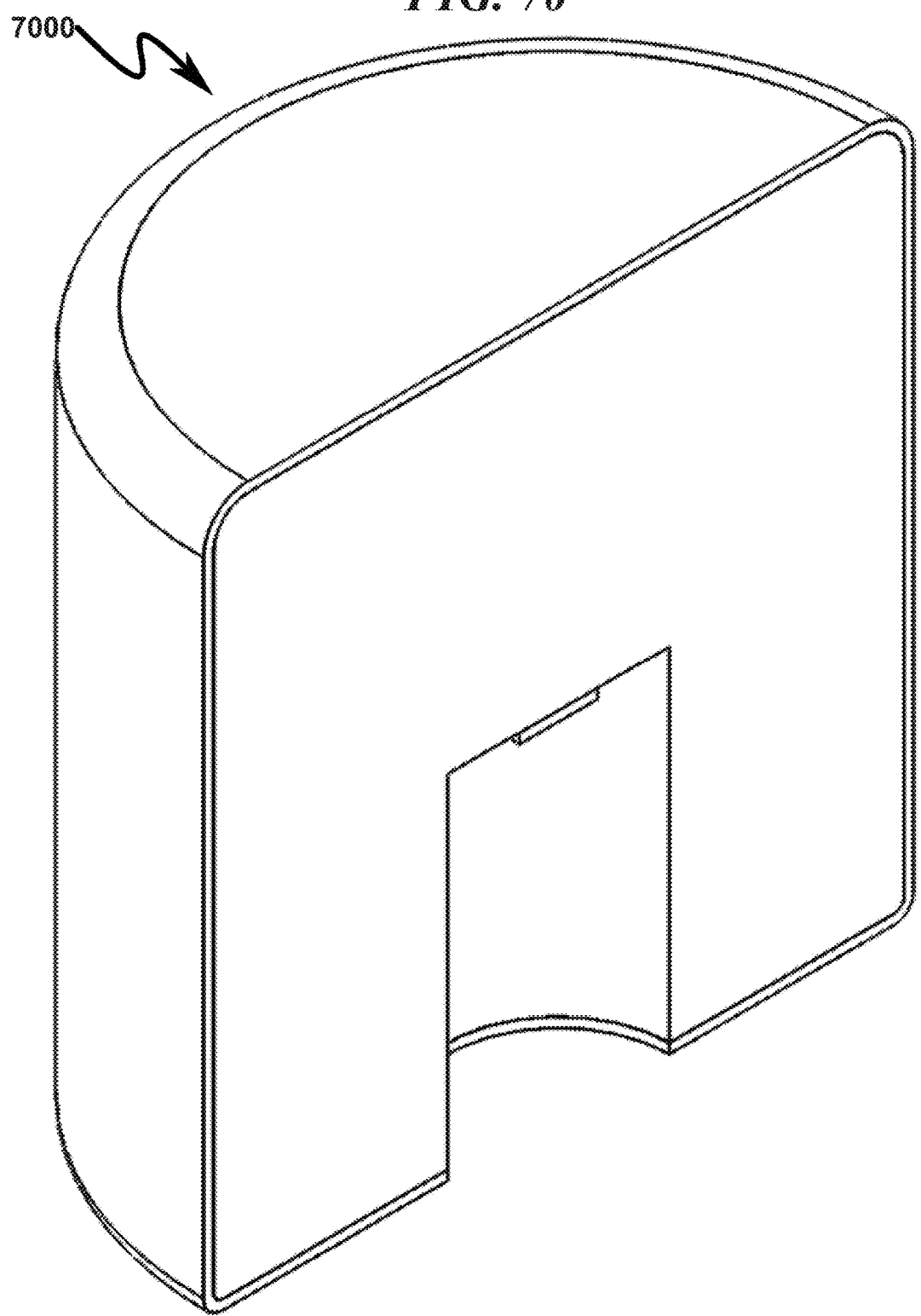
FIG. 70 illustrates a top right perspective right sectional view of a preferred exemplary cylindrical invention system embodiment incorporating a reduced-area centroid signal contact.
Figure 71:
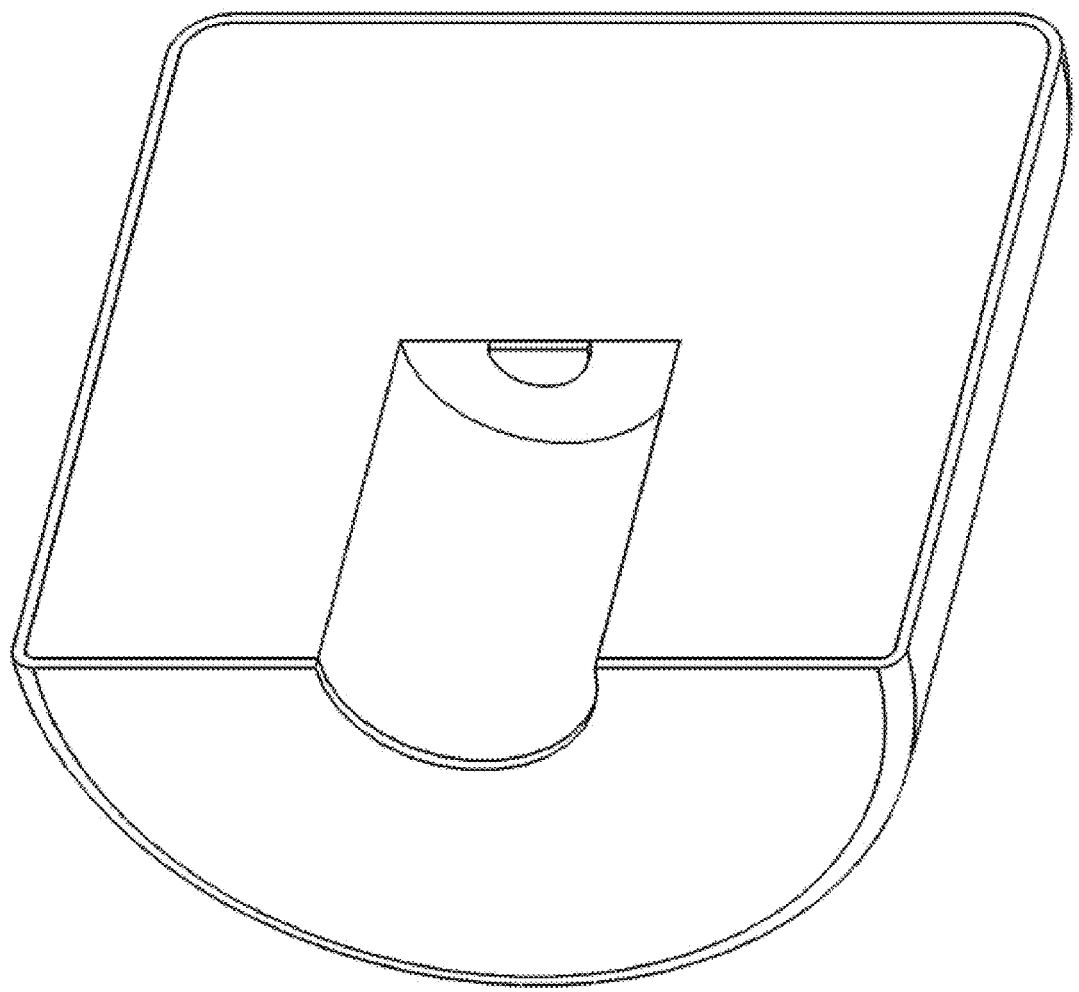
FIG. 71 illustrates a bottom front perspective front sectional view of a preferred exemplary cylindrical invention system embodiment incorporating a reduced-area centroid signal contact.
Figure 72:
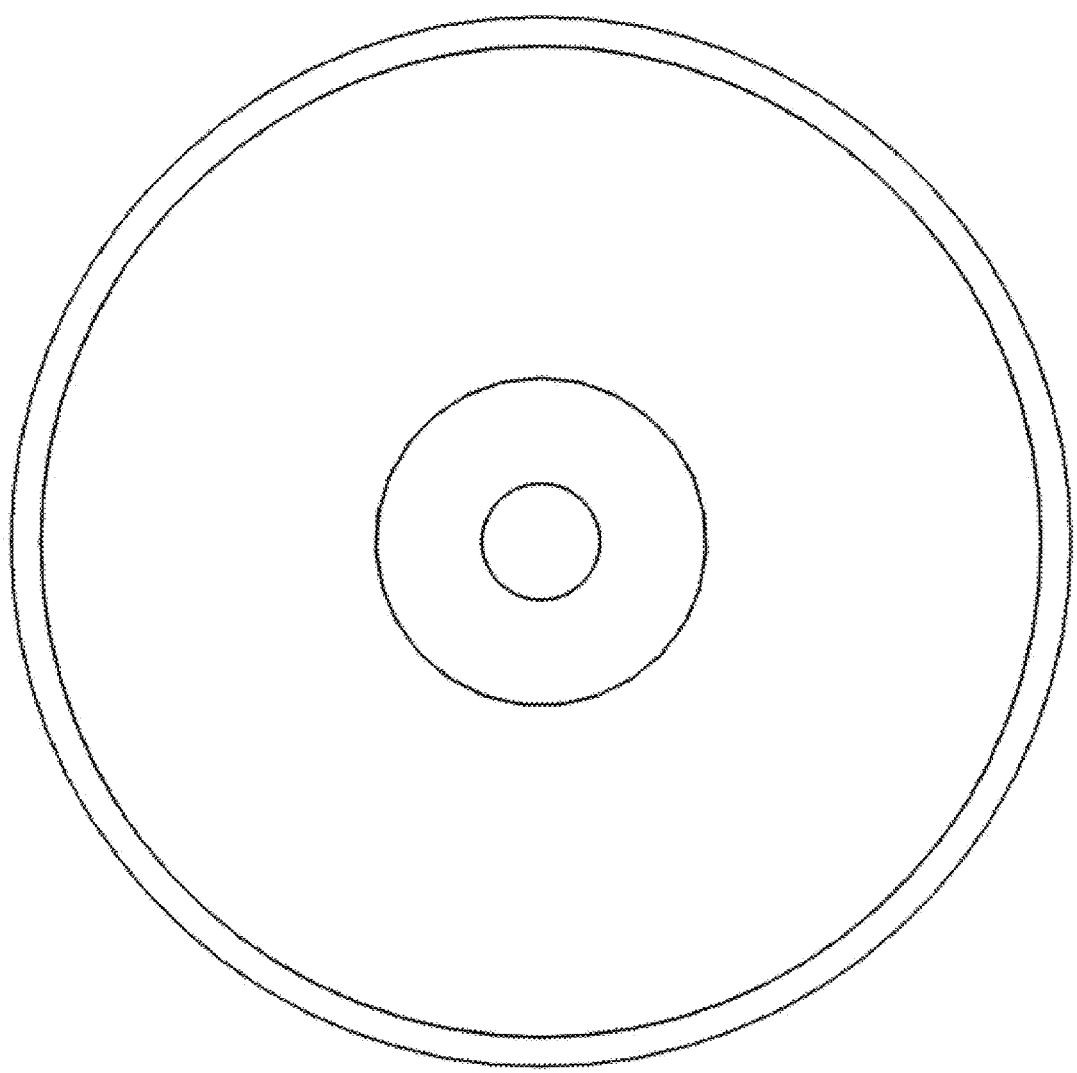
FIG. 72 illustrates a bottom view of a preferred exemplary cylindrical invention system embodiment incorporating a reduced-area centroid signal contact.

FIG. 69 (6900)-FIG. 72 (7200) depict a preferred exemplary cylindrical invention embodiment in which the centroid contact (6912) is implemented as a reduced-area contact structure.

Large-Area Contact Cylindrical Embodiment (7300)-(7600)

Figure 73:
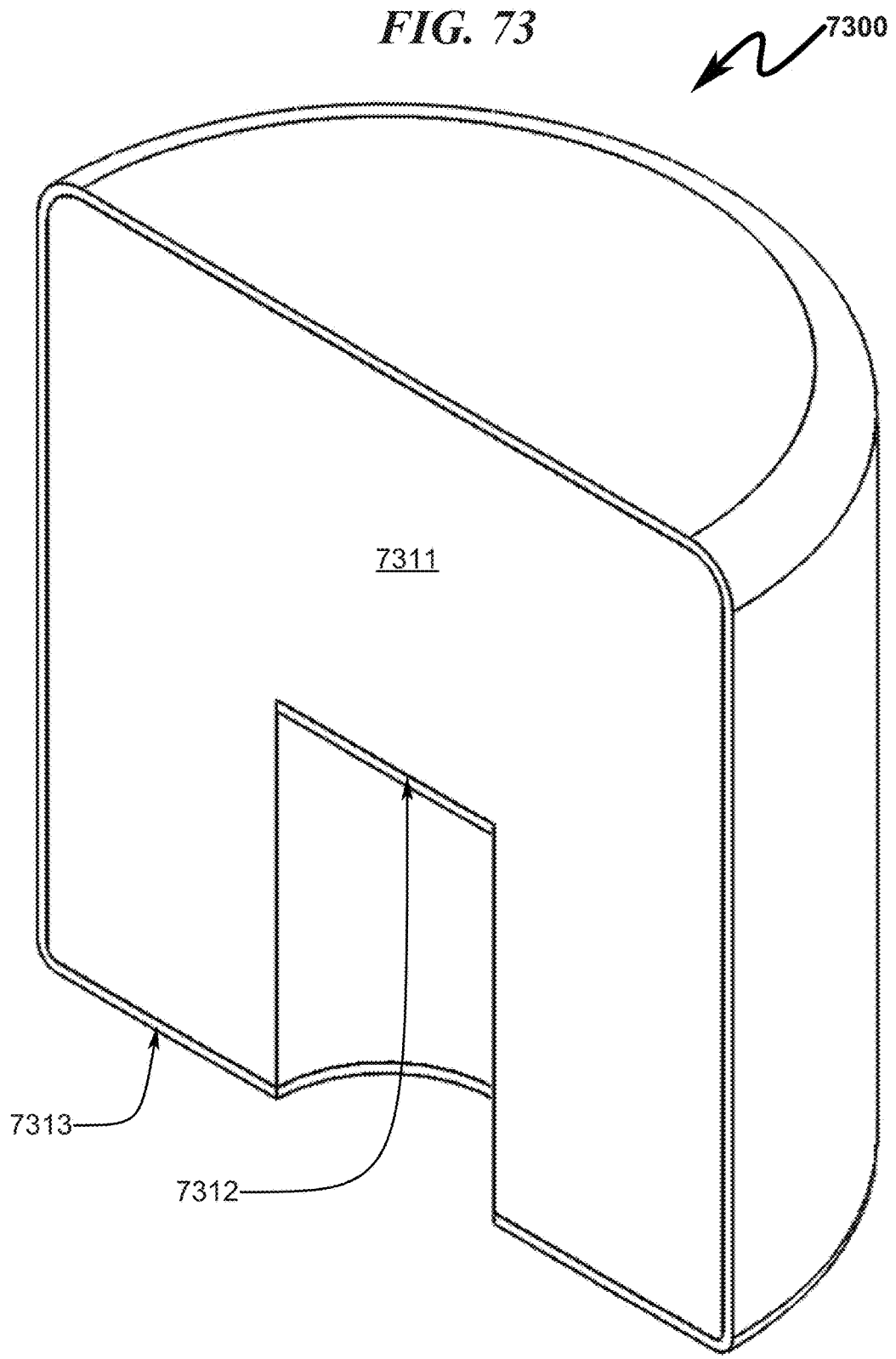
FIG. 73 illustrates a top right perspective front sectional view of a preferred exemplary cylindrical invention system embodiment incorporating a large-area centroid signal contact.
Figure 74:
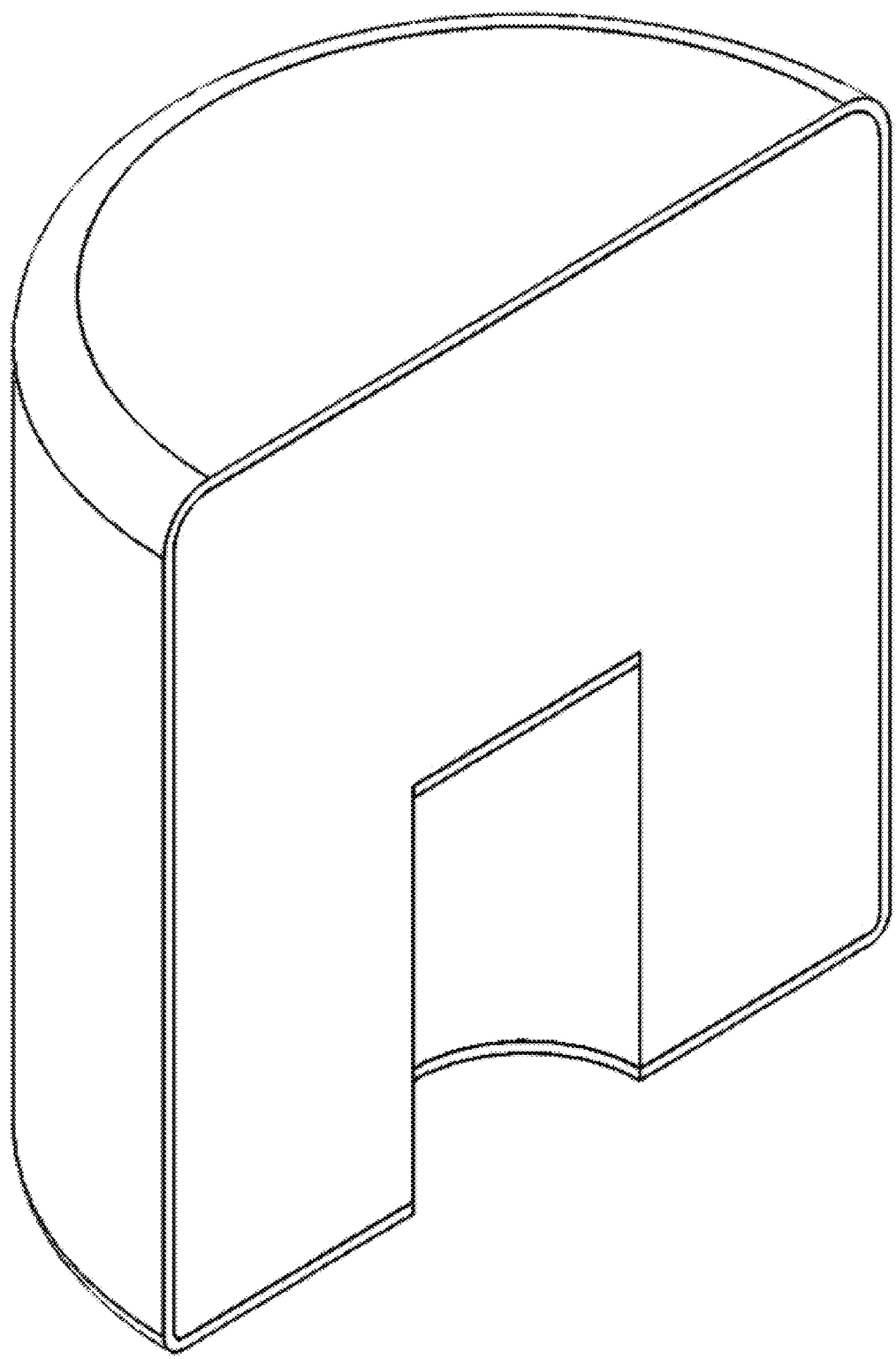
FIG. 74 illustrates a top right perspective right sectional view of a preferred exemplary cylindrical invention system embodiment incorporating a large-area centroid signal contact.
Figure 75:
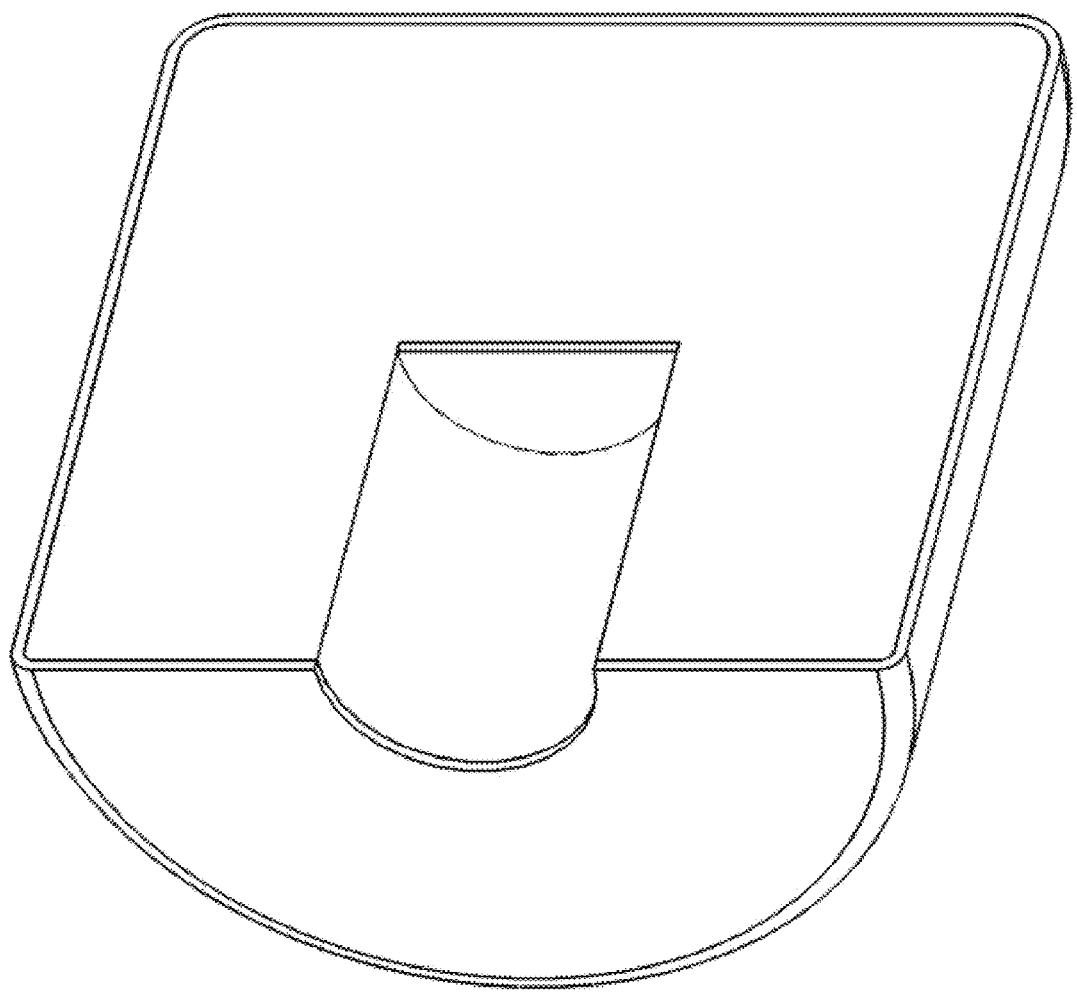
FIG. 75 illustrates a bottom front perspective front sectional view of a preferred exemplary cylindrical invention system embodiment incorporating a large-area centroid signal contact.
Figure 76:
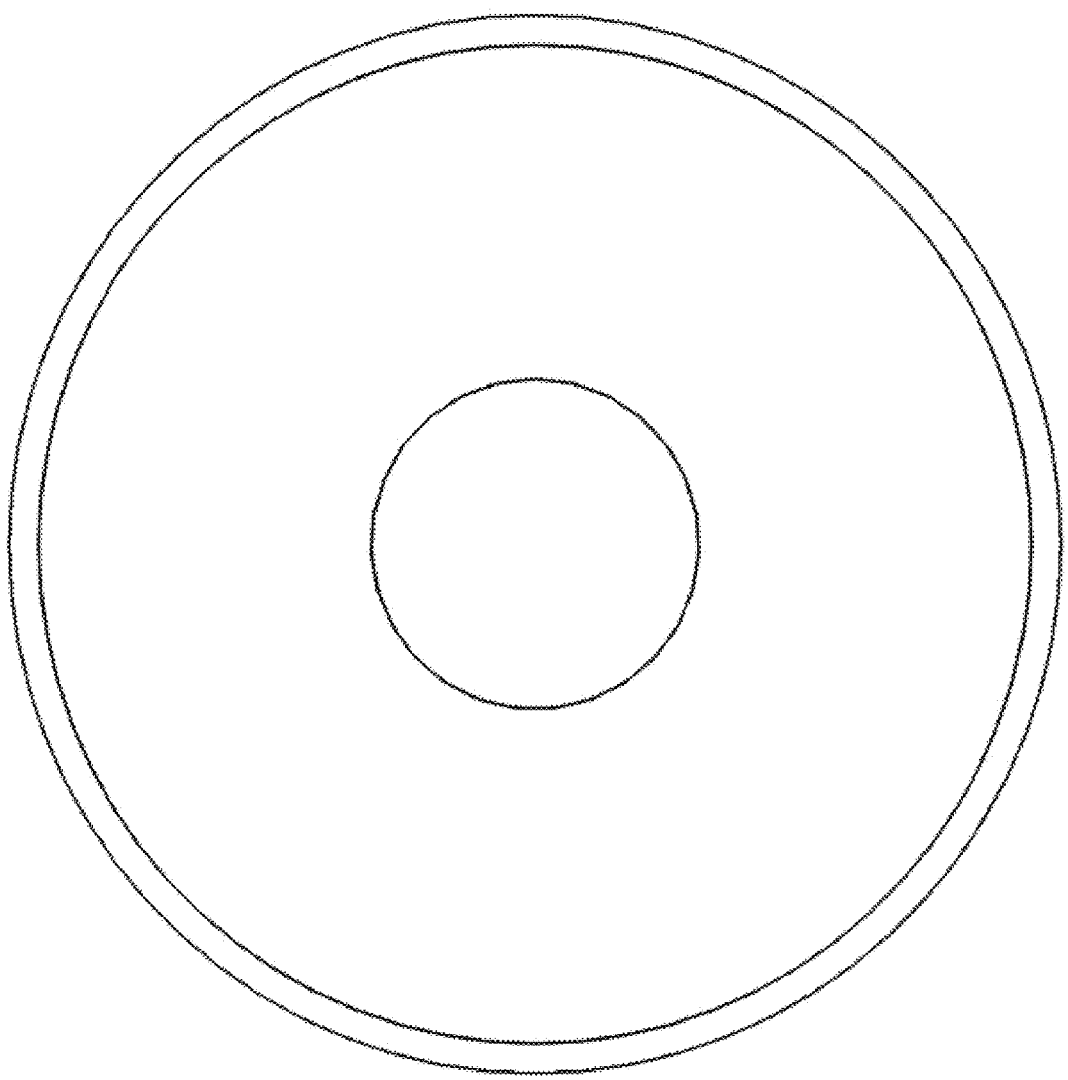
FIG. 76 illustrates a bottom view of a preferred exemplary cylindrical invention system embodiment incorporating a large-area centroid signal contact.

FIG. 73 (7300)-FIG. 76 (7600) depict a preferred exemplary cylindrical invention embodiment in which the centroid contact (7312) is implemented as a large-area contact structure.

Medium-Area Contact Cylindrical Embodiment (7700)-(8000)

Figure 77:
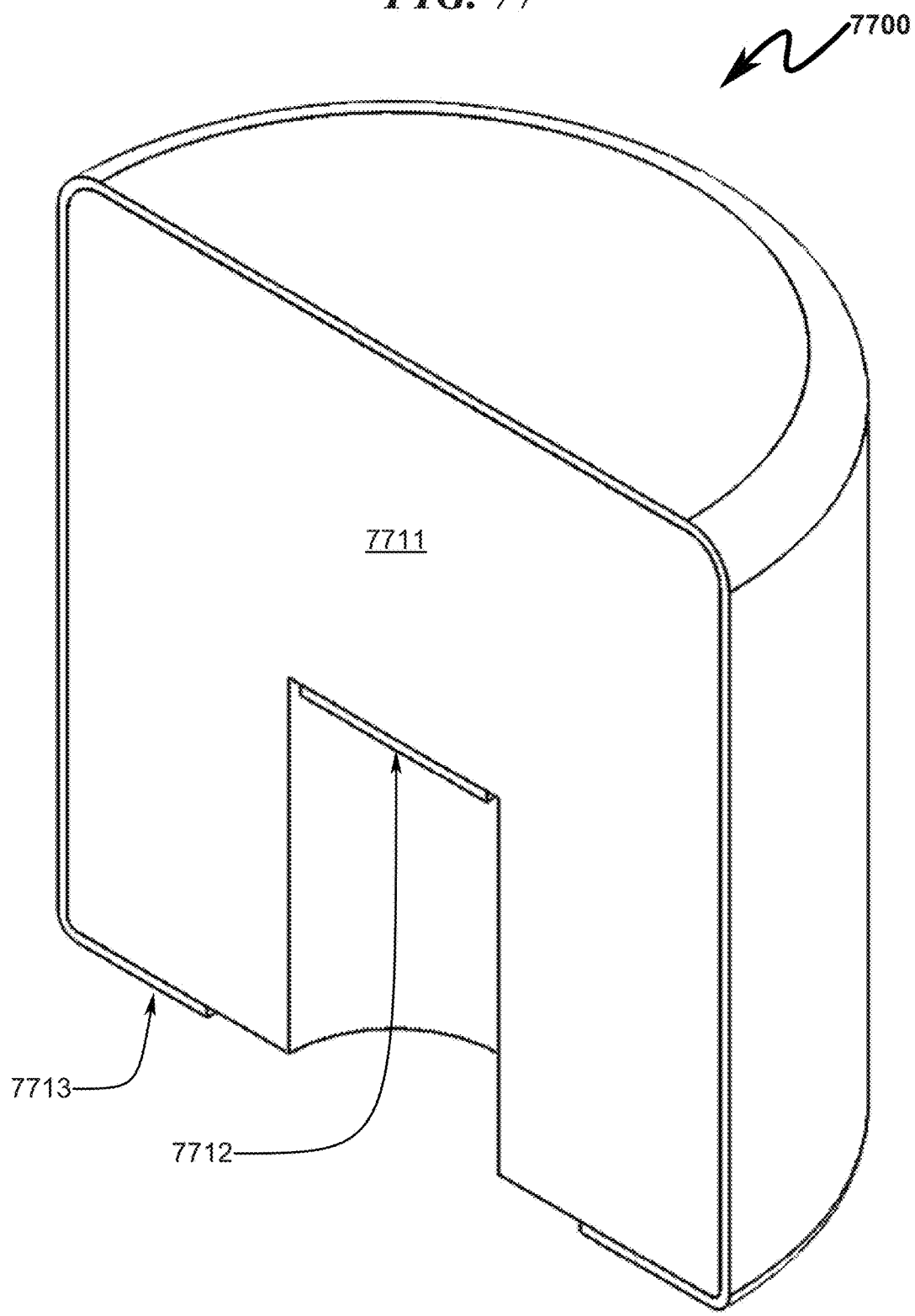
FIG. 77 illustrates a top right perspective front sectional view of a preferred exemplary cylindrical invention system embodiment incorporating a medium-area centroid signal contact and partial outer contact wraparound.
Figure 78:
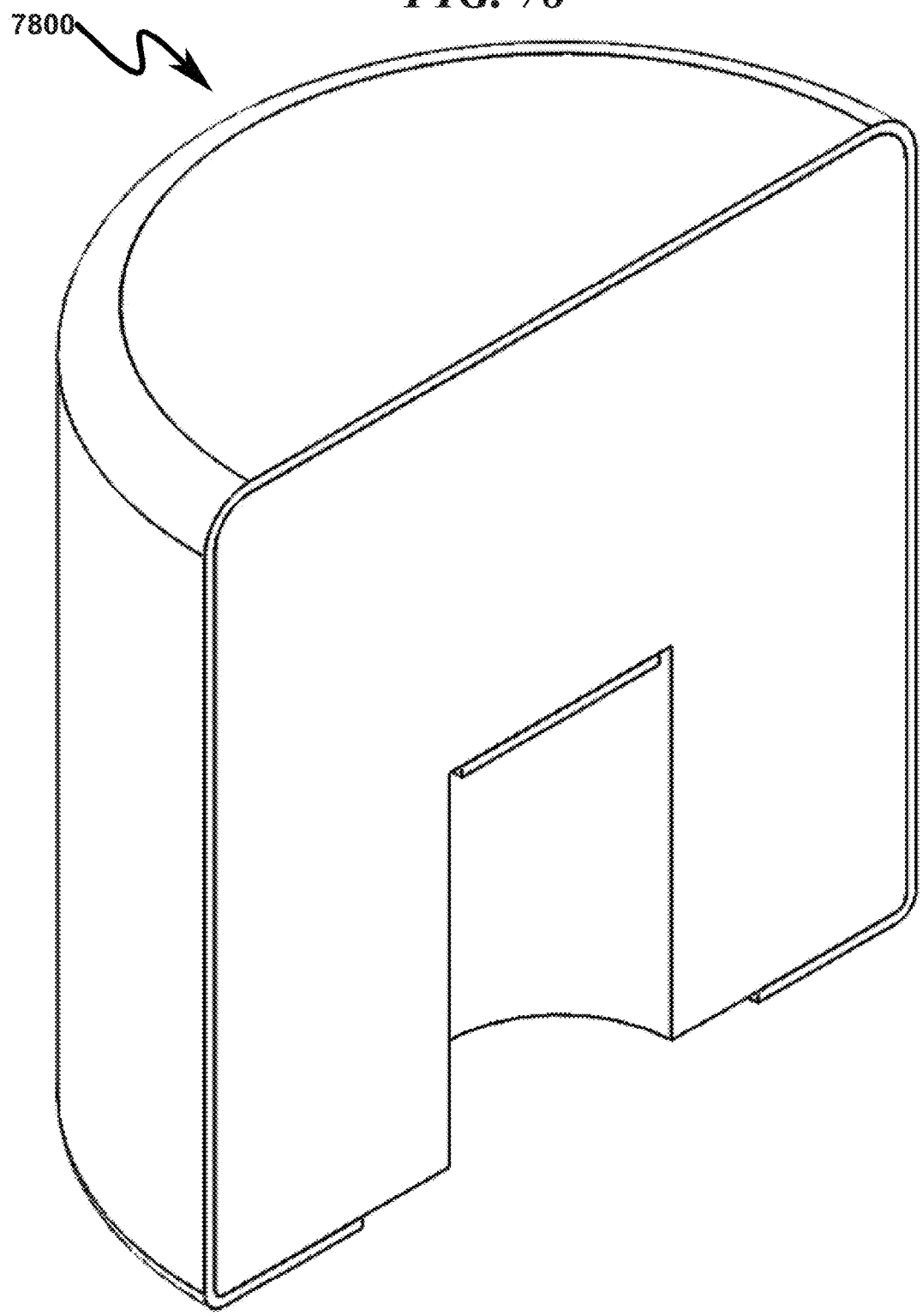
FIG. 78 illustrates a top right perspective right sectional view of a preferred exemplary cylindrical invention system embodiment incorporating a medium-area centroid signal contact and partial outer contact wraparound.
Figure 79:
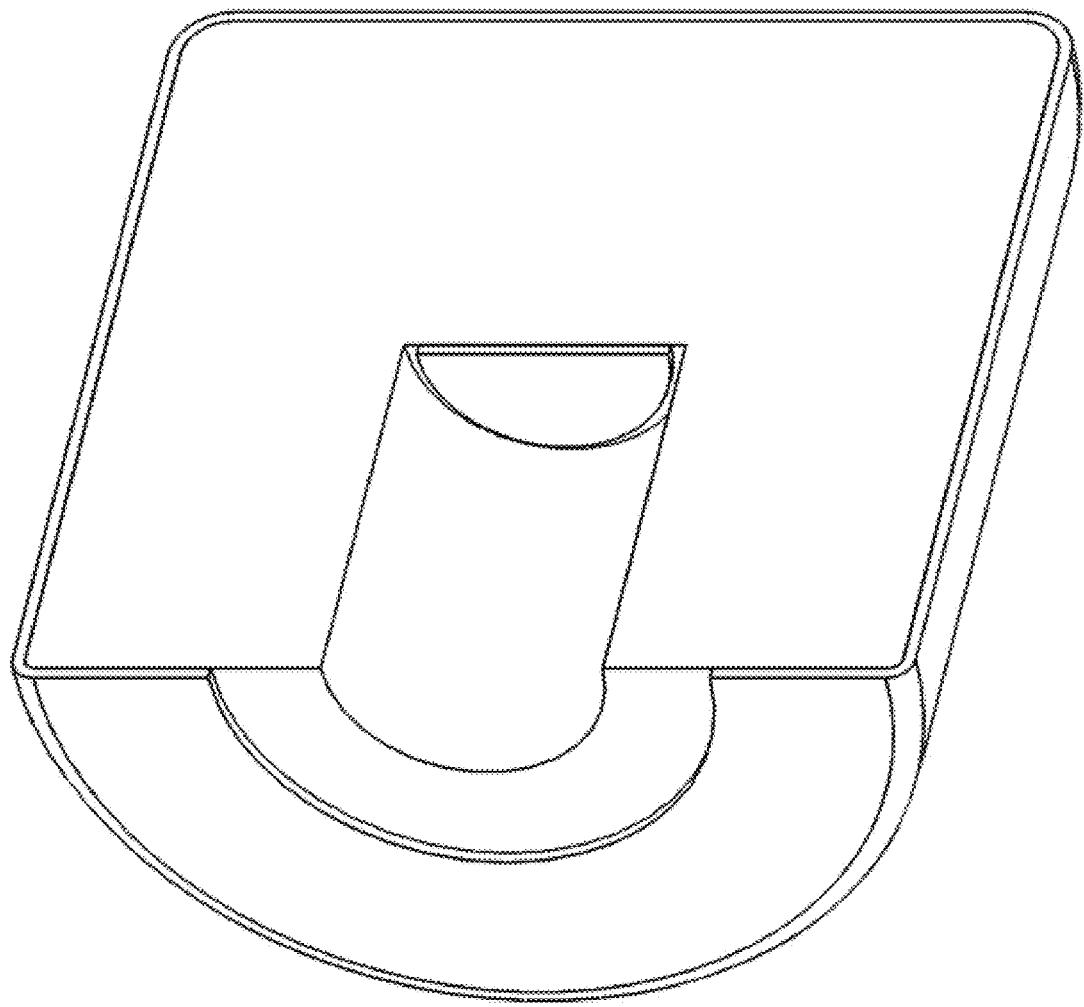
FIG. 79 illustrates a bottom front perspective front sectional view of a preferred exemplary cylindrical invention system embodiment incorporating a medium-area centroid signal contact and partial outer contact wraparound.
Figure 80:
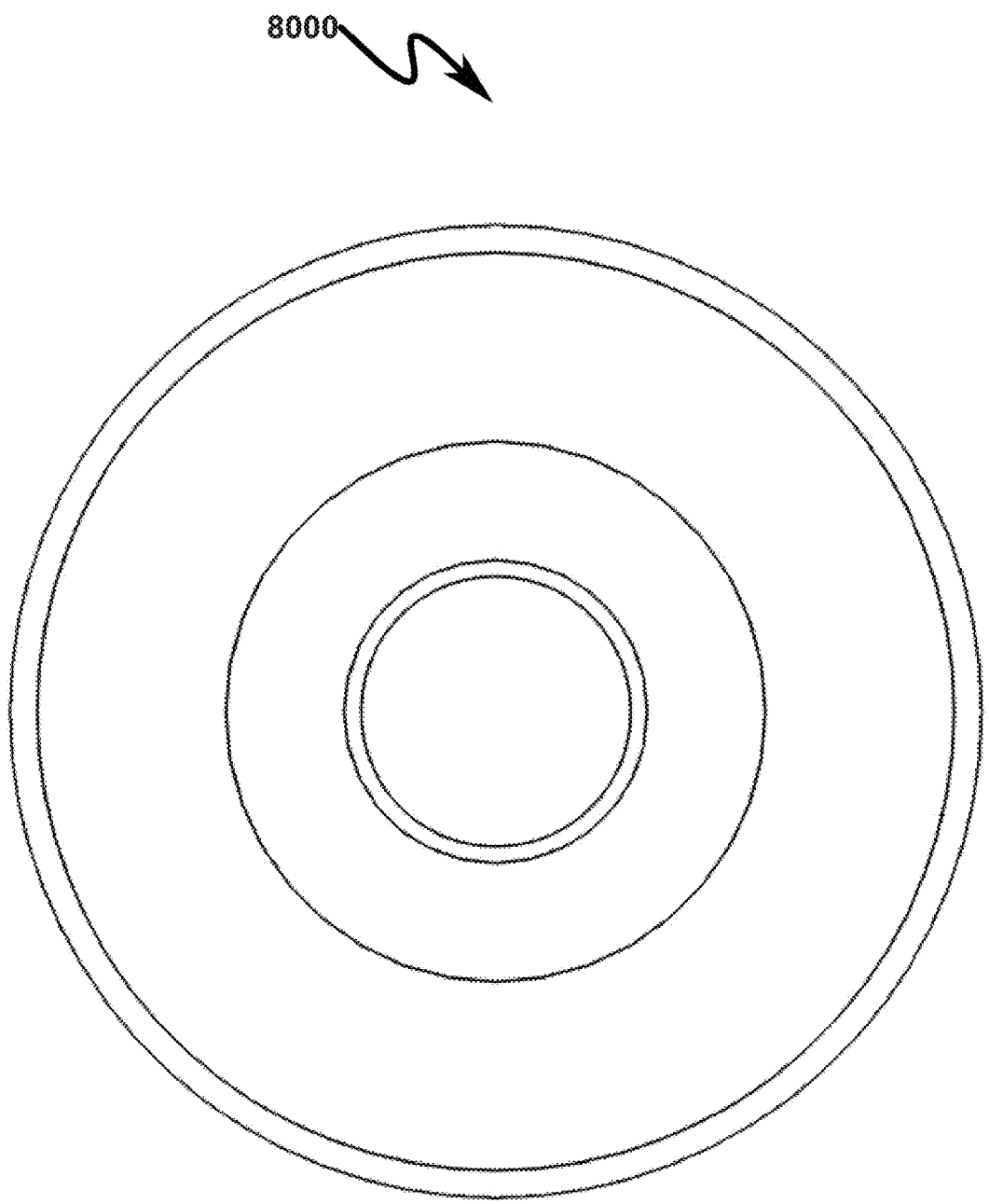
FIG. 80 illustrates a bottom view of a preferred exemplary cylindrical invention system embodiment incorporating a medium-area centroid signal contact and partial outer contact wraparound.

FIG. 77 (7700)-FIG. 80 (8000) depict a preferred exemplary cylindrical invention embodiment in which the centroid contact (7712) is implemented as a medium-area contact structure. This embodiment illustrates the variation in centroid area may range from point contact (small area coverage) to large-area contact (complete area coverage).

Grooved Junction Cylindrical Embodiment (8100)-(8400)

Figure 81:
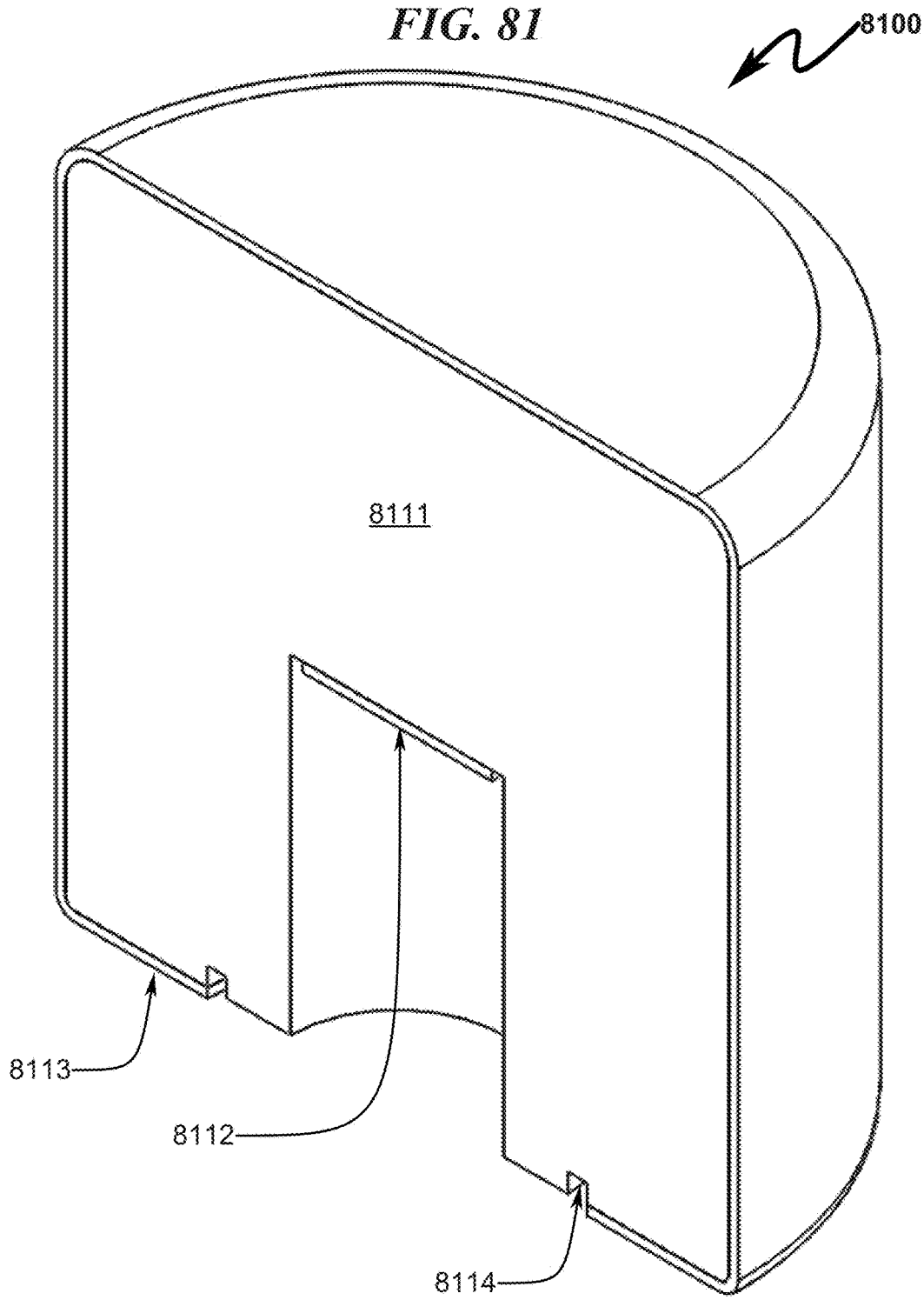
FIG. 81 illustrates a top right perspective front sectional view of a preferred exemplary cylindrical invention system embodiment incorporating a medium-area centroid signal contact, grooved junction interface, and partial outer contact wraparound.
Figure 82:
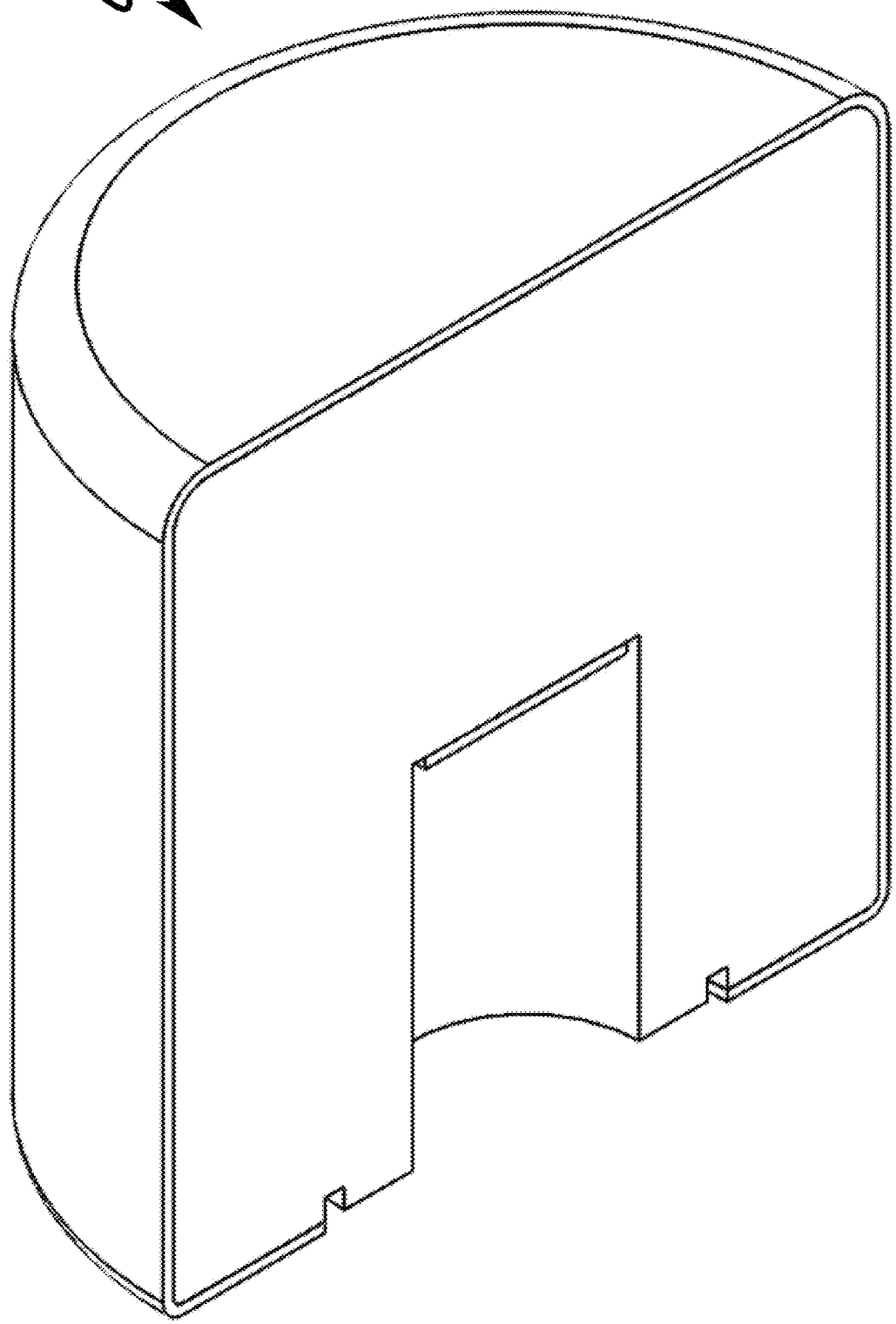
FIG. 82 illustrates a top right perspective right sectional view of a preferred exemplary cylindrical invention system embodiment incorporating a medium-area centroid signal contact, grooved junction interface, and partial outer contact wraparound.
Figure 83:
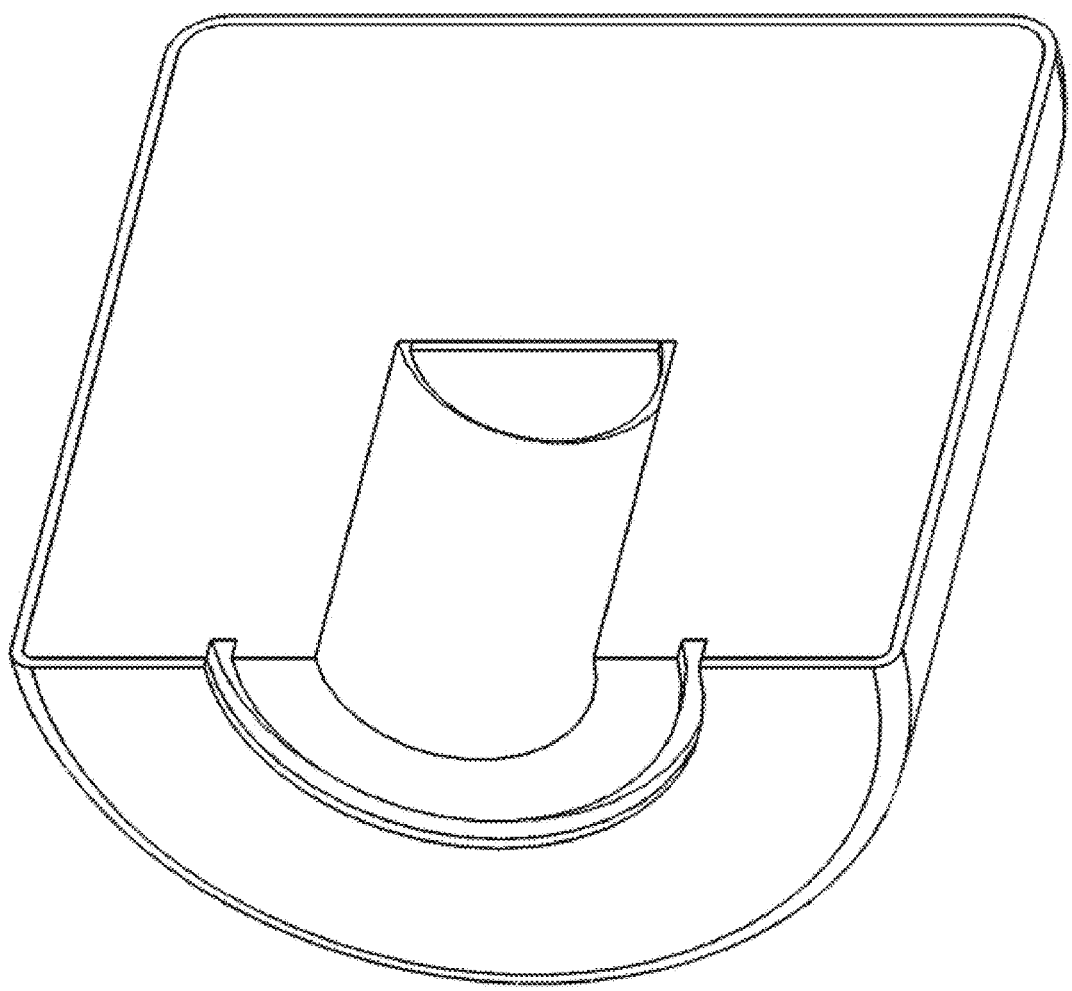
FIG. 83 illustrates a bottom front perspective front sectional view of a preferred exemplary cylindrical invention system embodiment incorporating a medium-area centroid signal contact, grooved junction interface, and partial outer contact wraparound.
Figure 84:
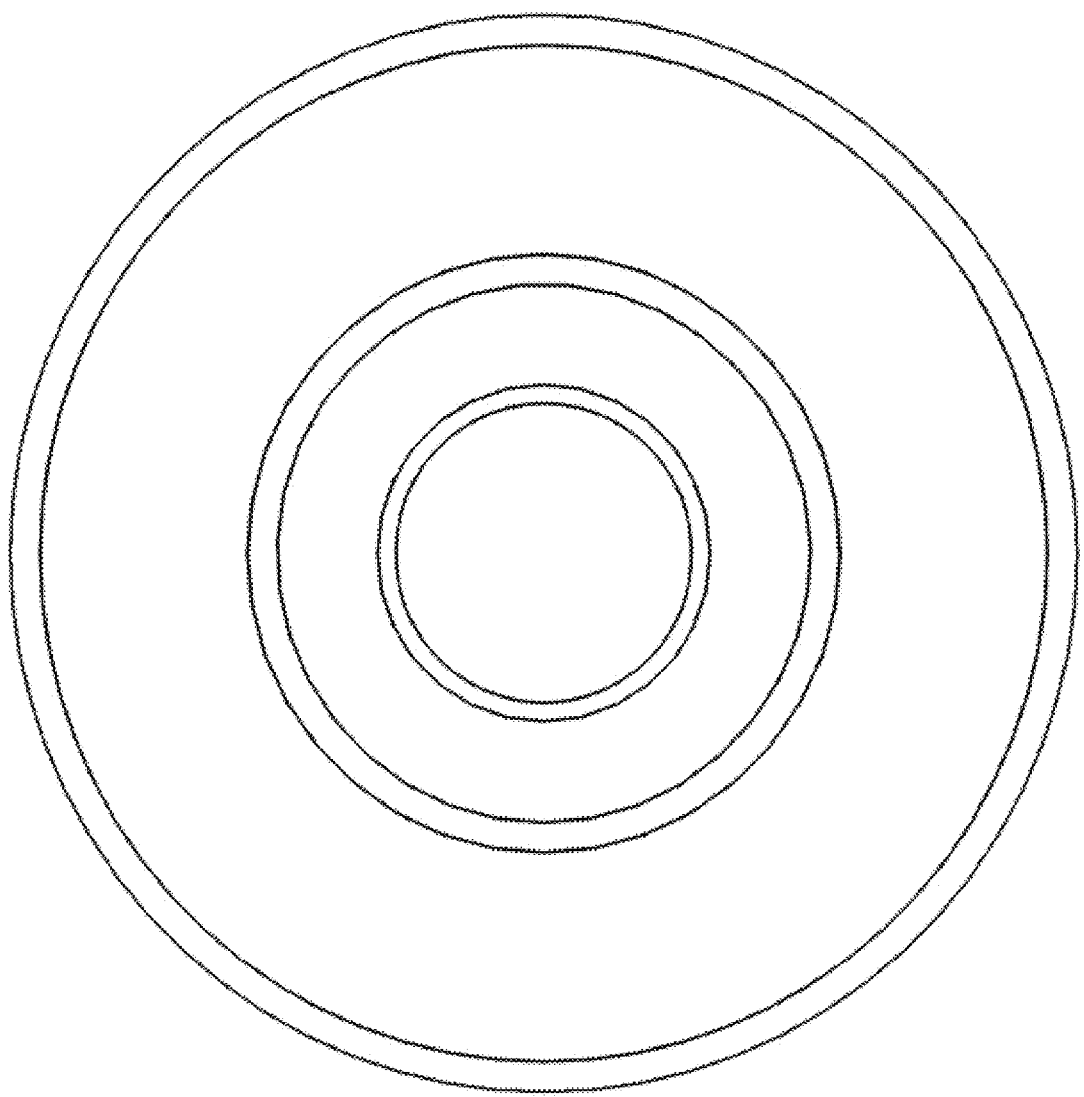
FIG. 84 illustrates a bottom view of a preferred exemplary cylindrical invention system embodiment incorporating a medium-area centroid signal contact, grooved junction interface, and partial outer contact wraparound.

FIG. 81 (8100)-FIG. 84 (8400) depict a preferred exemplary cylindrical invention embodiment in which the centroid contact (8112) is implemented as a medium-area contact structure. This embodiment illustrates the variation in which the bulk semiconductor (8111) may incorporate a separation groove (8114) that delineates the extent of the outer conductor surface (8113).

Partial Wraparound Cylindrical Embodiment (8500)-(8800)

Figure 85:
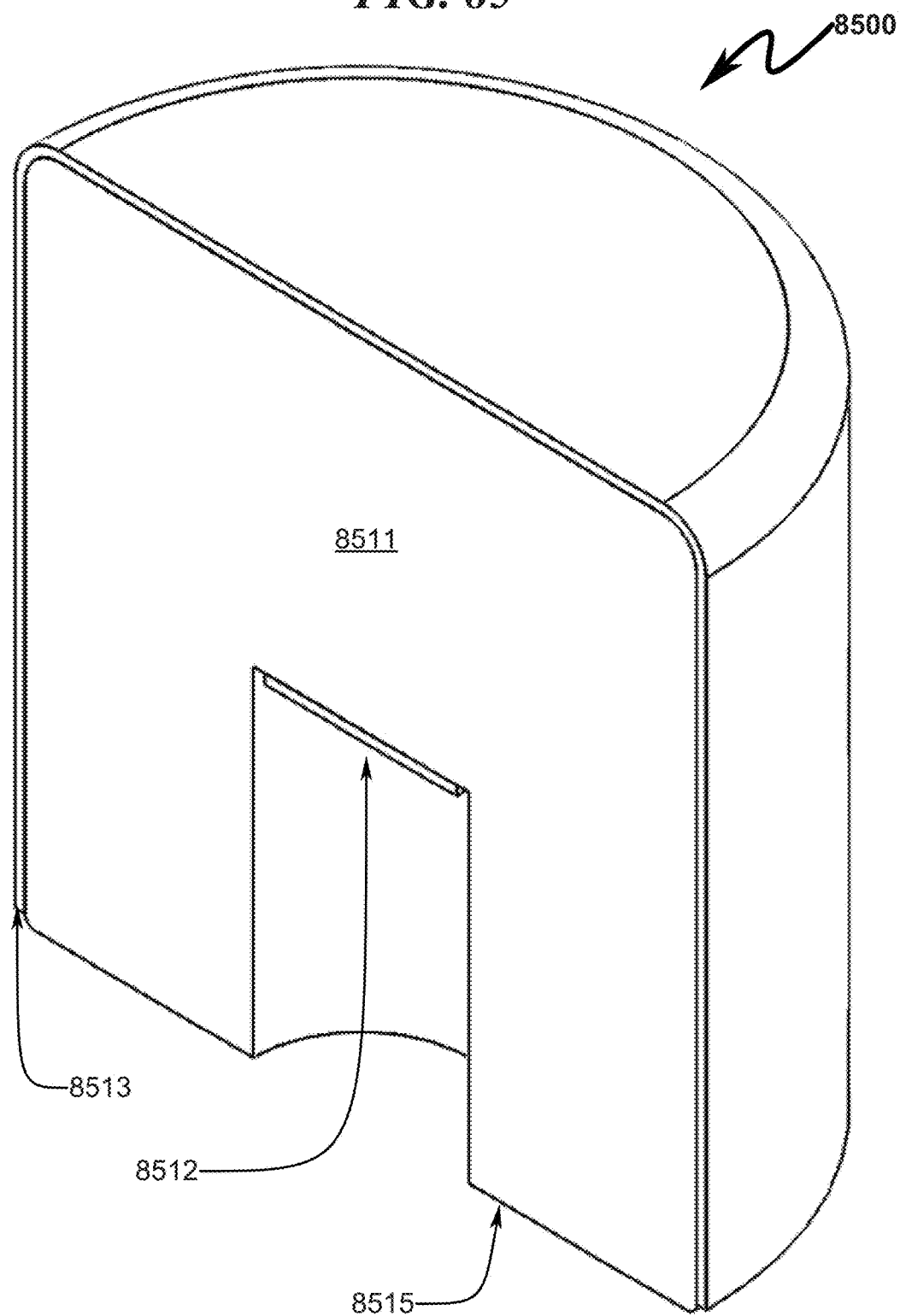
FIG. 85 illustrates a top right perspective front sectional view of a preferred exemplary cylindrical invention system embodiment incorporating a medium-area centroid signal contact and full open face outer surface junction.
Figure 86:
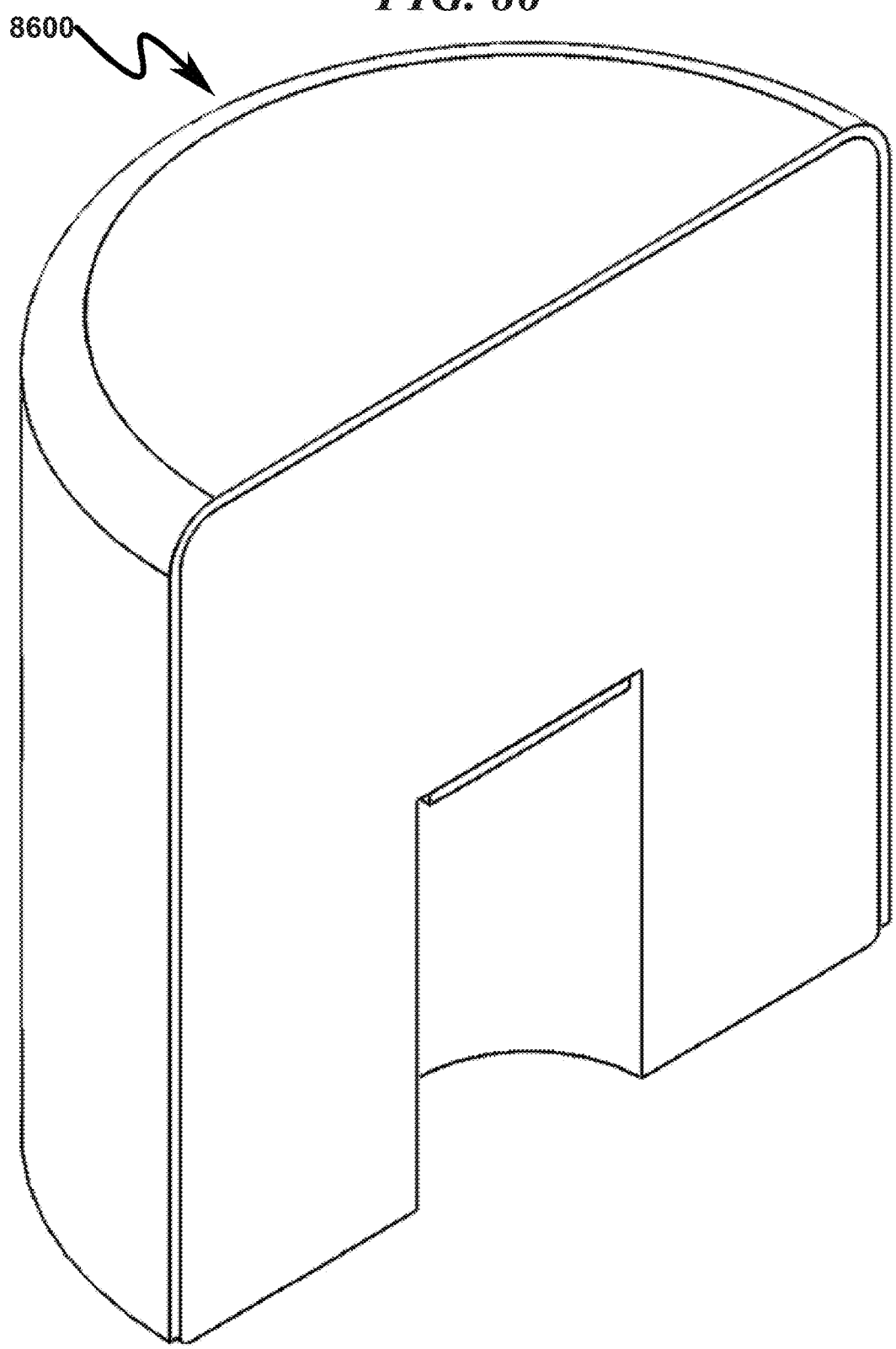
FIG. 86 illustrates a top right perspective right sectional view of a preferred exemplary cylindrical invention system embodiment incorporating a medium-area centroid signal contact and full open face outer surface junction.
Figure 87:
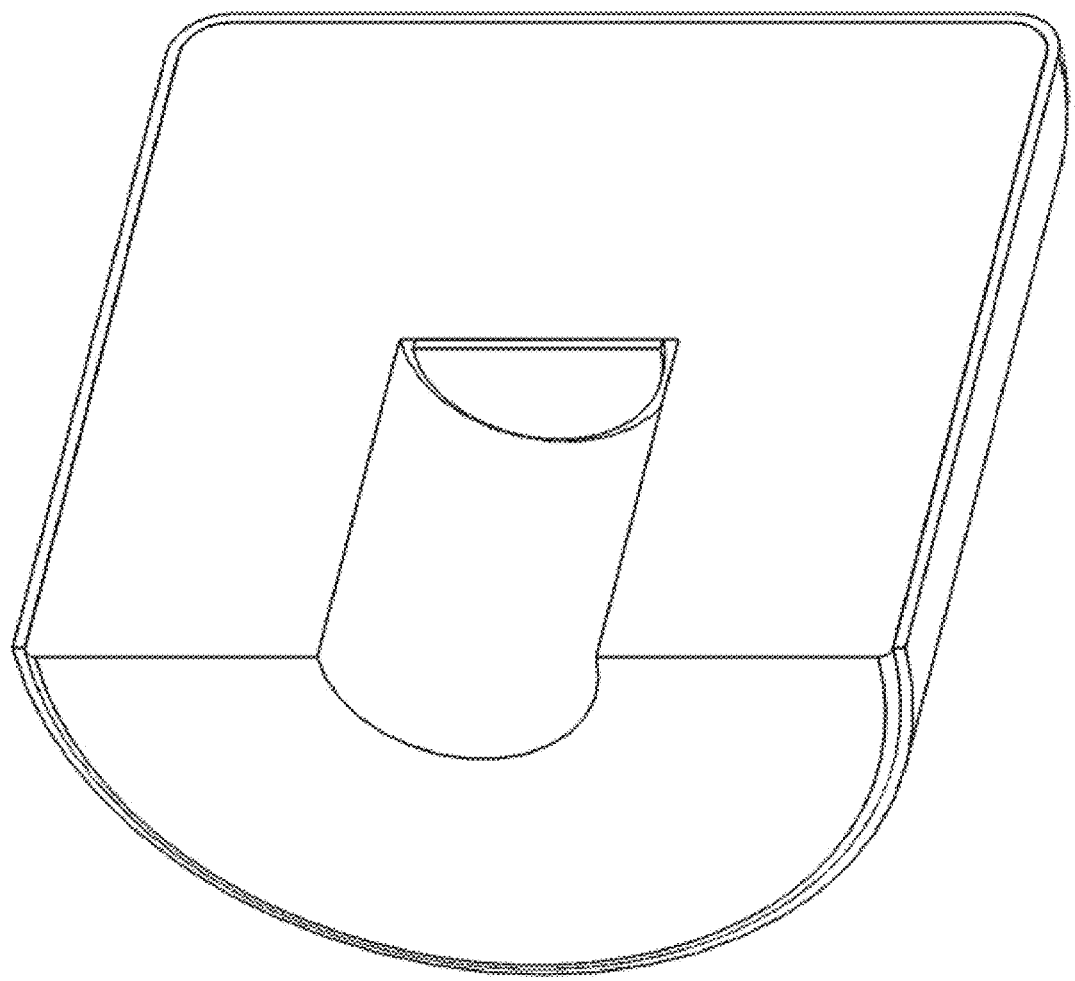
FIG. 87 illustrates a bottom front perspective front sectional view of a preferred exemplary cylindrical invention system embodiment incorporating a medium-area centroid signal contact and full open face outer surface junction.
Figure 88:
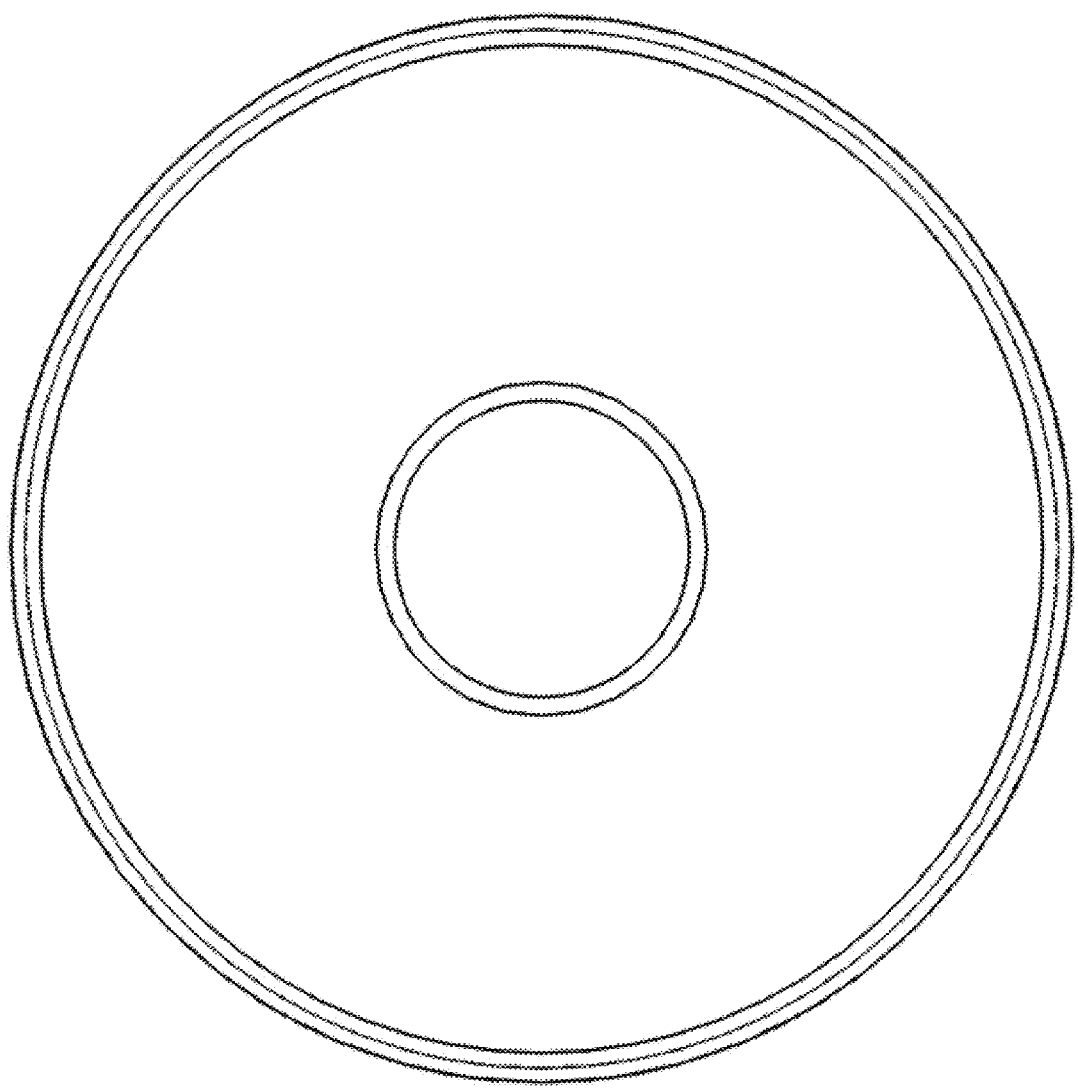
FIG. 88 illustrates a bottom view of a preferred exemplary cylindrical invention system embodiment incorporating a medium-area centroid signal contact and full open face outer surface junction.

FIG. 85 (8500)-FIG. 88 (8800) depict a preferred exemplary cylindrical invention embodiment in which the centroid contact (8512) is implemented as a medium-area contact structure with full open face outer surface junction (8515). In this embodiment the outer conductor (8513) does not cover a portion of the open face (8515) of the bulk detector.

Hemispherical Contact Dome Embodiment (8900)-(9200)

Figure 89:
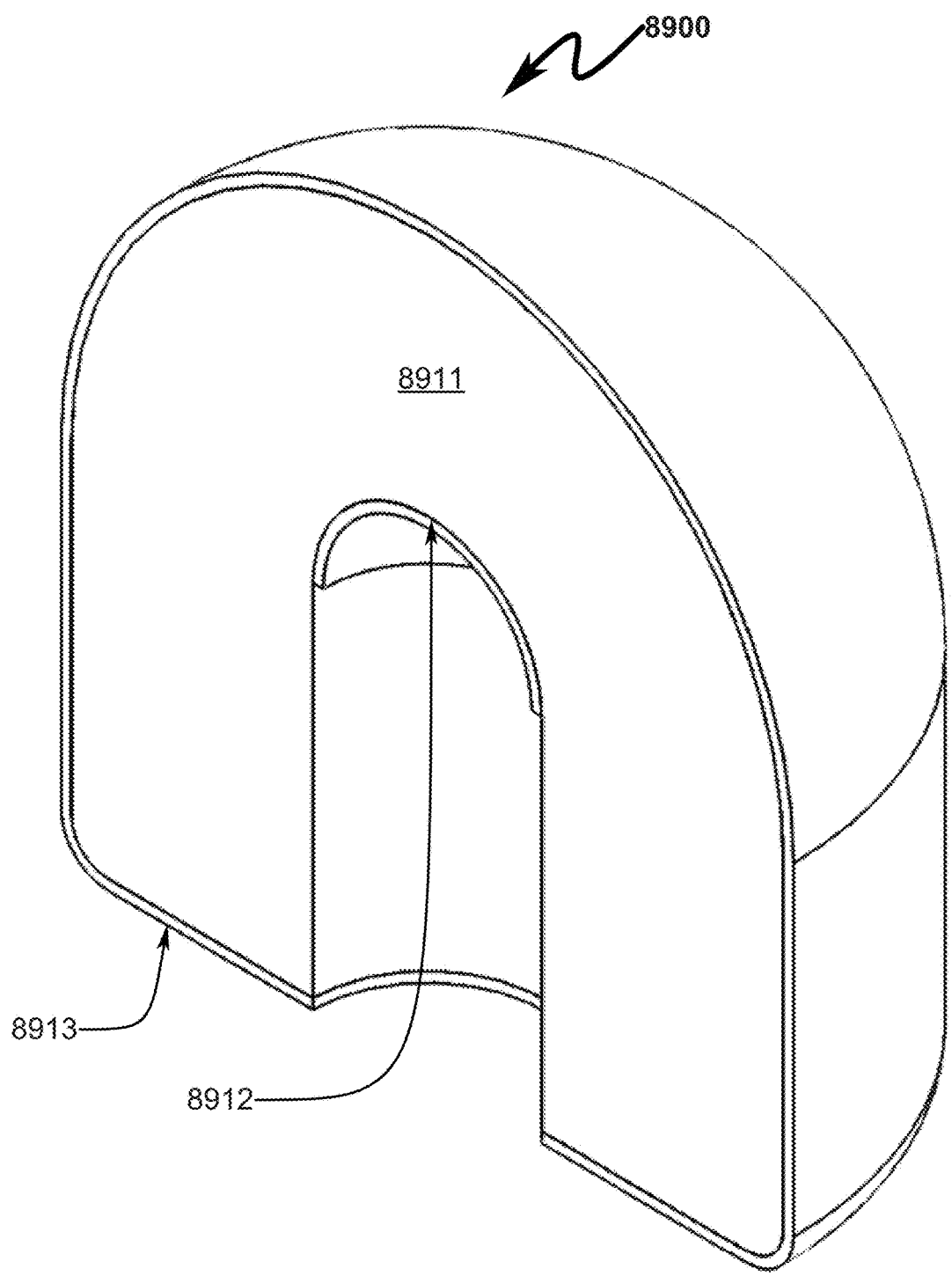
FIG. 89 illustrates a top right perspective front sectional view of a preferred exemplary dome-shaped invention system embodiment incorporating a hemispherical centroid signal contact.
Figure 90:
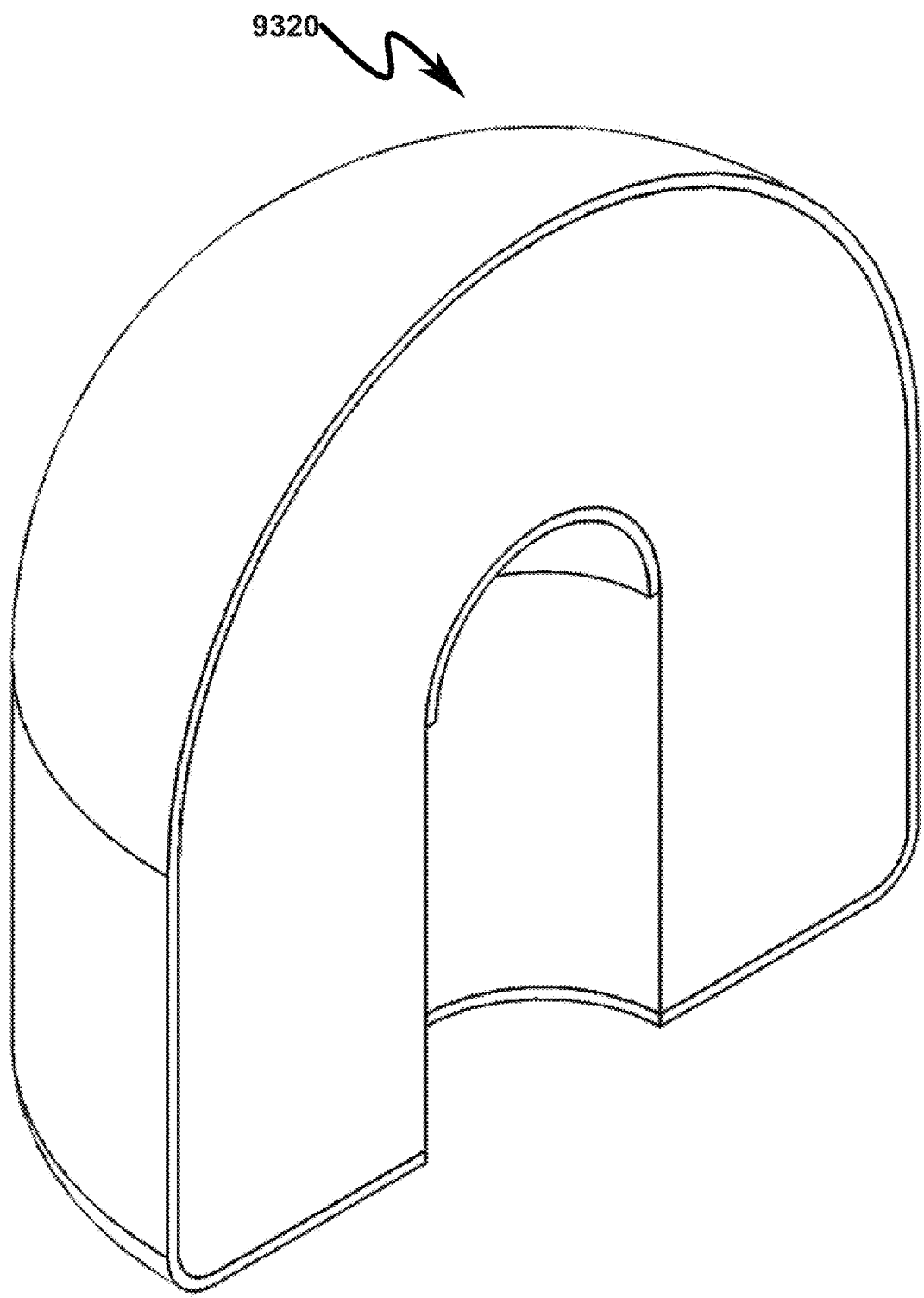
FIG. 90 illustrates a top right perspective right sectional view of a preferred exemplary dome-shaped invention system embodiment incorporating a hemispherical centroid signal contact.
Figure 91:
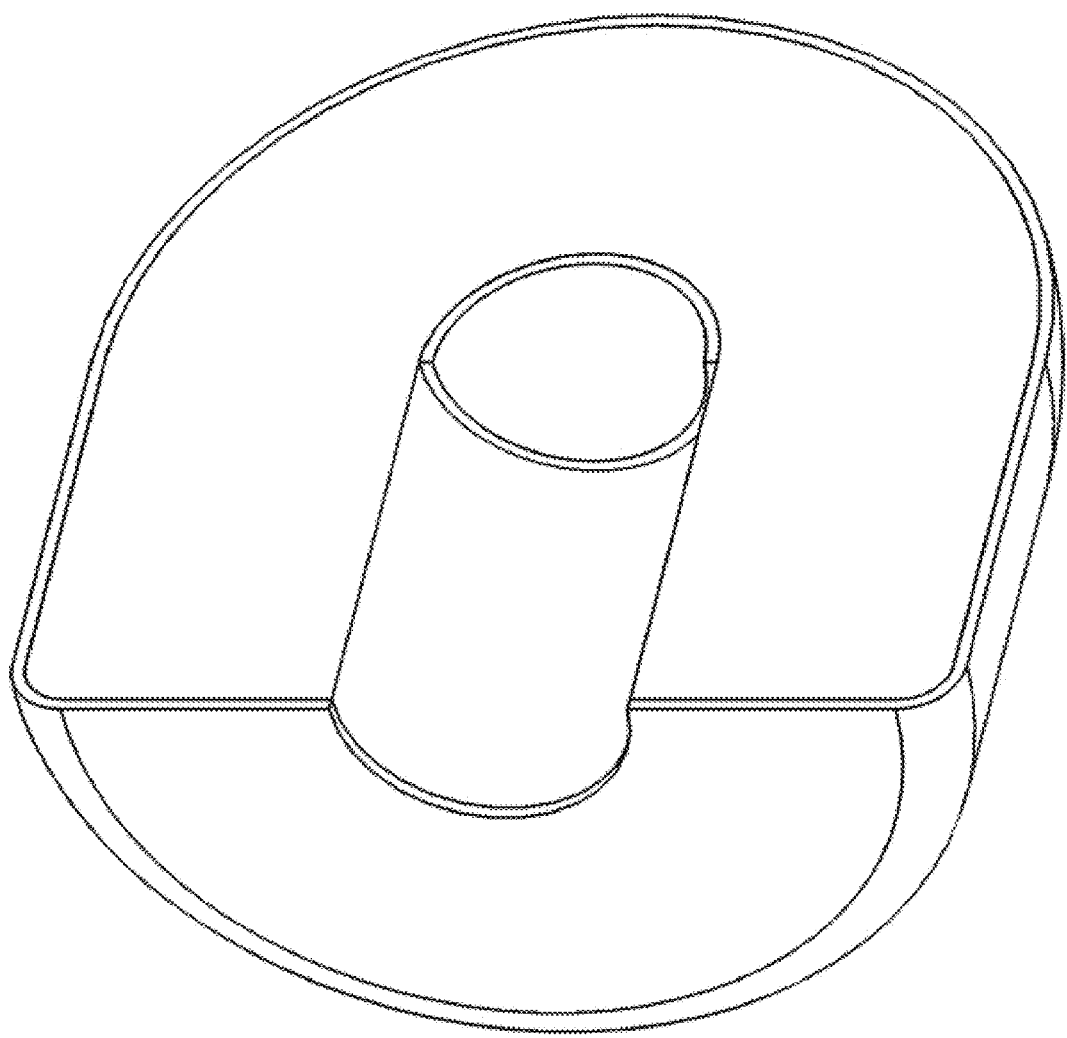
FIG. 91 illustrates a bottom front perspective front sectional view of a preferred exemplary dome-shaped invention system embodiment incorporating a hemispherical centroid signal contact.
Figure 92:
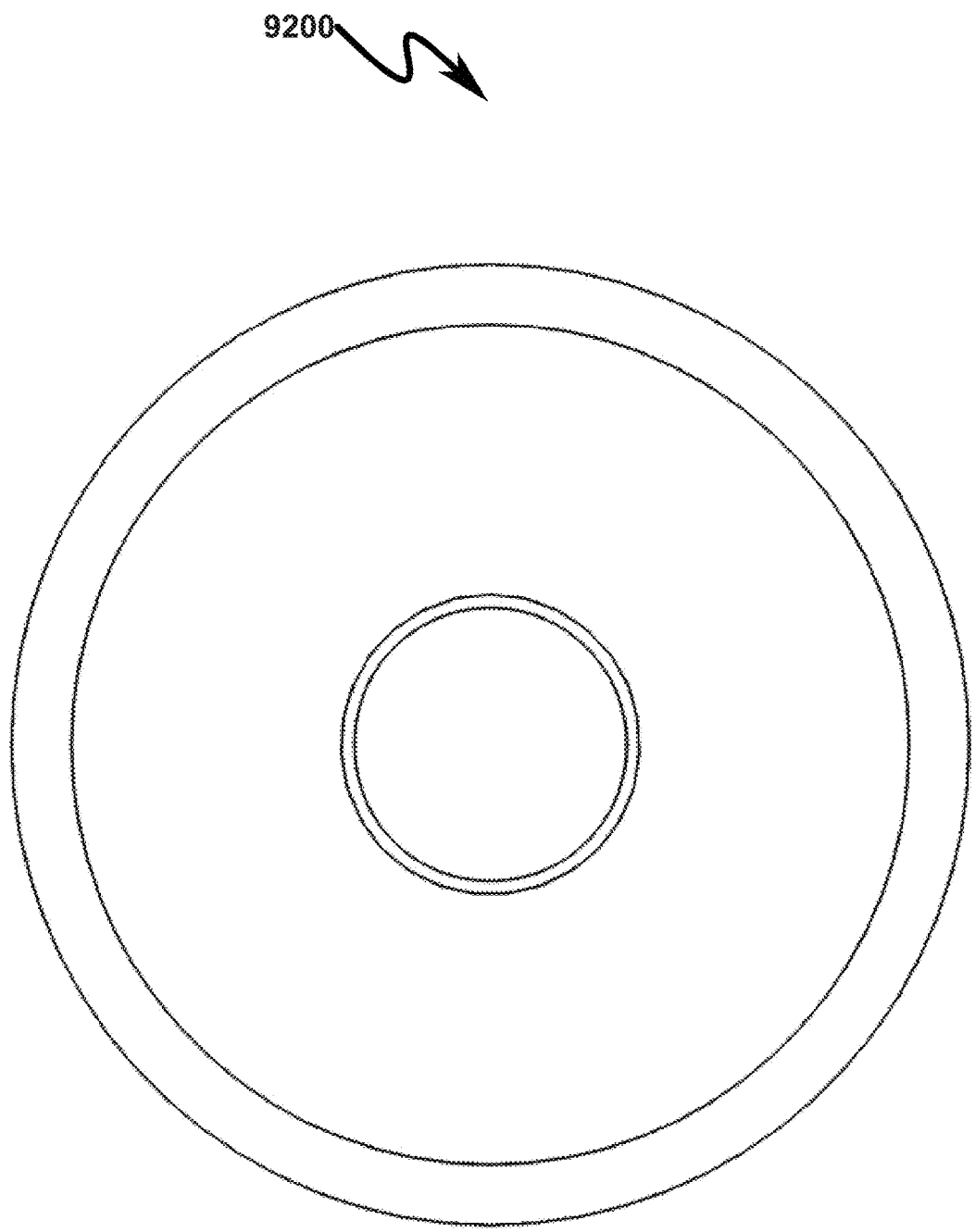
FIG. 92 illustrates a bottom view of a preferred exemplary dome-shaped invention system embodiment incorporating a hemispherical centroid signal contact.

FIG. 89 (8900)-FIG. 92 (9200) depict a preferred exemplary dome-shaped invention embodiment in which the centroid contact (8912) is implemented as a hemispherical contact structure.

Semi-Hemispherical Contact Dome Embodiment (9300)-(9600)

Figure 93:
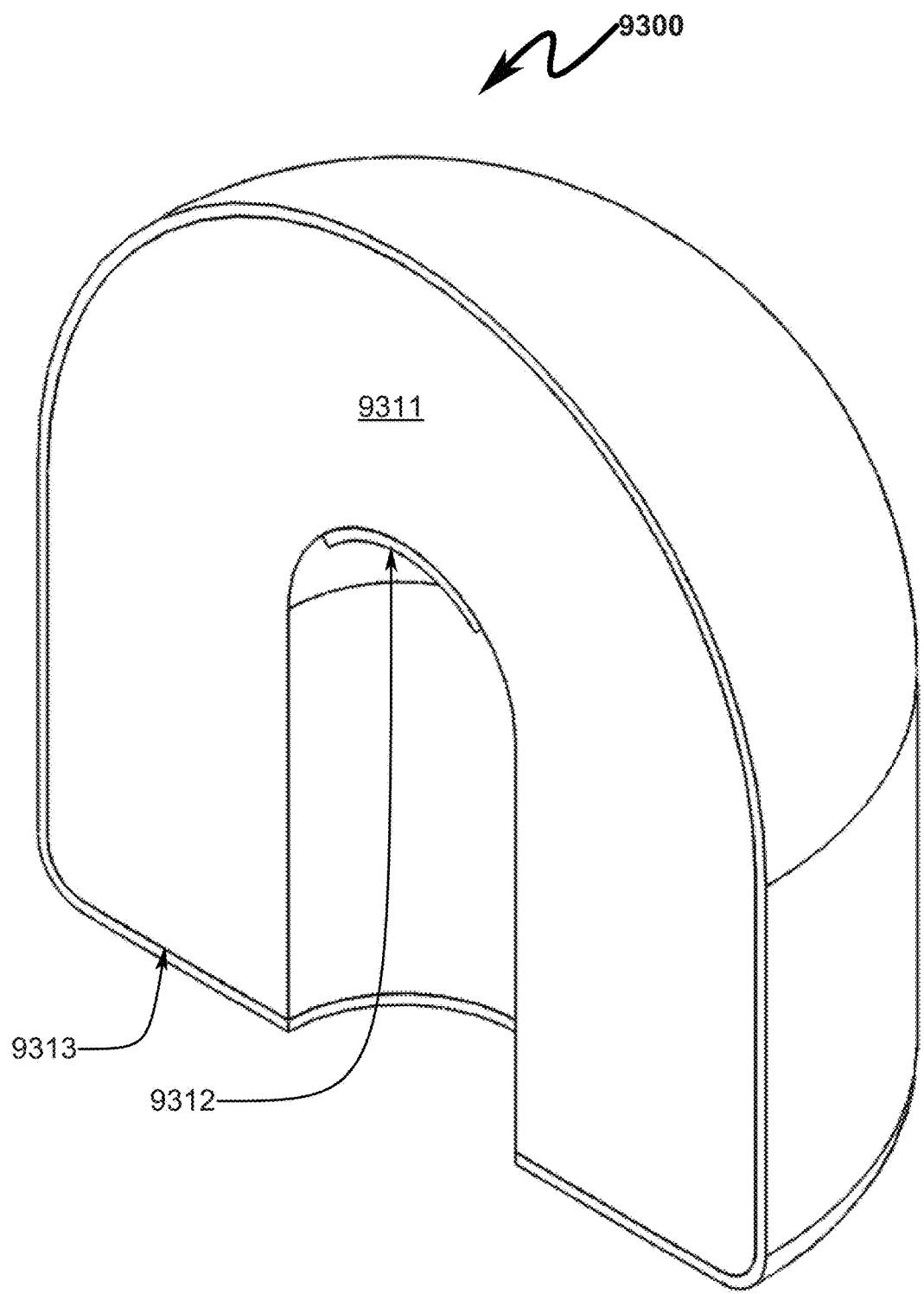
FIG. 93 illustrates a top right perspective front sectional view of a preferred exemplary dome-shaped invention system embodiment incorporating a semi-hemispherical centroid signal contact.
Figure 94:
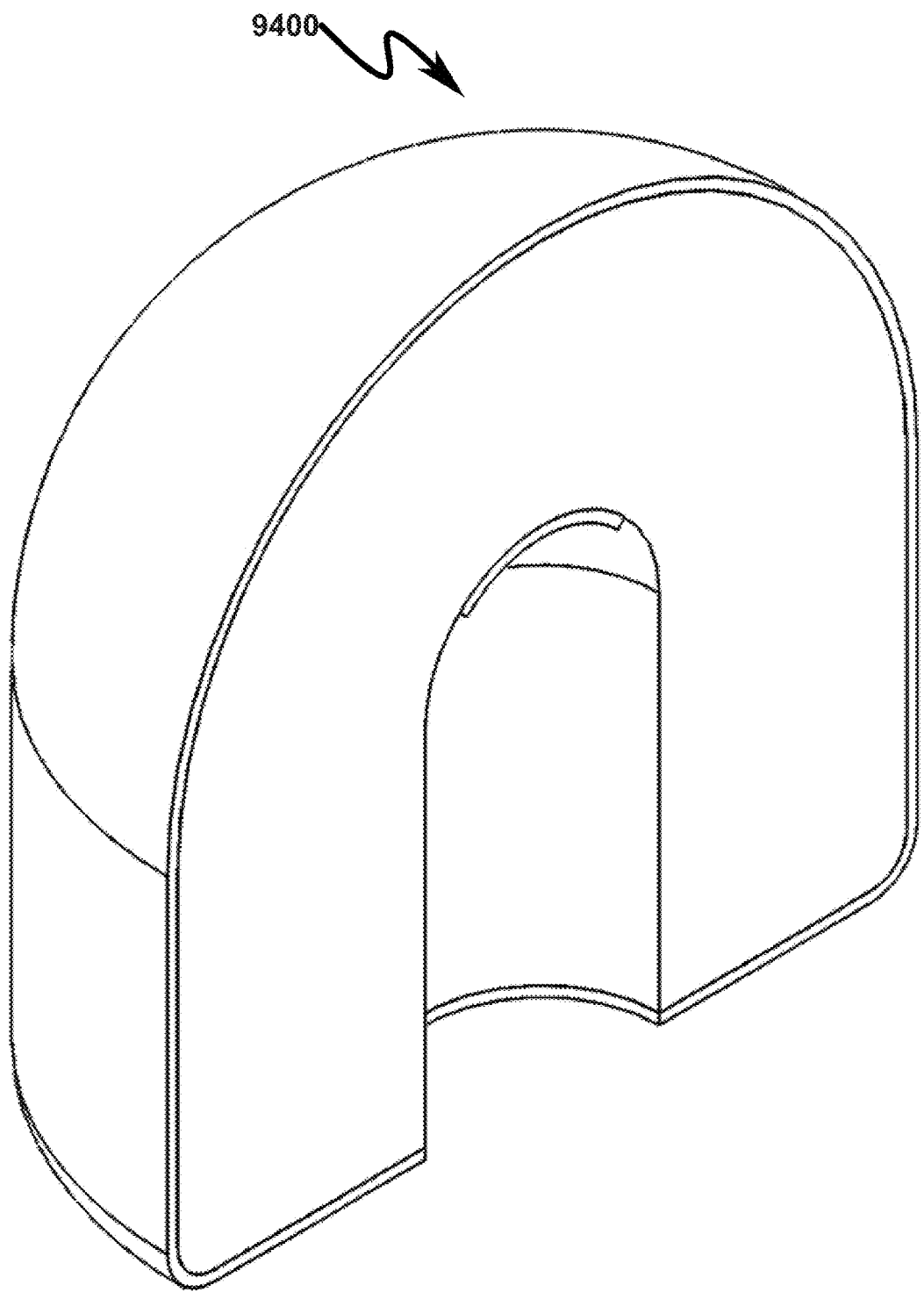
FIG. 94 illustrates a top right perspective right sectional view of a preferred exemplary dome-shaped invention system embodiment incorporating a semi-hemispherical centroid signal contact.
Figure 95:
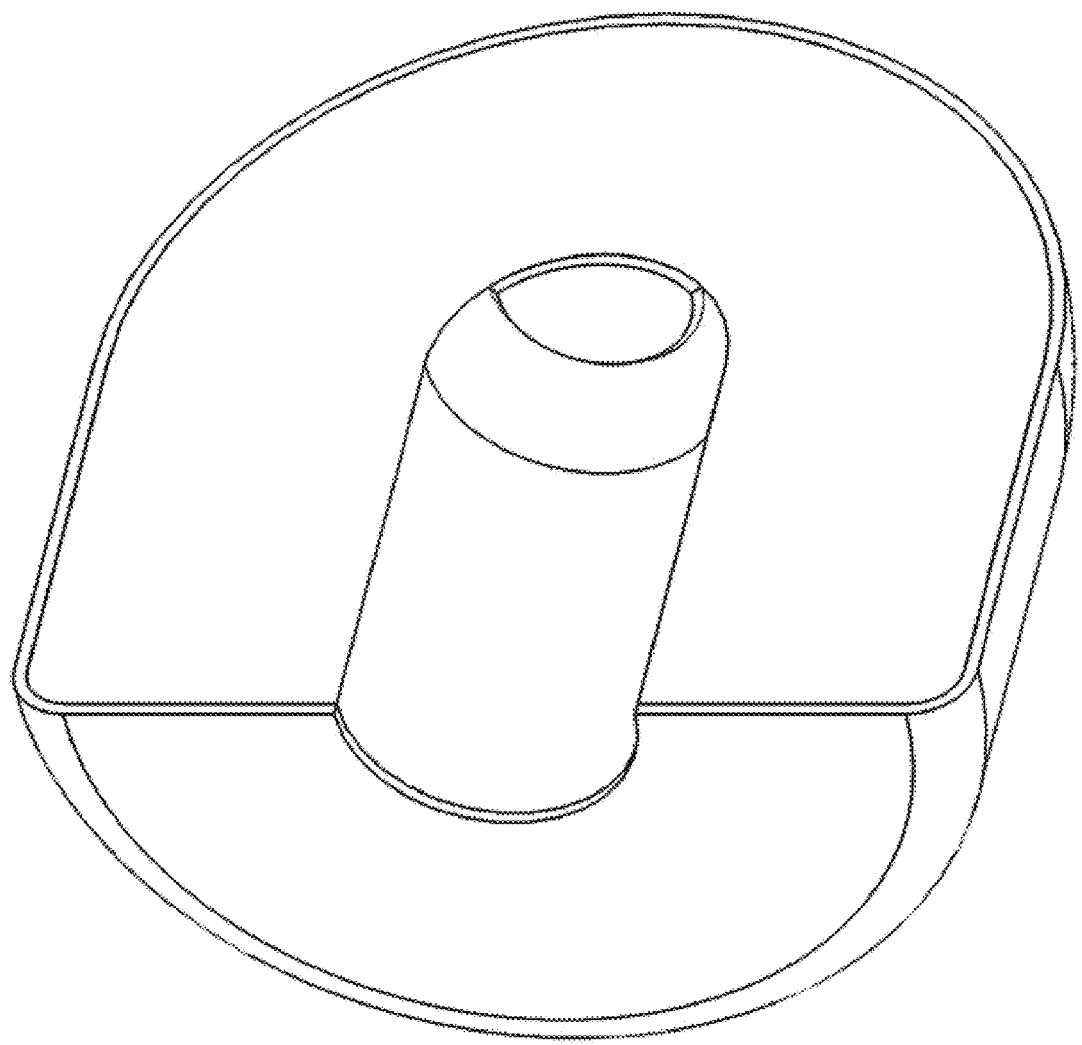
FIG. 95 illustrates a bottom front perspective front sectional view of a preferred exemplary dome-shaped invention system embodiment incorporating a semi-hemispherical centroid signal contact.
Figure 96:
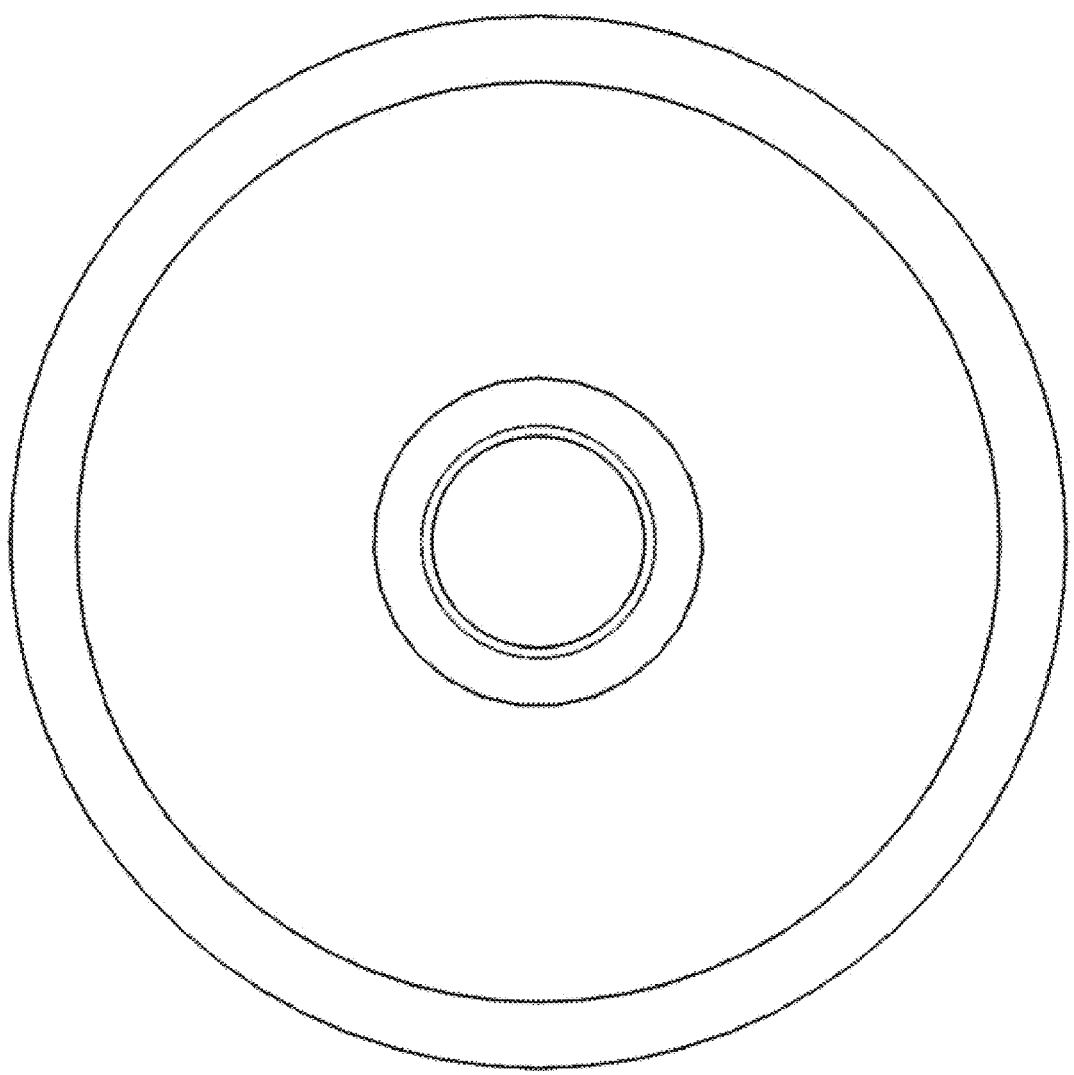
FIG. 96 illustrates a bottom view of a preferred exemplary dome-shaped invention system embodiment incorporating a semi-hemispherical centroid signal contact.

FIG. 93 (9300)-FIG. 96 (9600) depict a preferred exemplary dome-shaped invention embodiment in which the centroid contact (9312) is implemented as a semi-hemispherical contact structure.

Medium-Area Contact Spherical Embodiment (9700)-(10000)

Figure 97:
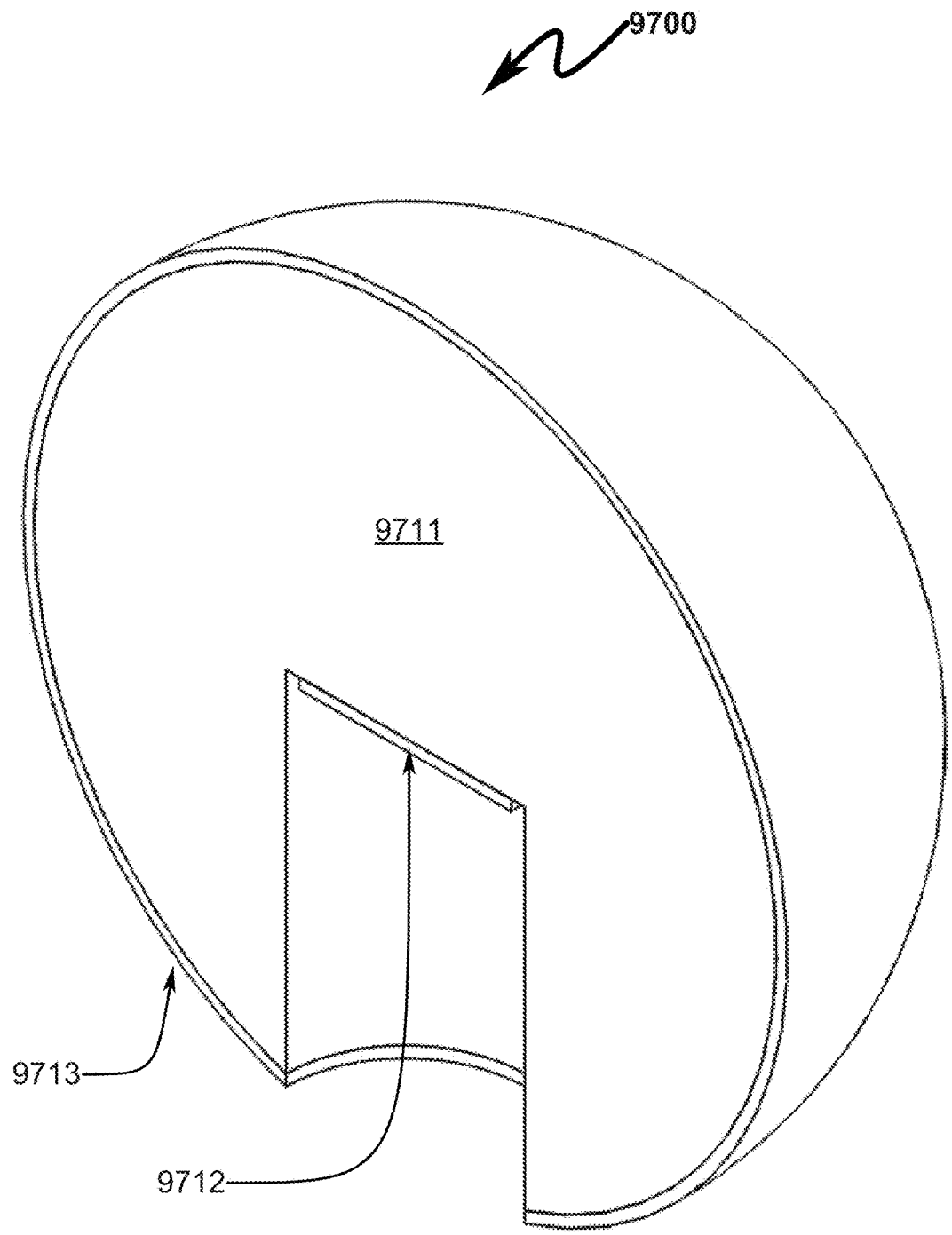
FIG. 97 illustrates a top right perspective front sectional view of a preferred exemplary sphere-shaped invention system embodiment incorporating a medium-area centroid signal contact.
Figure 98:
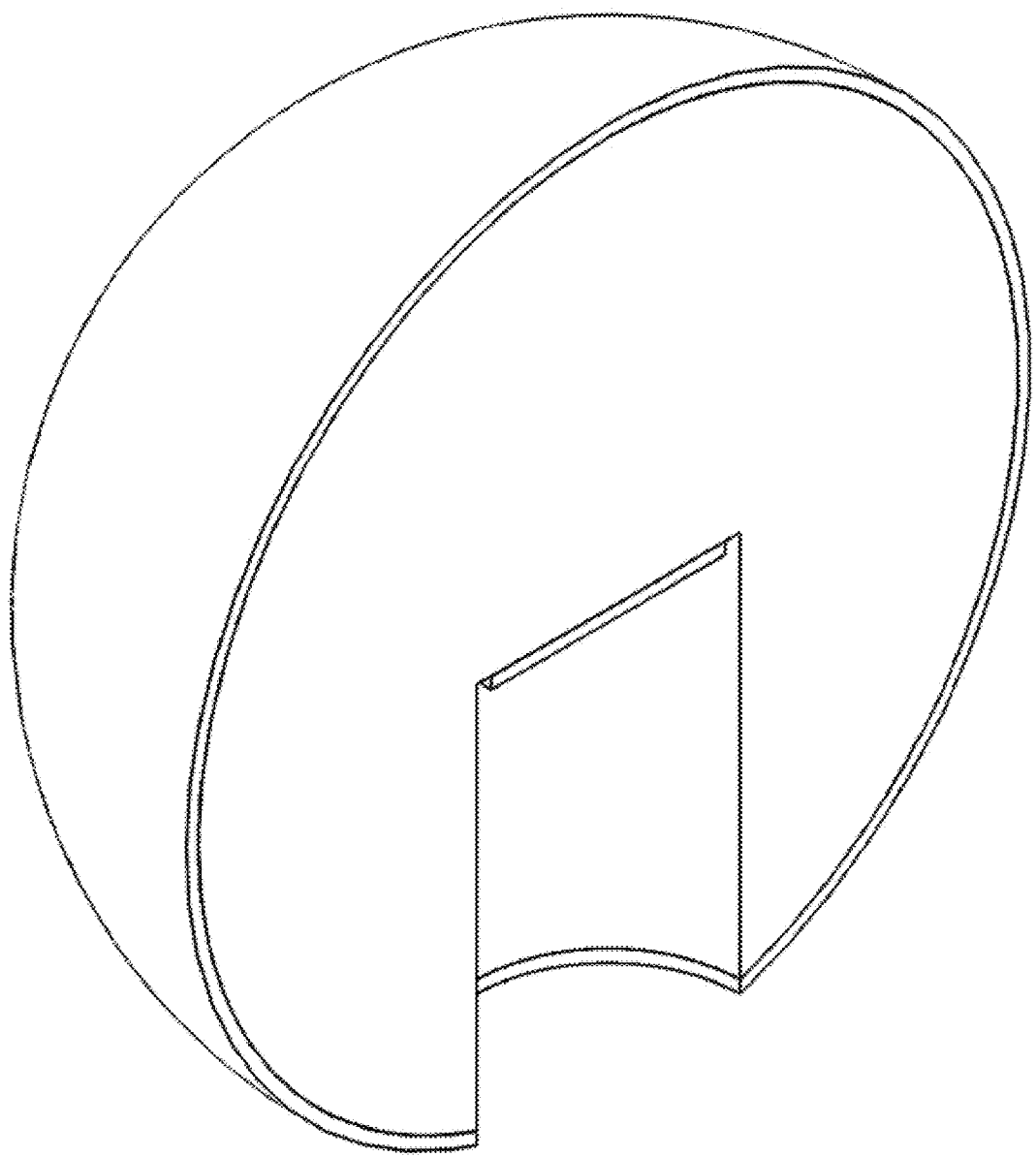
FIG. 98 illustrates a top right perspective right sectional view of a preferred exemplary sphere-shaped invention system embodiment incorporating a medium-area centroid signal contact.
Figure 99:
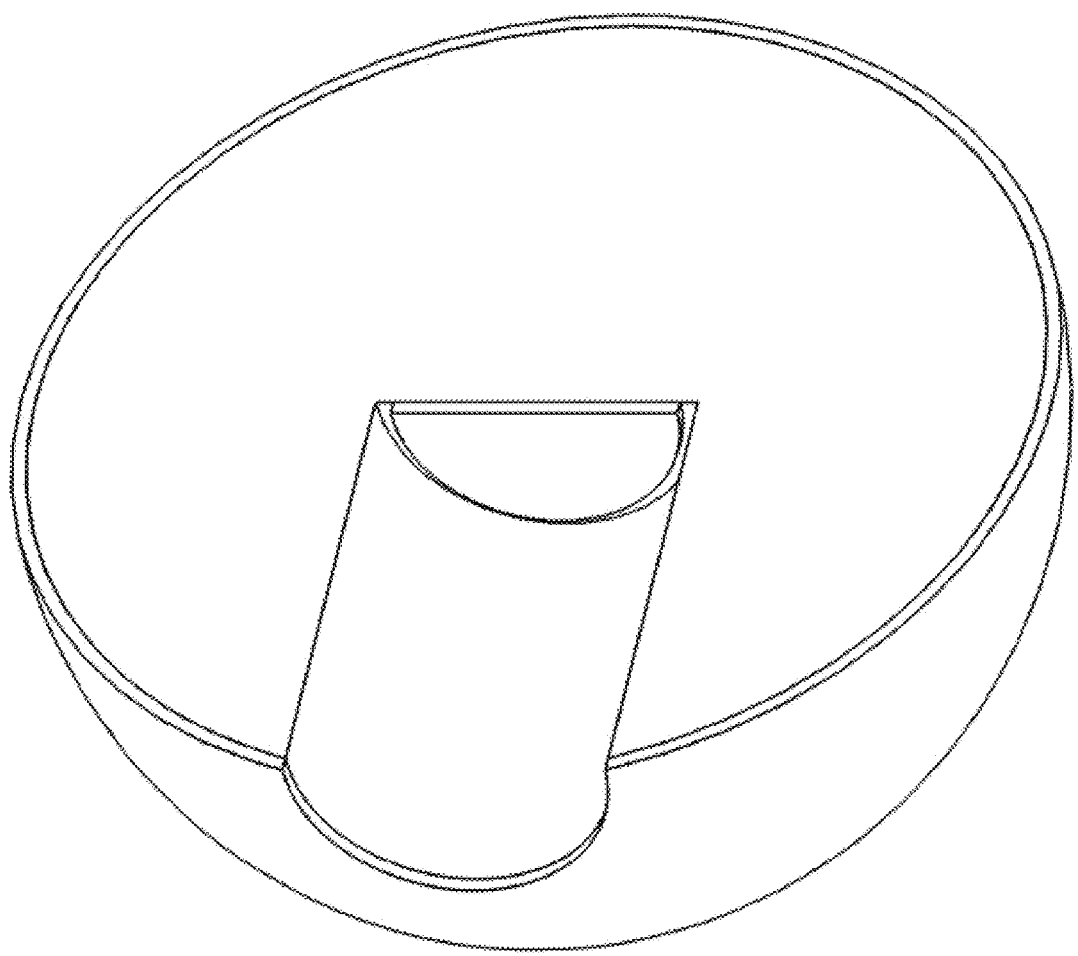
FIG. 99 illustrates a bottom front perspective front sectional view of a preferred exemplary sphere-shaped invention system embodiment incorporating a medium-area centroid signal contact.
Figure 100:
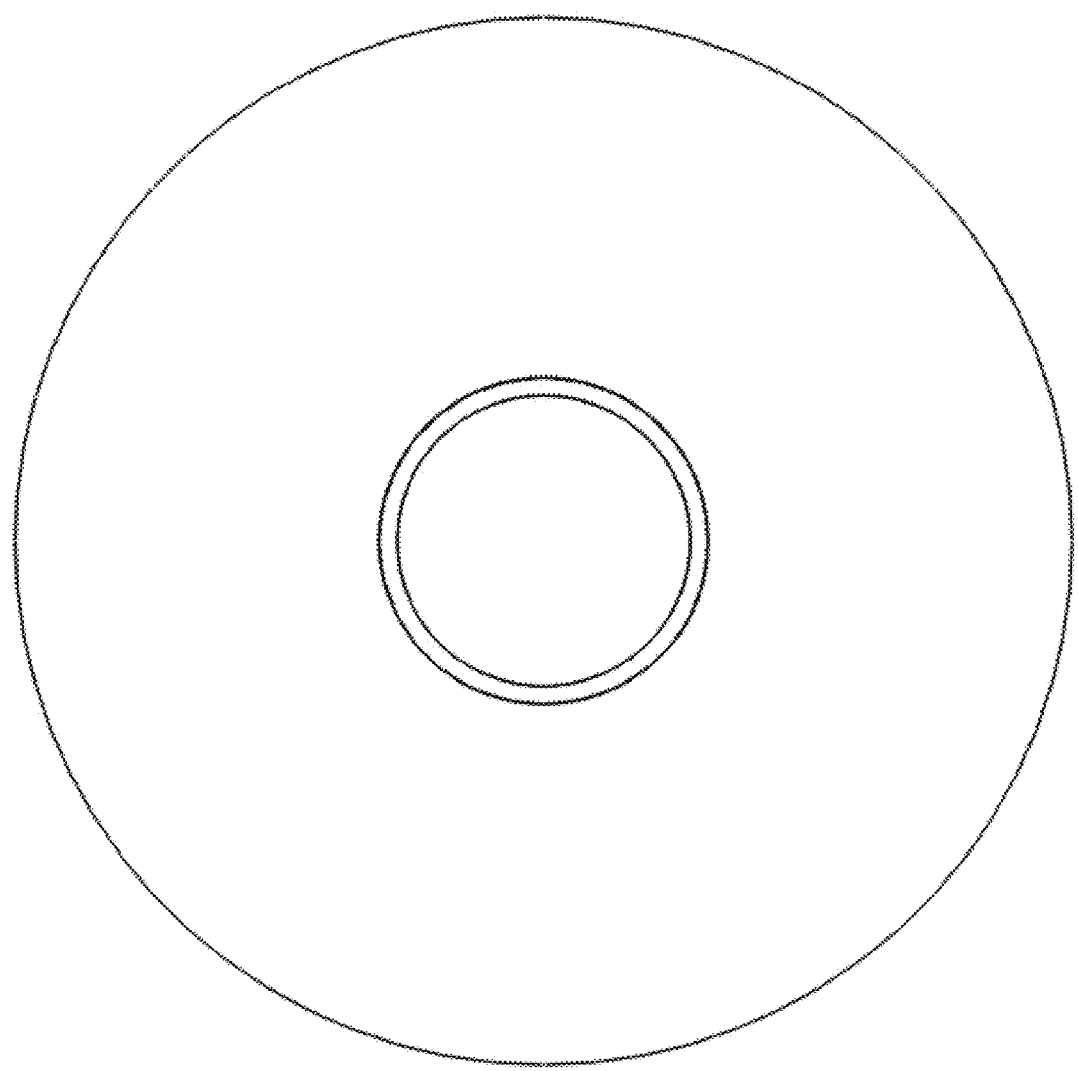
FIG. 100 illustrates a bottom view of a preferred exemplary sphere-shaped invention system embodiment incorporating a medium-area centroid signal contact.

FIG. 97 (9700)-FIG. 100 (10000) depict a preferred exemplary spherical-shaped invention embodiment in which the centroid contact (9712) is implemented as a medium-area contact structure.

Hemispherical Contact Spherical Embodiment (10100)-(10400)

Figure 101:
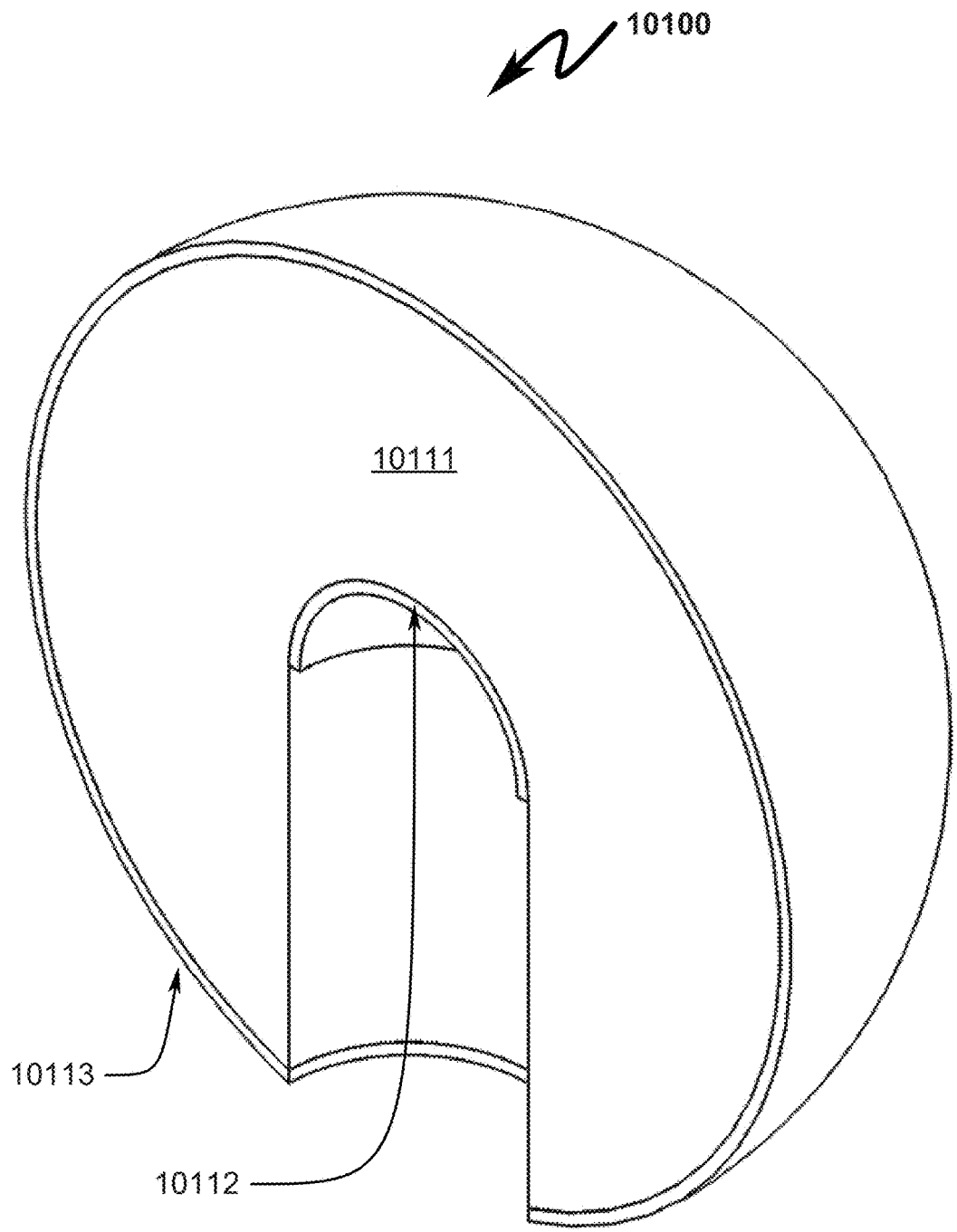
FIG. 101 illustrates a top right perspective front sectional view of a preferred exemplary sphere-shaped invention system embodiment incorporating a hemispherical centroid signal contact.
Figure 102:
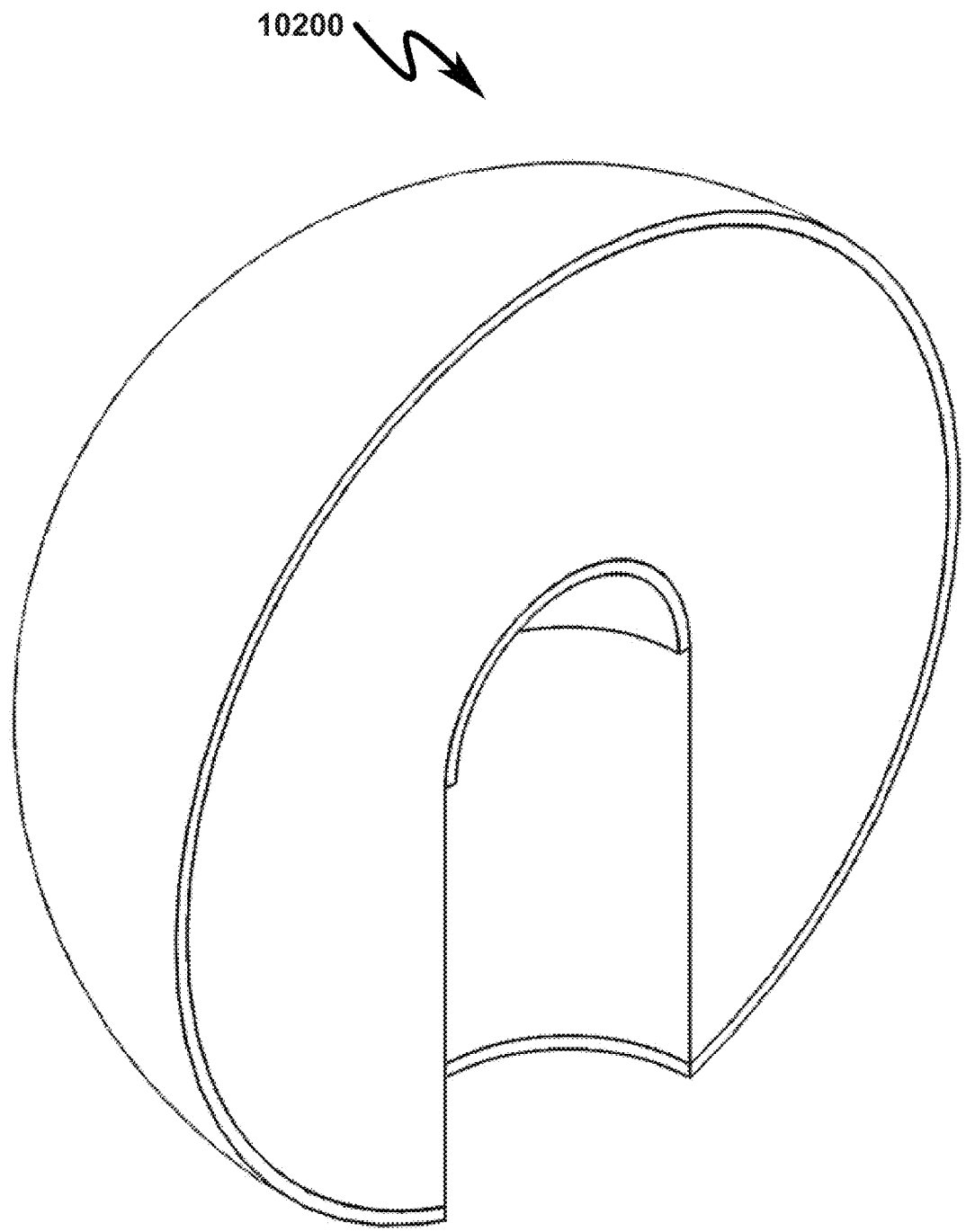
FIG. 102 illustrates a top right perspective right sectional view of a preferred exemplary sphere-shaped invention system embodiment incorporating a hemispherical centroid signal contact.
Figure 103:
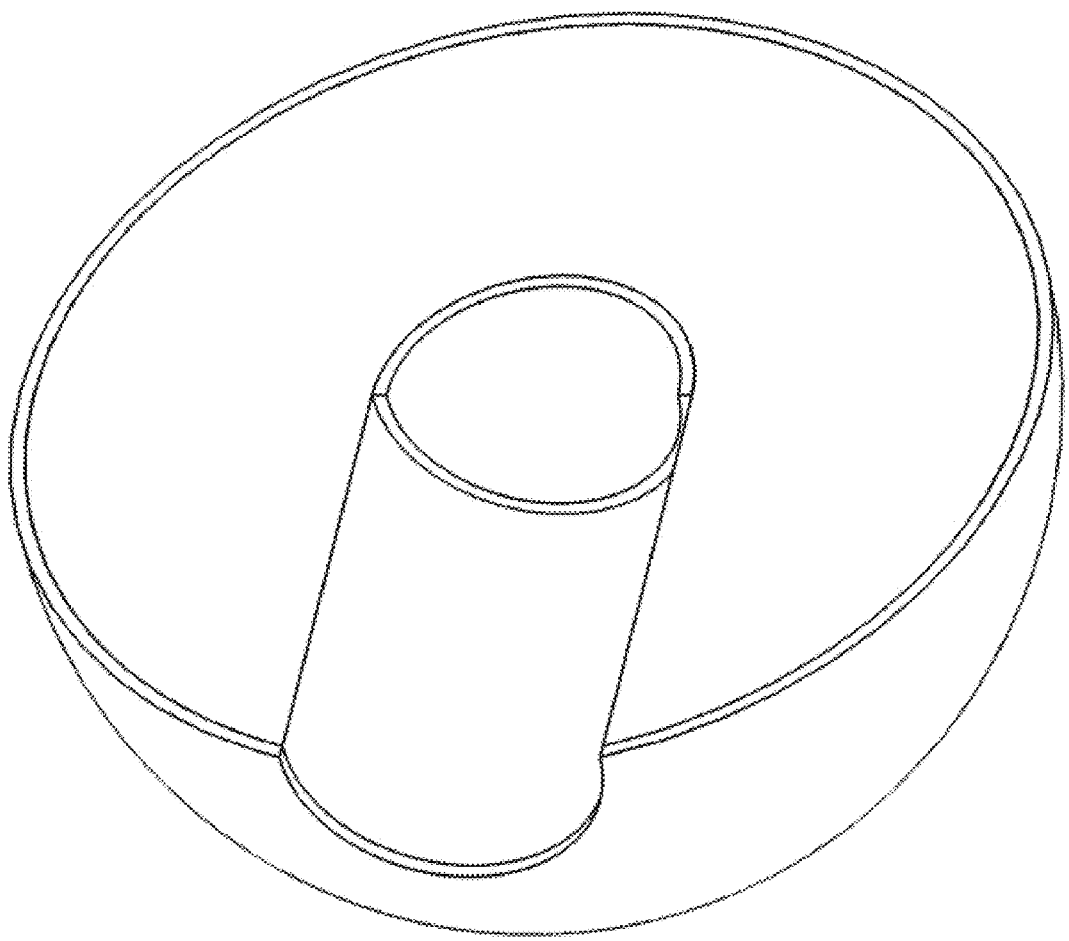
FIG. 103 illustrates a bottom front perspective front sectional view of a preferred exemplary sphere-shaped invention system embodiment incorporating a hemispherical centroid signal contact.
Figure 104:
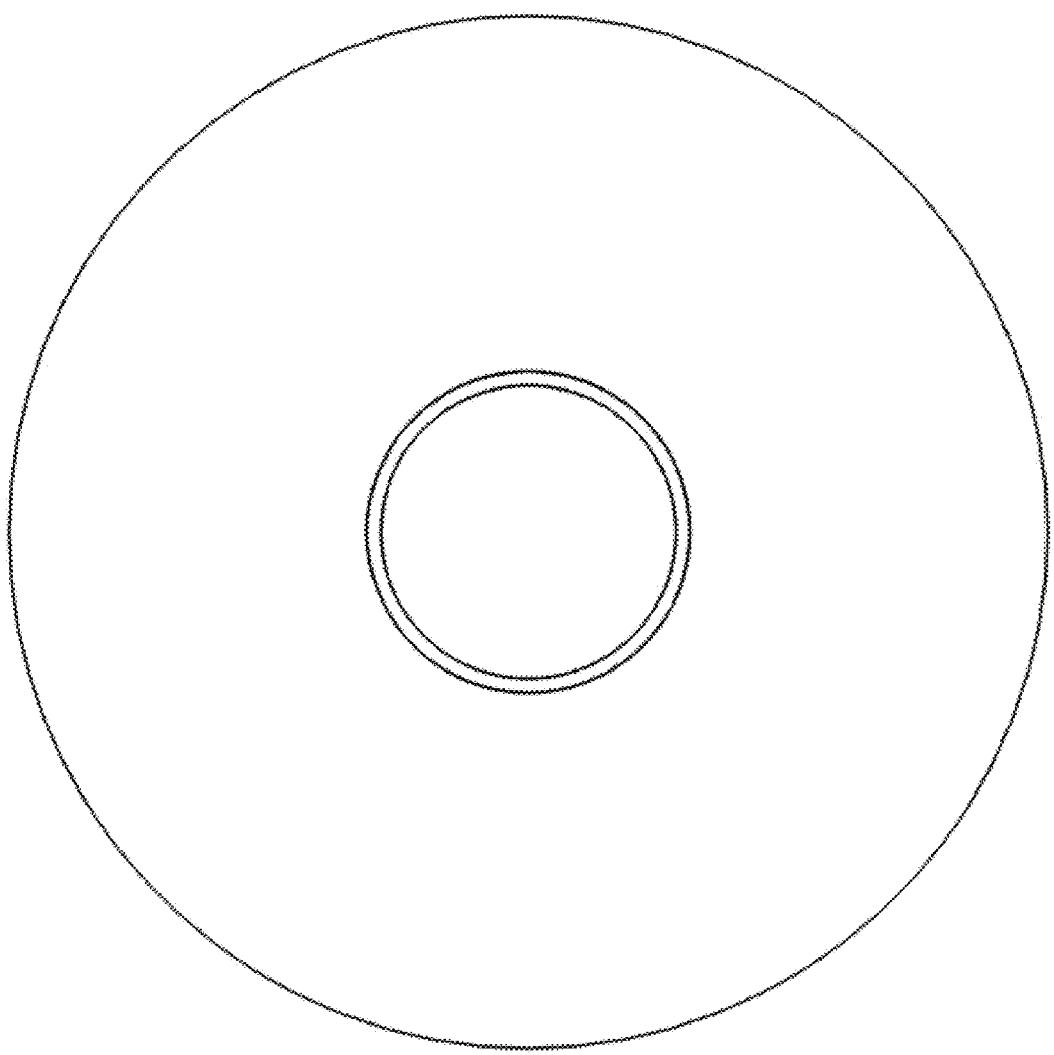
FIG. 104 illustrates a bottom view of a preferred exemplary sphere-shaped invention system embodiment incorporating a hemispherical centroid signal contact.

FIG. 101 (10100)-FIG. 104 (10400) depict a preferred exemplary spherical-shaped invention embodiment in which the centroid contact (10112) is implemented as a hemispherical contact structure.

Semi-Hemispherical Contact Spherical Embodiment (10500)-(10800)

Figure 105:
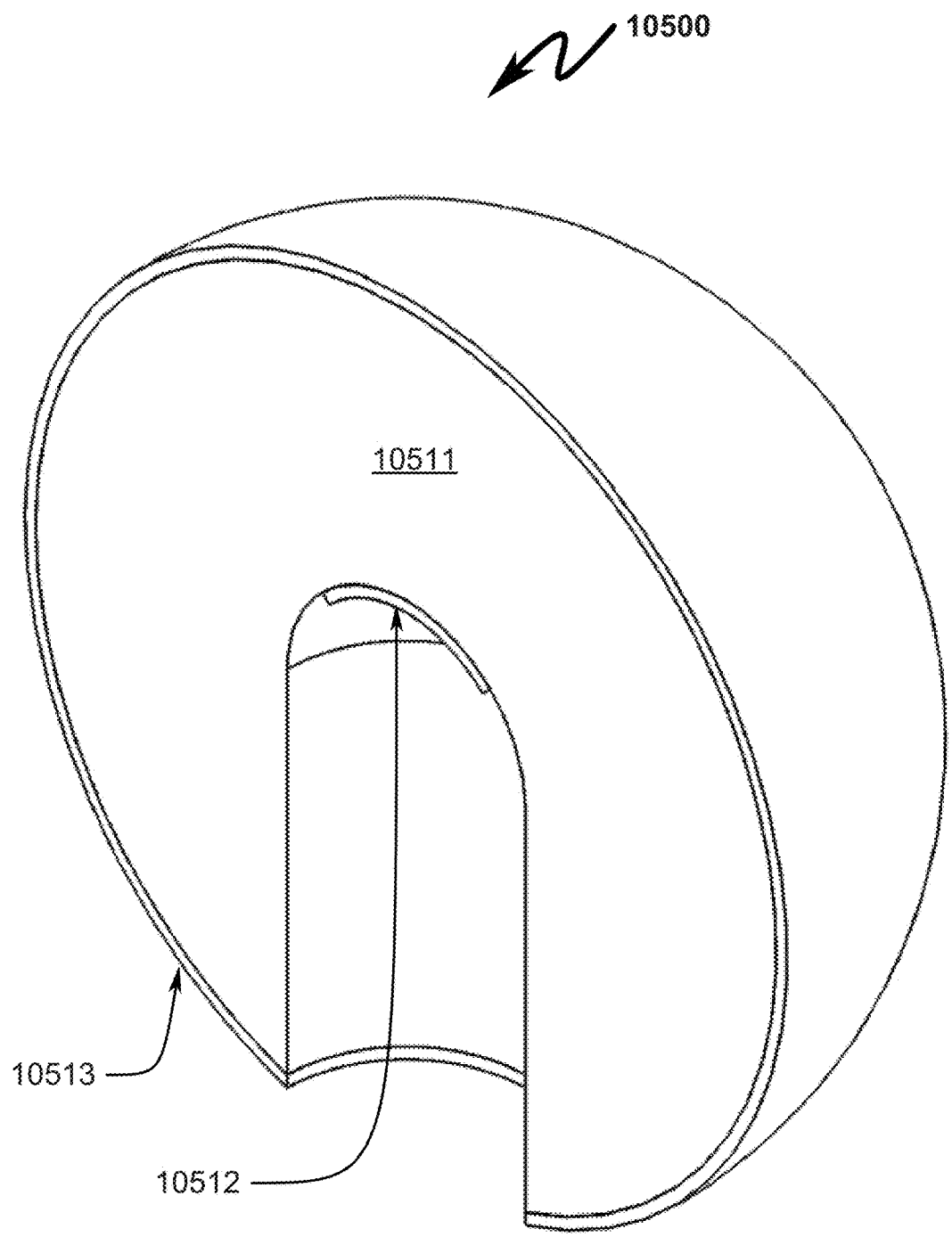
FIG. 105 illustrates a top right perspective front sectional view of a preferred exemplary sphere-shaped invention system embodiment incorporating a semi-hemispherical centroid signal contact.
Figure 106:
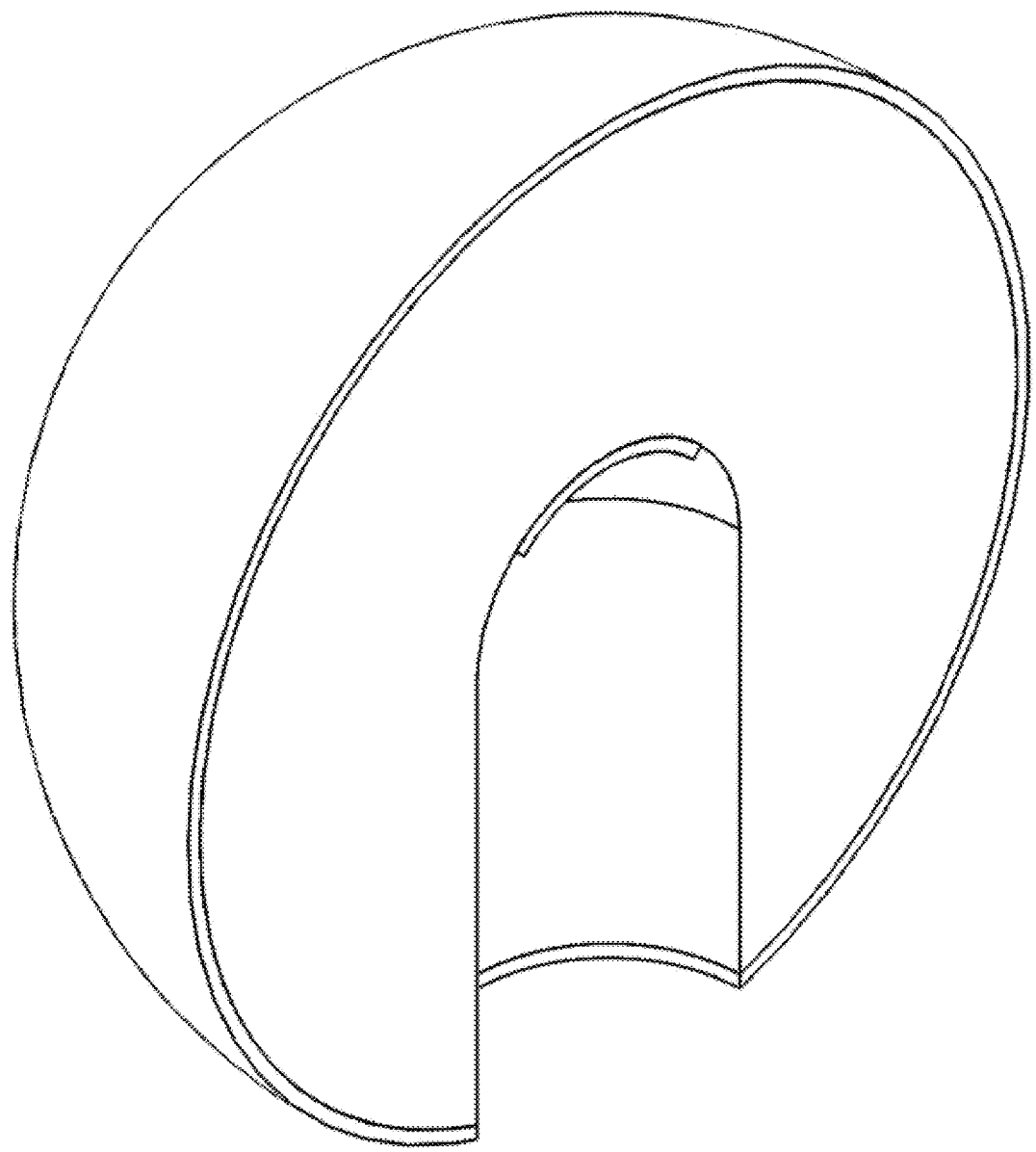
FIG. 106 illustrates a top right perspective right sectional view of a preferred exemplary sphere-shaped invention system embodiment incorporating a semi-hemispherical centroid signal contact.
Figure 107:
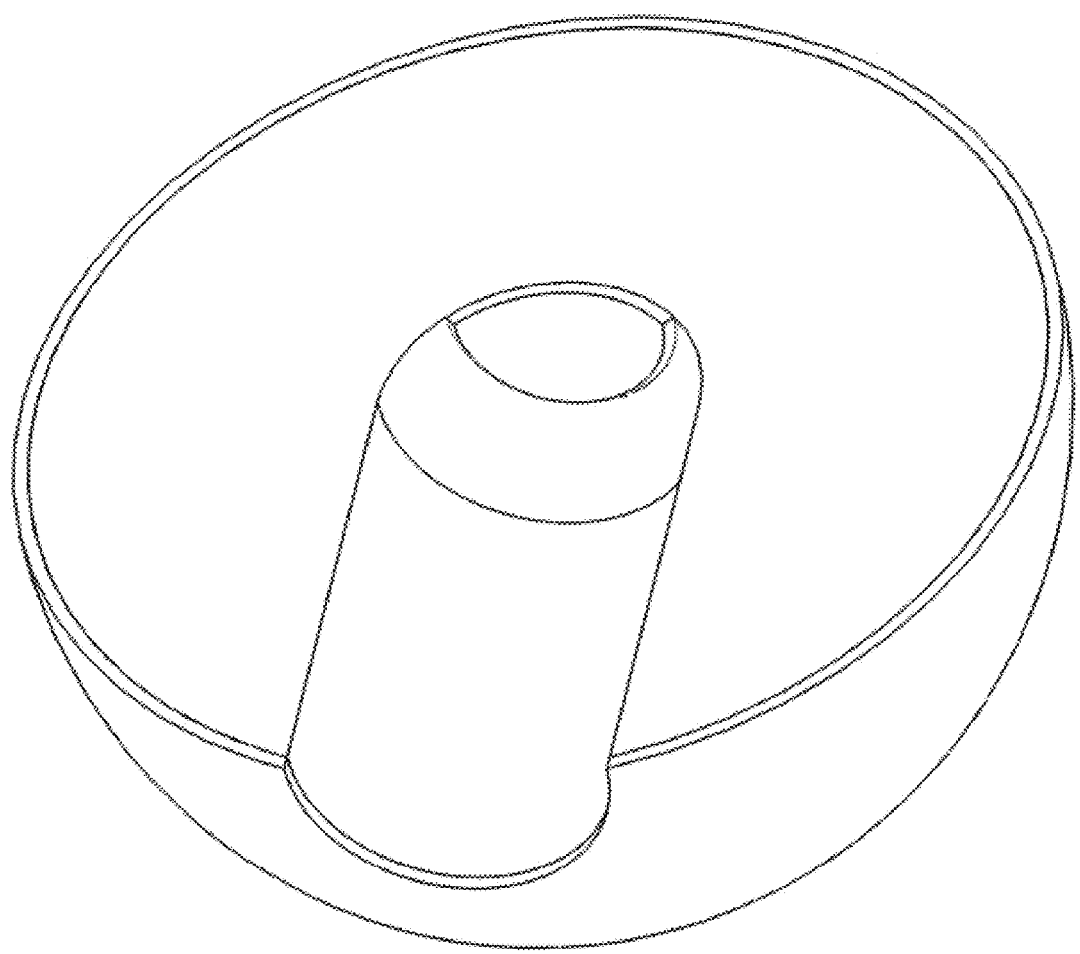
FIG. 107 illustrates a bottom front perspective front sectional view of a preferred exemplary sphere-shaped invention system embodiment incorporating a semi-hemispherical centroid signal contact.
Figure 108:
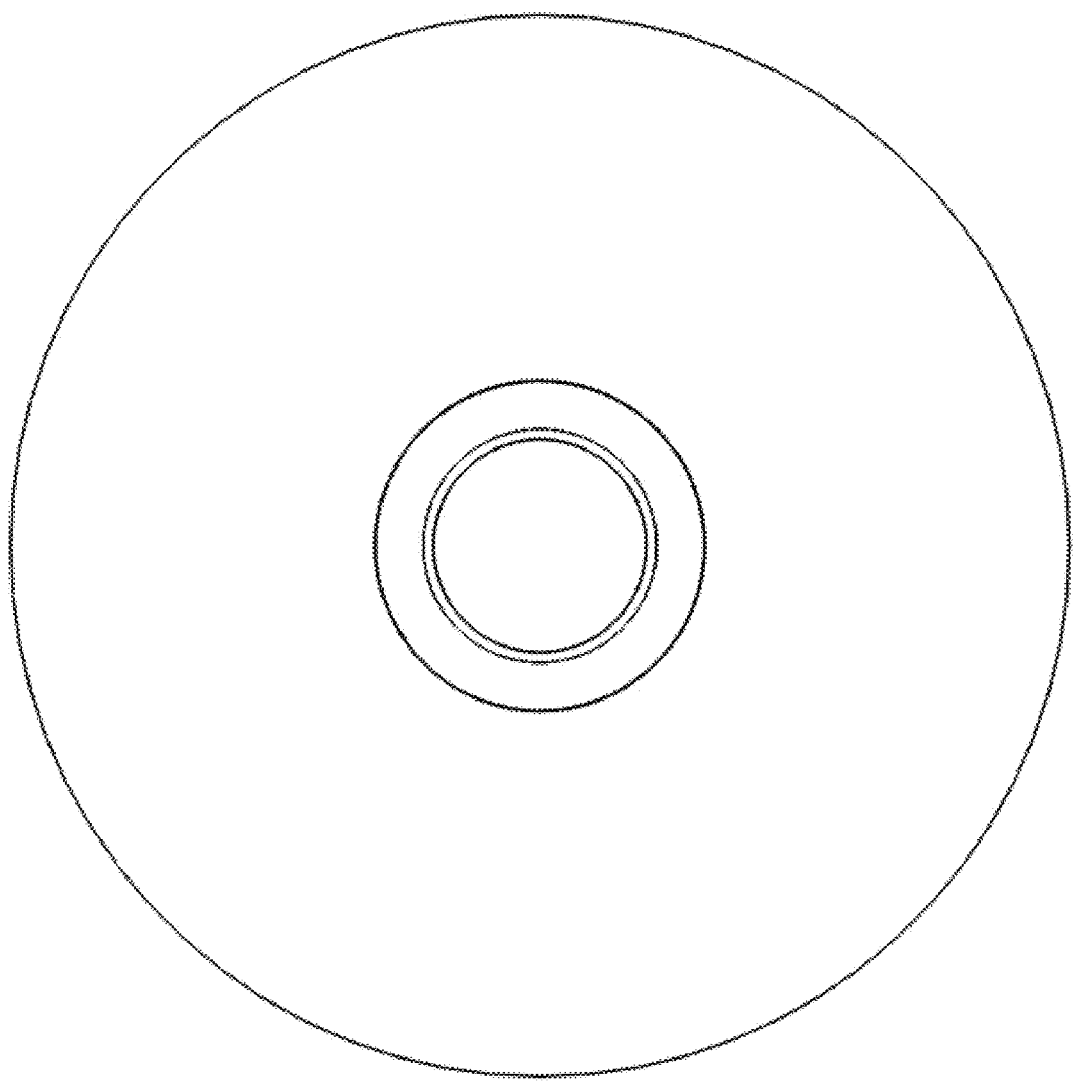
FIG. 108 illustrates a bottom view of a preferred exemplary sphere-shaped invention system embodiment incorporating a semi-hemispherical centroid signal contact.

FIG. 105 (10500)-FIG. 108 (10800) depict a preferred exemplary spherical-shaped invention embodiment in which the centroid contact (10512) is implemented as a semi-hemispherical contact structure.

Point Contact Spherical Embodiment (10900)-(11200)

Figure 109:
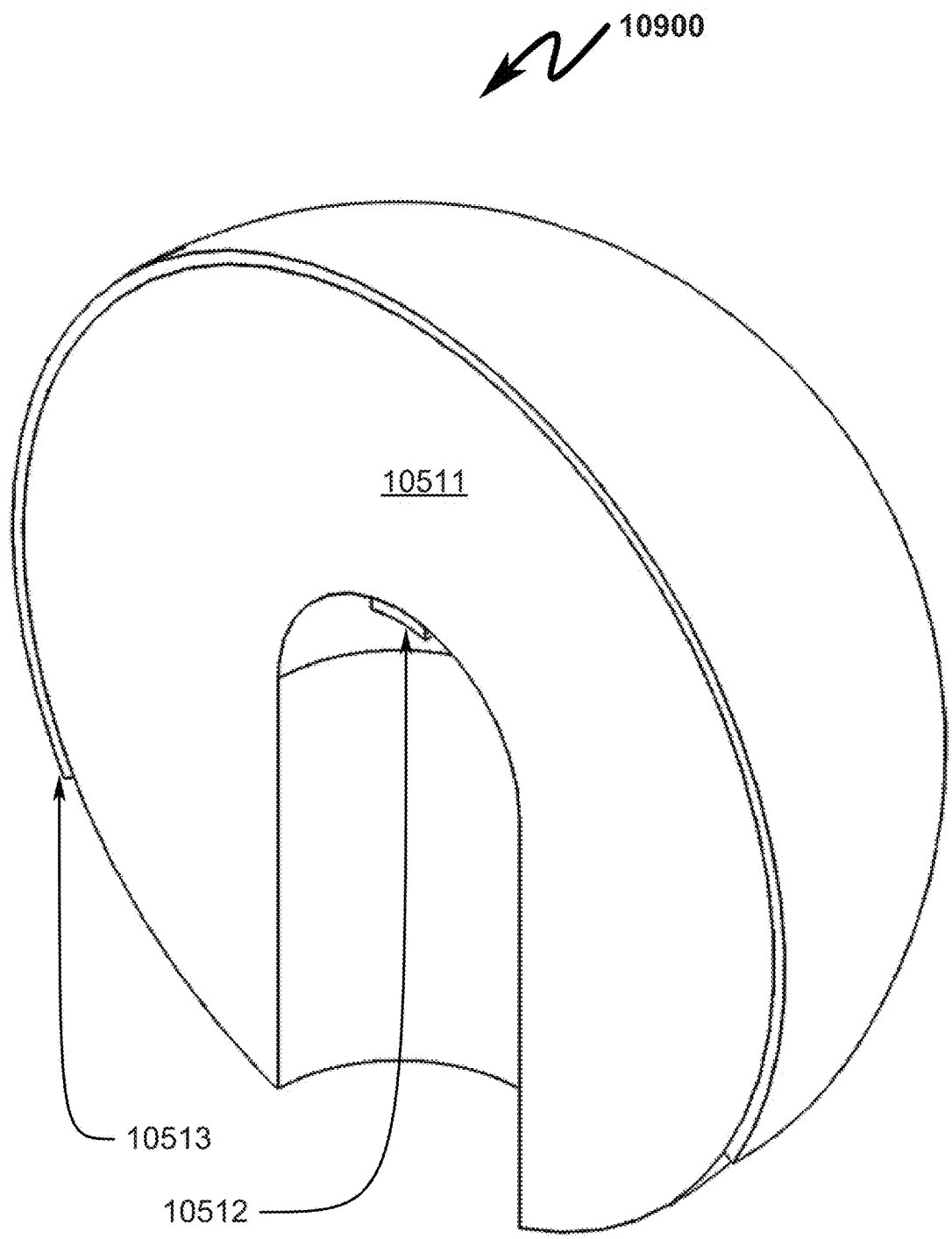
FIG. 109 illustrates a top right perspective front sectional view of a preferred exemplary sphere-shaped invention system embodiment incorporating a semi-hemispherical point-contact centroid signal contact.
Figure 110:
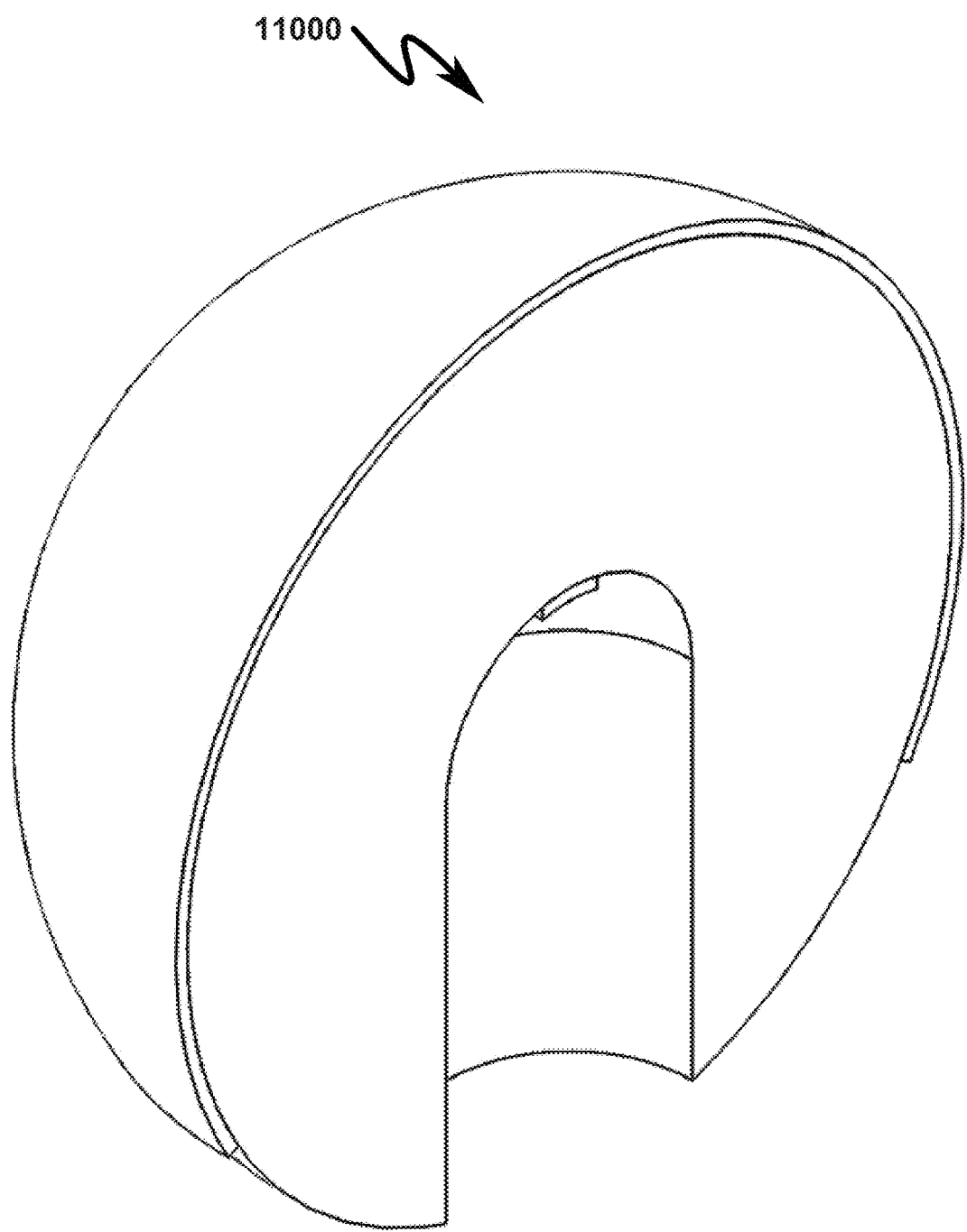
FIG. 110 illustrates a top right perspective right sectional view of a preferred exemplary sphere-shaped invention system embodiment incorporating a semi-hemispherical point-contact centroid signal contact.
Figure 112:
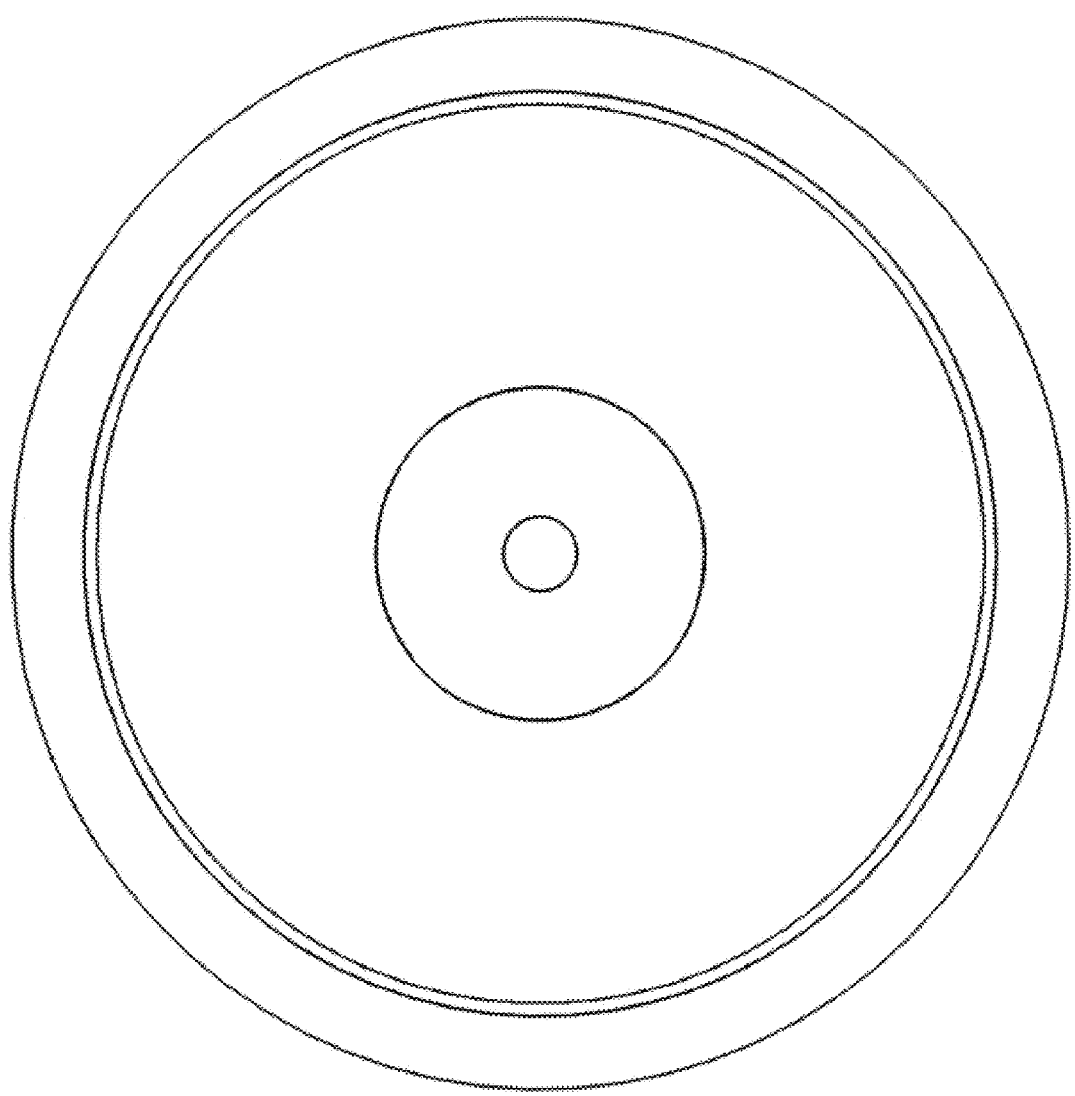
FIG. 112 illustrates a bottom view of a preferred exemplary sphere-shaped invention system embodiment incorporating a semi-hemispherical point-contact centroid signal contact.

FIG. 109 (10900)-FIG. 112 (11200) depict a preferred exemplary spherical-shaped invention embodiment in which the centroid contact (10912) is implemented as a semi-hemispherical point contact structure with partial outer surface contact coverage.

Preferred Exemplary Embodiment (11300)-(12000)

Figure 113:
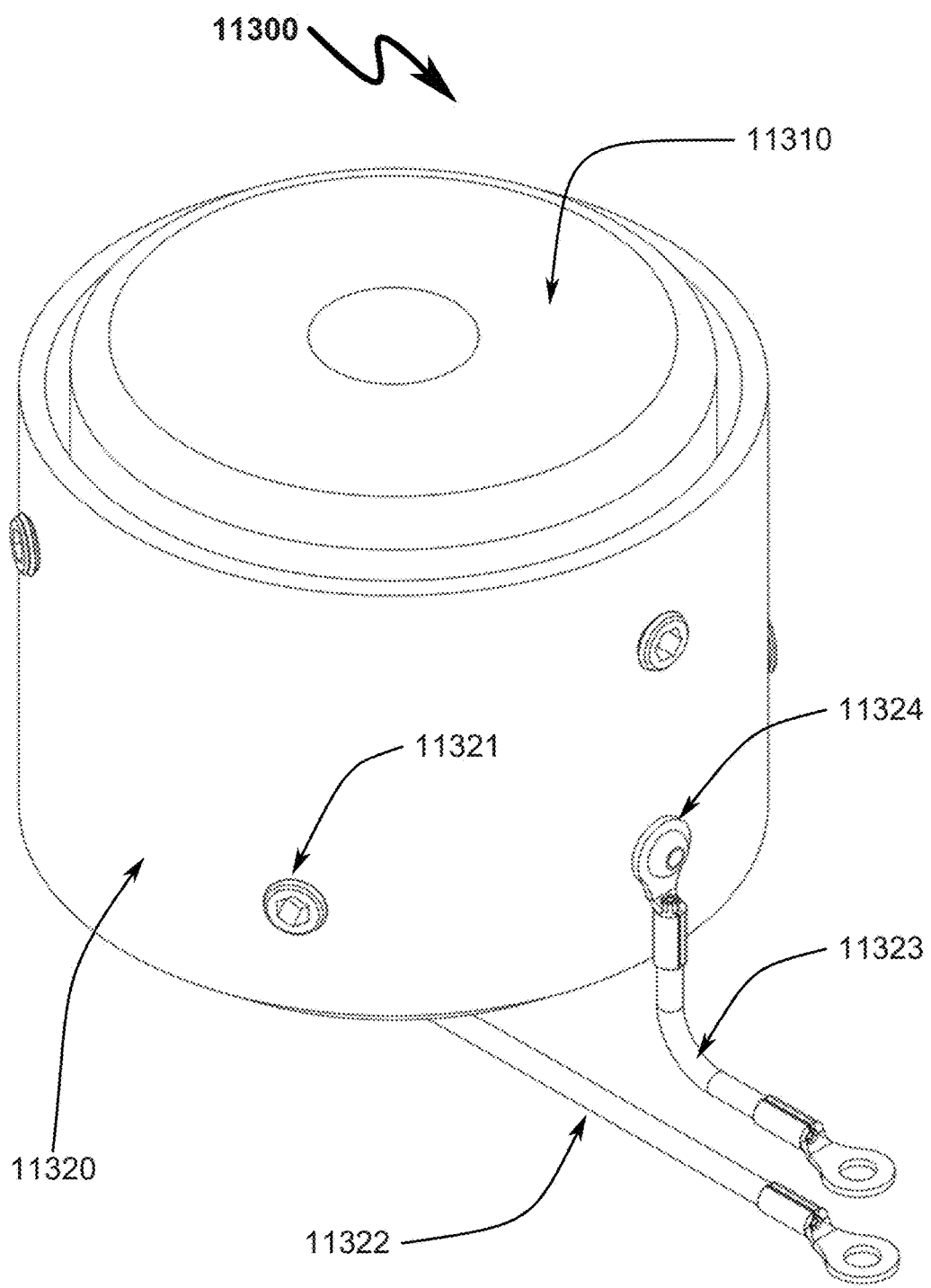
FIG. 113 illustrates a top right front perspective view of a preferred exemplary invention system embodiment depicting an exemplary detector housing and detector contact wiring.
Figure 120:
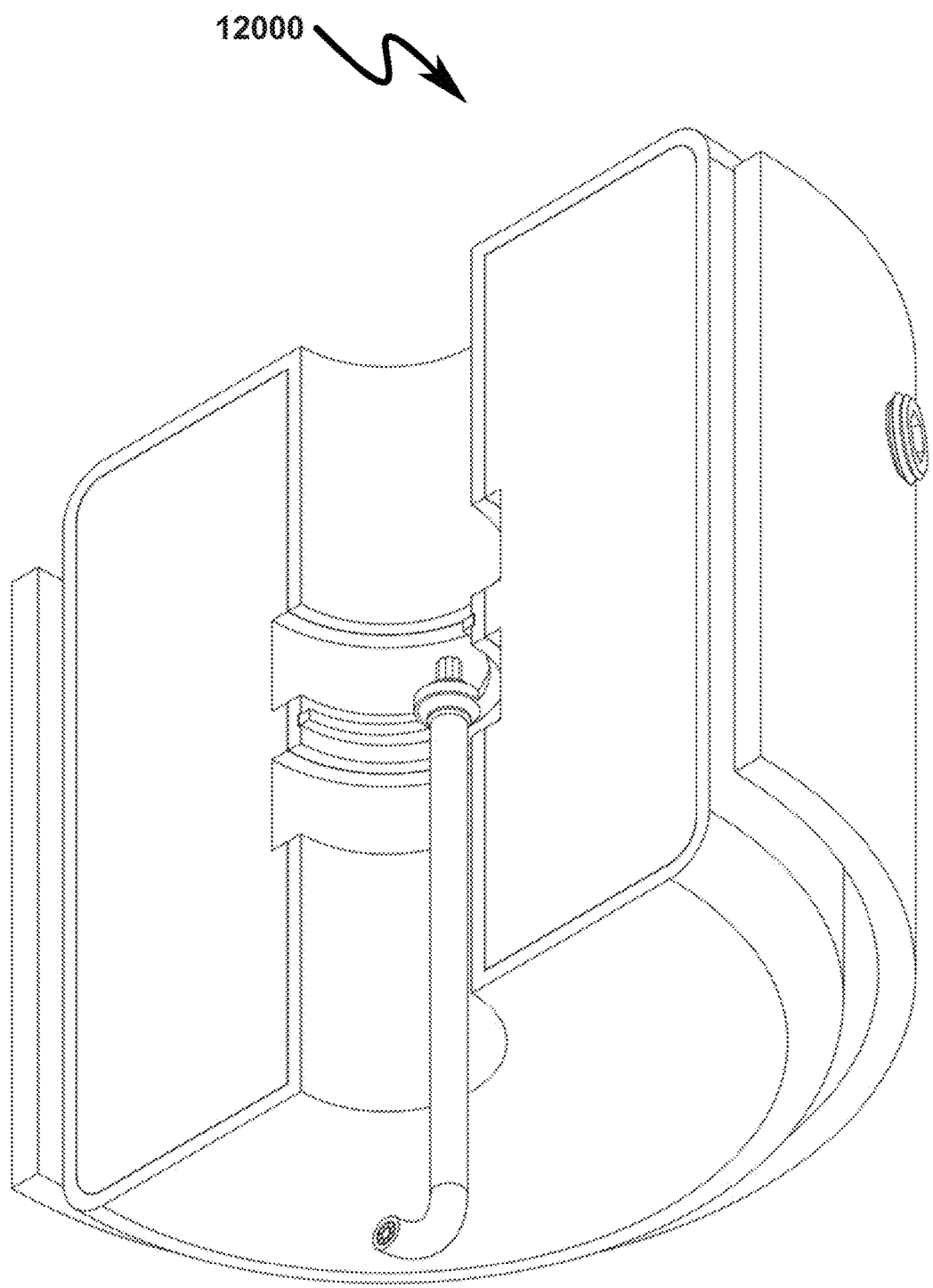

FIG. 113 (11300)-FIG. 120 (12000) depict a preferred exemplary invention system embodiment in which the centroid contact radiation detector (11310) is retained by a detector enclosure (11320) using setscrews (11321) or equivalent fastening means. Electrical contact with the centroid contact radiation detector (11310) is accomplished using wiring (11322, 11323) that contacts (11324) the detector enclosure (11320) and the centroid contact of the detector.

Figure 114:
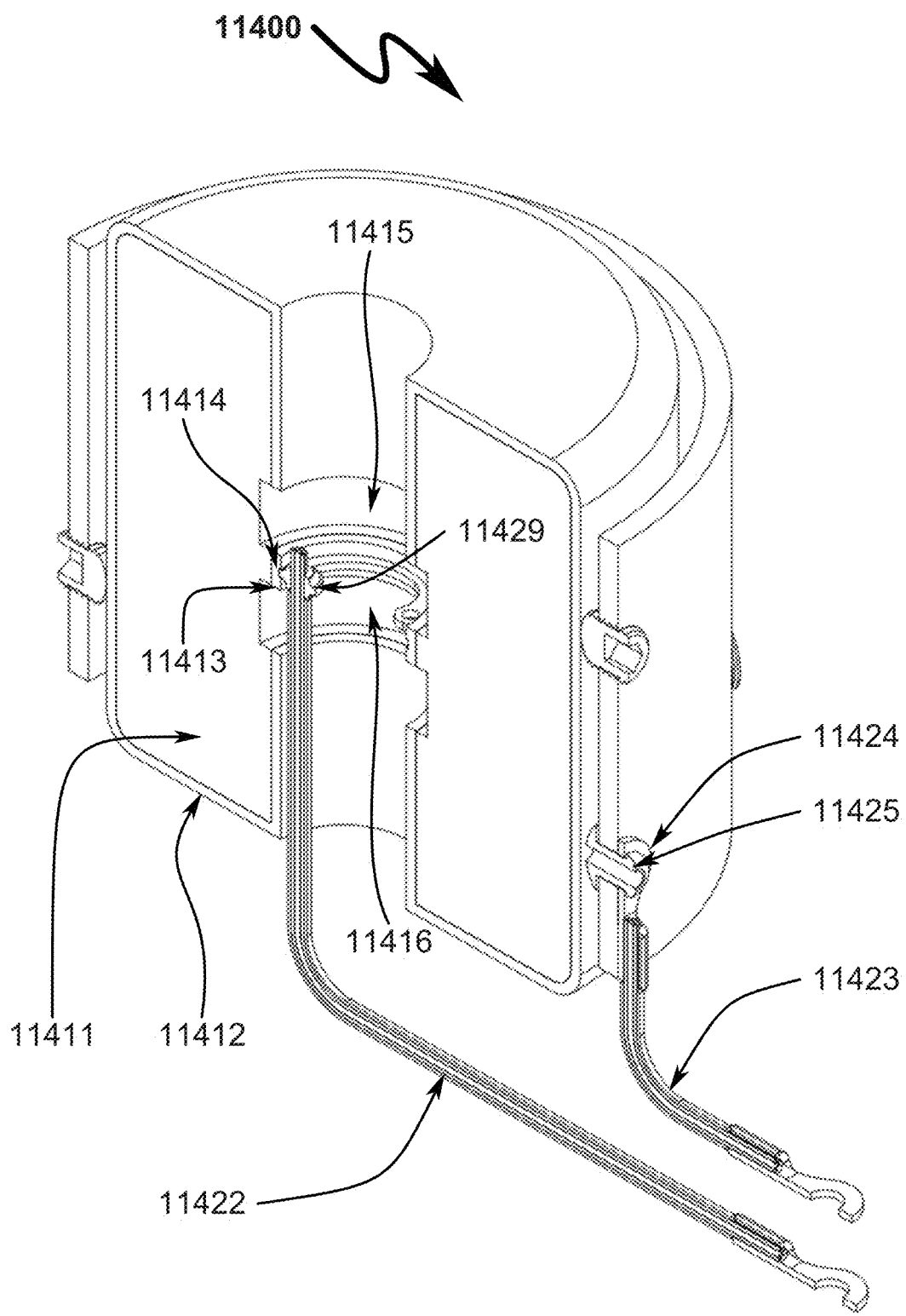
FIG. 114 illustrates a top right front perspective front section view of a preferred exemplary invention system embodiment depicting an exemplary detector housing and detector contact wiring.
Figure 115:
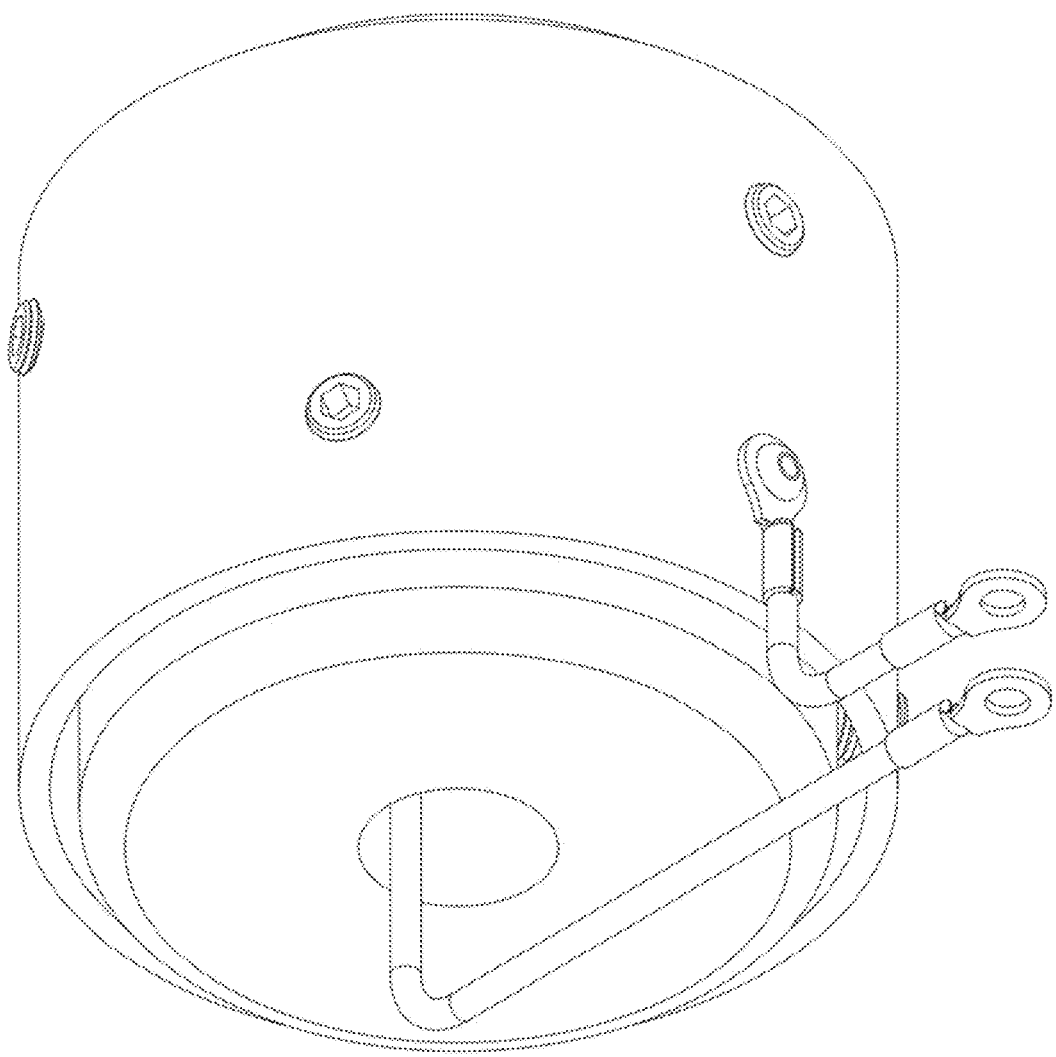
FIG. 115 illustrates a bottom right front perspective view of a preferred exemplary invention system embodiment depicting an exemplary detector housing and detector contact wiring.
Figure 116:
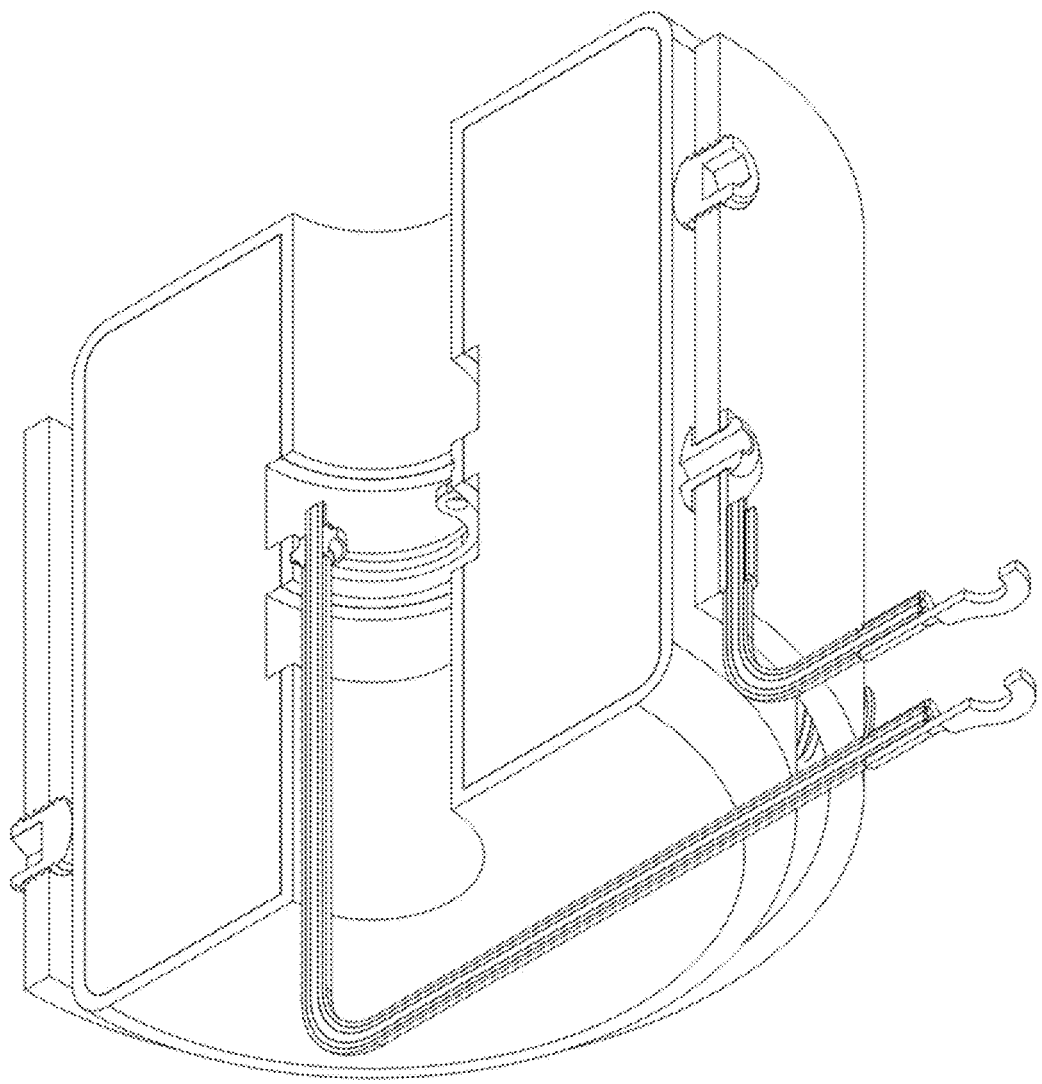
FIG. 116 illustrates a bottom right front perspective front section view of a preferred exemplary invention system embodiment depicting an exemplary detector housing and detector contact wiring.
Figure 117:
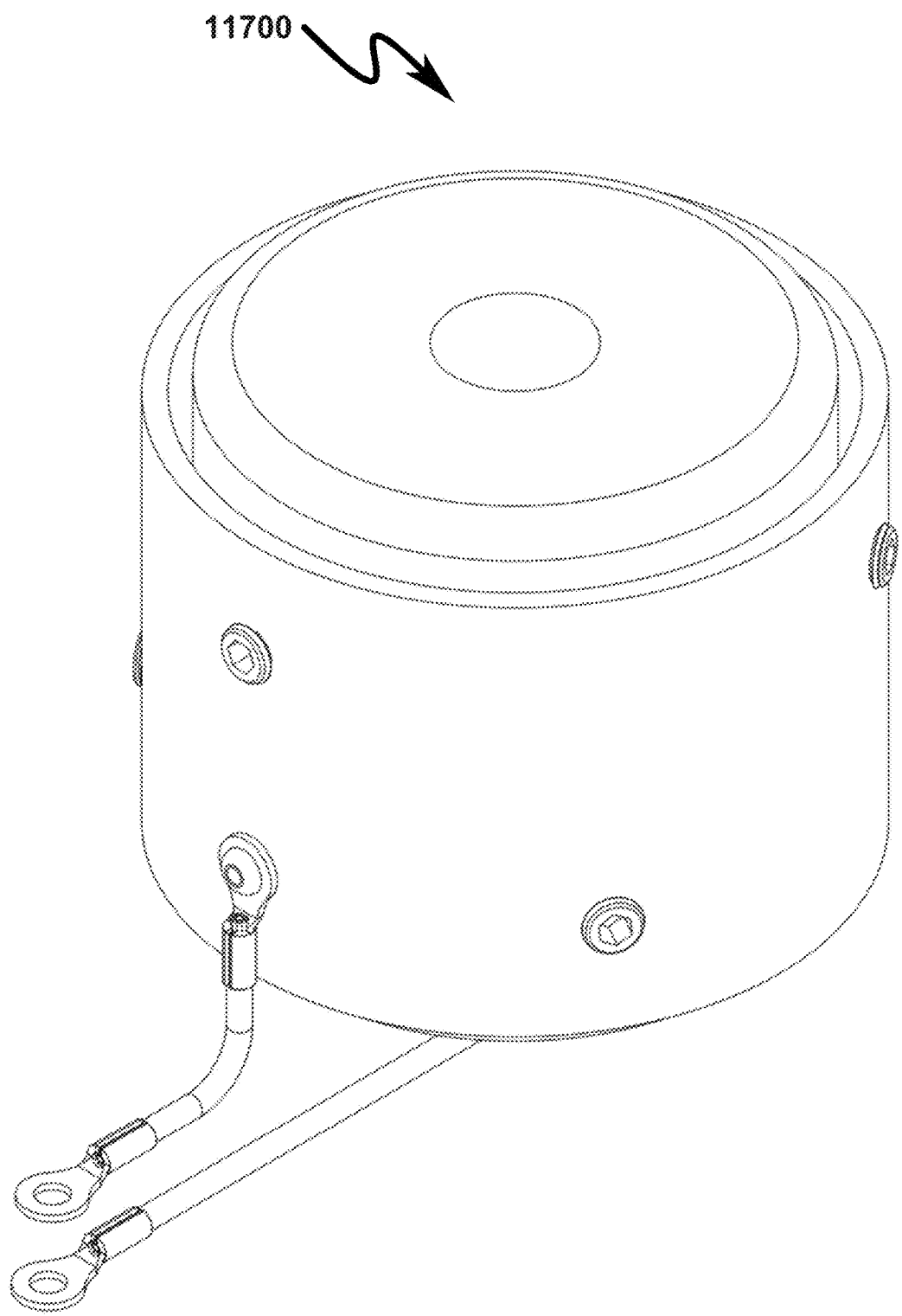
FIG. 117 illustrates a top right rear perspective view of a preferred exemplary invention system embodiment depicting an exemplary detector housing and detector contact wiring.
Figure 118:
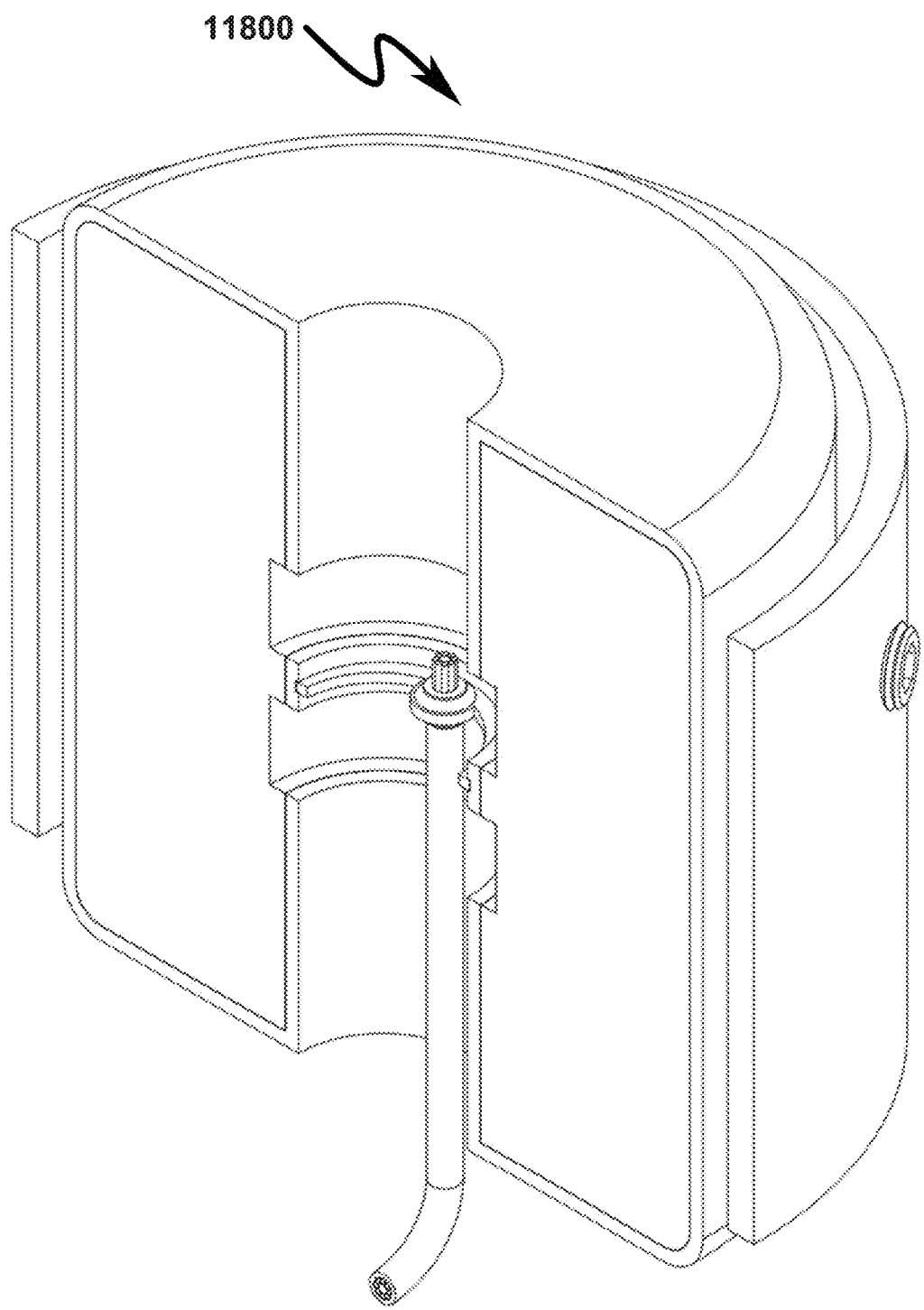
FIG. 118 illustrates a top right rear perspective right section view of a preferred exemplary invention system embodiment depicting an exemplary detector housing and detector contact wiring.
Figure 119:
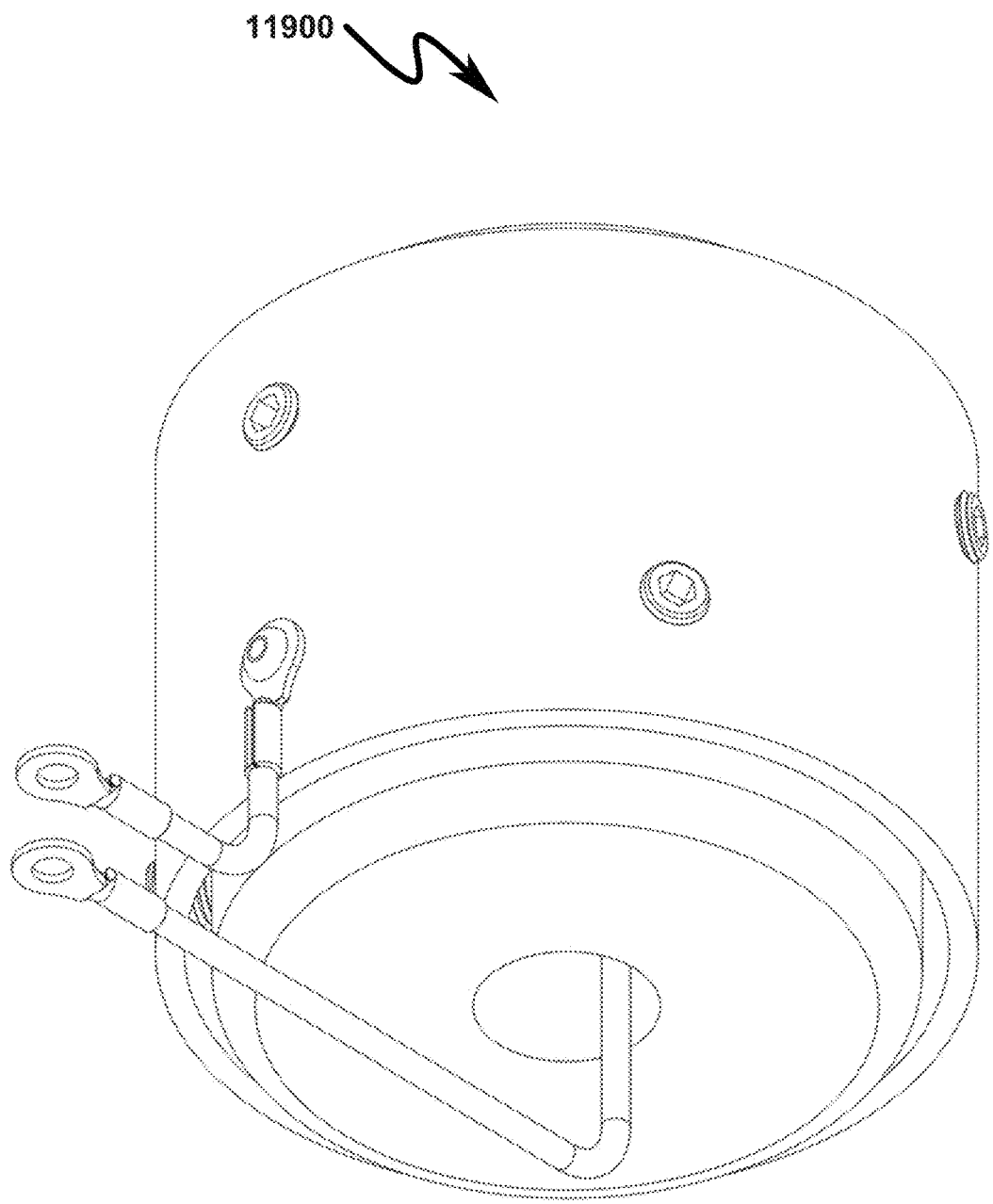

The front section view depicted in FIG. 114 (11400) illustrates a typical centroid contact radiation detector wherein the radiation detector bulk material (11411) incorporates a wraparound P+ (or N+) outer contact (11412) and N+ (or P+) centroid inner contact (11413) with optional inner contact connection ring groove (11414) surrounded by grooved intercontact junction regions (11415, 11416). A modified snap ring (11429) provides electrical connectivity between the centroid inner contact (11413) and the wiring harness (11422), while in this embodiment a rivet (11425) or other fastening means is used to make electrical contact between the detector enclosure (11420) and the wiring harness (11423).

Snap Ring Contact Embodiment (12100)-(12400)

Figure 121:
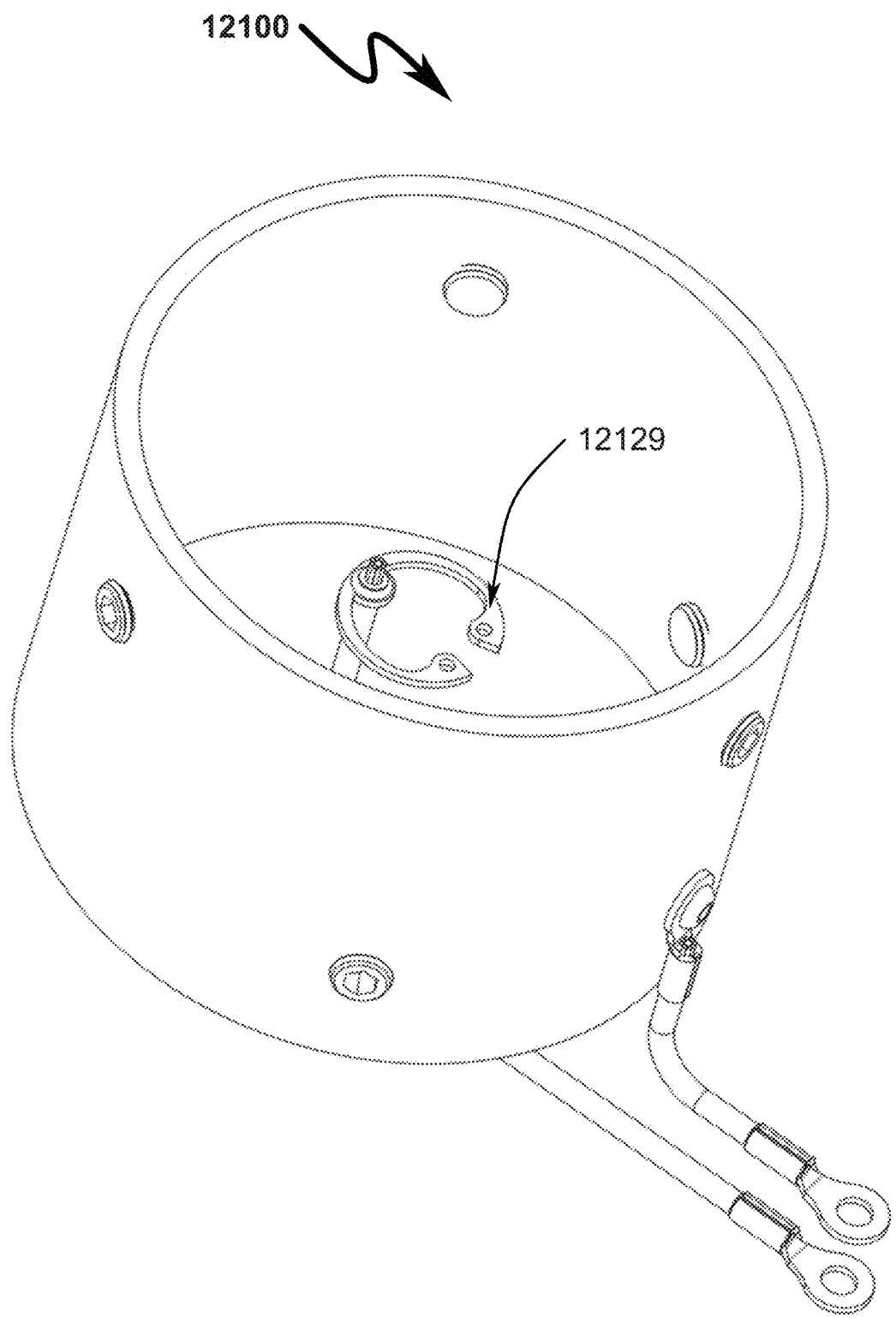
Figure 122:
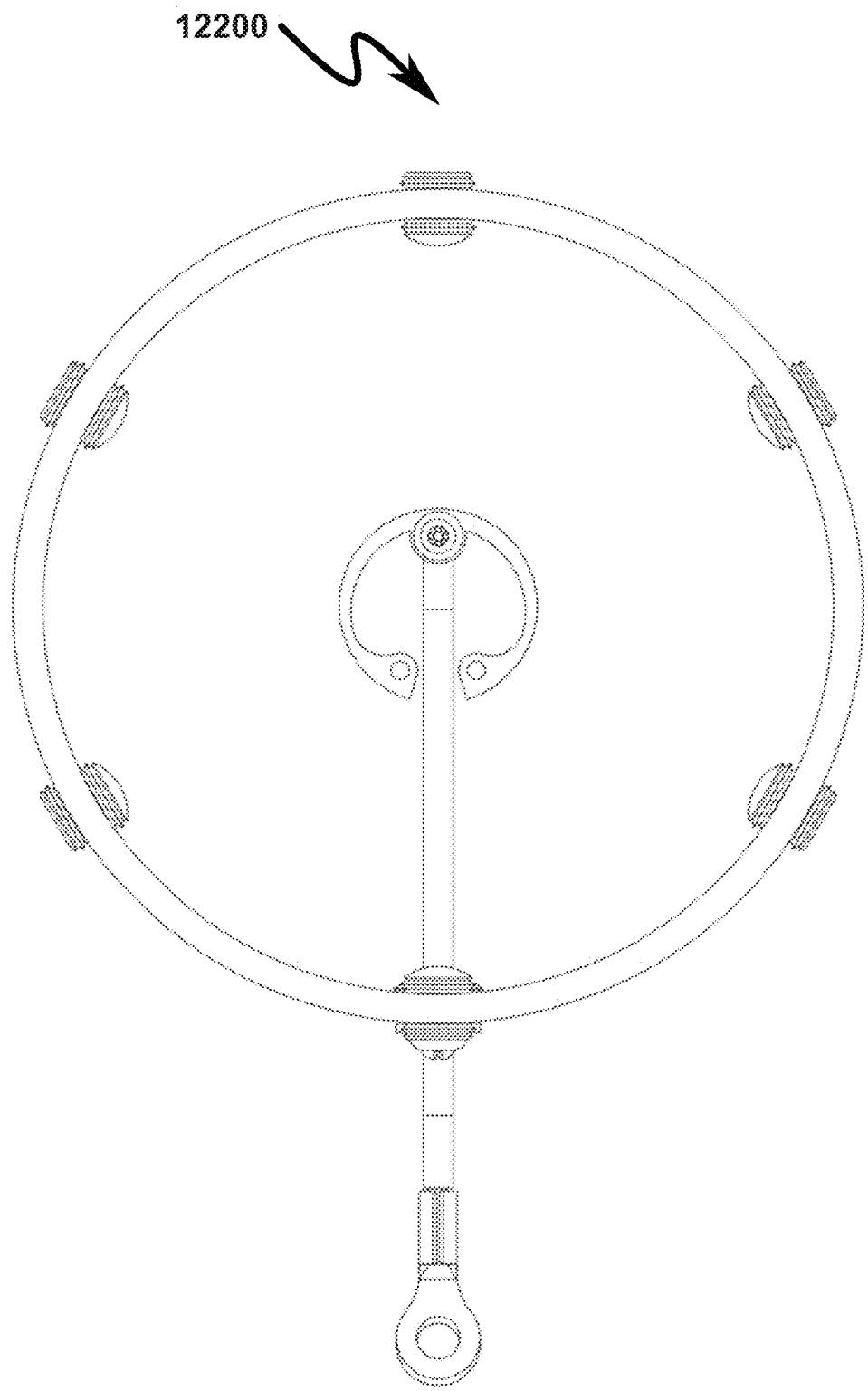
Figure 123:
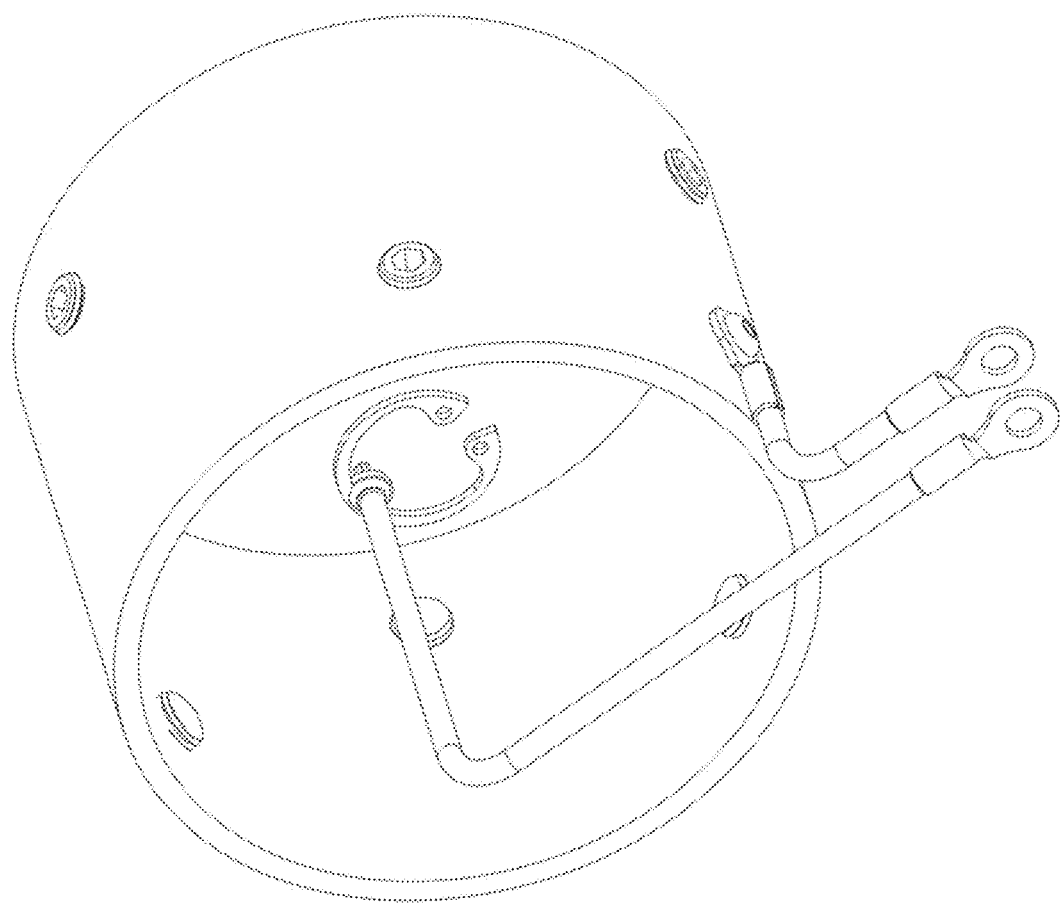
Figure 124:
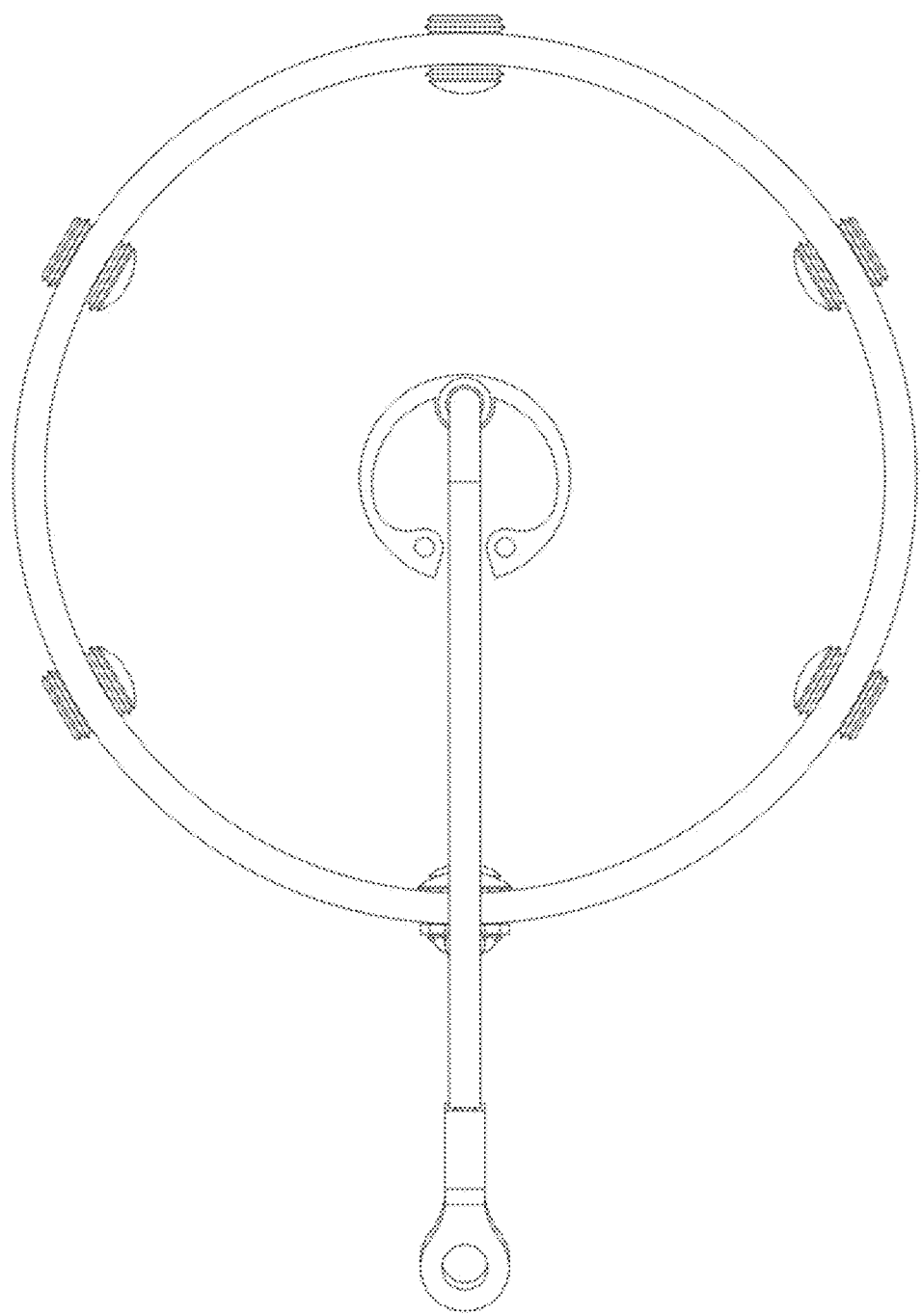

FIG. 121 (12100)-FIG. 124 (12400) depict a preferred exemplary snap ring contact embodiment that may be used to make electrical contact with the annular centroid contact. These drawings provide additional detail to the preferred exemplary embodiment depicted in FIG. 113 (11300)-FIG. 120 (12000). Here a snap ring (12129) has been modified to support connection to electrical wiring to allow mechanical/ electrical contact between the annular centroid contact and electrical wiring. While the centroid contact in this example is shown as comprising a cylindrical annulus with snap ring mating groove, one skilled in the art will recognize that this contacting technique to the centroid contact may take other forms that what is shown and may not involve the use of a snap ring or snap ring mating groove. Additionally, while the snap ring groove is shown in the centroid contact to mate to the snap ring in this example, this is not a requirement in many preferred embodiments.

Alternative Centroid Contact Embodiment (12500)-(12800)

Figure 125:
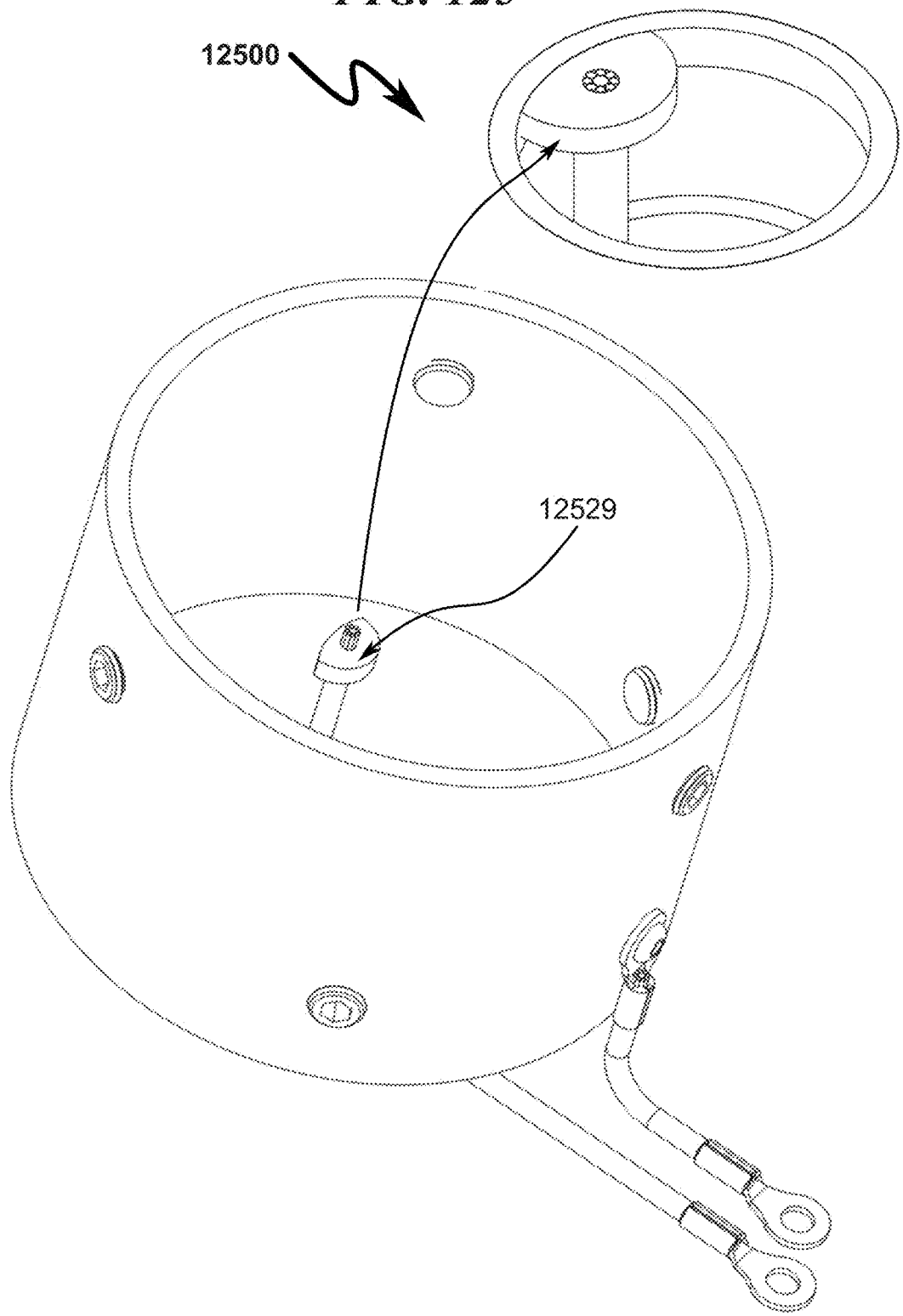
Figure 126:
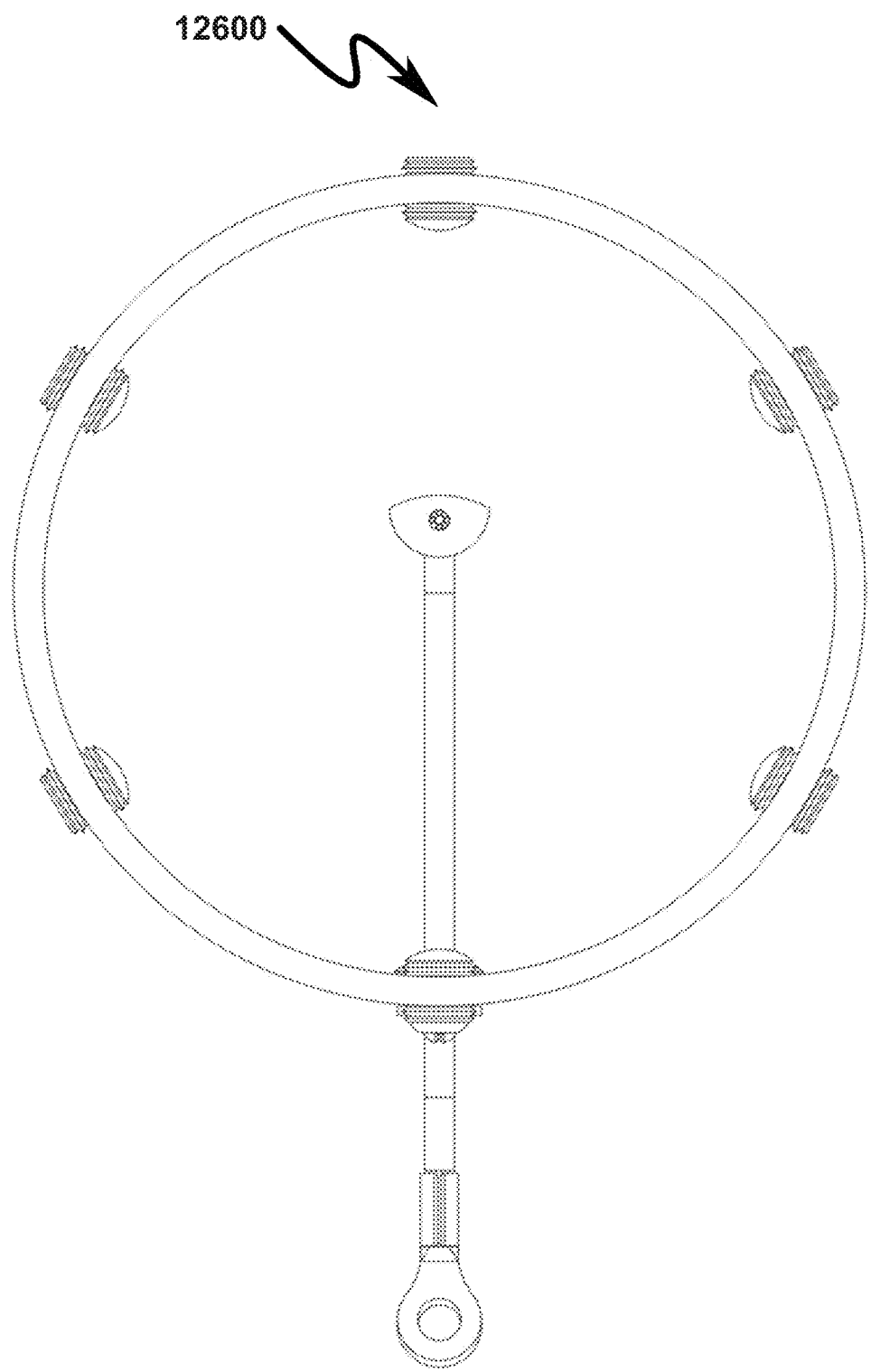
Figure 127:
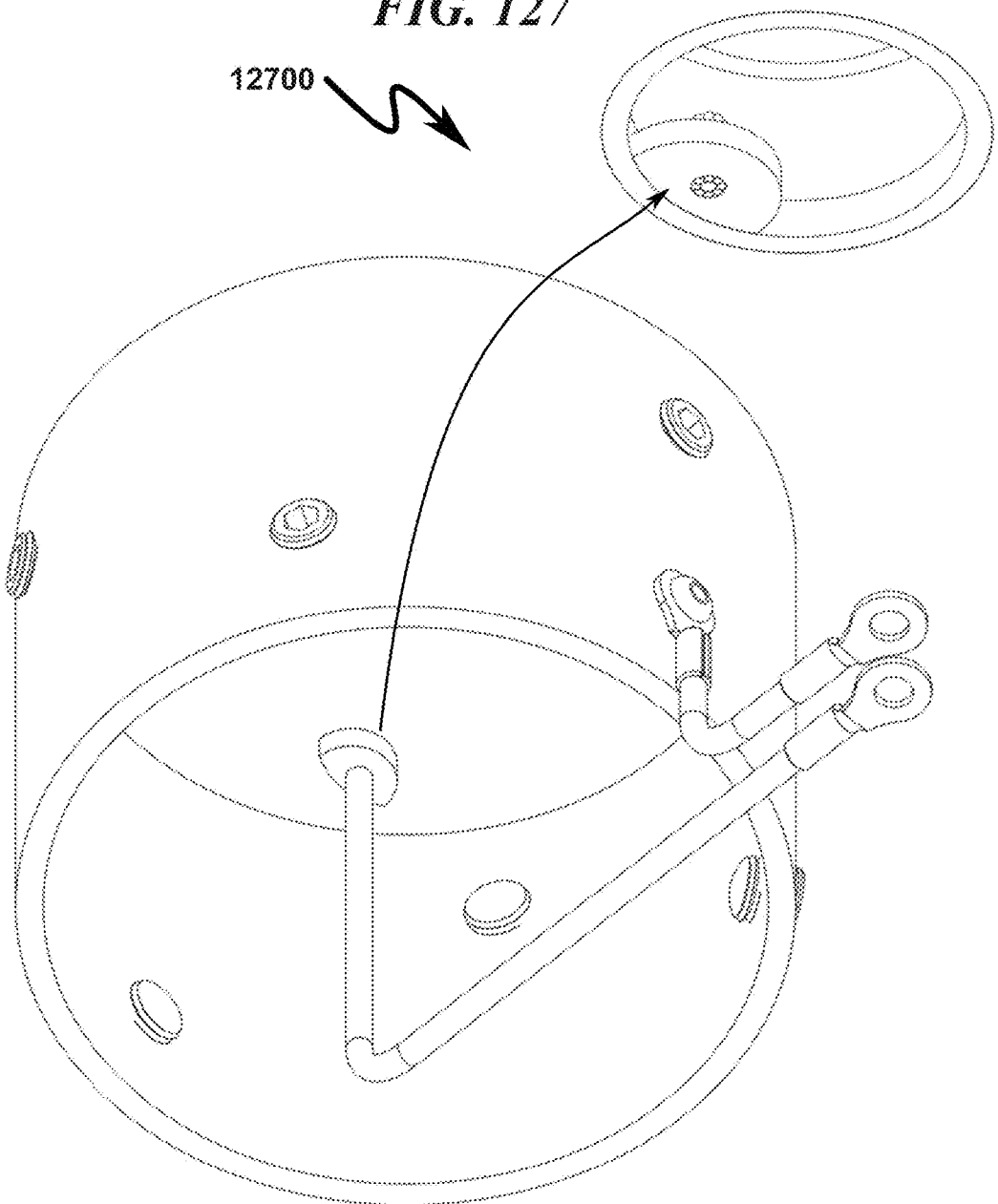

FIG. 125 (12500)-FIG. 128 (12800) depict an alternative means of making electrical contact to the centroid contact. As mentioned previously, the electrical contact to the centroid contact may take many forms, including but not limited to welding, soldering, mechanical contact, etc. Here it can be seen that a weld/soldered contact (12529) is provided for making contact to the centroid contact. One skilled in the art will be able to take the teachings of FIG. 121 (12100)-FIG. 128 (12800) and quickly deduce other methods of making this electrical connection to the centroid contact.

Alternative Contact Embodiments

While the outer and centroid contact have been shown to be on top of the bulk semiconductor germanium in many of the illustrated examples, these contacts may be diffused and/or ion implanted with no loss of generality in the invention teachings. In any example herein in which the contact is place on the surface of the bulk germanium, these alternative methods of forming the contact may be utilized without loss of generality in the overall invention scope.

Combined Structure Embodiments

The present invention anticipates that combinations of structures as detailed in any of the examples presented in FIG. 40 (4000)-FIG. 48 (4800) and FIG. 65 (6500)-FIG. 176 (17600) may be assembled to achieve similar performance characteristics without departing from the spirit of the invention.

Spring Ring Centroid Contact (12100-12400)

While the present invention anticipates a wide variety of methodologies may be used to make electrical contact with the centroid contact in the radiation detector, one preferred exemplary methodology is depicted in the modified spring ring contact depicted in FIG. 121 (12100)-FIG. 124 (12400). In this embodiment a spring ring clip is augmented with support for electrical contact with a wire. The spring ring is collapsed and inserted into an optional groove in the centroid contact. In some circumstances the spring ring may be used without the need for a corresponding groove in the centroid contact.

Point Wiring Contact Centroid Contact (12500-12800)

While the present invention anticipates a wide variety of methodologies may be used to make electrical contact with the centroid contact in the radiation detector, one preferred exemplary methodology is depicted in the point wiring contact depicted in FIG. 125 (12500)-FIG. 128 (12800). In this embodiment a point wiring contact is provided to support a electrical contact with a wire. The point contact may be accomplished using a variety of known methodologies to attach the wire to the centroid annulus formed at the centroid contact. In some circumstances point contact may be made directly between the wire and the centroid contact using a variety of known welding and/or soldering techniques.

Wraparound Outer Contact (12900-13600)

Figure 129:
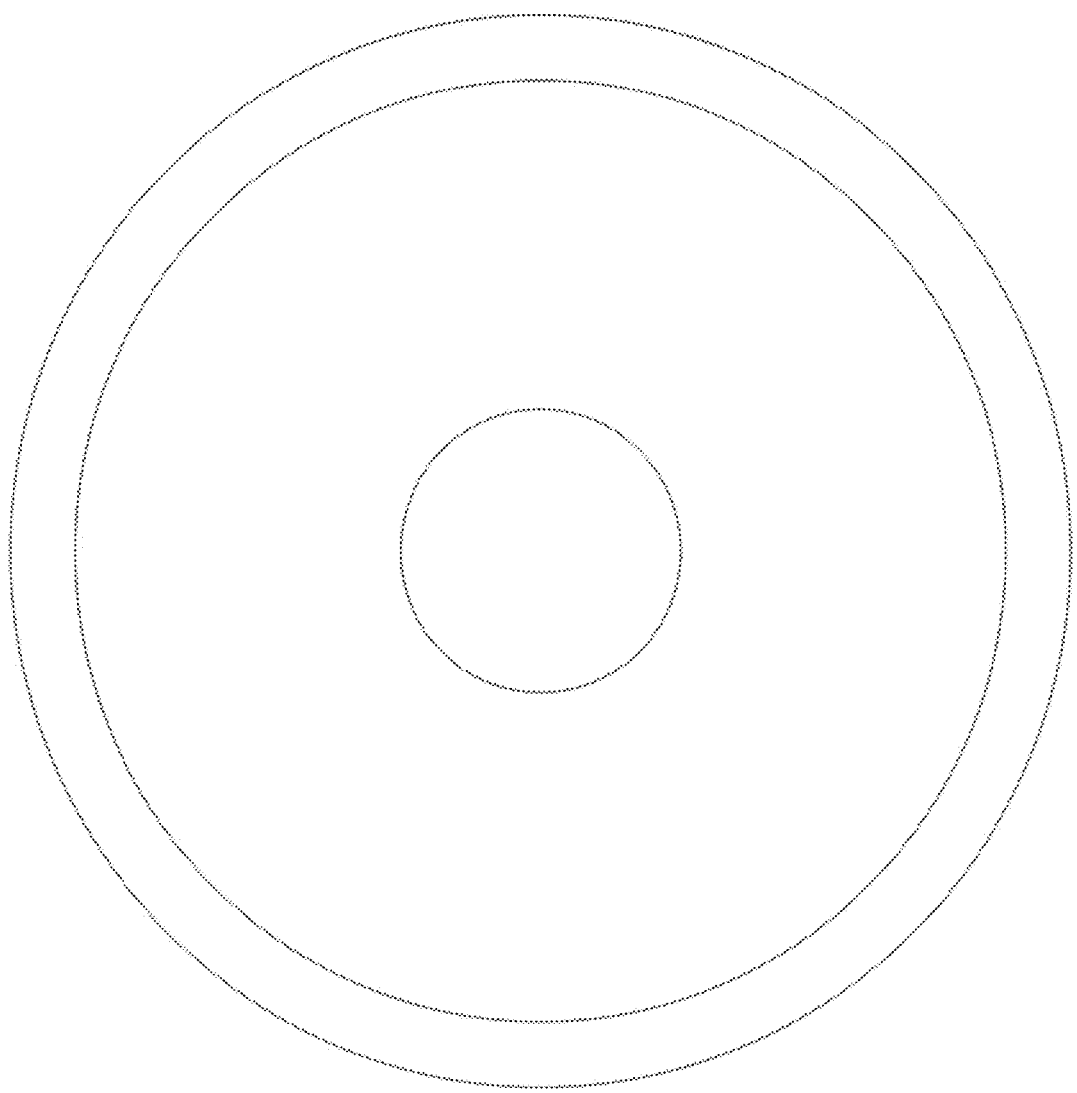
Figure 130:
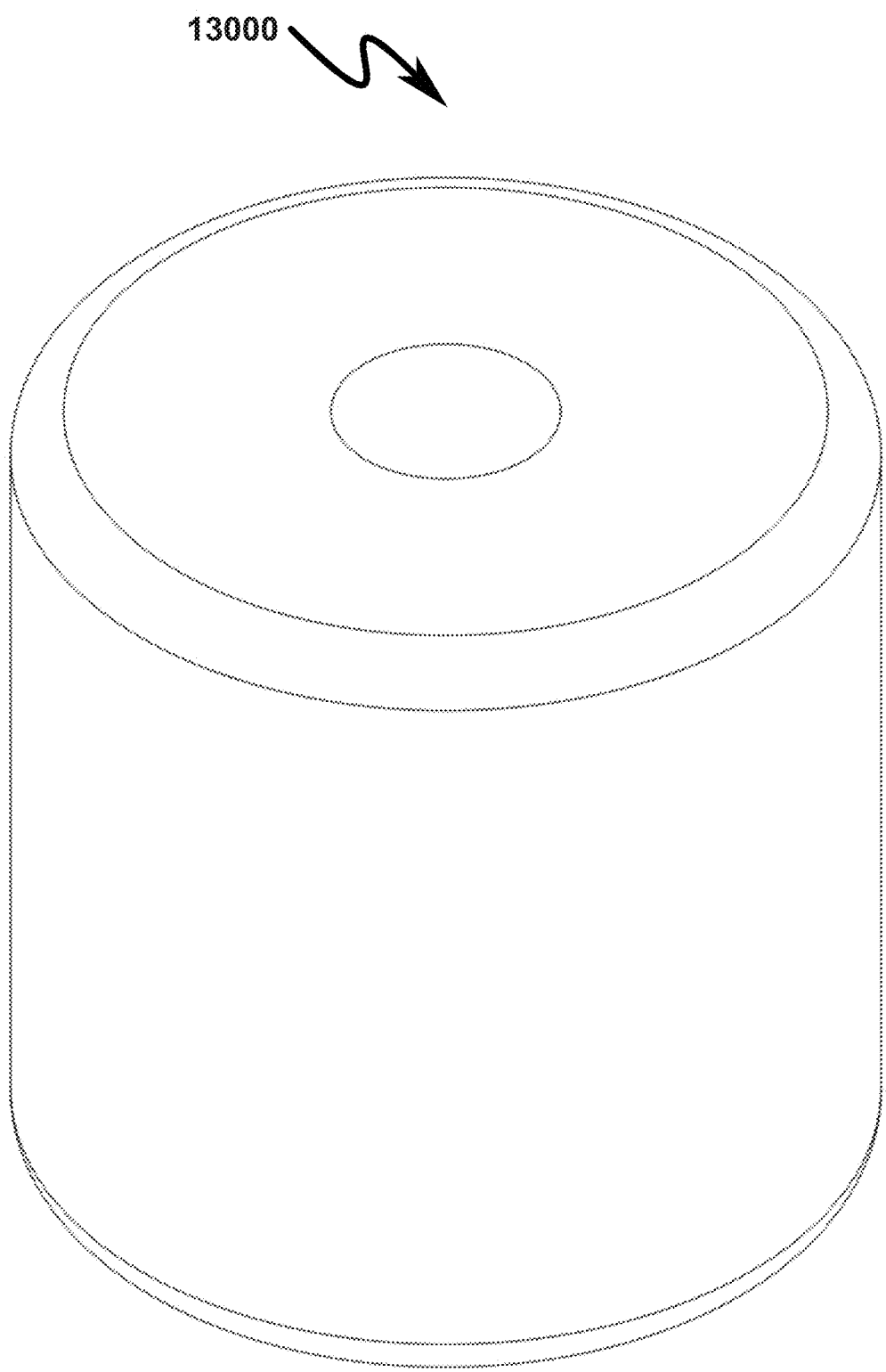

The present invention anticipates that the centroid contact region may be configured as generally depicted in the preferred exemplary embodiment of FIG. 129 (12900)-FIG. 136 (13600) wherein the radiation detector bulk material (13201) incorporates a wraparound P+ (or N+) outer contact (13202) and N+ (or P+) centroid inner contact (13203) with optional inner contact connection ring groove (13204).

Intercontact Junction Region (ICJR) (13700-14400)

The present invention anticipates that the centroid contact region may be configured as generally depicted in the preferred exemplary embodiment of FIG. 137 (13700)-FIG. 144 (14400) wherein the radiation detector bulk material (14001) incorporates a wraparound P+ (or N+) outer contact (14002) and N+ (or P+) centroid inner contact (14003) with optional inner contact connection ring groove (14004) surrounded by intercontact junction regions (ICJR) (14005, 14006).

Diffused/Implanted Contact Regions (14500-15200)

The present invention anticipates that the centroid contact region may be configured as generally depicted in the preferred exemplary embodiment of FIG. 145 (14500)-FIG. 152 (15200) wherein the radiation detector bulk material (14801) incorporates a wraparound P+ (or N+) outer diffused and/or ion implanted surface contact (14802) and N+ (or P+) centroid inner diffused and/or ion implanted surface contact (14803) surrounded by intercontact junction regions (ICJR) (14805, 14806).

Note in FIG. 145 (14500)-FIG. 152 (15200) the N+ and P+ contacts are shown as diffused or ion implanted contacts that are IN THE SURFACE OF THE BULK SEMICONDUCTOR, not ON THE SURFACE OF THE BULK SEMICONDUCTOR as the less common surface barrier or amorphous semiconductor contacts might be located. Both configurations are within the scope of teaching of the present invention. Thus, while the diagrams indicate depth for the ICJR and inner/outer contacts, this visualization is provided only to show the boundaries between the various contacts and ICJR, and does not represent a physical surface depth. The contacts are shown separated by an arbitrarily wide ICJR to accentuate the fact there is a noncontact region separating the two contacts. To form the radiation detector using the present invention teachings, the detector must have contacts, a bulk, and an intercontact surface between these two regions.

Also note the ICJR may extend outside the hole, with or without a groove, as is illustrated in the following figures. In principle the inside contact can grow in width until in the limit it reaches the ends of the hole in which case the detector becomes a high capacitance true coaxial germanium detector with reduced overall efficiency as compared to the present invention teachings.

Grooved Inner Intercontact Junction Region (15300-16000)

The present invention anticipates that the centroid contact region may be configured as generally depicted in the preferred exemplary embodiment of FIG. 153 (15300)-FIG. 160 (16000) wherein the radiation detector bulk material (15601) incorporates a wraparound P+ (or N+) outer contact (15602) and N+ (or P+) centroid inner contact (15603) with optional inner contact connection ring groove (15604) surrounded by grooved intercontact junction regions (15605, 15606).

Wraparound Outer Contact (16100-16800)

The present invention anticipates that the centroid contact region may be configured as generally depicted in the preferred exemplary embodiment of FIG. 161 (16100)-FIG. 168 (16800) wherein the radiation detector bulk material (16401) incorporates a peripheral surface P+ (or N+) outer contact (16402) and N+ (or P+) centroid inner contact (16403) with optional inner contact connection ring groove (16404) surrounded by intercontact junction surface regions (16407, 16408). The intercontact junction surface regions (16407, 16408) have no thickness and represent the bare surface of the germanium separating the outer (16402) contact and inner contact (16403). The intercontact junction surface regions (16407, 16408) may be chemically passivated, oxidized, or coated with a dielectric or other passivating coating.

Grooved Outer Intercontact Region (16900-17600)

The present invention anticipates that the centroid contact region may be configured as generally depicted in the preferred exemplary embodiment of FIG. 169 (16900)-FIG. 176 (17600) wherein the radiation detector bulk material (17201) incorporates a peripheral surface P+ (or N+) outer contact (17202) surrounded by grooved intercontact junction regions (17209, 17210) and N+ (or P+) centroid inner contact (17203) with optional inner contact connection ring groove (17204) surrounded by grooved intercontact junction regions (17205, 17206) proximal to the intercontact junction surface regions (17207, 17208).

Expanded Centroid Contact with ICJR (17700-18400)

The present invention anticipates that the centroid contact region may be expanded in width to comprise as much as 30% of the detector height and configured as generally depicted in the preferred exemplary embodiment of FIG. 177 (17700)-FIG. 184 (18400) wherein the radiation detector bulk material (18001) incorporates a wraparound P+ (or N+) outer contact (18002) and N+ (or P+) centroid inner contact (18003) surrounded by intercontact junction regions (ICJR) (18005, 18006). The centroid contact inner contact groove is omitted in this example but may be present in some other preferred embodiments.

The external contact can extend arbitrarily far into the core hole to within proximity of the small contact as long as there remains an ICJR. This detector configuration is not currently implemented in the prior art and provides a significant performance improvement over the prior art.

Expanded Centroid Contact without Thru-Hole (18500-19200)

The present invention anticipates that the centroid contact region may be expanded in width/height to comprise as much as 30% of the detector height for a detector not having a thru-hole and configured as generally depicted in the preferred exemplary embodiment of FIG. 185 (18500)-FIG. 188 (18800) and FIG. 189 (18900)-FIG. 192 (19200) wherein the radiation detector bulk material (18511, 18911) incorporates a wraparound P+ (or N+) outer contact (18512, 18912) and N+ (or P+) centroid inner contact (18513, 18913) surrounded by intercontact junction regions (ICJR) (18515, 18915). The centroid contact inner contact groove is omitted in this example but may be present in some other preferred embodiments. The example in FIG. 189 (18900)-FIG. 192 (19200) illustrates that while the centroid inner contact (18913) may be expanded in width/height, the wraparound P+ (or N+) outer contact (18912) may extend within the central void of the detector and need only be separated from the centroid inner contact (18913) via the intercontact junction regions (ICJR) (18915).

The external contact can extend arbitrarily far into the core hole to within proximity of the small contact as long as there remains an ICJR. This detector configuration is not currently implemented in the prior art and provides a significant performance improvement over the prior art.

Preferred Embodiment System Summary

The present invention preferred exemplary system embodiment anticipates a wide variety of variations in the basic theme of construction, but can be generalized as a centroid contact radiation detector (CCRD) comprising:
(a) P-type bulk germanium volume (PGEV);
(b) N+ electrode; and
(c) P+ electrode;
wherein:
the PGEV is symmetrically constructed along a central vertical longitudinal axis;
the PGEV further comprises an internal surface and an external surface;
the external surface comprises an outer surface and a cavity entry region (CER);
the PGEV further comprises an internal well cavity void (IWCV) coincident with the CER, the surface of the IWCV forming the internal surface;
the IWCV further comprises one or more side surfaces and a contact surface;
the N+ electrode is formed on the external surface; and
the P+ electrode is located on the contact surface at a geometric centroid of the PGEV.

This general system summary may be augmented by the various elements described herein to produce a wide variety of invention embodiments consistent with this overall design description.

Alternate Preferred Embodiment System Summary

An alternate present invention preferred exemplary system embodiment anticipates a wide variety of variations in the basic theme of construction, but can be generalized as a centroid contact radiation detector (CCRD) comprising:
(a) N-type bulk germanium volume (NGEV);
(b) P+ electrode; and
(c) N+ electrode;
wherein:
the NGEV is symmetrically constructed along a central vertical longitudinal axis;
the NGEV further comprises an internal surface and an external surface;

the external surface comprises an outer surface and a cavity entry region (CER);

the NGEV further comprises an internal well cavity void (IWCV) coincident with the CER, the surface of the IWCV forming the internal surface;

the IWCV further comprises one or more side surfaces and a contact surface;

the P+ electrode is formed on the external surface; and the N+ electrode is located on the contact surface at a geometric centroid of the NGEV.

This general system summary may be augmented by the various elements described herein to produce a wide variety of invention embodiments consistent with this overall design description.

Preferred Embodiment Method Summary

The present invention preferred exemplary method embodiment anticipates a wide variety of variations in the basic theme of implementation, but can be generalized as a centroid contact radiation detector (CCRD) method, the method operating in conjunction with a centroid contact radiation detector (CCRD) system, the system comprising:
(a) P-type bulk germanium volume (PGEV);
(b) N+ electrode; and
(c) P+ electrode;
wherein:
the PGEV is symmetrically constructed along a central vertical longitudinal axis;
the PGEV further comprises an internal surface and an external surface;
the external surface comprises an outer surface and a cavity entry region (CER);
the PGEV further comprises an internal well cavity void (IWCV) coincident with the CER, the surface of the IWCV forming the internal surface;
the IWCV further comprises one or more side surfaces and a contact surface;
the N+ electrode is formed on the external surface; and
the P+ electrode is located on the contact surface at a geometric centroid of the PGEV;
wherein the method comprises the steps of:
(1) placing a radiation sample in proximity of the PGEV;
(2) collecting electrical charge from the N+ electrode and the P+ electrode attached to the PGEV;
(3) pre-processing the electrical charge with a preamplifier to form a detection voltage pulse (DVP);
(4) post-processing the DVP by amplifying, shaping, filtering, digitizing, and optimizing the DVP with a signal processing chain to form a detection signal pulse (DSP); and
(5) analyzing, recording, and displaying the DSP.

Note that this method may incorporate displays, audible alarms, or other type of human and/or computer interfaces in conjunction with data logging and/or mathematical analysis of the collected radiation detection information. This general method summary may be augmented by the various elements described herein to produce a wide variety of invention embodiments consistent with this overall design description.

Alternate Preferred Embodiment Method Summary

An alternate present invention preferred exemplary method embodiment anticipates a wide variety of variations in the basic theme of implementation, but can be generalized as a centroid contact radiation detector (CCRD) method, the method operating in conjunction with a centroid contact radiation detector (CCRD) system, the system comprising:
(a) N-type bulk germanium volume (NGEV);
(b) P+ electrode; and
(c) N+ electrode;
wherein:
the NGEV is symmetrically constructed along a central vertical longitudinal axis;
the NGEV further comprises an internal surface and an external surface;
the external surface comprises an outer surface and a cavity entry region (CER);
the NGEV further comprises an internal well cavity void (IWCV) coincident with the CER, the surface of the IWCV forming the internal surface;
the IWCV further comprises one or more side surfaces and a contact surface;
the P+ electrode is formed on the external surface; and
the N+ electrode is located on the contact surface at a geometric centroid of the NGEV;
wherein the method comprises the steps of:
(1) placing a radiation sample in proximity of the NGEV;
(2) collecting electrical charge from the P+ electrode and the N+ electrode attached to the NGEV;
(3) pre-processing the electrical charge with a preamplifier to form a detection voltage pulse (DVP);
(4) post-processing the DVP by amplifying, shaping, filtering, digitizing, and optimizing the DVP with a signal processing chain to form a detection signal pulse (DSP); and
(5) analyzing, recording, and displaying the DSP.

Note that this method may incorporate displays, audible alarms, or other type of human and/or computer interfaces in conjunction with data logging and/or mathematical analysis of the collected radiation detection information. This general method summary may be augmented by the various elements described herein to produce a wide variety of invention embodiments consistent with this overall design description.

System/Method Variations

The present invention anticipates a wide variety of variations in the basic theme of construction. The examples presented previously do not represent the entire scope of possible usages. They are meant to cite a few of the almost limitless possibilities.

This basic system and method may be augmented with a variety of ancillary embodiments, including but not limited to:

An embodiment wherein the PGEV forms a cylindrical annulus having a height H, external diameter D, and internal diameter I; the external surface of the PGEV forms a cylinder of the diameter D; the internal surface of the PGEV forms a cylinder of the diameter I; the P+ electrode forms a cylindrical annulus of the diameter I at a midplane of the cylindrical PGEV along a longitudinal centerline of the cylindrical PGEV; and the P+ electrode cylindrical annulus has a surface width less than or equal to 30% of the height H.

An embodiment wherein the NGEV forms a cylindrical annulus having a height H, external diameter D, and internal diameter I; the external surface of the NGEV forms a cylinder of the diameter D; the internal surface of the NGEV forms a cylinder of the diameter I; the N+ electrode forms a cylindrical annulus of the diameter I at a midplane of the cylindrical NGEV along a longitudinal centerline of the cylindrical NGEV; and the N+ electrode cylindrical annulus has a surface width less than or equal to 30% of the height H.

An embodiment wherein the external surface of the PGEV forms a shape selected from a group consisting of: cylinder; dome; sphere; frustum; conic frustum; and regular polyhedron prism.

An embodiment wherein the external surface of the NGEV forms a shape selected from a group consisting of: cylinder; dome; sphere; frustum; conic frustum; and regular polyhedron prism.

An embodiment wherein the IWCV forms a shape selected from a group consisting of: cylinder; frustum; conic frustum; dome; and regular polyhedron prism.

An embodiment wherein the P+ electrode forms a shape selected from a group consisting of: point contact; circular plate; hemisphere; semi-hemisphere; and cylindrical annulus.

An embodiment wherein the N+ electrode forms a shape selected from a group consisting of: point contact; circular plate; hemisphere; semi-hemisphere; and cylindrical annulus.

An embodiment wherein the P+ electrode is formed on only a portion of the internal surface.

An embodiment wherein the N+ electrode is formed on only a portion of the internal surface.

An embodiment wherein the N+ electrode is formed on only a portion of the external surface.

An embodiment wherein the P+ electrode is formed on only a portion of the external surface.

An embodiment wherein the N+ electrode is formed on only a portion of the external surface and is adjacent to an isolation groove formed within the PGEV.

An embodiment wherein the P+ electrode is formed on only a portion of the external surface and is adjacent to an isolation groove formed within the NGEV.

An embodiment wherein the PGEV comprises a plurality of uniformly constructed wedge segments combined together to form a unified radiation detection structure.

An embodiment wherein the NGEV comprises a plurality of uniformly constructed wedge segments combined together to form a unified radiation detection structure.

An embodiment wherein the PGEV comprises a plurality of uniformly constructed wedge segments combined together to form a unified radiation detection structure incorporating a radial P+ electrode positioned along the longitudinal axis within each the plurality of uniformly constructed wedge segments.

An embodiment wherein the NGEV comprises a plurality of uniformly constructed wedge segments combined together to form a unified radiation detection structure incorporating a radial N+ electrode positioned along the longitudinal axis within each the plurality of uniformly constructed wedge segments.

An embodiment wherein the N+ electrode comprises an electrical contact selected from a group consisting of: implanted donor species; implanted acceptor species; diffused donor species; diffused acceptor species; surface barrier contact; amorphous semiconductor contact; metal oxide semiconductor (MOS) contact; metal insulator semiconductor (MIS) contact; Schottky barrier contacts; rectifying semiconductor contact; blocking semiconductor contact; and ohmic semiconductor contact.

An embodiment wherein the P+ electrode comprises an electrical contact selected from a group consisting of: implanted donor species; implanted acceptor species; diffused donor species; diffused acceptor species; surface barrier contact; amorphous semiconductor contact; metal oxide semiconductor (MOS) contact; metal insulator semiconductor (MIS) contact; Schottky barrier contacts; rectifying semiconductor contact; blocking semiconductor contact; and ohmic semiconductor contact.

One skilled in the art will recognize that other embodiments are possible based on combinations of elements taught within the above invention description.

Generalized Computer Usable Medium

In various alternate embodiments, the present invention may be implemented as a computer program product for use with a computerized computing system. Those skilled in the art will readily appreciate that programs defining the functions defined by the present invention can be written in any appropriate programming language and delivered to a computer in many forms, including but not limited to: (a) information permanently stored on non-writeable storage media (e.g., read-only memory devices such as ROMs or CD-ROM disks); (b) information alterably stored on writeable storage media (e.g., floppy disks and hard drives); and/or (c) information conveyed to a computer through communication media, such as a local area network, a telephone network, or a public network such as the Internet. When carrying computer readable instructions that implement the present invention methods, such computer readable media represent alternate embodiments of the present invention.

As generally illustrated herein, the present invention system embodiments can incorporate a variety of computer readable media that comprise computer usable medium having computer readable code means embodied therein. One skilled in the art will recognize that the software associated with the various processes described herein can be embodied in a wide variety of computer accessible media from which the software is loaded and activated. Pursuant to *In re Beauregard*, 35 USPQ2d 1383 (U.S. Pat. No. 5,710, 578), the present invention anticipates and includes this type of computer readable media within the scope of the invention. Pursuant to *In re Nuijten*, 500 F.3d 1346 (Fed. Cir. 2007) (U.S. patent application Ser. No. 09/211,928), the present invention scope is limited to computer readable media wherein the media is both tangible and non-transitory.

CONCLUSION

A centroid contact radiation detector system/method providing for low capacitance and noise insensitivity has been disclosed. The system incorporates a P-type/N-type bulk germanium volume (PGEV/NGEV) having an internal well cavity void (IWCV). The external NGEV surfaces incorporate an N+/P+ electrode and the surface of the IWCV incorporates a centrally located P+/N+ contact (CPPC). The IWCV surface is constructed and the CPPC is positioned within the IWCV so as to provide uniform symmetric field distribution within the PGEV/NGEV and improved noise immunity. The CPPC may be formed using point, reduced-area, medium-area, large-area, hemispherical, semi-hemispherical, and cylindrical annulus contact constructions. The PGEV/NGEV may be constructed using cylindrical, regular polyhedral, or spherical forms.

CLAIMS INTERPRETATION

The following rules apply when interpreting the CLAIMS of the present invention:

The CLAIM PREAMBLE should be considered as limiting the scope of the claimed invention.

"WHEREIN" clauses should be considered as limiting the scope of the claimed invention.

"WHEREBY" clauses should be considered as limiting the scope of the claimed invention.

"ADAPTED TO" clauses should be considered as limiting the scope of the claimed invention.

"ADAPTED FOR" clauses should be considered as limiting the scope of the claimed invention.

The term "MEANS" specifically invokes the means-plus-function claims limitation recited in 35 U.S.C. § 112(f) and such claim shall be construed to cover the corresponding structure, material, or acts described in the specification and equivalents thereof.

The phrase "MEANS FOR" specifically invokes the means-plus-function claims limitation recited in 35 U.S.C. § 112(f) and such claim shall be construed to cover the corresponding structure, material, or acts described in the specification and equivalents thereof.

The phrase "STEP FOR" specifically invokes the step-plus-function claims limitation recited in 35 U.S.C. § 112(f) and such claim shall be construed to cover the corresponding structure, material, or acts described in the specification and equivalents thereof.

The step-plus-function claims limitation recited in 35 U.S.C. § 112(f) shall be construed to cover the corresponding structure, material, or acts described in the specification and equivalents thereof ONLY for such claims including the phrases "MEANS FOR", "MEANS", or "STEP FOR".

The phrase "AND/OR" in the context of an expression "X and/or Y" should be interpreted to define the set of "(X and Y)" in union with the set "(X or Y)" as interpreted by Ex Parte Gross (USPTO Patent Trial and Appeal Board, Appeal 2011-004811, Ser. No. 11/565,411, ("'and/or' covers embodiments having element A alone, B alone, or elements A and B taken together").

The claims presented herein are to be interpreted in light of the specification and drawings presented herein with sufficiently narrow scope such as to not preempt any abstract idea.

The claims presented herein are to be interpreted in light of the specification and drawings presented herein with sufficiently narrow scope such as to not preclude every application of any idea.

The claims presented herein are to be interpreted in light of the specification and drawings presented herein with sufficiently narrow scope such as to preclude any basic mental process that could be performed entirely in the human mind.

The claims presented herein are to be interpreted in light of the specification and drawings presented herein with sufficiently narrow scope such as to preclude any process that could be performed entirely by human manual effort.

Although a preferred embodiment of the present invention has been illustrated in the accompanying drawings and described in the foregoing Detailed Description, it will be understood that the invention is not limited to the embodiments disclosed, but is capable of numerous rearrangements, modifications, and substitutions without departing from the spirit of the invention as set forth and defined by the following claims.

What is claimed is:

1. A centroid contact radiation detector (CCRD) system comprising:
   (a) P-type bulk germanium volume (PGEV);
   (b) N+ electrode; and
   (c) P+ electrode;
   wherein:
   said PGEV is symmetrically constructed along a central vertical longitudinal axis;
   said PGEV further comprises an internal surface and an external surface;
   said external surface comprises an outer surface and a cavity entry region (CER);
   said PGEV further comprises an internal well cavity void (IWCV) coincident with said CER, the surface of said IWCV forming said internal surface;
   said IWCV further comprises one or more side surfaces and a contact surface;
   said N+ electrode is formed on said external surface; and
   said P+ electrode is located on said contact surface at a geometric centroid of said PGEV.

2. The centroid contact radiation detector (CCRD) system of claim 1 wherein said PGEV forms a cylindrical annulus having a height H, external diameter D, and internal diameter I; said external surface of said PGEV forms a cylinder of said diameter D; said internal surface of said PGEV forms a cylinder of said diameter I; said P+ electrode forms a cylindrical annulus of said diameter I at a midplane of said cylindrical PGEV along a longitudinal centerline of said cylindrical PGEV; and said P+ electrode cylindrical annulus has a surface width less than or equal to 30% of said height H.

3. The centroid contact radiation detector (CCRD) system of claim 1 wherein said external surface of said PGEV forms a shape selected from a group consisting of: cylinder; dome; sphere; frustum; conic frustum; and regular polyhedron prism.

4. The centroid contact radiation detector (CCRD) system of claim 1 wherein said IWCV forms a shape selected from a group consisting of: cylinder; frustum; conic frustum; dome; and regular polyhedron prism.

5. The centroid contact radiation detector (CCRD) system of claim 1 wherein said P+ electrode forms a shape selected from a group consisting of: point contact; circular plate; hemisphere; semi-hemisphere; and cylindrical annulus.

6. The centroid contact radiation detector (CCRD) system of claim 1 wherein said P+ electrode is formed on only a portion of said internal surface.

7. The centroid contact radiation detector (CCRD) system of claim 1 wherein said N+ electrode is formed on only a portion of said external surface.

8. The centroid contact radiation detector (CCRD) system of claim 1 wherein said N+ electrode is formed on only a portion of said external surface and is adjacent to an isolation groove formed within said PGEV.

9. The centroid contact radiation detector (CCRD) system of claim 1 wherein said N+ electrode comprises an electrical contact selected from a group consisting of: implanted donor species; implanted acceptor species; diffused donor species; diffused acceptor species; surface barrier contact; amorphous semiconductor contact; metal oxide semiconductor (MOS) contact; metal insulator semiconductor (MIS) contact; Schottky barrier contacts; rectifying semiconductor contact; blocking semiconductor contact; and ohmic semiconductor contact.

10. The centroid contact radiation detector (CCRD) system of claim 1 wherein said P+ electrode comprises an electrical contact selected from a group consisting of: implanted donor species; implanted acceptor species; diffused donor species; diffused acceptor species; surface barrier contact; amorphous semiconductor contact; metal oxide semiconductor (MOS) contact; metal insulator semiconductor (MIS) contact; Schottky barrier contacts; rectifying semiconductor contact; blocking semiconductor contact; and ohmic semiconductor contact.

11. A centroid contact radiation detector (CCRD) system comprising:
(a) N-type bulk germanium volume (NGEV);
(b) P+ electrode; and
(c) N+ electrode;
wherein:
said NGEV is symmetrically constructed along a central vertical longitudinal axis;
said NGEV further comprises an internal surface and an external surface;
said external surface comprises an outer surface and a cavity entry region (CER);
said NGEV further comprises an internal well cavity void (IWCV) coincident with said CER, the surface of said IWCV forming said internal surface;
said IWCV further comprises one or more side surfaces and a contact surface;
said P+ electrode is formed on said external surface; and
said N+ electrode is located on said contact surface at a geometric centroid of said NGEV.

12. The centroid contact radiation detector (CCRD) system of claim 11 wherein said NGEV forms a cylindrical annulus having a height H, external diameter D, and internal diameter I; said external surface of said NGEV forms a cylinder of said diameter D; said internal surface of said NGEV forms a cylinder of said diameter I; said N+ electrode forms a cylindrical annulus of said diameter I at a midplane of said cylindrical NGEV along a longitudinal centerline of said cylindrical NGEV; and said N+ electrode cylindrical annulus has a surface width less than or equal to 30% of said height H.

13. The centroid contact radiation detector (CCRD) system of claim 11 wherein said external surface of said NGEV forms a shape selected from a group consisting of: cylinder; dome; sphere; frustum; conic frustum; and regular polyhedron prism.

14. The centroid contact radiation detector (CCRD) system of claim 11 wherein said IWCV forms a shape selected from a group consisting of: cylinder; frustum; conic frustum; dome; and regular polyhedron prism.

15. The centroid contact radiation detector (CCRD) system of claim 11 wherein said N+ electrode forms a shape selected from a group consisting of: point contact; circular plate; hemisphere; semi-hemisphere; and cylindrical annulus.

16. The centroid contact radiation detector (CCRD) system of claim 11 wherein said N+ electrode is formed on only a portion of said internal surface.

17. The centroid contact radiation detector (CCRD) system of claim 11 wherein said P+ electrode is formed on only a portion of said external surface.

18. The centroid contact radiation detector (CCRD) system of claim 11 wherein said P+ electrode is formed on only a portion of said external surface and is adjacent to an isolation groove formed within said NGEV.

19. The centroid contact radiation detector (CCRD) system of claim 11 wherein said P+ electrode comprises an electrical contact selected from a group consisting of: implanted donor species; implanted acceptor species; diffused donor species; diffused acceptor species; surface barrier contact; amorphous semiconductor contact; metal oxide semiconductor (MOS) contact; metal insulator semiconductor (MIS) contact; Schottky barrier contacts; rectifying semiconductor contact; blocking semiconductor contact; and ohmic semiconductor contact.

20. The centroid contact radiation detector (CCRD) system of claim 11 wherein said N+ electrode comprises an electrical contact selected from a group consisting of: implanted donor species; implanted acceptor species; diffused donor species; diffused acceptor species; surface barrier contact; amorphous semiconductor contact; metal oxide semiconductor (MOS) contact; metal insulator semiconductor (MIS) contact; Schottky barrier contacts; rectifying semiconductor contact; blocking semiconductor contact; and ohmic semiconductor contact.

* * * * *